US012033694B2

(12) United States Patent
Yamazaki et al.

(10) Patent No.: US 12,033,694 B2
(45) Date of Patent: Jul. 9, 2024

(54) SEMICONDUCTOR DEVICE AND ELECTRONIC DEVICE

(71) Applicant: Semiconductor Energy Laboratory Co., Ltd., Atsugi (JP)

(72) Inventors: Shunpei Yamazaki, Setagaya (JP); Hajime Kimura, Atsugi (JP); Takayuki Ikeda, Atsugi (JP); Yoshiyuki Kurokawa, Sagamihara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 21 days.

(21) Appl. No.: 18/007,766

(22) PCT Filed: Jul. 5, 2021

(86) PCT No.: PCT/IB2021/055988
§ 371 (c)(1),
(2) Date: Dec. 2, 2022

(87) PCT Pub. No.: WO2022/013676
PCT Pub. Date: Jan. 20, 2022

(65) Prior Publication Data
US 2023/0274779 A1 Aug. 31, 2023

(30) Foreign Application Priority Data
Jul. 17, 2020 (JP) ................... 2020-122879

(51) Int. Cl.
*G11C 11/34* (2006.01)
*G06G 7/60* (2006.01)
(Continued)

(52) U.S. Cl.
CPC ............ *G11C 11/5642* (2013.01); *G06G 7/60* (2013.01); *G11C 7/06* (2013.01); *H01L 29/786* (2013.01);
(Continued)

(58) Field of Classification Search
CPC ....... G11C 11/5642; G11C 7/06; H10B 12/30; H03K 19/0806
See application file for complete search history.

(56) References Cited

U.S. PATENT DOCUMENTS 5,386,149 A 1/1995 Arima
6,353,337 B2 * 3/2002 Nasu ................. H03K 19/0005
326/88
(Continued)

FOREIGN PATENT DOCUMENTS

CN 112384927 A 2/2021
EP 0466331 A 1/1992
(Continued)

OTHER PUBLICATIONS

International Search Report (Application No. PCT/IB2021/055988) Dated Sep. 21, 2021.
(Continued)

*Primary Examiner* — Viet Q Nguyen
(74) *Attorney, Agent, or Firm* — Eric J. Robinson; Robinson Intellectual Property Law Office, P.C.

(57) ABSTRACT

A semiconductor device that restores degraded data is provided. The semiconductor device includes a first circuit, a storage portion, and an arithmetic portion. The first circuit includes a current source and a first switch. The storage portion includes a first transistor and a first capacitor. The arithmetic portion includes a second transistor. A first terminal of the first transistor is electrically connected to a control terminal of the first switch, a first terminal of the first switch is electrically connected to an output terminal of the current source, and a second terminal of the first switch is electrically connected to a first terminal of the second transistor. When data retained in the arithmetic portion is restored, the first transistor is turned on, and the data retained in the storage portion is supplied to the control terminal of
(Continued)

the first switch through the first transistor. The first switch is brought into an on state or an off state in accordance with the data and supplies current from the current source to the arithmetic portion through the second transistor to supply electric charge to a retention portion of the arithmetic portion.

16 Claims, 43 Drawing Sheets

(51) Int. Cl.
    *G11C 7/06*         (2006.01)
    *G11C 11/56*       (2006.01)
    *H01L 29/786*     (2006.01)
    *H10B 12/00*       (2023.01)
    *H03K 19/08*       (2006.01)

(52) U.S. Cl.
    CPC ......... H10B 12/30 (2023.02); *H03K 19/0806* (2013.01)

(56) References Cited

U.S. PATENT DOCUMENTS

| | | | |
|---|---|---|---|
| 7,372,440 B2* | 5/2008 | Ota | G09G 3/3283 345/76 |
| 7,880,158 B2* | 2/2011 | Aitken | G11C 17/18 257/4 |
| 9,859,961 B2* | 1/2018 | Onodera | H04B 7/0452 |
| 10,090,022 B2* | 10/2018 | Shionoiri | G11C 5/025 |
| 10,102,897 B2* | 10/2018 | Park | G11C 11/1673 |
| 10,236,875 B2* | 3/2019 | Kato | H01L 29/78648 |
| 10,446,246 B2 | 10/2019 | Tran et al. | |
| 10,607,710 B2 | 3/2020 | Tran et al. | |
| 10,658,048 B2* | 5/2020 | Conte | G11C 16/28 |
| 10,720,885 B2* | 7/2020 | Kobayashi | H03B 5/02 |
| 10,861,568 B2 | 12/2020 | Tran et al. | |
| 11,075,629 B2* | 7/2021 | Agnes | H03K 17/163 |
| 11,139,298 B2* | 10/2021 | Harada | H01L 27/1255 |
| 11,335,813 B2* | 5/2022 | Kobayashi | H10B 12/0335 |
| 11,367,739 B2* | 6/2022 | Okamoto | H10N 30/302 |
| 11,417,704 B2 | 8/2022 | Kimura et al. | |
| 11,568,944 B2* | 1/2023 | Onuki | G11C 29/00 |
| 2005/0275647 A1 | 12/2005 | Numao | |
| 2018/0181862 A1 | 6/2018 | Ikeda | |
| 2020/0160158 A1 | 5/2020 | Okamoto. et al. | |
| 2020/0201603 A1 | 6/2020 | Kozuma et al. | |
| 2021/0257015 A1 | 8/2021 | Yamazaki et al. | |
| 2021/0294573 A1 | 9/2021 | Morie et al. | |
| 2021/0384193 A1 | 12/2021 | Kimura et al. | |
| 2022/0165311 A1 | 5/2022 | Kimura et al. | |
| 2022/0180159 A1 | 6/2022 | Kimura et al. | |
| 2022/0237440 A1 | 7/2022 | Kimura et al. | |
| 2022/0254401 A1* | 8/2022 | Kurokawa | H01L 29/78696 |
| 2022/0254402 A1 | 8/2022 | Yakubo. et al. | |

FOREIGN PATENT DOCUMENTS

| | | |
|---|---|---|
| EP | 3822843 A | 5/2021 |
| JP | 05-114294 A | 5/1993 |
| JP | 2019-003464 A | 1/2019 |
| JP | 2021-517704 | 7/2021 |
| WO | WO-2019/177687 | 9/2019 |
| WO | WO-2020/013069 | 1/2020 |
| WO | WO-2022/013680 | 1/2022 |
| WO | WO-2022/029534 | 2/2022 |

OTHER PUBLICATIONS

Written Opinion (Application No. PCT/IB2021/055988) Dated Sep. 21, 2021.

Kang.M et al., "A Multi-Functional In-Memory Inference Processor Using a Standard 6T SRAM Array", IEEE Journal of Solid-State Circuits, Jan. 4, 2018, vol. 53, No. 2, pp. 642-655.

Zhang.J et al., "In-Memory Computation of a Machine-Learning Classifier in a Standard 6T SRAM Array", IEEE Journal of Solid-State Circuits, Mar. 10, 2017, vol. 52, No. 4, pp. 915-924.

Agrawal.A et al., "X-SRAM: Enabling In-Memory Boolean Computations in CMOS Static Random Access Memories", IEEE Transactions on Circuits and Systems, Jul. 2, 2018, pp. 1-14.

Akyel.K et al., "DRC2: Dynamically Reconfigurable Computing Circuit based on memory architecture", IEEE International Conference on Rebooting Computing, Oct. 17, 2016, pp. 1-8pages.

Kang.M et al., "A 19.4-nJ/Decision, 364-K Decisions/s, In-Memory Random Forest Multi-Class Inference Accelerator", IEEE Journal of Solid-State Circuits, May 2, 2018, vol. 53, No. 7, pp. 2126-2135.

Moradi.S et al., "An Event-Based Neural Network Architecture With an Asynchronous Programmable Synaptic Memory", IEEE Transactions on Biomedical Circuits and Systems, Jun. 4, 2013, vol. 8, No. 1, pp. 98-107.

* cited by examiner

100

FIG. 40A
Intermediate state
New crystalline phase
| Amorphous | Crystalline | Crystal |
|---|---|---|
| • completely amorphous | • CAAC<br>• nc<br>• CAC<br><br>excluding single crystal and poly crystal | • single crystal<br>• poly crystal |
FIG. 40B
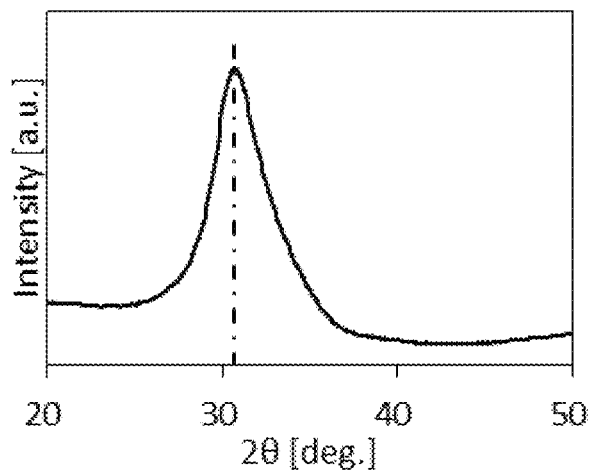
FIG. 40C
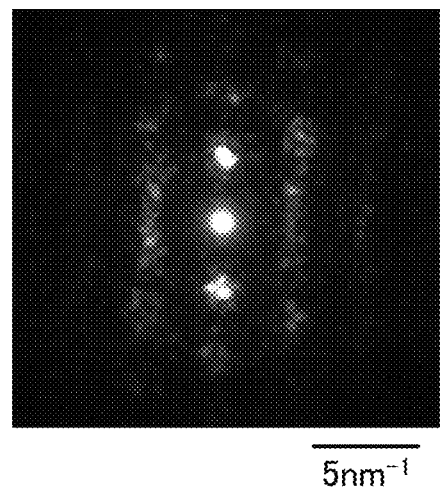

SEMICONDUCTOR DEVICE AND ELECTRONIC DEVICE

TECHNICAL FIELD

One embodiment of the present invention relates to a semiconductor device and an electronic device.

Note that one embodiment of the present invention is not limited to the above technical field. The technical field of the invention disclosed in this specification and the like relates to an object, a driving method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display device, a liquid crystal display device, a light-emitting device, a power storage device, an imaging device, a storage device, a signal processing device, a processor, an electronic device, a system, a driving method thereof, a manufacturing method thereof, and a testing method thereof.

BACKGROUND ART

Integrated circuits that imitate the mechanism of the human brain are currently under active development. The integrated circuits incorporate electronic circuits as the brain mechanism and include circuits corresponding to "neurons" and "synapses" of the human brain. Such integrated circuits may therefore be called "neuromorphic", "brain-morphic", or "brain-inspired" circuits, for example. The integrated circuits have a non-von Neumann architecture and are expected to be able to perform parallel processing with extremely low power consumption as compared with a von Neumann architecture, in which power consumption increases with increasing processing speed.

An information processing model that imitates a biological neural network including "neurons" and "synapses" is called an artificial neural network (ANN). For example, Non-Patent Document 1 and Non-Patent Document 2 each disclose an arithmetic device including an artificial neural network constructed using an SRAM (Static Random Access Memory).

REFERENCE

Non-Patent Document

[Non-Patent Document 1] M. Kang et al., "IEEE Journal Of Solid-State Circuits", 2018, Volume 53, No. 2, pp. 642-655.
[Non-Patent Document 2] J. Zhang et al., "IEEE Journal Of Solid-State Circuits", 2017, Volume 52, No. 4, pp. 915-924.

SUMMARY OF THE INVENTION

Problems to be Solved by the Invention

An artificial neural network performs calculations in which the connection strength (sometimes referred to as weight coefficient) of a synapse that connects two neurons is multiplied by a signal transmitted between the two neurons. In particular, in a hierarchical artificial neural network, the connection strength of synapses between a plurality of first neurons in a first layer and one of second neurons in a second layer and signals input from the plurality of first neurons in the first layer to the one of the second neurons in the second layer need to be multiplied and summed; that is, the product-sum operation of the connection strength and signals need to be performed. The number of connection strengths and the number of parameters indicating the signals are determined in accordance with the scale of the artificial neural network. In addition, with use of a result of the product-sum operation of the connection strength of synapses and the signal output from the first neurons, the second neuron performs active function calculation and outputs a calculation result as a signal to third neurons in a third layer. That is, in the artificial neural network, as the number of layers, the number of neurons, and the like increase, the number of circuits corresponding to the "neurons" and "synapses" also increases, which sometimes makes the amount of arithmetic operation enormous. Accordingly, the power consumed by the circuits increases and the amount of heat generated by the circuits increases in some cases.

As the number of circuits included in a chip increases, the power consumption increases and the amount of heat generated when a device is driven also increases. In particular, a larger amount of heat generation is more likely to affect the characteristics of circuit elements included in a chip; thus, a circuit constituting the chip preferably includes circuit elements that are less affected by temperatures. In addition, variations in characteristics of a transistor, a current source, or the like included in a chip lead to variations in arithmetic operation results.

In the case where the above product-sum operation is performed, a circuit in which multiplication is performed (the circuit is called a multiplier cell in this specification) needs to keep retaining a weight coefficient as a multiplier (multiplicand in some cases). Thus, the multiplier cell is provided with a storage element such as a capacitor retaining a weight coefficient. However, data retained in the storage element is degraded over time, in which case the value of the weight coefficient changes sometimes. Data degradation occurs when electric charges retained by the storage elements decrease. A decrease in charges is caused by, for example, leakage current flowing from the storage element, and examples of leakage current include the leakage current flowing when a switching element such as a transistor is in an off state and the leakage current flowing through a dielectric between a pair of electrodes in a capacitor. In the case of the leakage current flowing when a switching element such as a transistor is in an off state, the capacitance value of the capacitor is increased, thereby diminishing the effect of the leakage current. On the other hand, in the case of the leakage current flowing through a dielectric between a pair of electrodes in a capacitor, the amount of leakage current per unit area of the pair of electrodes does not change even when the capacitance value of the capacitor is increased; thus, it is difficult to diminish the effect of the leakage current on the whole.

In an arithmetic circuit including the multiplier cell, measures other than an increase in the capacitance value in the capacitor are needed to prevent degradation of data retained by the multiplier cell. Examples of the measures include regular rewriting of the weight coefficient to the storage element in the multiplier cell. Alternatively, as a favorable way, a dummy cell or the like is provided in the arithmetic circuit including the multiplier cell, and data retained by the dummy cell is monitored, so that rewriting of the weight coefficient to the multiplier cell would be performed when the data is degraded. Note that the rewriting of data in this specification and the like indicates the operation of rewriting of data the same as that originally held by a cell to the cell. In addition, the rewriting of data also indicates the operation of restocking a cell, in which the absolute value of the amount of retained charges is reduced, with charges to have the same amount as the originally retained amount, so that the data is restored.

An object of one embodiment of the present invention is to provide a semiconductor device or the like that performs a product-sum operation and/or a function operation. Another object of one embodiment of the present invention is to provide a semiconductor device that rewrites data to be retained in a multiplier cell. Another object of one embodiment of the present invention is to provide a semiconductor device that retains a digital value and performs digital-analog conversion on the digital value to perform arithmetic operation with an analog value. Another object of one embodiment of the present invention is to provide a semiconductor device or the like that performs convolution processing such as CNN (Convolutional Neutral Network). Another object of one embodiment of the present invention is to provide a semiconductor device or the like for AI (Artificial Intelligence). Another object of one embodiment of the present invention is to provide a semiconductor device or the like for DNN (Deep Neural Network). Another object of one embodiment of the present invention is to provide a semiconductor device or the like with low power consumption. Another object of one embodiment of the present invention is to provide a semiconductor device or the like that is less affected by environmental temperatures. Another object of one embodiment of the present invention is to provide a semiconductor device or the like that is less affected by variations in characteristics of a transistor. Another object of one embodiment of the present invention is to provide a semiconductor device or the like that is less affected by variations in characteristics of a current source. Another object of one embodiment of the present invention is to provide a novel semiconductor device or the like.

Note that the objects of one embodiment of the present invention are not limited to the objects listed above. The objects listed above do not preclude the existence of other objects. Note that the other objects are objects that are not described in this section and will be described below. The objects that are not described in this section are derived from the description of the specification, the drawings, and the like and can be extracted as appropriate from the description by those skilled in the art. Note that one embodiment of the present invention is to achieve at least one of the objects listed above and the other objects. Note that one embodiment of the present invention does not necessarily achieve all the objects listed above and the other objects.

Means for Solving the Problems (1)
One embodiment of the present invention is a semiconductor device including a first circuit, a second circuit, and a third circuit. The first circuit includes a current source and a first switch. The second circuit includes a first transistor, a third transistor, a fourth transistor, and a first capacitor. The third circuit includes a second transistor. A first terminal of the first transistor is electrically connected to a control terminal of the first switch, and a second terminal of the first transistor is electrically connected to a first terminal of the fourth transistor. A second terminal of the fourth transistor is electrically connected to a first terminal of the first capacitor, and a gate of the fourth transistor is electrically connected to a second terminal of the first capacitor and a first terminal of the third transistor. A first terminal of the first switch is electrically connected to an output terminal of the current source, and a second terminal of the first switch is electrically connected to a first terminal of the second transistor.

(2)
Another embodiment of the present invention may be a structure of the above (1), which includes a fourth circuit including a latch circuit. The electrical connection between the first terminal of the first transistor and the control terminal of the first switch is made when a first terminal of the fourth circuit is electrically connected to the first terminal of the first transistor and a second terminal of the fourth circuit is electrically connected to the control terminal of the first switch.

(3)
Another object of one embodiment of the present invention is a semiconductor device including a first circuit, a second circuit, a third circuit, and a sense amplifier. The first circuit include a current source and a first switch. The second circuit includes a first transistor and a first capacitor. The third circuit includes a second transistor. A first terminal of the first transistor is electrically connected to a control terminal of the first switch through the sense amplifier, and a second terminal of the first transistor is electrically connected to a first terminal of the first capacitor. A first terminal of the first switch is electrically connected to an output terminal of the current source, and a second terminal of the first switch is electrically connected to a first terminal of the second transistor.

(4)
Another embodiment of the present invention may be a structure of any one of the above (1) to (3), in which a gate of the first transistor is electrically connected to a gate of the second transistor.

(5)
Another embodiment of the present invention is a semiconductor device including a first circuit, a second circuit, and a third circuit. The first circuit includes a current source and a first switch. The second circuit includes a first transistor, a third transistor, and a first capacitor. The third circuit includes a second transistor. A first terminal of the first transistor is electrically connected to a control terminal of the first switch. A first terminal of the third transistor is electrically connected to a first terminal of the first capacitor and a gate of the first transistor. A first terminal of the first switch is electrically connected to an output terminal of the current source, and a second terminal of the first switch is electrically connected to a first terminal of the second transistor.

(6)
Another embodiment of the present invention may be a structure including a fourth circuit including a latch circuit. The electrical connection between the first terminal of the first transistor and the control terminal of the first switch is made when a first terminal of the fourth circuit is electrically connected to the first terminal of the first transistor and a second terminal of the fourth circuit is electrically connected to the control terminal of the first switch.

(7)
Another embodiment of the present invention may be a structure of the above (5) or (6), in which a second terminal of the first capacitor is electrically connected to a gate of the second transistor.

(8)
Another embodiment of the present invention may be a structure of any one of the above (1) to (7), in which the transistors included in the second circuit each include a metal oxide in a channel formation region.

(9)

Another embodiment of the present invention is a semiconductor device including a first circuit and a fifth circuit. The first circuit includes a first current source, a second current source, a first switch, a fifth transistor, and a sixth transistor. The fifth circuit includes a seventh transistor, an eighth transistor, a second capacitor, a second switch, a third switch, and a current comparison circuit. An output terminal of the first current source is electrically connected to a first terminal of the first switch. An output terminal of the second current source is electrically connected to a gate of the fifth transistor, a gate of the sixth transistor, and a first terminal of the sixth transistor. A first terminal of the seventh transistor is electrically connected to a first terminal of the eighth transistor, a first terminal of the second switch, and a first terminal of the third switch. A gate of the seventh transistor is electrically connected to a second terminal of the eighth transistor and a first terminal of the second capacitor. A second terminal of the first switch is electrically connected to a second terminal of the second switch. A first terminal of the current comparison circuit is electrically connected to a second terminal of the third switch, and a second terminal of the current comparison circuit is electrically connected to a first terminal of the fifth transistor.

(10)

Another embodiment of the present invention is a semiconductor device including a first circuit and a fifth circuit, which is different from the above (9). The first circuit includes a first current source, a third current source, a first switch, and a fourth switch. The fifth circuit includes a seventh transistor, an eighth transistor, a second capacitor, a second switch, a third switch, a fifth switch, and a current comparison circuit. An output terminal of the first current source is preferably electrically connected to a first terminal of the first switch. An input terminal of the third current source is preferably electrically connected to a first terminal of the fourth switch. A first terminal of the seventh transistor is preferably electrically connected to a first terminal of the eighth transistor, a first terminal of the second switch, and a first terminal of the third switch. A gate of the seventh transistor is preferably electrically connected to a second terminal of the eighth transistor and a first terminal of the second capacitor. A second terminal of the first switch is preferably electrically connected to a second terminal of the second switch. A second terminal of the fourth switch is preferably electrically connected to a first terminal of the fifth switch. A first terminal of the current comparison circuit is preferably electrically connected to a second terminal of the third switch, and a second terminal of the current comparison circuit is preferably electrically connected to a second terminal of the fifth switch.

(11)

Another embodiment of the present invention may be a structure of the above (9) or (10), in which the seventh transistor includes a silicon in a channel formation region and the eighth transistor includes a metal oxide in a channel formation region.

(12)

Another embodiment of the present invention may be a structure of the above (10), in which the fifth circuit includes a ninth transistor, a tenth transistor, a third capacitor, and a sixth switch. A first terminal of the ninth transistor is preferably electrically connected to a first terminal of the tenth transistor, a first terminal of the second switch, and a first terminal of the sixth transistor. A gate of the ninth transistor is preferably electrically connected to a second terminal of the tenth transistor and a first terminal of the third capacitor. A second terminal of the sixth transistor is preferably electrically connected to a first terminal of the fifth switch and a second terminal of the fourth switch. It is preferable that a gate of the eighth transistor and a gate of the tenth transistor be not directly connected.

(13)

Another embodiment of the present invention may be a structure of the above (12), in which each of the seventh transistor and the ninth transistor includes silicon in a channel formation region and each of the eighth transistor and the tenth transistor includes a metal oxide in a channel formation region.

(14)

Another embodiment of the present invention is an electronic device including the semiconductor device according to any one of the above (1) to (13) and a housing.

Note that in this specification and the like, a semiconductor device refers to a device that utilizes semiconductor characteristics, and means a circuit including a semiconductor element (a transistor, a diode, a photodiode, or the like), a device including the circuit, and the like. The semiconductor device also means all devices that can function by utilizing semiconductor characteristics. For example, an integrated circuit, a chip including an integrated circuit, an electronic component including a chip in a package, and the like are examples of the semiconductor device. Moreover, a storage device, a display device, a light-emitting device, a lighting device, an electronic device, and the like themselves are semiconductor devices, or include semiconductor devices in some cases.

In the case where there is description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relationship, for example, a connection relationship shown in drawings or texts, a connection relationship other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow electrical connection between X and Y (e.g., a switch, a transistor, a capacitor, an inductor, a resistor, a diode, a display device, a light-emitting device, and a load) can be connected between X and Y. Note that a switch has a function of being controlled to be turned on or off. That is, the switch has a function of being in a conduction state (on state) or a non-conduction state (off state) to control whether current flows or not.

For example, in the case where X and Y are functionally connected, one or more circuits that allow functional connection between X and Y (e.g., a logic circuit (an inverter, a NAND circuit, a NOR circuit, or the like); a signal converter circuit (a digital-analog converter circuit, an analog-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of a current, or the like, an operational amplifier, a differential amplifier circuit, a source follower circuit, a buffer circuit, or the like); a signal generation circuit; a memory circuit; or a control circuit) can be connected between X and Y. For example, even when another circuit is interposed between X and Y, X and Y are functionally connected when a signal output from X is transmitted to Y.

Note that an explicit description, X and Y are electrically connected, includes the case where X and Y are electrically connected (i.e., the case where X and Y are connected with another element or another circuit interposed therebetween) and the case where X and Y are directly connected (i.e., the case where X and Y are connected without another element or another circuit interposed therebetween).

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X; a drain (or a second terminal or the like) of the transistor is electrically connected to Y; and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and the expression is not limited to these expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both of the components that are a wiring and an electrode. Thus, electrical connection in this specification includes, in its category, such a case where one conductive film has functions of a plurality of components.

In this specification and the like, a "resistor" can be, for example, a circuit element having a resistance value higher than 0Ω or a wiring having a resistance value higher than 0Ω. Therefore, in this specification and the like, a "resistor" sometimes includes a wiring having a resistance value, a transistor in which current flows between its source and drain, a diode, and a coil. Thus, the term "resistor element" can be sometimes replaced with the terms "resistor", "load", and "region having a resistance", and the like; conversely, the terms "resistor", "load", and "region having a resistance" can be sometimes replaced with the term "resistor element" and the like. The resistance value can be, for example, preferably greater than or equal to 1 mΩ and less than or equal to 10Ω, further preferably greater than or equal to 5 mΩ and less than or equal to 5Ω, still further preferably greater than or equal to 10 mΩ and less than or equal to 1Ω.

As another example, the resistance value may be greater than or equal to 1Ω and less than or equal to $1\times10^9$Ω.

In this specification and the like, a "capacitor" can be, for example, a circuit element having an electrostatic capacitance value higher than 0 F, a region of a wiring having an electrostatic capacitance value higher than 0 F, parasitic capacitance, or gate capacitance of a transistor. Therefore, in this specification and the like, a "capacitor" includes a circuit element that has a pair of electrodes and a dielectric between the electrodes. The term "capacitor", "parasitic capacitance", "gate capacitance", or the like can be replaced with the term "capacitance" or the like in some cases. Conversely, the term "capacitance" can be replaced with the term "capacitor", "parasitic capacitance", "gate capacitance", or the like. The term "pair of electrodes" of "capacitor" can be replaced with "pair of conductors", "pair of conductive regions", "pair of regions", and the like. Note that the electrostatic capacitance value can be greater than or equal to 0.05 fF and less than or equal to 10 pF, for example. Alternatively, the electrostatic capacitance value may be greater than or equal to 1 pF and less than or equal to 10 μF, for example.

In this specification and the like, a transistor includes three terminals called a gate, a source, and a drain. The gate is a control terminal for controlling the conduction state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor. Thus, the terms "source" and "drain" can be sometimes replaced with each other in this specification and the like. In this specification and the like, expressions "one of a source and a drain" (or a first electrode or a first terminal) and "the other of the source and the drain" (or a second electrode or a second terminal) are used in description of the connection relationship of a transistor. Depending on the transistor structure, a transistor may include a back gate in addition to the above three terminals. may be referred to as a first gate and the other of the gate and the back gate of the transistor may be referred to as a second gate. Moreover, the terms "gate" and "back gate" can be replaced with each other in one transistor in some cases. In the case where a transistor includes three or more gates, the gates may be referred to as a first gate, a second gate, and a third gate, for example, in this specification and the like.

In this specification and the like, for example, a transistor with a multi-gate structure having two or more gate electrodes can be used as the transistor. With the multi-gate structure, channel formation regions are connected in series; accordingly, a plurality of transistors are connected in series. Thus, with the multi-gate structure, the amount of an off-state current can be reduced, and the withstand voltage of the transistor can be increased (the reliability can be improved). Alternatively, by providing the multi-gate structure, in the case of operation in a saturation region, current flowing between the drain and the source does not change much even if the drain-source voltage changes, and thus the voltage-current characteristics having a flat slope can be obtained. By utilizing the flat slope of the voltage-current characteristics, an ideal current source circuit or an active load having an extremely high resistance value can be obtained. Accordingly, a differential circuit, a current mirror circuit, and the like having excellent properties can be obtained.

The case where a single circuit element is illustrated in a circuit diagram may indicate a case where the circuit element includes a plurality of circuit elements. For example, the case where a single resistor is illustrated in a circuit diagram may indicate a case where two or more resistors are electrically connected to each other in series. For another example, the case where a single capacitor is illustrated in a circuit diagram may indicate a case where two or more capacitors are electrically connected to each other in parallel. For another example, the case where a single transistor is illustrated in a circuit diagram may indicate a case where two or more transistors are electrically connected to each other in series and their gates are electrically connected to each other. Similarly, for another example, the case where a single switch is illustrated in a circuit diagram may indicate a case where the switch includes two or more transistors which are electrically connected to each other in series or in parallel and whose gates are electrically connected to each other.

In this specification and the like, a node can be referred to as a terminal, a wiring, an electrode, a conductive layer, a conductor, an impurity region, or the like depending on the circuit configuration, the device structure, or the like. Furthermore, a terminal, a wiring, or the like can be referred to as a node.

In this specification and the like, "voltage" and "potential" can be replaced with each other as appropriate. "Voltage" refers to a potential difference from a reference potential, and when the reference potential is a ground potential, for example, "voltage" can be replaced with "potential". Note that the ground potential does not necessarily mean 0 V. Moreover, potentials are relative values, and a potential supplied to a wiring, a potential applied to a circuit and the like, and a potential output from a circuit and the like, for example, change with a change of the reference potential.

In this specification and the like, the term "high-level potential" or "low-level potential" does not mean a particular potential. For example, in the case where two wirings are both described as "functioning as a wiring for supplying a high-level potential", the levels of the high-level potentials supplied from the wirings are not necessarily equal to each other. Similarly, in the case where two wirings are both described as "functioning as a wiring for supplying a low-level potential", the levels of the low-level potentials supplied from the wirings are not necessarily equal to each other.

"Current" means a charge transfer (electrical conduction); for example, the description "electrical conduction of positively charged particles occurs" can be rephrased as "electrical conduction of negatively charged particles occurs in the opposite direction". Therefore, unless otherwise specified, "current" in this specification and the like refers to a charge transfer (electrical conduction) accompanied by carrier movement. Examples of a carrier here include an electron, a hole, an anion, a cation, and a complex ion, and the type of carrier differs between current flow systems (e.g., a semiconductor, a metal, an electrolyte solution, and a vacuum). The "direction of a current" in a wiring or the like refers to the direction in which a carrier with a positive charge moves, and the amount of current is expressed as a positive value. In other words, the direction in which a carrier with a negative charge moves is opposite to the direction of a current, and the amount of current is expressed as a negative value. Thus, in the case where the polarity of current (or the direction of current) is not specified in this specification and the like, the description "current flows from element A to element B" can be rephrased as "current flows from element B to element A", for example. The description "current is input to element A" can be rephrased as "current is output from element A", for example.

Ordinal numbers such as "first", "second", and "third" in this specification and the like are used to avoid confusion among components. Thus, the terms do not limit the number of components. Furthermore, the terms do not limit the order of components. For example, a "first" component in one embodiment in this specification and the like can be referred to as a "second" component in other embodiments or claims. For another example, a "first" component in one embodiment in this specification and the like can be omitted in other embodiments or claims.

In this specification and the like, the terms for describing positioning, such as "over" and "under", are sometimes used for convenience to describe the positional relationship between components with reference to drawings. The positional relationship between components is changed as appropriate in accordance with the direction in which the components are described. Thus, the positional relationship is not limited to the terms described in the specification and the like, and can be described with another term as appropriate depending on the situation. For example, the expression "an insulator positioned over (on) a top surface of a conductor" can be replaced with the expression "an insulator positioned under (on) a bottom surface of a conductor" when the direction of a drawing showing these components is rotated by 180°.

Furthermore, the terms such as "over" and "under" do not necessarily mean that a component is placed directly over or directly under and in direct contact with another component. For example, the expression "electrode B over insulating layer A" does not necessarily mean that the electrode B is formed on and in direct contact with the insulating layer A, and does not exclude the case where another component is provided between the insulating layer A and the electrode B.

In this specification and the like, the terms "film", "layer", and the like can be interchanged with each other depending on the situation. For example, the term "conductive layer" can be changed into the term "conductive film" in some cases. Moreover, for example, the term "insulating film" can be changed into the term "insulating layer" in some cases. Alternatively, the term "film", "layer", or the like is not used and can be interchanged with another term depending on the case or the situation. For example, the term "conductive layer" or "conductive film" can be changed into the term "conductor" in some cases. Furthermore, for example, the term "insulating layer" or "insulating film" can be changed into the term "insulator" in some cases.

In this specification and the like, the term "electrode", "wiring", "terminal", or the like does not limit the function of a component. For example, an "electrode" is used as part of a "wiring" in some cases, and vice versa. Furthermore, the term "electrode," "wiring," or the like also includes the case where a plurality of "electrodes," "wirings," or the like are formed in an integrated manner, for example. For example, a "terminal" is used as part of a "wiring," an "electrode," or the like in some cases, and vice versa. Furthermore, the term "terminal" also includes the case where a plurality of "electrodes", "wirings", "terminals", or the like are formed in an integrated manner, for example. Therefore, for example, an "electrode" can be part of a "wiring" or a "terminal", and a "terminal" can be part of a "wiring" or an "electrode". Moreover, the terms "electrode", "wiring", "terminal", and the like are sometimes replaced with the term "region" or the like depending on the case.

In this specification and the like, the terms "wiring", "signal line", "power supply line", and the like can be interchanged with each other depending on the case or the situation. For example, the term "wiring" can be changed into the term "signal line" in some cases. For another example, the term "wiring" can be changed into the term "power supply line" or the like in some cases. Conversely, the term "signal line", "power supply line", or the like can be changed into the term "wiring" in some cases. The term "power supply line" or the like can be changed into the term "signal line" or the like in some cases. Conversely, the term "signal line" or the like can be changed into the term "power supply line" or the like in some cases. The term "potential" that is applied to a wiring can be changed into the term "signal" or the like depending on the case or the situation. Conversely, the term "signal" or the like can be changed into the term "potential" in some cases.

In this specification and the like, an impurity in a semiconductor refers to, for example, an element other than a main component of a semiconductor layer. For example, an element with a concentration of lower than 0.1 atomic % is an impurity. When an impurity is contained, for example, the density of defect states in a semiconductor is increased, carrier mobility is decreased, or crystallinity is decreased in some cases. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specific examples are hydrogen (contained also in water), lithium, sodium, silicon, boron, phosphorus, carbon, and nitrogen. Specifically, when the semiconductor is a silicon layer, examples of an impurity that changes characteristics of the semiconductor include Group 1 elements, Group 2 elements, Group 13 elements, and Group 15 elements (except oxygen and hydrogen).

In this specification and the like, a switch has a function of being in a conduction state (on state) or a non-conduction state (off state) to determine whether current flows or not. Alternatively, a switch has a function of selecting and changing a current path. Thus, a switch may have two or more terminals through which a current flows, in addition to a control terminal. For example, an electrical switch or a mechanical switch can be used. That is, a switch can be any element capable of controlling current, and is not limited to a particular element.

Examples of an electrical switch include a transistor (e.g., a bipolar transistor and a MOS transistor), a diode (e.g., a PN diode, a PIN diode, a Schottky diode, a MIM (Metal Insulator Metal) diode, a MIS (Metal Insulator Semiconductor) diode, and a diode-connected transistor), and a logic circuit in which such elements are combined. Note that in the case of using a transistor as a switch, a "conduction state" of the transistor refers to a state where a source electrode and a drain electrode of the transistor can be regarded as being electrically short-circuited, a state where current can be made to flow between the source electrode and the drain electrode, or the like. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical systems) technology. Such a switch includes an electrode that can be moved mechanically, and operates by controlling conduction and non-conduction with movement of the electrode.

In this specification, "parallel" indicates a state where two straight lines are placed at an angle greater than or equal to −10° and less than or equal to 10°. Thus, the case where the angle is greater than or equal to −5° and less than or equal to 5° is also included. In addition, "approximately parallel" or "substantially parallel" indicates a state where two straight lines are placed at an angle greater than or equal to −30° and less than or equal to 30°. Moreover, "perpendicular" indicates a state where two straight lines are placed at an angle greater than or equal to 800 and less than or equal to 100°. Thus, the case where the angle is greater than or equal to 850 and less than or equal to 950 is also included. Furthermore, "approximately perpendicular" or "substantially perpendicular" indicates a state where two straight lines are placed at an angle greater than or equal to 600 and less than or equal to 120°.

Effect of the Invention

According to one embodiment of the present invention, a semiconductor device or the like that performs a product-sum operation and/or function operation can be provided. According to another embodiment of the present invention, a semiconductor device that rewrites data to be retained in a multiplier cell can be provided. According to another embodiment of the present invention, a semiconductor device that retains a digital value and performs digital-analog conversion on the digital value to perform arithmetic operation with an analog value can be provided. According to another embodiment of the present invention, a semiconductor device or the like that performs convolution processing such as CNN can be provided. According to another embodiment of the present invention, a semiconductor device or the like for AI can be provided. According to another embodiment of the present invention, a semiconductor device or the like for DNN can be provided. According to another embodiment of the present invention, a semiconductor device or the like with low power consumption can be provided. According to another embodiment of the present invention, a semiconductor device or the like that is less affected by environmental temperatures can be provided. According to another embodiment of the present invention, a semiconductor device or the like that is less affected by variations in characteristics of a transistor can be provided. According to another embodiment of the present invention, a semiconductor device or the like that is less affected by variations in characteristics of a current source can be provided. According to another embodiment of the present invention, a novel semiconductor device or the like can be provided.

Note that the effects of one embodiment of the present invention are not limited to the effects listed above. The effects listed above do not preclude the existence of other effects. Note that the other effects are effects that are not described in this section and will be described below. The effects that are not described in this section are derived from the description of the specification, the drawings, and the like and can be extracted from the description by those skilled in the art. Note that one embodiment of the present invention has at least one of the effects listed above and the other effects. Accordingly, depending on the case, one embodiment of the present invention does not have the effects listed above in some cases.

BRIEF DESCRIPTION OF THE DRAWINGS

FIG. 40A is a diagram showing classifications of crystal structures of IGZO, FIG. 40B is a diagram showing an XRD spectrum of crystalline IGZO, and FIG. 40C is a diagram showing a nanobeam electron diffraction pattern of the crystalline IGZO.

MODE FOR CARRYING OUT THE INVENTION

Figure 1A:
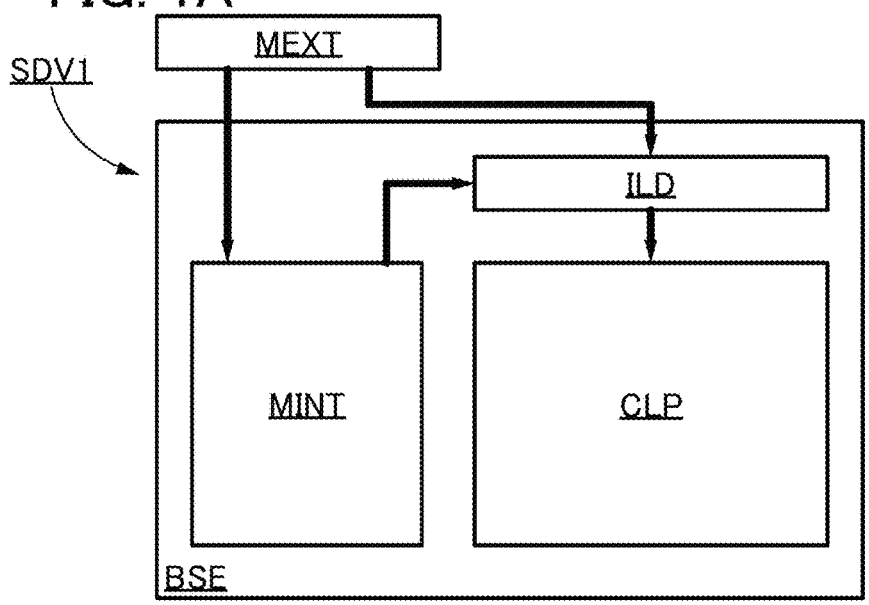
FIG. 1A and FIG. 1B are block diagrams each illustrating a structure example of a semiconductor device.

In an artificial neural network (hereinafter, referred to as a neural network), the connection strength between synapses can be changed when existing information is given to the neural network. The processing for determining a connection strength by providing a neural network with existing information in such a manner is called "learning" in some cases.

Furthermore, when a neural network in which "learning" has been performed (the connection strength has been determined) is provided with some type of information, new information can be output on the basis of the connection strength. The processing for outputting new information on the basis of provided information and the connection strength in a neural network in such a manner is called "inference" or "recognition" in some cases.

Examples of the model of a neural network include a Hopfield type and a hierarchical type. In particular, a neural network with a multilayer structure is called a "deep neural network" (DNN), and machine learning using a deep neural network is called "deep learning" in some cases.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is included in a channel formation region of a transistor, the metal oxide is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor. In the case where an OS transistor is mentioned, the OS transistor can also be referred to as a transistor including a metal oxide or an oxide semiconductor.

In this specification and the like, a metal oxide containing nitrogen is also collectively referred to as a metal oxide in some cases. A metal oxide containing nitrogen may be referred to as a metal oxynitride.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate.

Note that a content (or part of the content) described in one embodiment can be applied to, combined with, or replaced with at least one of another content (or part of the content) in the embodiment and a content (or part of the content) described in one or a plurality of different embodiments.

Note that in each embodiment, content described in the embodiment is content described using a variety of diagrams or content described with text disclosed in the specification.

Note that by combining a diagram (or part thereof) described in one embodiment with at least one of another part of the diagram, a different diagram (or part thereof) described in the embodiment, and a diagram (or part thereof) described in one or a plurality of different embodiments, much more diagrams can be formed.

Embodiments described in this specification are described with reference to the drawings. Note that the embodiments can be implemented in many different modes, and it will be readily appreciated by those skilled in the art that modes and details can be changed in various ways without departing from the spirit and scope thereof. Therefore, the present invention should not be interpreted as being limited to the description in the embodiments. Note that in the structures of the invention in the embodiments, the same portions or portions having similar functions are denoted by the same reference numerals in different drawings, and repeated description thereof is omitted in some cases. In perspective views and the like, some components might not be illustrated for clarity of the drawings.

In this specification and the like, when a plurality of components are denoted with the same reference numerals, and in particular need to be distinguished from each other, an identification sign such as "_1", "[n]", or "[m,n]" is sometimes added to the reference numerals. Components denoted with identification signs such as "_1", "[n]", and "[m,n]" in the drawings and the like are sometimes denoted without such identification signs in this specification and the like when the components do not need to be distinguished from each other.

In the drawings in this specification, the size, the layer thickness, or the region is exaggerated for clarity in some cases. Therefore, they are not limited to the illustrated scale. The drawings are schematic views showing ideal examples, and embodiments of the present invention are not limited to shapes, values, or the like shown in the drawings. For example, variations in signal, voltage, or current due to noise, variations in signal, voltage, or current due to difference in timing, or the like can be included.

Embodiment 1

In this embodiment, a structure of a semiconductor device of one embodiment of the present invention will be described.

Structure Example 1 of Semiconductor Device

FIG. 1A is a block diagram illustrating a structure example of a semiconductor device SDV1 of one embodiment of the present invention. The semiconductor device SDV1 includes a storage device MINT, a circuit ILD, and an arithmetic portion CLP, for example. FIG. 1A also illustrates a storage device MEXT to show a structure of electrical connection with the semiconductor device SDV1.

The storage device MEXT is provided outside the semiconductor device SDV1, for example. In this embodiment, the storage device MEXT retains data used for arithmetic operation in the arithmetic portion CLP. The storage device MEXT transmits the data as a digital voltage signal or the like to the storage device MINT. Furthermore, the storage device MEXT may transmit the data to the circuit ILD described later as well as to the storage device MINT. In other words, semiconductor device SDV1 may be configured so that the destination of transmission from the storage device MEXT is switched between the storage device MINT and the circuit ILD.

In such a structure of the semiconductor device SDV1 that the destination of transmission from the storage device MEXT is switched between the storage device MINT and the circuit ILD, the data transmitted from the storage device MEXT to the storage device MINT may have the number of bits reduced so that the memory capacitor of the storage device MINT is reduced. The data transmitted from the storage device MEXT to the circuit ILD may have the number of bits increased. Alternatively, when the data is transmitted from the storage device MEXT to the storage device MINT, the transmitted data may have a high-bit value so that the memory capacitor of the storage device MINT is reduced, and a low-bit value may be input from the storage device MEXT to the circuit ILD as necessary. In other words, the data input to the circuit ILD may be concurrently performed by the storage device MINT and the storage device MEXT.

Note that the storage device MEXT can be a storage such as an HDD (hard disk drive) or an SSD (solid state drive).

The semiconductor device SDV1 can be made with circuit elements and the like formed on one substrate BSE.

As the substrate BSE, a variety of substrates can be used, for example. Examples of a variety of substrates include a semiconductor substrate (e.g., a single crystal substrate or a silicon substrate), an SOI substrate, a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, paper including a fibrous material, and abase material film. Examples of the glass substrate include barium borosilicate glass, aluminoborosilicate glass, and soda lime glass. As examples of the flexible substrate, the attachment film, the base material film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as acrylic. Other examples include polypropylene, polyester, polyvinyl fluoride, and polyvinyl chloride. Other examples include polyamide, polyimide, aramid, an epoxy resin, an inorganic vapor deposition film, and paper. In particular, the use of a semiconductor substrate, a single crystal substrate, an SOI substrate, or the like enables the manufacture of small-sized transistors with a small variation in characteristics, size, shape, or the like and with high current capability. When a circuit is formed with such transistors, lower power consumption of the circuit or higher integration of the circuit can be achieved.

Alternatively, a flexible substrate may be used as the substrate BSE, and a transistor may be directly formed over the flexible substrate. Alternatively, a separation layer may be provided between the substrate and the transistor. After part or the whole of a semiconductor device is completed over the separation layer, the separation layer can be used for separation from the substrate and transfer to another substrate. In that case, the transistor can be transferred to even a substrate having low heat resistance, a flexible substrate, or the like. As the separation layer, a stacked-layer structure of inorganic films of a tungsten film and a silicon oxide film, or a structure in which an organic resin film of polyimide or the like is formed over a substrate can be used, for example.

In other words, the transistor may be formed using one substrate and then transferred to another substrate, and after that, the transistor may be positioned further over another substrate (e.g., the substrate BSE). Examples of the substrate to which the transistor is transferred include, in addition to the above-described substrates over which the transistor can be formed, a paper substrate, a cellophane substrate, an aramid film substrate, a polyimide film substrate, a stone substrate, a wood substrate, a cloth substrate (including a natural fiber (silk, cotton, or hemp), a synthetic fiber (nylon, polyurethane, or polyester), a regenerated fiber (acetate, cupro, rayon, or regenerated polyester), or the like), a leather substrate, and a rubber substrate. When such a substrate is used, forming a transistor with excellent characteristics, forming a transistor with low power consumption, manufacturing a device with high durability, providing high heat resistance, reducing weight, or reducing thickness can be achieved.

Note that all the circuits necessary to achieve a predetermined function can be formed over one substrate (e.g., a glass substrate, a plastic substrate, a single crystal substrate, or an SOI substrate). In this manner, the cost can be reduced by a reduction in the number of components or the reliability can be improved by a reduction in the number of connection points to circuit components.

Note that it is possible that not all the circuits necessary to achieve a predetermined function are formed over one substrate. That is, it is possible to form part of the circuits necessary to achieve the predetermined function over a given substrate and form the other part of the circuits necessary to achieve the predetermined function over another substrate. For example, part of the circuits necessary to achieve the predetermined function can be formed over a glass substrate, and the other part of the circuits necessary to achieve the predetermined function can be formed over a single crystal substrate (or an SOI substrate). The single crystal substrate where the other part of the circuits necessary to achieve the predetermined function is formed (also referred to as an IC chip) can be connected to the glass substrate by COG (Chip On Glass), and the IC chip can be placed over the glass substrate. Alternatively, the IC chip can be connected to the glass substrate by TAB (Tape Automated Bonding), COF (Chip On Film), or SMT (Surface Mount Technology), or using a printed circuit board, for example. When part of the circuits is formed over the same substrate as a pixel portion in this manner, the cost can be reduced by a reduction in the number of components or the reliability can be improved by a reduction in the number of connection points to circuit components. In particular, a circuit in a portion where the driving voltage is high, a circuit in a portion where the driving frequency is high, or the like consumes much power in many cases. In view of this, such a circuit is formed over a substrate (e.g., a single crystal substrate) different from a substrate where a pixel portion is formed, whereby an IC chip is formed. The use of this IC chip can prevent the increase in power consumption.

Figure 1B:
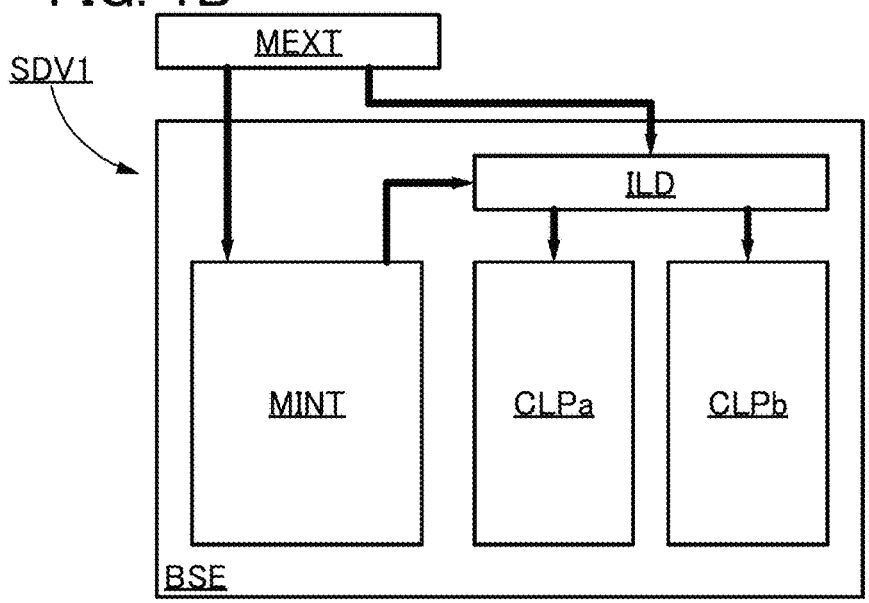
Figure 1C:
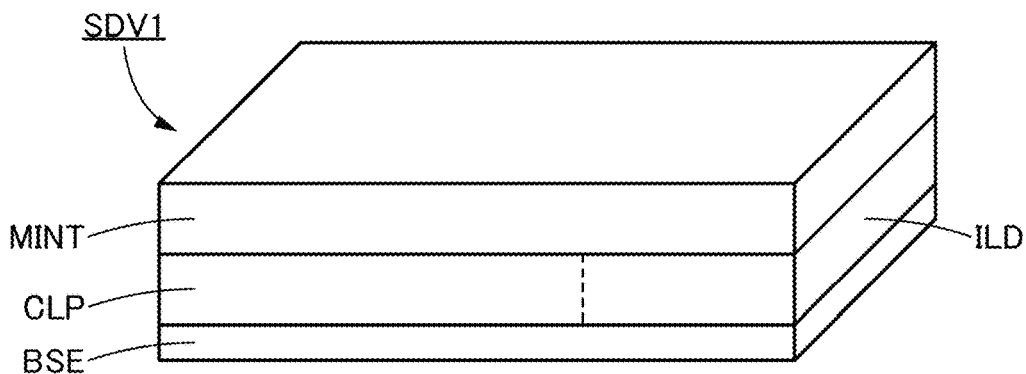
FIG. 1C is a perspective view illustrating a structure example of a semiconductor device.

For example, when the substrate BSE is a semiconductor substrate containing silicon, transistors included in the arithmetic portion CLP and transistors included in the circuit ILD can be Si transistors and formed on the substrate BSE. Furthermore, when transistors included in the storage device MINT are OS transistors, the storage device MINT can be provided above the arithmetic portion CLP and/or the circuit ILD. In other words, the semiconductor device SDV1 can have a structure, as illustrated in FIG. 1C, where the arithmetic portion CLP and the circuit ILD are provided above the substrate BSE and the storage device MINT is provided above the arithmetic portion CLP and the circuit ILD.

The storage device MINT provided in the semiconductor device SDV1 has a function of acquiring information read out by the storage device MEXT provided outside the semiconductor device SDV1 and retaining the information. In addition, the storage device MINT has a function of reading the information retained in the storage device MINT and transmitting the information to the circuit ILD. The information transmitted from the storage device MEXT to the storage device MINT is used as data for arithmetic operation performed by the arithmetic portion CLP described later.

In this specification and the like, the storage device MINT is described as a unit storing a digital value. With the storage device MINT that is a storage device storing a digital value, the range of potentials enabling data to be read is large; thus, data comparable to written data can be read out even when the absolute value of charge amount stored in a storage element is reduced. Moreover, in the storage device storing a digital value, refresh of data stored in the storage element is facilitated, which enables a potential (charge) held by the storage element to be kept for a long time. Thus, the storage device MINT preferably has a function of refreshing retained data regularly. The refresh operation may be performed after data is transmitted to the arithmetic portion CLP (the circuit ILD) described later. Note that in this specification and the like, data refresh refers to operation in which the voltage corresponding to data in the storage element is read out, increased or decreased to an appropriate level by an amplifier circuit such as a sense amplifier, and written back to the storage element. When data in a memory cell of the storage device MINT is rewritten appropriately, data may be read out from the storage device MEXT and written to the memory cell. The storage device MINT according to a semiconductor device of the present invention may store not only a digital value but also a multilevel value, an analog value, and the like. For example, when the memory cell of the storage device MINT can retain a multilevel (multibit) value, the bit number in the memory cell is made smaller than the bit number in a multiplier cell in the arithmetic portion CLP, whereby a plurality of memory cells in the storage device MINT can have compatibility with one multiplier cell in the arithmetic portion CLP. For example, on the assumption that one memory cell in the storage device MINT can retain a 4-bit value and one multiplier cell in the arithmetic portion CLP can retain an 8-bit value, two 4-bit values are written to the memory cell in the storage device MINT, whereby an 8-bit value can be written to the multiplier cell in the arithmetic portion CLP.

As the transistor included in the storage device MINT, an OS transistor is preferably used, for example. In particular, a metal oxide included in a channel formation region in the OS transistor, it is preferable to use, for example, an In-M-Zn oxide containing indium, an element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like). Alternatively, as the transistor, a transistor including silicon in a channel formation region (hereinafter referred to as a Si transistor) is used, for example. As silicon, single-crystal silicon, amorphous silicon (referred to as hydrogenated amorphous silicon in some cases), microcrystalline silicon, or polycrystalline silicon can be used, for example. Furthermore, usable transistors other than the OS transistor and the Si transistor can be, for example, a transistor including Ge or the like in a channel formation region, a transistor including a compound semiconductor such as ZnSe, CdS, GaAs, InP, GaN, or SiGe in a channel formation region, a transistor including a carbon nanotube in a channel formation region, a transistor including an organic semiconductor in a channel formation region, and the like.

The circuit ILD functions as a current source circuit for supplying current to the arithmetic portion CLP, for example. Specifically, the circuit ILD supplies current comparable to information read out from the storage device MINT to a circuit included in the arithmetic portion CLP. Note that the circuit ILD may be a voltage source circuit (voltage generation circuit) for inputting the voltage comparable to information read out from the storage device MINT to the arithmetic portion CLP, instead of the current source circuit for supplying current to the arithmetic portion CLP.

The arithmetic portion CLP includes a plurality of circuits functioning as multiplier cells. Each of the multiplier cells has a function of retaining data used for arithmetic operation as an analog value, for example. The circuits in the arithmetic portion CLP are arranged in a matrix. After retaining information (e.g., current, voltage, or the like) transmitted from the circuit ILD, each of the circuits can calculate a product of a value comparable to the information and a multiplier that is a voltage input to the arithmetic portion CLP. When the product calculated by the circuit is output as current, the current output from the plurality of circuits is summed up, so that the total current can have an amount comparable to a value of product sum of the information (e.g., current, voltage, or the like) retained in the plurality of circuits and a plurality of multipliers. In addition, in the arithmetic portion CLP, a driver circuit for driving the multiplier cell is also included. The circuit configuration in the arithmetic portion CLP and a principle of the product-sum operation in the arithmetic portion CLP will be described in details in Embodiment 2.

In the case where the storage device MINT has a function of retaining a digital value and the arithmetic portion CLP has a function of retaining an analog value in the multiplier cell, digital-analog conversion is necessary for transmitting data used in arithmetic operation from the storage device MINT to the arithmetic portion. In this case, the circuit ILD preferably has a function of a digital-analog conversion circuit in addition to a function of a current source circuit. As analog data written to the arithmetic portion CLP has a larger volume, the memory capacity necessary in the storage device MINT is increased. Specifically, in the case where one multiplier cell in the arithmetic portion CLP retains data corresponding to an 8-bit value, for example, eight memory cells retaining 2-bit values are necessary in the storage device MINT. In this case, the circuit area of the storage device MINT has to be increased; accordingly, the semiconductor device SDV1 preferably has the described-above structure, as illustrated in FIG. 1C, where the storage device MINT is provided above the arithmetic portion CLP (including the circuit for driving the arithmetic portion CLP) and the circuit ILD. A reduction in the area of one memory cell becomes possible also by using a trench-shaped capacitor provided in the memory cell in the storage device MINT.

In the case where the multiplier cell in the arithmetic portion CLP has a function of retaining an analog value, the analog data retained in the multiplier cell is degraded by leakage current from the multiplier cell in some cases. Therefore, the semiconductor device SDV1 preferably has a structure performing operation regularly where digital data (with a value equivalent to data retained in the multiplier cell) retained in the storage device MINT is converted into analog data by the circuit ILD and the analog data is transmitted to the arithmetic portion CLP so as to be written again (input of current, voltage, or the like or supply of electric charge) to a storage element in the multiplier cell in the arithmetic portion CLP. In this case, the storage device MINT functions as a circuit that retains digital data corresponding to analog data retained in the storage element in the multiplier cell in the arithmetic portion CLP to compensate for the analog data. The storage device MINT in such a structure is referred to as a main memory for the arithmetic portion CLP in some cases. In this case, the storage element provided in the multiplier cell in the arithmetic portion CLP can be regarded as a transitory memory. Furthermore, in the case where a memory cell MCL in the storage device MINT is a circuit enabling digital data (2 bits) to be retained and the multiplier cell in the arithmetic portion CLP is a circuit enabling analog data corresponding to 8 bits to be retained, the memory cell MCL in the storage device MINT can retain data longer than the multiplier cell in the arithmetic portion CLP (because a value of data is less likely to vary by a reduction in the charge amount absolute value caused by leakage current); therefore, the storage device MINT is preferably used as a main memory. The arithmetic operation using analog data has higher calculation efficiency than the arithmetic operation using digital data; thus, the semiconductor device SDV1 preferably has a structure where digital data read from the storage device MINT is converted into analog data and the analog data is used for arithmetic operation performed in the arithmetic portion CLP.

The semiconductor device SDV1 may include a plurality of arithmetic portions CLP. For example, instead of the arithmetic portion CLP illustrated in FIG. 1A, an arithmetic portion CLPa and an arithmetic portion CLPb may be included as illustrated in FIG. 1B. When the semiconductor device SDV1 is provided with a plurality of arithmetic portions in this manner, the semiconductor device SDV1 can perform operation such that data transmitted from the storage device MINT is written to one of the arithmetic portion CLPa and the arithmetic portion CLPb while arithmetic operation is performed in the other of the arithmetic portion CLPa and the arithmetic portion CLPb.

Alternatively, the structure illustrated in FIG. 1B may be as follows: one of the arithmetic portion CLPa and the arithmetic portion CLPb is a circuit performing analog arithmetic operation and the other of the arithmetic portion CLPa and the arithmetic portion CLPb is a circuit performing digital arithmetic operation. Further alternatively, both the arithmetic portion CLPa and the arithmetic portion CLPb may be circuits performing digital arithmetic operation.

<<Circuit ILD>>

Figure 2A:
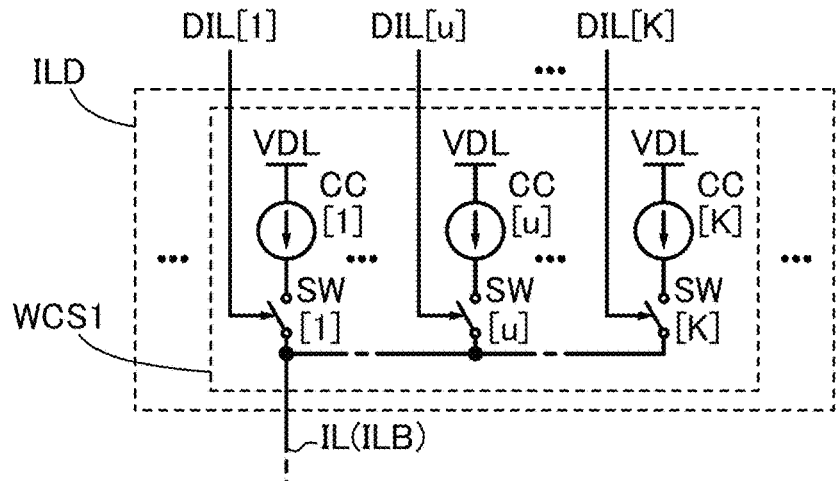
FIG. 2A to FIG. 2C are circuit diagrams each illustrating a configuration example of a circuit included in a semiconductor device.

Here, a specific example of the circuit configuration of the circuit ILD is described. The circuit ILD described here is regarded as a VI conversion circuit (referred to as a digital-analog conversion circuit in some cases) that outputs analog current with a digital value read from the storage device MINT. The circuit ILD illustrated in FIG. 2A is an example of a current source circuit applicable to the circuit ILD in FIG. 1A. The circuit ILD in FIG. 2A includes a circuit WCS1, and the circuit WCS1 includes a constant current source CC[1] to a constant current source CC[K] (K is an integer greater than or equal to 1) and a switch SW[1] to a switch SW[K].

An input terminal of a constant current source CC[u] (u is an integer greater than or equal to 1 and less than or equal to K) is electrically connected to a wiring VDL, an output terminal of the constant current source CC[u] is electrically connected to a first terminal of a switch SW[u], and a second terminal of the switch SW[u] is electrically connected to a wiring IL. A control terminal of the switch SW[u] is electrically connected to a wiring DIL[u].

A wiring DIL[1] to a wiring DIL[K] illustrated in FIG. 2A are electrically connected to the storage device MINT included in the semiconductor device SDV1 in FIG. 1A. In other words, the wiring DIL[1] to the wiring DIL[K] function as wirings transmitting information read from the storage device MINT.

The wiring VDL functions as a wiring that supplies a constant voltage, for example. The constant voltage is preferably a high-level potential, for example.

The wiring IL functions as a wiring for electrical connection to the arithmetic portion CLP. In other words, the wiring IL functions as a wiring that supplies current, which is generated by the circuit ILD and comparable to the information retained in the storage device MINT, to the arithmetic portion CLP. The wiring IL functions as one write data line extending to the arithmetic portion CLP, for example. Thus, when the arithmetic portion CLP includes multiplier cells in a plurality of columns, the circuit ILD preferably includes a plurality of circuits WCS1. In accordance with the structure of the arithmetic portion CLP, two write data lines are provided for a plurality of multiplier cells arranged in one column in some cases. For that case, in FIG. 2A, one of the wirings is denoted by the wiring IL and the other wiring is denoted by a wiring ILB in a parenthesis.

The circuit WCS1 in FIG. 2A has a function of outputting information as current of K-bit ($2^K$ value) (K is an integer greater than or equal to 1) information, for example. Specifically, information corresponding to a value of a first bit is input to the wiring DIL[1], information corresponding to a value of an u-th bit is input to the wiring DIL[u], and information corresponding to a value of a K-th bit is input to the wiring DIL[K], for example, whereby the amount of current supplied from the circuit WCS1 to the wiring IL can be determined. At this time, on the assumption that the constant current supplied by the constant current source CC[1] is $I_{ut}$, the constant current supplied by the constant current source CC[u] is preferably $2^{u-1} \times I_{ut}$, and the constant current supplied by the constant current source CC[K] is preferably $2^{K-1} \times I_{ut}$.

Figure 2B:
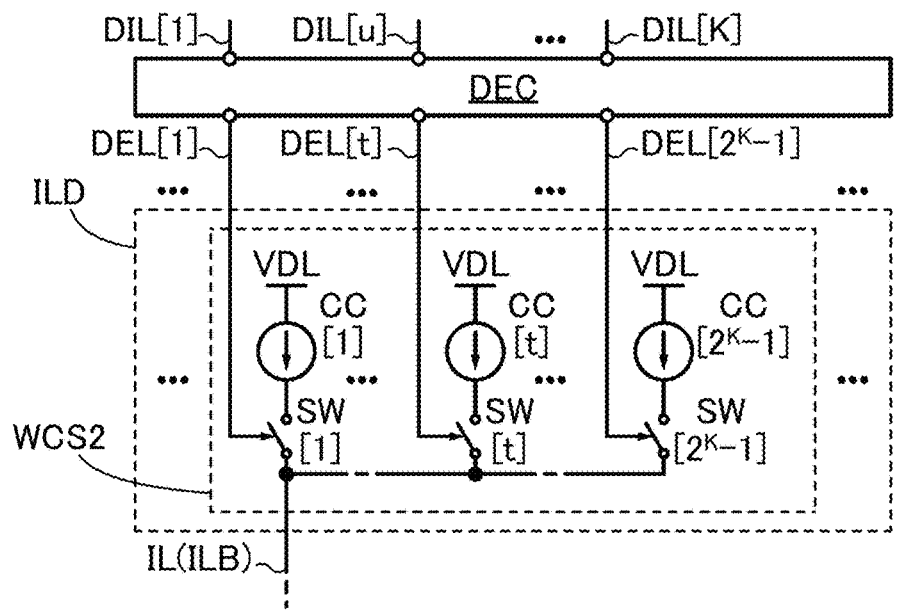

A decoder DEC converting the data from a binary number to a decimal number may be provided between the storage device MINT and the circuit ILD. A circuit configuration of the circuit ILD in such a case is illustrated in FIG. 2B. A circuit WCS2 included in the circuit ILD in FIG. 2B includes the constant current source CC[1] to a constant current source CC[$2^K$-1] and the switch SW[1] to a switch SW[$2^K$-1].

The decoder DEC is electrically connected to the wiring DIL[1] to the wiring DIL[K] and a wiring DEL[1] to a wiring DEL[$2^K$-1]. An input terminal of a constant current source CC[t] (t is an integer greater than or equal to $2^K$-1) is electrically connected to the wiring VDL, an output terminal of the constant current source CC[t] is electrically connected to a first terminal of a switch SW[t], and a second terminal of the switch SW[t] is electrically connected to the wiring IL. A control terminal of the switch SW[t] is electrically connected to a wiring DEL[t].

The decoder DEC has a function of converting K-bit (binary number) information transmitted to the wiring DIL[1] to the wiring DIL[K] into decimal number information and transmitting the converted information to the wiring DEL[1] to the wiring DEL[$2^K$-1].

For example, the circuit WCS2 in FIG. 2B has a function of outputting K-bit ($2^K$ value) (K is an integer greater than or equal to 1) information as current, like the circuit WCS1 in FIG. 2A. Note that to the circuit WCS2, information converted to have a decimal number is transmitted by the decoder DEC, and accordingly, the amount of constant current supplied by each of the constant current source CC[1] to the constant current source CC[$2^K$-1] is preferably set to $I_{ut}$.

Each of the constant current sources CC included in the circuit WCS1 in FIG. 2A and the circuit WCS2 in FIG. 2B may be a transistor, for example. As the switches SW included in the circuit WCS1 in FIG. 2A and the circuit WCS2 in FIG. 2B, electrical switches such as an analog switch and a transistor can be used, for example. As another example, a mechanical switch may be used as the switches SW.

Note that in this specification and the like, the switch SW is in an off state when a high-level potential is supplied to the control terminal, and is in an on state when a low-level potential is supplied to the control terminal.

Figure 2C:
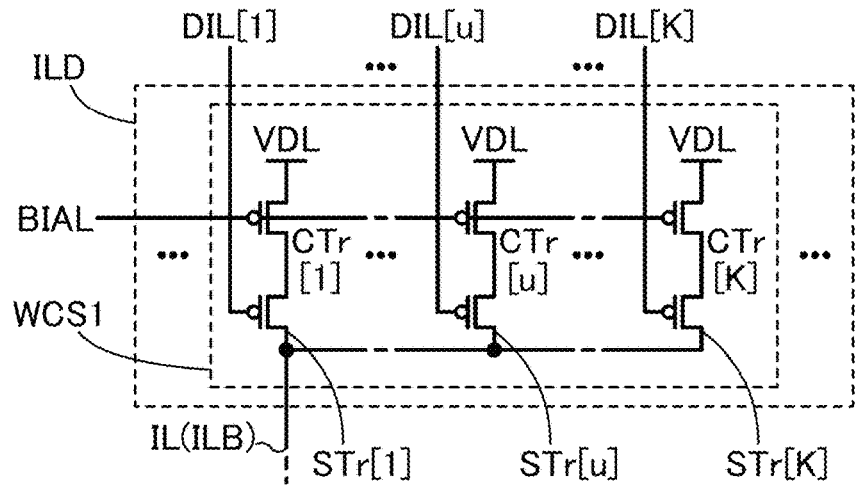

FIG. 2C illustrates a specific example of the above. For example, the circuit ILD in FIG. 2C has a configuration such that the constant current source CC[1], the constant current source CC[u], the constant current source CC[K], the switch SW[1], the switch SW[u], and the switch SW[K] in the circuit ILD in FIG. 2A are a transistor CTr[1], a transistor CTr[u], a transistor CTr[K], a transistor STr[1], a transistor STr[u], and a transistor STr[K], respectively.

Each of the transistor CTr[1] to the transistor CTr[K] and each of the transistor STr[1] to the transistor STr[K] illustrated in FIG. 2C are preferably a Si transistor. A usable transistor other than the Si transistor can be, for example, a transistor including Ge or the like in a channel formation region, a transistor including a compound semiconductor such as ZnSe, CdS, GaAs, InP, GaN, or SiGe in a channel formation region, a transistor including a carbon nanotube in a channel formation region, a transistor including an organic semiconductor in a channel formation region, and the like.

Each of the transistor CTr[1] to the transistor CTr[K] and the transistor STr[1] to the transistor STr[K] illustrated in FIG. 2C is a p-channel transistor, for example. Depending on the circumstances or conditions, each of the transistor CTr[1] to the transistor CTr[K] and the transistor STr[1] to the transistor STr[K] may be an n-channel transistor. When the transistor CTr[1] to the transistor CTr[K] and the transistor STr[1] to the transistor STr[K] are each an n-channel transistor, an OS transistor may be used as each of the transistor CTr[1] to the transistor CTr[K] and the transistor STr[1] to the transistor STr[K].

For example, a first terminal of the transistor CTr[1] is electrically connected to the wiring VDL, a second terminal of the transistor CTr[1] is electrically connected to a first terminal of the transistor STr[1], and a second terminal of the transistor STr[1] is electrically connected to the wiring IL. A gate of the transistor CTr[1] is electrically connected to a wiring BIAL, and a gate of the transistor STr[1] is electrically connected to the wiring DIL[1]. For example, a first terminal of the transistor CTr[u] is electrically connected to the wiring VDL, a second terminal of the transistor CTr[u] is electrically connected to a first terminal of the transistor STr[u], and a second terminal of the transistor STr[u] is electrically connected to the wiring IL. A gate of the transistor CTr[u] is electrically connected to the wiring BIAL, and a gate of the transistor STr[u] is electrically connected to the wiring DIL[u]. For example, a first terminal of the transistor CTr[K] is electrically connected to the wiring VDL, a second terminal of the transistor CTr[K] is electrically connected to a first terminal of the transistor STr[K], and a second terminal of the transistor STr[K] is electrically connected to the wiring IL. A gate of the transistor CTr[K] is electrically connected to the wiring BIAL, and a gate of the transistor STr[K] is electrically connected to the wiring DIL[K].

The wiring BIAL functions as a wiring that supplies a constant voltage, for example. The wiring BIAL is electrically connected to the gates of the transistor CTr[1] to the transistor CTr[K]; accordingly, the constant voltage serves as a bias voltage for supplying current to each of the transistor CTr[1] to the transistor CTr[K]. The bias voltage is preferably a low-level potential, a ground potential, or the like y, for example.

When the ratio of the channel width (hereinafter called W length) to the channel length (hereinafter called L length) of the transistor CTr[1] in the circuit ILD in FIG. 2C is represented as W/L, the ratio of the W length to the L length of the transistor CTr[u] is preferably $2^{u-1} \times W/L$ or a value in the vicinity thereof, and the ratio of the W length to the L length of the transistor CTr[K] is preferably $2^{K-1} \times W/L$ or a value in the vicinity thereof. Accordingly, the ratio of current flowing in each of the transistor CTr[1], the transistor CTr[u], and the transistor CTr[K] is approximately $1:2^{u-1}:2^{K-1}$. The value in the vicinity of $2^{u-1} \times W/L$ can be, for example, a value greater than or equal to 0.9 times of $2^{u-1} \times W/L$ and less than or equal to 1.1 times thereof. Similarly, the value in the vicinity of $2^{K-1} \times W/L$ can be, for example, a value greater than or equal to 0.9 times of $2^{K-1} \times W/L$ and less than or equal to 1.1 times thereof.

Alternatively, as a configuration of the circuit ILD in FIG. 2C, the transistor CTr[u] may be replaced by $2^{u-1}$ transistors with the same structure that are electrically connected in parallel, and agate of each of the transistors may be electrically connected to the wiring DIL[u]. Similarly, the transistor CTr[K] may be replaced by $2^{K-1}$ transistors with the same structure that are electrically connected in parallel, and a gate of each of the transistors may be electrically connected to the wiring DIL[K]. Accordingly, the ratio of current flowing in each of the transistor CTr[1], the transistor CTr[u], and the transistor CTr[K] is approximately $1:2^{u-1}:2^{K-1}$.

Unless otherwise specified, the transistor CTr in an on state may operate in a saturation region in the end. In other words, the gate voltage, source voltage, and drain voltage of the transistor CTr may be appropriately biased to voltages in the range where the transistor operates in the saturation region. However, one embodiment of the present invention is not limited thereto. The transistor CTr may operate in a linear region so that the amplitude value of a voltage to be supplied is decreased. In order to reduce the amount of current flowing in the transistor CTr, the transistor CTr may operate in a subthreshold region. Alternatively, the transistor CTr may operate around a boundary between the saturation region and the subthreshold region. In this specification and the like, for example, the vicinity of the boundary between the saturation region and the subthreshold region includes a case such that, with the threshold voltage of the transistor denoted by $V_{th}$, the voltage between the gate and the source is higher than or equal to $V_{th}-1.0$ V, higher than or equal to $V_{th}-0.5$ V, or higher than or equal to $V_{th}-0.1$ V and lower than or equal to $V_{th}+0.1$ V, lower than or equal to $V_{th}+0.5$ V, or lower than or equal to $V_{th}+1.0$ V. Note that any of the above minimum values and maximum values can be combined with each other. Alternatively, in the transistor CTr, for example, cases of operating in the linear region, operating in the saturation region, and operating in the subthreshold region may coexist, cases of operating in the linear region and operating in the saturation region may coexist, cases of operating in the saturation region and operating in the subthreshold region may coexist, or cases of operating in the linear region and operating in the subthreshold region may coexist.

In this specification and the like, unless otherwise specified, the transistor STr in an on state may operate in a linear region in the end. In other words, the gate voltage, the source voltage, and the drain voltage of the transistor STr may be appropriately biased to voltages in the range where the transistor operates in the linear region. However, one embodiment of the present invention is not limited thereto. For example, the transistor STr may operate in a saturation region or a subthreshold region when being in an on state. Alternatively, the transistor STr may operate around a boundary between the saturation region and the subthreshold region. Alternatively, in the transistor STr, cases of operating in a linear region and operating in the saturation region may coexist, cases of operating in the saturation region and operating in the subthreshold region may coexist, or cases of operating in the linear region, operating in the saturation region and operating in the subthreshold region may coexist.

The circuit ILD does not necessarily have the structures in FIG. 2A to FIG. 2C but may have a structure of a digital-analog conversion circuit using an operational amplifier, for example. In the case of reducing power consumption, it is preferable to use a VI conversion circuit structure illustrated in FIG. 2A to FIG. 2C.

Structure Example 1 of Storage Device MINT and Circuit ILD

Next, the storage device MINT and the electrical connection between the storage device MINT, the circuit ILD, and the arithmetic portion CLP are described.

Figure 3:
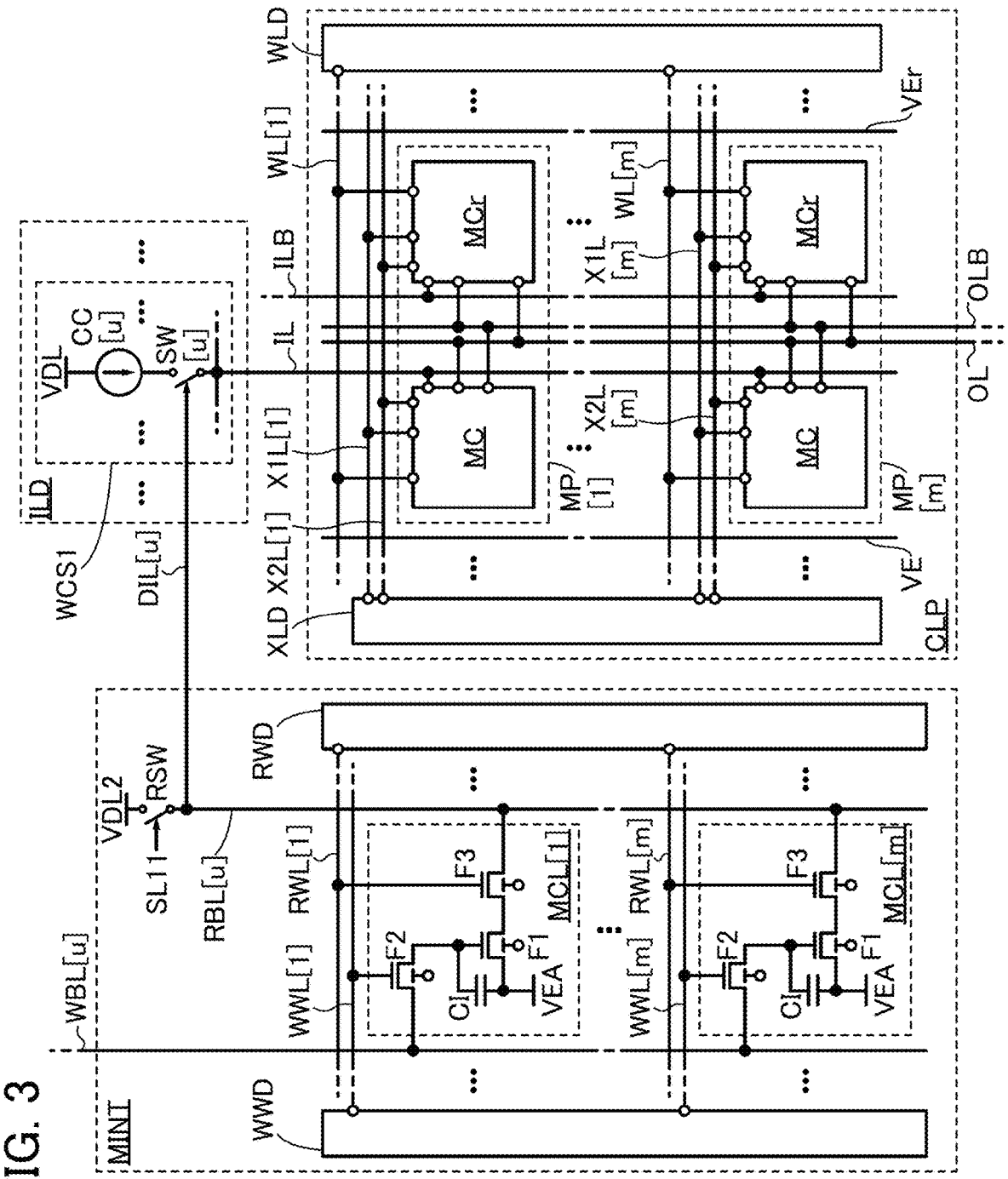
FIG. 3 is a circuit diagram illustrating a configuration example of a circuit included in a semiconductor device.

FIG. 3 illustrates a circuit configuration example showing the storage device MINT, part of the circuit ILD in FIG. 2A, and part of the arithmetic portion CLP.

The structure of the arithmetic portion CLP illustrated in FIG. 3 corresponds to part of an arithmetic circuit 110 described in Embodiment 2 as an example. Thus, for the details of the arithmetic portion CLP illustrated in FIG. 3, description in Embodiment 2 is referred to.

The arithmetic portion illustrated in FIG. 3 has a structure where two write data lines are provided for a plurality of multiplier cells arranged in one column. The wiring IL that is one of the write data lines is electrically connected to the circuit WCS1 in the circuit ILD. Although the electrical connection between the wiring ILB that is the other write data line and the circuit ILD is not illustrated, the wiring ILB is electrically connected to the circuit WCS1 different from one electrically connected to the wiring IL.

The storage device MINT has a circuit including a memory circuit called a NOSRAM (Nonvolatile Oxide Semiconductor Random Access Memory) (registered trademark). Specifically, the storage device MINT in FIG. 3 includes a memory cell MCL[1] to a memory cell MCL[m] (m is an integer greater than or equal to 1), a switch RSW, a circuit WWD, and a circuit RWD. Each of the memory cell MCL[1] to the memory cell MCL[m] includes a transistor F1 to a transistor F3, and a capacitor CI.

As each of the transistor F1 to the transistor F3, as described above, an OS transistor can be used. Alternatively, each of the transistor F1 to the transistor F3 may be a Si transistor. Furthermore, usable transistors other than the OS transistor or the Si transistor can be, for example, a transistor including Ge or the like in a channel formation region, a transistor including a compound semiconductor such as ZnSe, CdS, GaAs, InP, GaN, or SiGe in a channel formation region, a transistor including a carbon nanotube in a channel formation region, a transistor including an organic semiconductor in a channel formation region, and the like.

When an OS transistor is employed as the transistor included in the storage device MINT and an OS transistor is employed as the transistor included in the arithmetic portion CLP, both of the OS transistors can be manufactured at one time in the same process in some cases. The OS transistors included in the storage device MINT and the arithmetic portion CLP are manufactured at one time, whereby the manufacture time of the semiconductor device SDV1 can be shortened.

Unless otherwise specified, the transistor F1 in an on state may operate in a saturation region in the end. In other words, the gate voltage, the source voltage, and the drain voltage of the transistor F1 may be appropriately biased to voltages in the range where the transistor operates in a saturation region. However, one embodiment of the present invention is not limited thereto. The transistor F1 may operate in a linear region so that the amplitude value of a voltage to be supplied is decreased. In order to reduce the amount of current flowing in the transistor F1, the transistor F1 may operate in a subthreshold region. Alternatively, the transistor F1 may operate around a boundary between the saturation region and the subthreshold region. Alternatively, in the transistor F1, cases of operating in the linear region, operating in the saturation region, and operating in the subthreshold region may coexist, cases of operating in the linear region and operating in the saturation region may coexist, cases of operating in the saturation region and operating in the subthreshold region may coexist, or cases of operating in the linear region and operating in the subthreshold region may coexist.

In this specification and the like, unless otherwise specified, the transistor F2 and the transistor F3 in an on state may operate in a linear region in the end. In other words, the gate voltage, the source voltage, and the drain voltage of each of the above transistors may be appropriately biased to voltages in the range where the transistor operates in the linear region. However, one embodiment of the present invention is not limited thereto. For example, the transistor F2 and the transistor F3 may operate in a saturation region or a subthreshold region when being in an on state. Alternatively, the transistor F2 and the transistor F3 may operate around a boundary between the saturation region and the subthreshold region. Alternatively, in the transistor F2 and the transistor F3, cases of operating in the linear region and operating in the saturation region may coexist, cases of operating in the saturation region and operating in the subthreshold region may coexist, cases of operating in the linear region, operating in the saturation region and operating in the subthreshold region may coexist, or cases of operating in the linear region and operating in the subthreshold region may coexist.

As the switch RSW, an electrical switch such as an analog switch or a transistor can be used, for example. As another example, a mechanical switch may be used as the switch SW.

In this specification and the like, the switch RSW is brought into an on state when a high-level potential is supplied to the control terminal and brought into an off state when a low-level potential is supplied to the control terminal.

The storage device MINT can have a structure where the memory cells MCL are arranged in a matrix. For example, the storage device MINT can have a structure where a plurality of columns each of which is composed of the memory cell MCL[1] to the memory cell MCL[m] are arranged. The storage device MINT illustrated in FIG. 3 has K columns each including the memory cell MCL[1] to the memory cell MCL[m] are arranged, and only the memory cell MCL[1] to the memory cell MCL[m] in the u-th column are illustrated here.

The memory cell MCL[1] to the memory cell MCL[m] in the u-th column in the storage device MINT are electrically connected to the wiring DIL[u]. In other words, the memory cell MCL[1] to the memory cell MCL[m] in the u-th column are electrically connected to the switch SW[u] in the circuit WCS1 in the circuit ILD.

In the memory cell MCL[1], a first terminal of the transistor F1 is electrically connected to a wiring VEA, a second terminal of the transistor F1 is electrically connected to a first terminal of the transistor F3, and a gate of the transistor F1 is electrically connected to a first terminal of the transistor F2 and a first terminal of the capacitor CI. A second terminal of the transistor F2 is electrically connected to a wiring WBL[u], and a gate of the transistor F2 is electrically connected to a wiring WWL[1]. A second terminal of the transistor F3 is electrically connected to a wiring RBL[u], and a gate of the transistor F3 is electrically connected to a wiring RWL[1]. A second terminal of the capacitor CI is electrically connected to the wiring VEA.

In the memory cell MCL[m], a first terminal of the transistor F1 is electrically connected to the wiring VEA, a second terminal of the transistor F1 is electrically connected to a first terminal of the transistor F3, and a gate of the transistor F1 is electrically connected to a first terminal of the transistor F2 and a first terminal of the capacitor CI. A second terminal of the transistor F2 is electrically connected to the wiring WBL[u], and a gate of the transistor F2 is electrically connected to a wiring WWL[m]. A second terminal of the transistor F3 is electrically connected to the wiring RBL[u], and a gate of the transistor F3 is electrically connected to the wiring RWL[m]. A second terminal of the capacitor CI is electrically connected to the wiring VEA.

The wiring WWL[1] to the wiring WWL[m] are electrically connected to a circuit WWD. The wiring RWL[1] to the wiring RWL[m] are electrically connected to a circuit RWD.

The wiring RBL[u] is electrically connected to a first terminal of the switch RSW and the wiring DIL[u]. A second terminal of the switch RSW is electrically connected to a wiring VDL2. A control terminal of the switch RSW is electrically connected to a wiring SL11.

The wiring WWL[1] to the wiring WWL[m] function as write word lines in the memory cell MCL[1] on the memory cell MCL[m]. The circuit WWD is a driver circuit for selecting a memory cell to which writing is performed, which has a function of transmitting a selection signal for writing to any one of the wiring WWL[1] to the wiring WWL[m].

The wiring RWL[1] to the wiring RWL[m] function as read word lines in the memory cell MCL[1] to the memory cell MCL[m]. The circuit RWD is a driver circuit for selecting a memory cell on which reading is performed, which has a function of transmitting a selection signal for reading to any one of the wiring RWL[1] to the wiring RWL[m].

The wiring WBL[u] functions as a write data line (referred to as a write bit line in some cases) in the memory cell MCL[1] to the memory cell MCL[m]. The wiring WBL[u] is electrically connected to the storage device MEXT because the storage device MINT retains information transmitted from the storage device MEXT in FIG. 1. In other words, the wiring WBL[u] functions as a wiring for transmitting information read from the storage device MEXT to the storage device MINT.

The wiring RBL[u] functions as a read data line (also referred to as a read bit line in some cases) in the memory cell MCL[1] to the memory cell MCL[m].

The wiring VDL2 functions as a wiring for precharging the wiring RBL[u] with a predetermined potential before reading data retained in any one of the memory cell MCL[1] to the memory cell MCL[m] in the storage device MINT. Thus, the wiring VDL2 is preferably a wiring for supplying a constant voltage. The constant voltage (with which the wiring RBL[u] is precharged) can be, for example, a high-level potential.

The wiring VEA functions as a wiring for supplying a source potential to the first terminal of the transistor F1, for example. Thus, the wiring VEA is preferably a wiring for supplying a constant voltage. The constant voltage (with which the wiring RBL[u] is precharged) can be, for example, a low-level potential.

The wiring VEA can fix the potential of the second terminal of the capacitor CI when functioning as a wiring for supplying a constant voltage. Accordingly, the first terminal of the capacitor CI is brought into a floating state, whereby a voltage between the first terminal and the second terminal of the capacitor CI, e.g., a voltage between the gate and the source of the transistor F1 can be retained. Note that the second terminal of the capacitor CI may be electrically connected not to the wiring VEA but to another wiring supplying a constant voltage.

The wiring SL11 functions as a wiring for transmitting a control signal (digital value) switching the state of the switch RSW between an on state and an off state.

[Operation of Writing to Storage Device MINT]

In the case where information read from the storage device MEXT is written to the memory cell MCL[1], first, a low-level potential is input to each of the wiring RWL[1] to the wiring RWL[m], and each transistor F3 in the memory cell MCL[1] to the memory cell MCL[m] is turned off. Next, a high-level potential is input to the wiring WWL[1], and a low-level potential is input to the wiring WWL[2] to the wiring WWL[m]. Accordingly, the transistor F2 in the memory cell MCL[1] is turned on, and each transistor F2 in the memory cell MCL[2] to the memory cell MCL[m] is turned off. At this time, a potential $V_{DATA}$ comparable to information read from the storage device MEXT is input to the wiring WBL[u], whereby the potential of the first terminal of the capacitor CI in the memory cell MCL[1] turns to be $V_{DATA}$. After that, a low-level potential is input to the wiring WWL[1], so that the transistor F2 in the memory cell MCL[1] is turned off. Accordingly, $V_{DATA}$ as information read from the storage device MEXT can be retained in the memory cell MCL[1].

[Operation of Reading from Storage Device MINT]

In the case where $V_{DATA}$ is read from the memory cell MCL[1] and input to the circuit ILD, first, a high-level potential is supplied to the wiring SL11, so that the switch RSW is turned on. Accordingly, the potential of the wiring RBL[u] is turned to be a high-level potential supplied by the wiring VDL2. Here, the high-level potential supplied by the wiring VDL2 is $V_{PR}$. When the potential of the wiring RBL[u] reaches $V_{PR}$, a low-level potential is supplied to the wiring SL11 to turn the switch RSW off, whereby the precharge of the wiring RBL[u] is completed. At this time, the potential of the wiring DIL[u] is also turned to $V_{PR}$ that is a high-level potential; thus, the switch SW[u] in the circuit ILD is brought into an off state, and the current generated by a current source CC[u] does not flow in the wiring IL.

Next, a high-level potential is input to the wiring RWL[1], and a low-level potential is input to the wiring RWL[2] to the wiring RWL[m]. Accordingly, the transistor F2 in the memory cell MCL[1] is turned on, and each transistor F2 in the memory cell MCL[2] to the memory cell MCL[m] is turned off. At this time, in the memory cell MCL[1], electrical continuity is established between the second terminal of the transistor F1 and the wiring RBL[u], so that the potential $V_{PR}$ is supplied to the second terminal of the transistor F1. In addition, at this time, when the voltage between the gate and the source of the transistor F1 is $V_{DATA}-V_S$ which is higher than the threshold voltage $V_{th}$ of the transistor F1, current flows between the source and the drain of the transistor F1. When the current flows between the source and the drain of the transistor F1, the potential of the precharged wiring RBL[u] is gradually reduced. At a time when the potential of the second terminal of the transistor F1 is reduced to a predetermined potential, the transistor F1 is turned off. Alternatively, when $V_{DATA}-V_S$ is lower than the threshold voltage $V_{th}$ of the transistor F1, the transistor F1 is brought into an off state, and thus, current does not flow between the source and the drain of the transistor F1. Therefore, the potential of the precharged wiring RBL[u] does not change.

As described above, whether the potential of the precharged wiring RBL[u] changes or not is determined depending on the voltage retained at the first terminal of the capacitor CI. Thus, the potential of the wiring RBL[u] is measured after inputting a high-level potential to the wiring RWL[1] to turn the transistor F3 on, whereby the voltage retained at the first terminal of the capacitor CI can be read.

The wiring RBL[u] has electrical continuity with the wiring DIL[u]; that is, the potential of the wiring DIL[u] changes along with a change in the potential of the wiring RBL[u]. Accordingly, the potential comparable to the information read from the memory cell MCL[1] is supplied to the control terminal of the switch SW[u] in the circuit WCS1, so that the on/off state of the switch SW[u] is determined. Specifically, when $V_{DATA}-V_S$ is higher than the threshold voltage $V_{th}$ of the transistor F1, the potential of the wiring DIL[u] is lower than $V_{PR}$, so that switch SW[u] is brought into an on state. In contrast, when $V_{DATA}-V_S$ is lower than the threshold voltage $V_{th}$ of the transistor F1, the potential of the wiring DIL[u] does not change and keeps $V_{PR}$, so that the switch SW[u] is kept in an off state.

When the structure of the storage device MINT and the connection between the storage device MINT and the circuit ILD are made as shown in FIG. 3, information retained in each of the memory cell MCL[1] to the memory cell MCL[m] in the u-th column in the storage device MINT can be compatible with the on/off state of the switch SW[u] in the circuit WCS1. Furthermore, in the circuit configuration in FIG. 3, a reading circuit for reading data from the storage device is not necessary, which enables reductions in circuit area and power consumption, for example.

With use of the structure illustrated in FIG. 3 for the semiconductor device SDV1, data can be read from the storage device MINT and written to the multiplier cell in the arithmetic portion CLP. This operation is performed at regular intervals, whereby data degraded (absolute value of charge amount reduced) by leakage current can be rewritten to be original data (original absolute value of data amount) regularly in the multiplier cell in the arithmetic portion CLP. In other words, with use of the structure illustrated in FIG. 3 for the semiconductor device SDV1, operation of rewriting of data retained in the storage element in the multiplier cell in the arithmetic portion CLP can be easily performed.

Structure Example 2 of Storage Device MINT and Circuit ILD

The structures of the storage device MINT and the circuit ILD according to one embodiment of the present invention are not limited to the circuit configuration illustrated in FIG. 3. Depending on the circumstances or conditions, a circuit element, a connection structure, or the like included in the structures of the storage device MINT and the circuit ILD may be changed.

Figure 4:
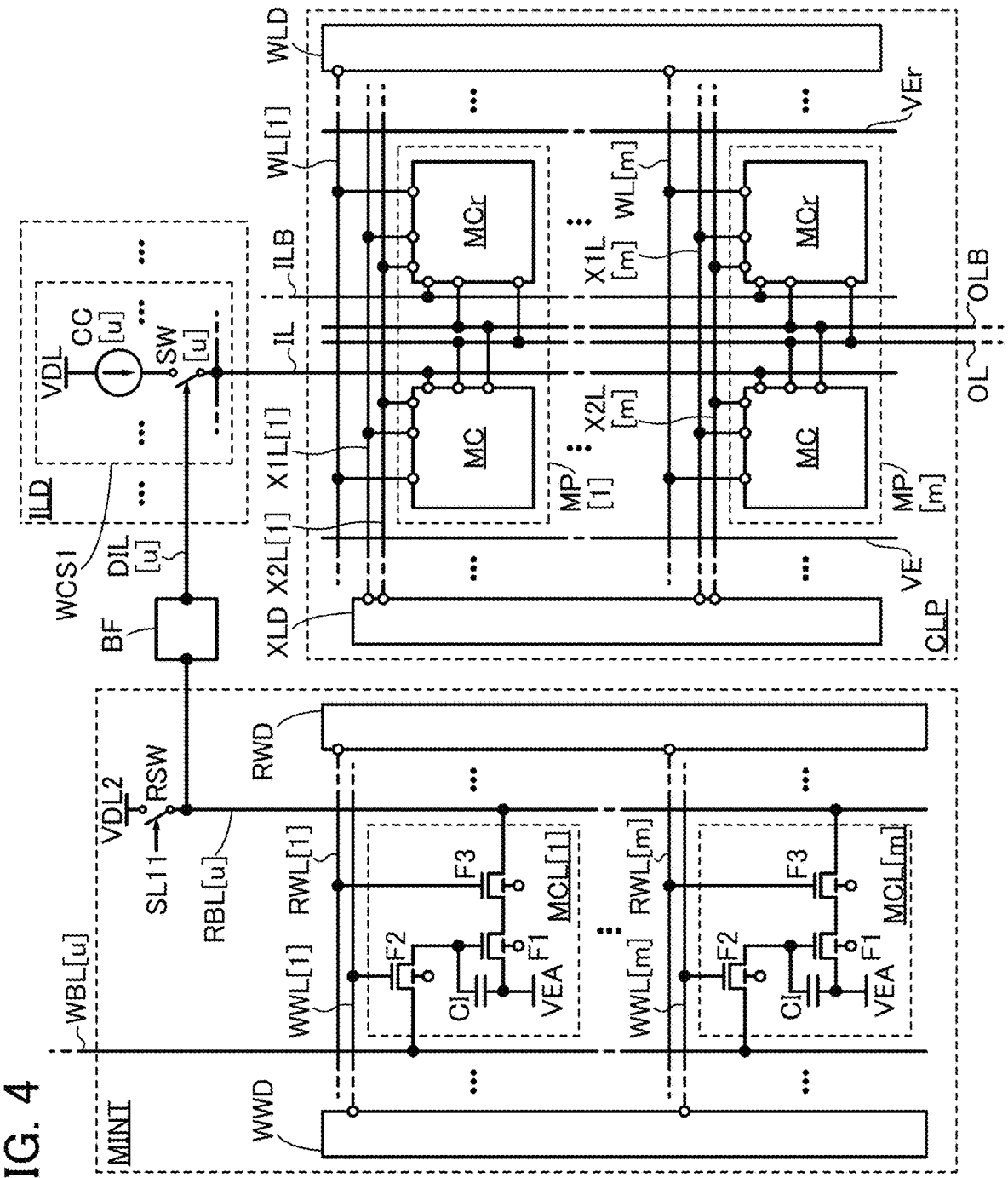
FIG. 4 is a circuit diagram illustrating a configuration example of a circuit included in a semiconductor device.

For example, the structures of the storage device MINT and the circuit ILD illustrated in FIG. 3 may be changed to have a circuit configuration illustrated in FIG. 4. FIG. 4 shows a configuration such that a circuit BF is provided on an electrical path between the wiring RBL[u] and the wiring DIL[u] in FIG. 3.

The circuit BF can include an amplifier circuit such as a buffer circuit, an inverter circuit, or a latch circuit, for example. Specifically, the circuit BF can have a function of amplifying a potential by referring a potential of the wiring RBL[u] and a function of outputting the amplified potential to the wiring DIL[u].

When the circuit BF is provided as illustrated in FIG. 4, a stable potential can be input to the control terminal of the switch SW[u].

With use of the structure illustrated in FIG. 4 for the semiconductor device SDV1, operation of rewriting of data retained in the storage element in the multiplier cell in the arithmetic portion CLP can be easily performed.

Structure Example 3 of Storage Device MINT and Circuit ILD

Figure 5:
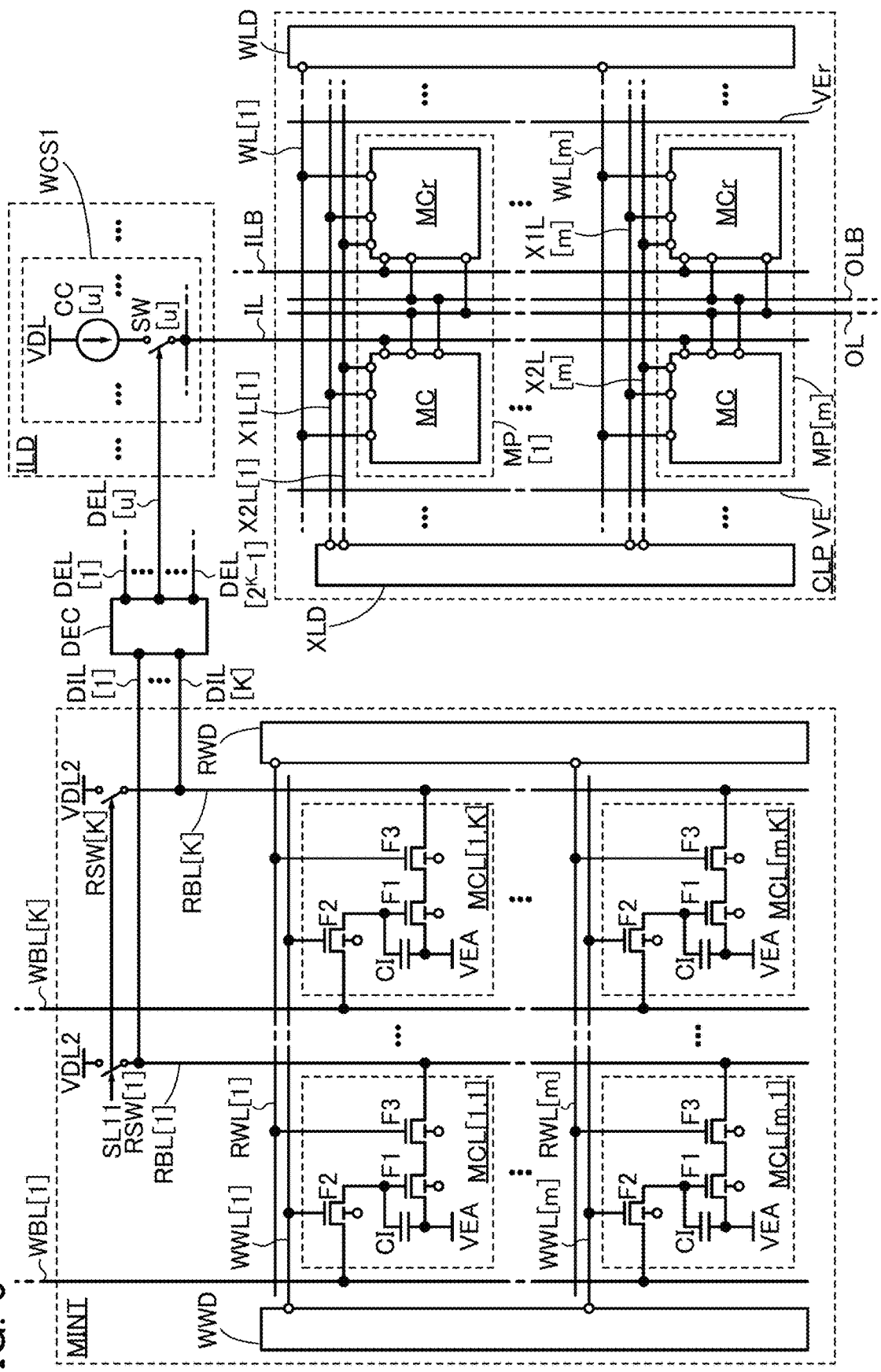
FIG. 5 is a circuit diagram illustrating a configuration example of a circuit included in a semiconductor device.

FIG. 5 illustrates a circuit configuration example showing the storage device MINT, part of the above-described circuit ILD, and the arithmetic portion CLP in the case where the decoder DEC is electrically connected to the circuit ILD as illustrated in FIG. 2B. The storage device MINT is electrically connected to the decoder DEC through the wiring DIL[1] to the wiring DIL[K], and the circuit ILD is electrically connected to the decoder DEC through the wiring DEL[1] to a wiring DEL[L], as illustrated in FIG. 5.

For the arithmetic portion CLP, the description of the arithmetic portion CLP illustrated in FIG. 3 is referred to.

FIG. 5 has a configuration including a storage circuit called NOSRAM (registered trademark), like FIG. 3, for example. In the storage device MINT in FIG. 5, the memory cell MCL[1] to the memory cell MCL[m] similar to those in FIG. 3 are arranged in a matrix of m rows and K columns. In FIG. 5, the memory cells arranged in a matrix are represented by a memory cell MCL[1,1] to a memory cell MCL[m,K]. Furthermore, the storage device MINT in FIG. 5 includes a switch RSW[1] to a switch RSW[K] corresponding to the switch RSW in FIG. 3, the circuit WWD, and the circuit RWD.

For the circuit WWD and the circuit RWD, the description of the circuit WWD and the circuit RWD illustrated in FIG. 3 is referred to.

The memory cell MCL[1,1] to a memory cell MCL[m,1] positioned in the first column are electrically connected to the wiring WBL[1] and the wiring RBL[1]. A memory cell MCL[1,K] to the memory cell MCL[m,K] positioned in the K-th column are electrically connected to the wiring WBL[K] and the wiring RBL[K]. The memory cell MCL[1,1] to the memory cell MCL[1,K] positioned in the first row are electrically connected to the wiring WWL[1] and the wiring RWL[1]. The memory cell MCL[m,1] to the memory cell MCL[m,K] positioned in the m-th row are electrically connected to the wiring WWL[m] and the wiring RWL[m].

The wiring RBL[1] is electrically connected to a first terminal of the switch RSW[1] and the wiring DIL[1]. A second terminal of the switch RSW[1] is electrically connected to the wiring VDL2. The wiring RBL[K] is electrically connected to a first terminal of the switch RSW[m] and the wiring DIL[K]. A second terminal of the switch RSW[K] is electrically connected to the wiring VDL2. Control terminals of each of the switch RSW[1] to the switch RSW[K] are electrically connected to the wiring SL11.

In the storage device MINT in FIG. 5, the operation of reading data is performed in a manner similar to that in the storage device MINT in FIG. 3, whereby information read from a plurality of memory cells MCL in any one of the first row to the m-th row can be input to the decoder DEC.

For example, in the reading operation of the storage device MINT in FIG. 5, when the memory cell MCL[1,1] to the memory cell MCL[1,K] positioned in the first row are selected, information read from each of the memory cell MCL[1,1] to the memory cell MCL[1,K] is input through the wiring DIL[1] to the wiring DIL[K] to the decoder DEC. In such a case, K-bit data is transmitted from the wiring DIL[1] to the wiring DIL[K] from the decoder DEC. The decoder DEC converts binary data transmitted from the wiring DIL[1] to the wiring DIL[K] into decimal data and outputs the converted data to the wiring DEL[1] to the wiring DEL[$2^K$-1]. Accordingly, the decimal data is input from the decoder DEC to the control terminals of the switch SW[1] to the switch SW[$2^K$-1] in the circuit WCS2 included in the circuit ILD, and the number of switches among the switch SW[1] to the switch SW[$2^K$-1], which are to be turned on, is determined in accordance with the data. In other words, the number of switches among the switch SW[1] to the switch SW[$2^K$-1], which are to be turned on, is determined in accordance with information written to a plurality of memory cells MCL positioned in one row in the storage device MINT, and the current whose amount corresponds to the number of switches that are turned on flows from the circuit WCS2 to the wiring IL.

With use of the structure illustrated in FIG. 5 as the semiconductor device SDV1, data can be read from the storage device MINT and written to the multiplier cell in the arithmetic portion CLP in a manner similar to that in FIG. 3. This operation is performed at regular intervals, whereby data degraded (absolute value of charge amount reduced) by leakage current can be rewritten to be original data (original absolute value of data amount) regularly in the multiplier cell in the arithmetic portion CLP. In other words, with use of the structure illustrated in FIG. 5 for the semiconductor device SDV1, operation of rewriting of data retained in the storage element in the multiplier cell in the arithmetic portion CLP can be easily performed.

Figure 6:
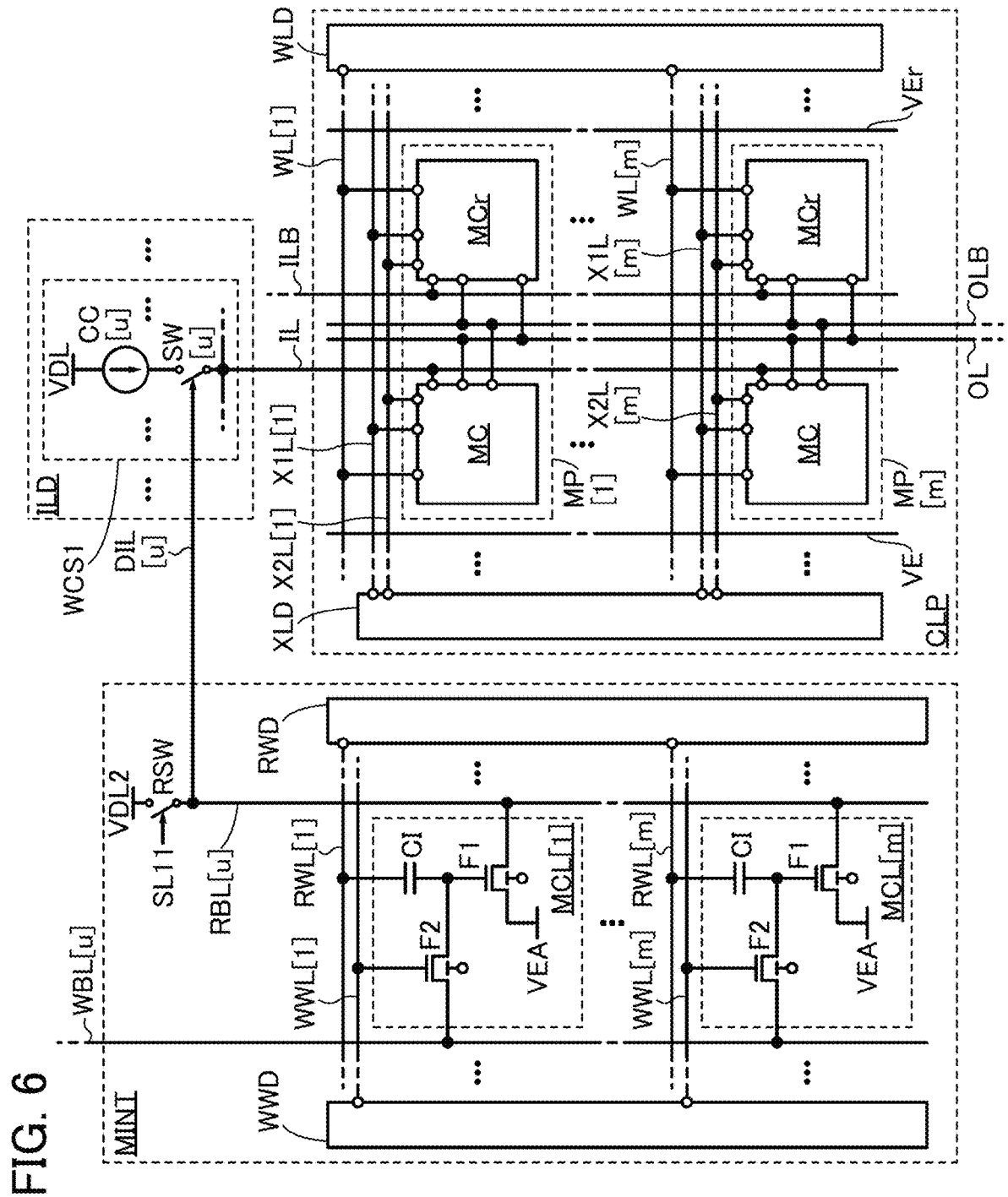
FIG. 6 is a circuit diagram illustrating a configuration example of a circuit included in a semiconductor device.

The memory cells MCL included in the storage devices MINT illustrated in FIG. 3 to FIG. 5 each include three transistors and one capacitor; however, one embodiment of the present invention is not limited thereto. In one embodiment of the present invention, the memory cell MCL included in the storage device MINT may have a structure including two transistors and one capacitor, for example. Such a structure example is illustrated in FIG. 6. The memory cell MCL in the storage device MINT illustrated in FIG. 6 differs from the memory cells MCL in the storage devices MINT illustrated in FIG. 3 to FIG. 5, in that the transistor F3 is not provided and the second terminal of the capacitor CI is electrically connected to the wiring RWL.

In each of the memory cell MCL[1] to the memory cell MCL[m] illustrated in FIG. 6, the second terminal of the transistor F1 is electrically connected to the wiring RBL[u]. Furthermore, the second terminal of the capacitor CI in the memory cell MCL[1] in FIG. 6 is electrically connected to the wiring RWL[1], and the second terminal of the capacitor CI in the memory cell MCL[m] in FIG. 6 is electrically connected to the wiring RWL[m].

It is preferable that a high-level potential be input to the wiring RWL[1] to the wiring RWL[m] when information read from the storage device MEXT is written to the first terminal of the capacitor CI in each of the memory cell MCL[1] to the memory cell MCL[m]. It is preferable that a low-level potential be input to the wiring RWL[1] to the wiring RWL[m] while information is retained at the first terminal of the capacitor CI in each of the memory cell MCL[1] to the memory cell MCL[m]. In particular, in this case, it is preferable that the transistor F1 be turned off by supply of the low-level potential to the wiring RWL[1] to the wiring RWL[m]. Furthermore, it is preferable that a high-level potential be input to the wiring RWL[1] to the wiring RWL[m] when information written to the first terminal of the capacitor CI is read from any one of the memory cell MCL[1] to the memory cell MCL[m]. In particular, in this case, it is preferable that the transistor F1 be turned on by supply of the high-level potential to the wiring RWL[1] to the wiring RWL[m].

Figure 7:
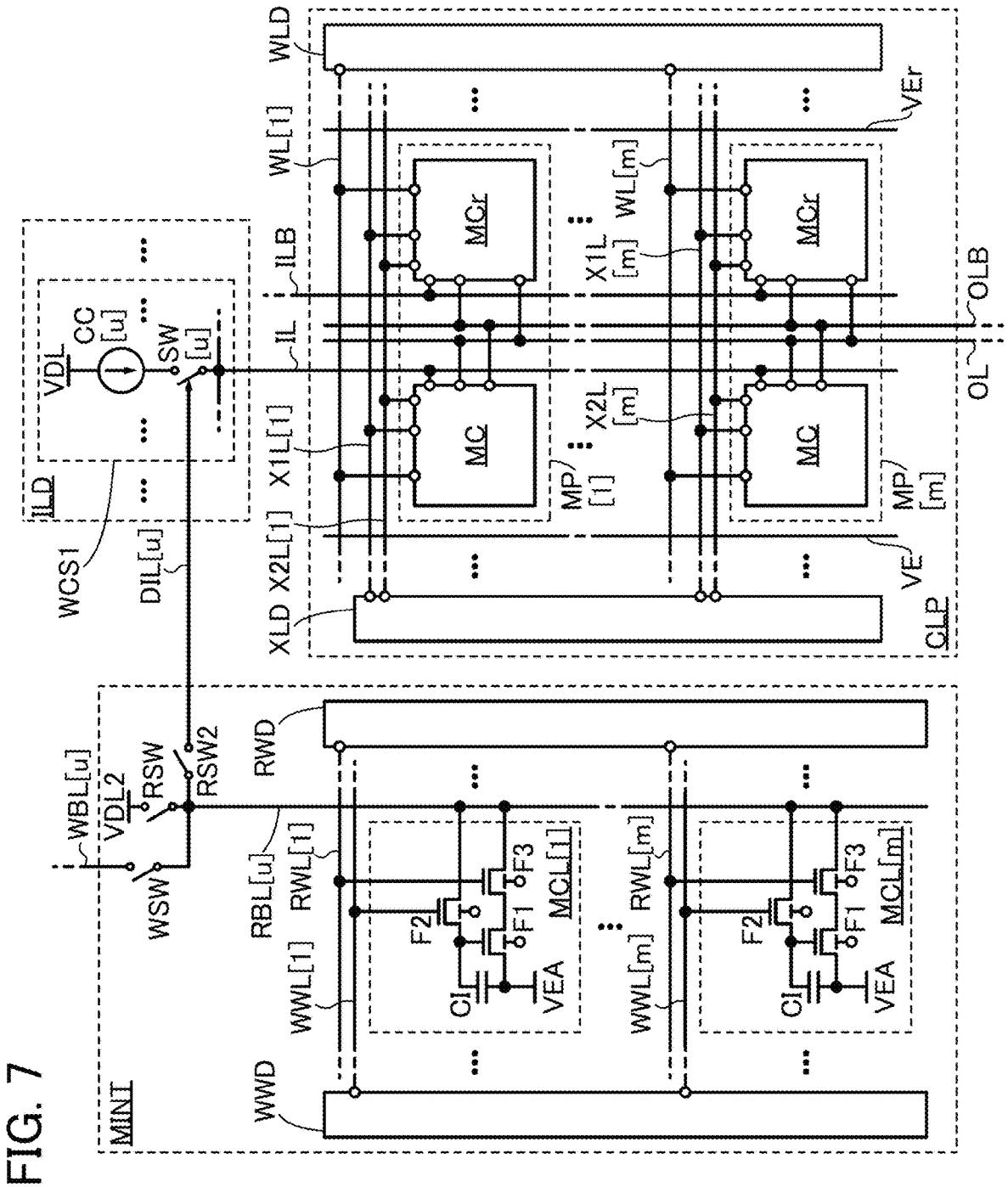
FIG. 7 is a circuit diagram illustrating a configuration example of a circuit included in a semiconductor device.

In one embodiment of the present invention, the wiring WBL[u] and the wiring RBL[u] in each of the storage devices MINT in FIG. 3 to FIG. 6 are may be united to one wiring as a common wiring. FIG. 7 illustrates a configuration such that the wiring WBL[u] and the wiring RBL[u] in the storage device MINT in FIG. 3 are united to one wiring as the wiring RBL[u]. In addition, the wiring RBL[u] in the storage device MINT in FIG. 7 serves as a write data line as well as a read data line; thus, the storage device MINT includes a switch WSW and a switch RSW2 for switching operation between the writing operation and the reading operation, in addition to the switch RSW.

In the storage device MINT in FIG. 7, the switch WSW is provided on an electrical path between the wiring WBL[u] and the wiring RBL[u], and the switch RSW2 is provided on an electrical path between the wiring RBL[u] and the wiring DIL[u].

As the switch WSW and the switch RSW2, a switch applicable to the above-described switch RSW can be used, for example.

When information read from the storage device MEXT is written to the first terminal of the capacitor CI in each of the memory cell MCL[1] to the memory cell MCL[m] in the storage device MINT in FIG. 7, the switch WSW is turned on, and the switch RSW and the switch RSW2 are turned off. For the subsequent operation of the memory cell MCL[1] to the memory cell MCL[m], the description of the operation of writing to the storage device MINT in FIG. 3 is referred to. When information written to the first terminal of the capacitor CI is read from any one of the memory cell MCL[1] to the memory cell MCL[m] in the storage device MINT in FIG. 7, the switch WSW is turned off as the first step. For the subsequent operation of the memory cell MCL[1] to the memory cell MCL[m], the description of the operation of reading from the storage device MINT in FIG. 3 is referred to.

Structure Example 4 of Storage Device MINT and Circuit ILD

Although the storage devices MINT illustrated in FIG. 3 to FIG. 7 each have a circuit configuration of NOSRAM (registered trademark), the storage device MINT in a semiconductor device of one embodiment of the present invention is not limited thereto. The storage device MINT may have a circuit configuration including DRAM (Dynamic Random Access Memory), for example.

Figure 8:
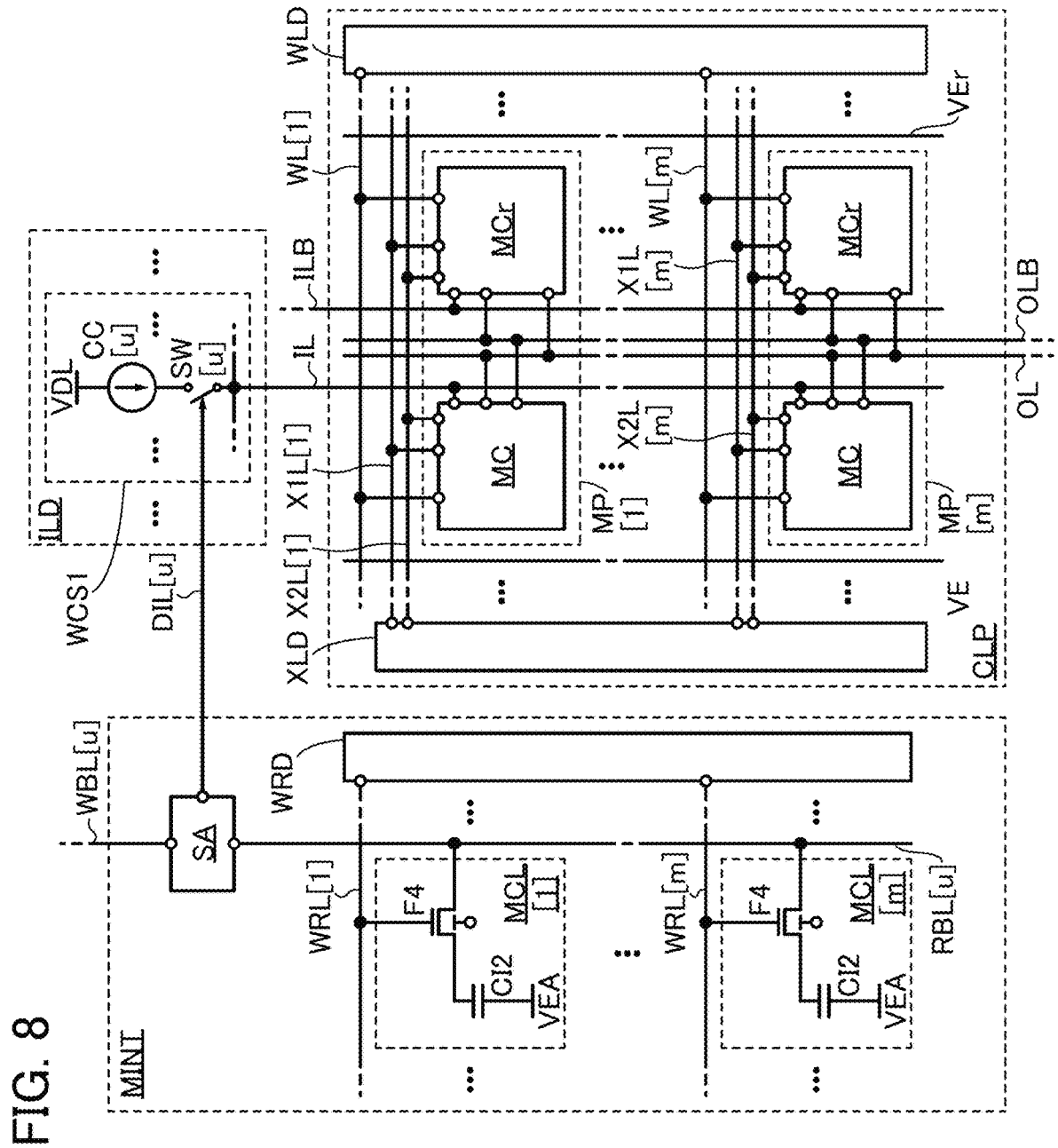
FIG. 8 is a circuit diagram illustrating a configuration example of a circuit included in a semiconductor device.

FIG. 8 illustrates a circuit configuration example showing the storage device MINT and part of the above-described circuit ILD. The storage device MINT includes the memory cell MCL[1] to the memory cell MCL[m], a circuit SA, and a circuit WRD. Each of the memory cell MCL[1] to the memory cell MCL[m] included in the storage device MINT has a structure of DRAM including a transistor F4 and a capacitor CI2.

As the transistor F4, a transistor that can be used as the transistor F2 illustrated in FIG. 3 to FIG. 7 can be used, for example. Thus, for the structure of the transistor F4 or the like, the description of the transistor F2 in this specification and the like is referred to.

In particular, when an OS transistor is used as the transistor F4, the storage device MINT in FIG. 8 is sometimes referred to as DOSRAM (Dynamic Oxide Semiconductor Random Access Memory) (registered trademark).

The storage device MINT can have a structure where the memory cells MCL are arranged in a matrix, for example. The storage device MINT can have a structure, for example, where a plurality of columns each including the memory cell MCL[1] to the memory cell MCL[m] are arranged. In the storage device MINT in FIG. 8, K columns each including the memory cell MCL[1] to the memory cell MCL[m], and only the memory cell MCL[1] to the memory cell MCL[m] in the u-th column are illustrated.

The memory cell MCL[1] to the memory cell MCL[m] in the u-th column in the storage device MINT are electrically connected to the wiring RBL[u]. The circuit SA is electrically connected to the wiring WBL[u], the wiring RBL[u], and the wiring DIL[u].

In each of the memory cell MCL[1] to the memory cell MCL[m], a first terminal of the transistor F4 is electrically connected to a first terminal of the capacitor CI2, and a second terminal of the capacitor CI2 is electrically connected to the wiring VEA. A second terminal of the transistor F4 is electrically connected to the wiring RBL[u].

In the memory cell MCL[1], a gate of the transistor F4 is electrically connected to a wiring WRL[1]. In addition, in the memory cell MCL[m], the gate of the transistor F4 is electrically connected to a wiring WRL[m].

The wiring WRL[1] to the wiring WRL[m] are electrically connected to the circuit WRD.

The wiring WRL[1] to the wiring WRL[m] have a function of a word line for operation of writing and reading to/from the memory cell MCL[1] to the memory cell MCL[m]. The circuit WRD is a driver circuit for selecting a memory cell where writing or reading is performed and has a function of transmitting a selection signal for writing or reading to/from any one of the wiring WRL[1] to the wiring WRL[m].

The wiring RBL[u] serves as a data line for operation of writing and reading to/from the memory cell MCL[1] to the memory cell MCL[m].

The wiring VEA serves as a wiring supplying a constant voltage, like the wiring VEA illustrated in FIG. 3 to FIG. 7. The constant voltage can be, for example, a low-level potential, a ground potential, or the like.

The circuit SA has a function of amplifying information (e.g., voltage, current or the like), which is read from the storage device MEXT and transmitted to the wiring WBL[u] and a function of supplying the amplified information to the wiring RBL[u], for example. Furthermore, the circuit SA has a function of amplifying information, which is read from any one of the memory cell MCL[1] to the memory cell MCL[m] and transmitted to the wiring RBL[u] and a function of transmitting the amplified information to the wiring DIL[u]. The circuit SA included in the storage device MINT in FIG. 8 can include a circuit for switching between the writing operation and the reading operation, an amplifier circuit (such as a sense amplifier), or the like. Therefore, the circuit SA is sometimes referred to as a reading circuit. The circuit SA may have a function of writing data back to any one of the memory cell MCL[1] to the memory cell MCL[m] where destructive readout occurs.

In the structure such that the storage device MINT is provided with a storage circuit of DRAM (or DOSRAM (registered trademark)) as illustrated in FIG. 8, the capacitance value of a capacitor C1 in the memory cell MCL is increased, whereby the read signal (voltage) from the memory cell MCL to the wiring RBL[u] at the time of reading data can be increased. As measures for increasing the capacitance value of the capacitor C1, a trench-shaped capacitor may be used for the capacitor C1.

One embodiment of the present invention is not limited to the circuit configuration illustrated in FIG. 8. Depending on the circumstances or conditions, one embodiment of the present invention may have a circuit configuration changed from that in FIG. 8. For example, to the storage device MINT illustrated in FIG. 8, the structure of the storage device MINT including a storage circuit of NOSRAM (registered trademark) illustrated in FIG. 3 to FIG. 7 can be combined.

For example, one embodiment of the present invention may have a structure where the decoder DEC is added to the circuit configuration in FIG. 8, like the structure in FIG. 5. As a specific example, FIG. 9 illustrates a structure where the storage device MINT is electrically connected to the decoder DEC through the wiring DIL[1] to the wiring DIL[K], and the circuit ILD is electrically connected to the decoder DEC through the wiring DEL[1] to the wiring DEL[L].

Figure 9:
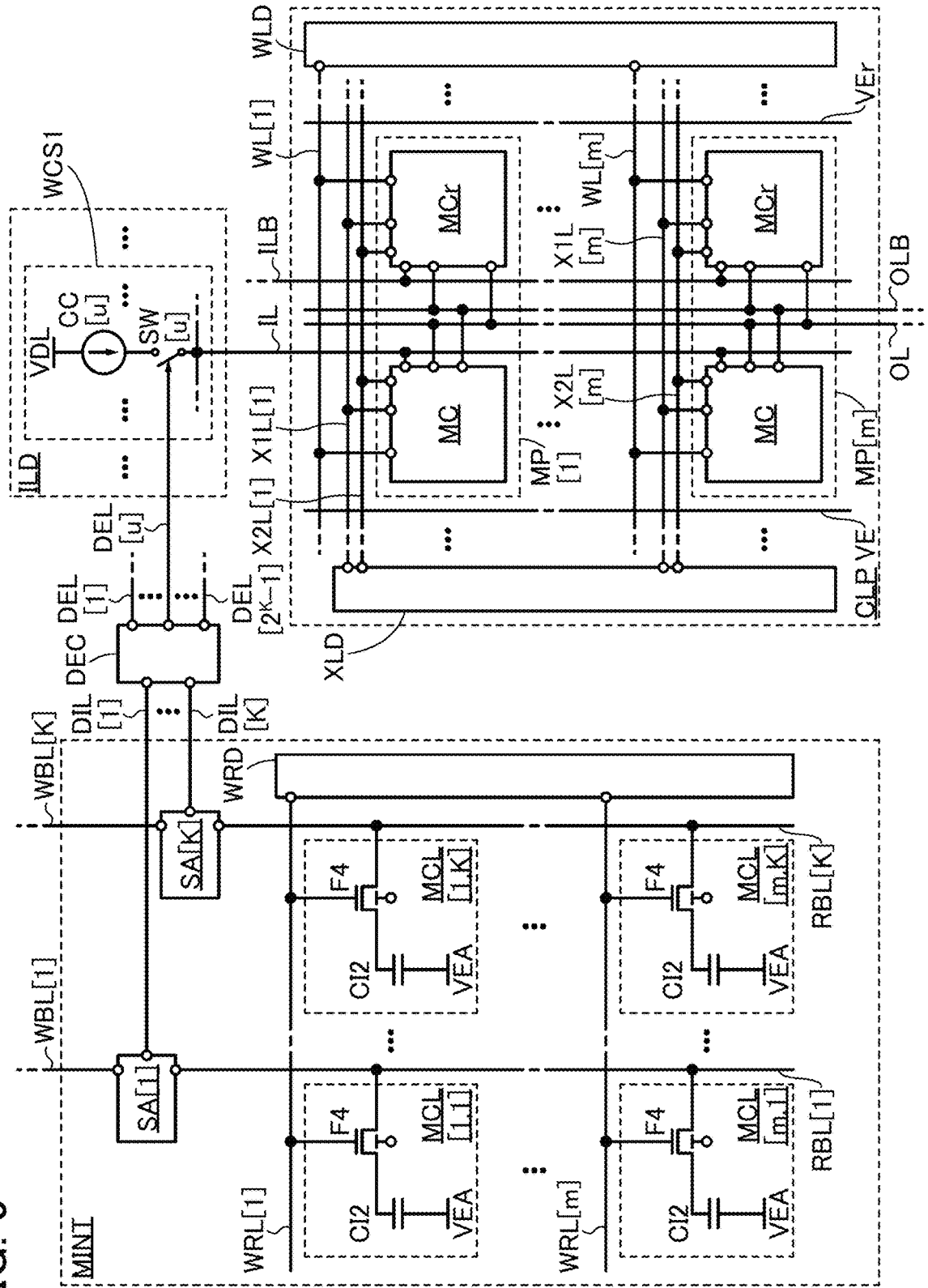
FIG. 9 is a circuit diagram illustrating a configuration example of a circuit included in a semiconductor device.

In the storage device MINT in FIG. 9, memory cells the same as the memory cell MCL[1] to the memory cell MCL[m] in FIG. 8 are arranged in a matrix of m rows and K columns. The memory cells arranged in the matrix in FIG. 9 are denoted by the memory cell MCL[1,1] to the memory cell MCL[m,K]. Furthermore, the storage device MINT in FIG. 9 includes the circuit SA[1] to the circuit SA[K] corresponding to the circuit SA in FIG. 8.

The memory cell MCL[1,1] to the memory cell MCL[m,1] positioned in the first column are electrically connected to the wiring RBL[1]. The memory cell MCL[1,K] to the memory cell MCL[m, K] positioned in the K-th column are electrically connected to the wiring RBL[K]. The memory cell MCL[1,1] to the memory cell MCL[1,K] positioned in the first row are electrically connected to the wiring WRL[1]. The memory cell MCL[m,1] to the memory cell MCL[m, K] positioned in the m-th row are electrically connected to the wiring WRL[m].

The circuit SA[1] is electrically connected to the wiring WBL[1], the wiring RBL[1], and the wiring DIL[1]. The circuit SA[K] is electrically connected to the wiring WBL[K], the wiring RBL[K], and the wiring DIL[K].

For the electrical connection between the decoder DEC and the circuit ILD, the description of FIG. 2B is referred to.

The data reading operation is performed in a manner similar to that in the storage device MINT illustrated in FIG. 8, whereby in the storage device MINT in FIG. 9, information read from a plurality of the memory cells MCL positioned in any one of the first row to the m-th row can be input to the decoder DEC.

With use of the structure illustrated in FIG. 9 for the semiconductor device SDV1, data can be read from the storage device MINT and written to the multiplier cell in the arithmetic portion CLP in a manner similar to that in FIG. 3. This operation is performed at regular intervals, whereby data degraded (absolute value of charge amount reduced) by leakage current can be rewritten to be original data (original absolute value of data amount) regularly in the multiplier cell in the arithmetic portion CLP. In other words, with use of the structure illustrated in FIG. 9 for the semiconductor device SDV1, operation of rewriting of data retained in the storage element in the multiplier cell in the arithmetic portion CLP can be easily performed.

Structure Example 5 of Storage Device MINT and Circuit ILD

Although the storage devices MINT illustrated in FIG. 3 to FIG. 7 each have a circuit configuration of NOSRAM (registered trademark) and the storage devices MINT illustrated in FIG. 8 and FIG. 9 each have a circuit configuration of DRAM (or DOSRAM (registered trademark)), the storage device MINT in a semiconductor device of one embodiment of the present invention is not limited thereto. The storage device MINT may have a circuit configuration including a load circuit LC, for example.

FIG. 10A illustrates a circuit configuration example showing the storage device MINT and part of the circuit ILD. The storage device MINT includes the memory cell MCL[1] to the memory cell MCL[m], a circuit IVC, the switch WSW, the switch RSW2, and the circuit WRD. Each of the memory cell MCL[1] to the memory cell MCL[m] included in the storage device MINT includes the transistor F4 and the load circuit LC.

As the transistor F4, a transistor that can be used as the transistor F2 illustrated in FIG. 3 to FIG. 7 can be used, for example. Thus, for the structure of the transistor F4 or the like, the description of the transistor F2 in this specification and the like is referred to.

For the switch WSW and the switch RSW2, the description of the switch WSW and the switch RSW2 illustrated in FIG. 7 is referred to.

For the circuit WRD, the description of the circuit WRD illustrated in FIG. 8 is referred to.

The load circuit LC is a circuit capable of changing a resistance value between a first terminal and a second terminal, for example. By changing the resistance value between the first terminal and the second terminal of the load circuit LC, the amount of current flowing between the first terminal and the second terminal of the load circuit LC can be changed.

Each of the memory cell MCL[1] to the memory cell MCL[m] included in the storage device MINT in FIG. 10A has a configuration such that the capacitor CI2 in the memory cell MCL illustrated in FIG. 8 or FIG. 9 is replaced with a load circuit. Specifically, a first terminal of the load circuit LC is electrically connected to the first terminal of the transistor F4, and a second terminal of the load circuit LC is electrically connected to the wiring VEA.

The storage device MINT can have a structure where the memory cells MCL are arranged in a matrix, for example. The storage device MINT can have a structure, for example, where a plurality of columns each including the memory cell MCL[1] to the memory cell MCL[m] are arranged. In the storage device MINT in FIG. 10A, K columns each including the memory cell MCL[1] to the memory cell MCL[m], and only the memory cell MCL[1] to the memory cell MCL[m] in the u-th column are illustrated.

In the storage device MINT in FIG. 10A, the switch WSW is provided on an electrical path between the wiring WBL[u] and the wiring RBL[u], and the switch RSW2 is provided on an electrical path between the wiring RBL[u] and an input terminal of the circuit IVC. An output terminal of the circuit IVC is electrically connected to the wiring DIL[u].

The memory cell MCL[1] to the memory cell MCL[m] in the u-th column in the storage device MINT are electrically connected to the wiring RBL[u]. The circuit IVC is electrically connected to the wiring RBL[u] through the switch RSW2. The circuit IVC is electrically connected to the wiring DIL[u].

The wiring VEA functions as a wiring supplying a constant voltage, like the wiring VEA illustrated in FIG. 3 to FIG. 7. The magnitude of the constant voltage may be determined as appropriate depending on the structure of the load circuit LC.

The circuit IVC has a function of converting current, which is comparable to information read from any one of the memory cell MCL[1] to the memory cell MCL[m] and flows in the wiring RBL[u] or the like, to a voltage and supplying the voltage to the wiring DIL[u], for example. Furthermore, the circuit IVC may have a function of applying a predetermined voltage to the wiring RBL[u] so that information is read from any one of the memory cell MCL[1] to the memory cell MCL[m]. Accordingly, the circuit IVC included in the storage device MINT in FIG. 10A functions as a read circuit.

When information read from the storage device MEXT is written to the memory cell MCL[1] to the memory cell MCL[m] included in the storage device MINT in FIG. 10A, the transistor F4 in the written memory cell MCL and the witch WSW are turned on, and the switch RSW is turned off. After that, the information read from the storage device MEXT can be input to the load circuit LC in the written memory cell MCL through the wiring WBL[u], the switch WSW, and the wiring RBL[u]. When the information written to the load circuit LC is read from any one of the memory cell MCL[1] to the memory cell MCL[m] in the storage device MINT in FIG. 10A, the switch WSW is turned off and the switch RSW2 is turned on as the first step. Next, a desired potential is supplied to the wiring RBL[u] by the circuit IVC as necessary. After that, the transistor F4 in the read memory cell MCL is turned on, whereby the amount of current comparable to the information flows from the load circuit LC to the circuit IVC (depending on information retained in the load circuit LC, no current flows in some cases). Then, the circuit IVC outputs a voltage corresponding to the amount of current to the wiring DIL[u], so that the switch SW[u] included in the circuit WCS1 in the circuit ILD can be turned on or off.

As the load circuit LC, a variable resistor VR included in a ReRAM (Resistive Random Access Memory) or the like as illustrated in FIG. 10B can be used, for example. As the load circuit LC, a load circuit LC including an MTJ (Magnet Tunnel Junction) element MR included in an MRAM (Magnetoresistive Random Access Memory) or the like as illustrated in FIG. 10C can be used, for example. As the load circuit LC, a resistor containing a phase-change material that is used for a phase-change memory (PCM) or the like (referred to as a phase-change memory PCM in this specification and the like for convenience) as illustrated in FIG. 10D, can be used for example.

As the load circuit LC, a ferroelectric capacitor FEC sandwiched between a pair of electrodes, which is used for an FeRAM (Ferroelectric Random Access Memory) or the like, as illustrated in FIG. 10E can be used, for example. In FIG. 10E, a first terminal of the ferroelectric capacitor FEC is electrically connected to the first terminal of the transistor F4, and a second terminal of the ferroelectric capacitor FEC is electrically connected to the wiring VEA.

In this case, the wiring VEA functions not as a wiring supplying a constant voltage but as a plate line polarizing a ferroelectric film of the ferroelectric capacitor or reversing the polarization of the ferroelectric film.

For example, the operation of writing information from the storage device MEXT to the ferroelectric capacitor FEC is conducted by the following way: the transistor F4 is turned on, so that the voltage comparable to the information is applied to the wiring RBL, and the predetermined voltage is applied to the wiring VEA, whereby the ferroelectric film included in the ferroelectric capacitor FEC is polarized. The operation of reading the written information from the ferroelectric capacitor FEC is conducted by application of a pulse voltage to the wiring VEA after the transistor F4 is turned on. The level of the pulse voltage applied to the wiring VEA may be the same as the level of the voltage applied to the wiring VEA at the time of writing the data. The ferroelectric capacitor FEC determines whether the retained information is "0" or "1" depending on whether the polarization reversal occurs by the pulse voltage from the wiring VEA. When the polarization reversal occurs in the ferroelectric film in the ferroelectric capacitor FEC, current flows into the wiring RBL through the transistor F4. The amount of current in the wiring RBL can be secured with use of the circuit IVC with a structure of a current-voltage converter circuit or an integrator circuit (or a current-charge (IQ) converter circuit), for example. Depending on the amount of the current, the on/off state of the switch SW[u] included in the circuit WCS1 in the circuit ILD is determined. As a result, the amount of current flowing in the wiring IL is determined depending on the on/off state of each of the switch SW[1] to the switch SW[K] included in the circuit WCS1.

Figure 10:
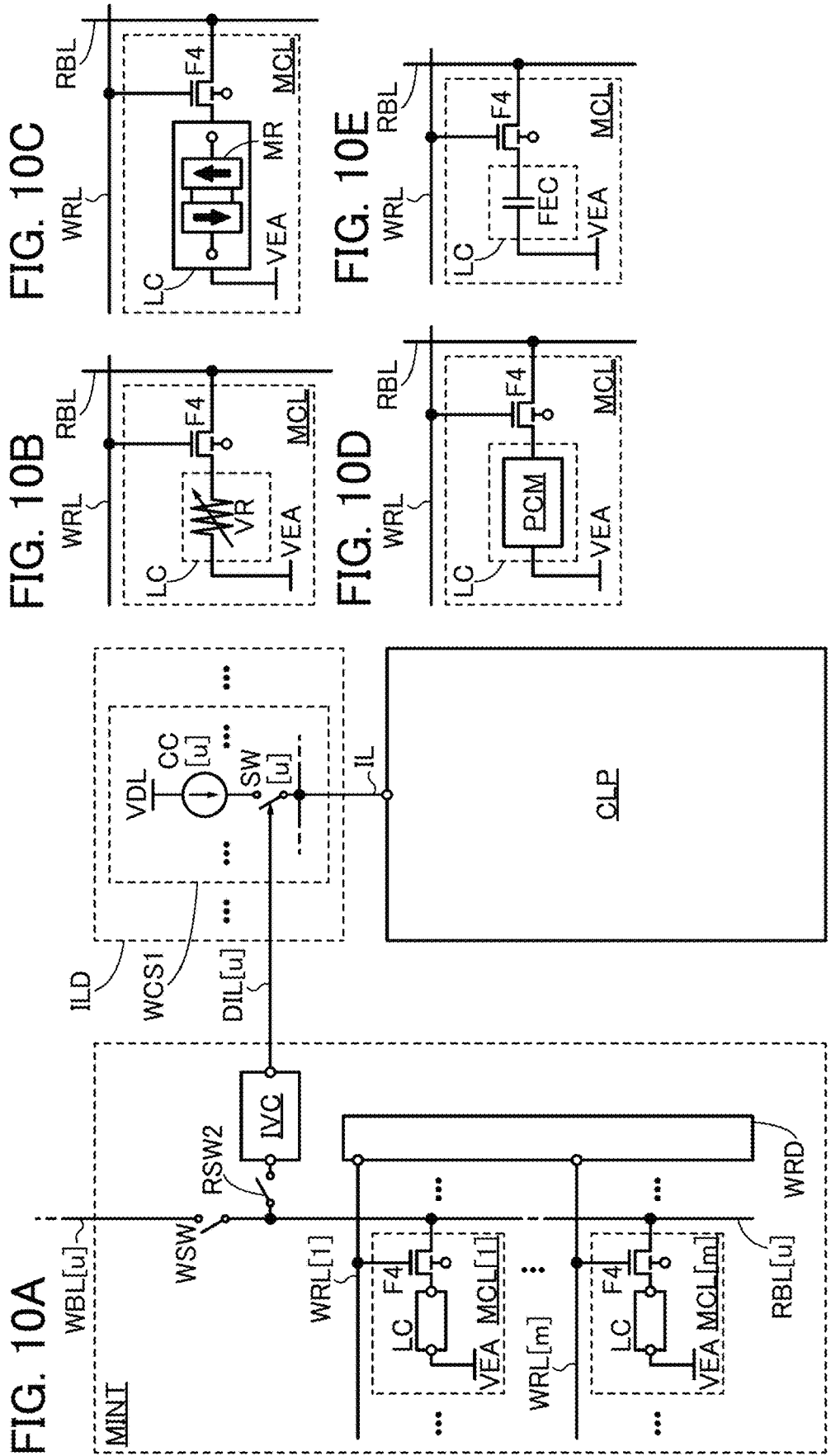
FIG. 10A is a circuit diagram illustrating a configuration example of a circuit included in a semiconductor device.
FIG. 10B to FIG. 10E are circuit diagrams each illustrating a configuration example of a memory cell included in the semiconductor device.

Although the storage device MINT illustrated in FIG. 10 has a structure where the memory cell MCL includes the load circuit LC, one embodiment of the present invention is not limited thereto. One embodiment of the present invention may have a structure where the memory cell MCL included in the storage device MINT includes SRAM (Static Random Access Memory), for example.

Figure 11:
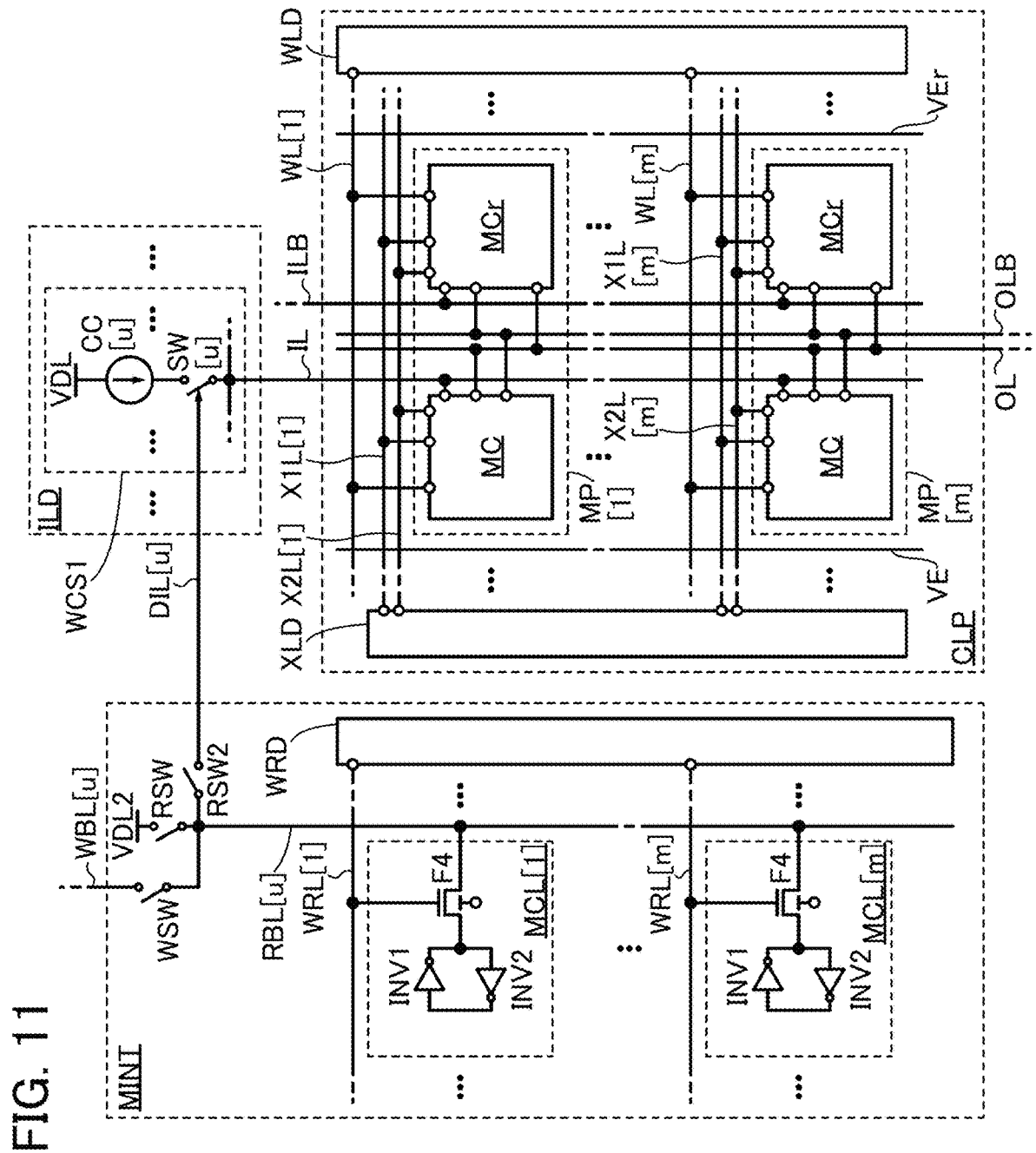
FIG. 11 is a circuit diagram illustrating a configuration example of a circuit included in a semiconductor device.

The storage device MINT in this case has a structure illustrated in FIG. 11, for example. The storage device MINT in FIG. 11 can have a structure, for example, where memory cells MCL are arranged in a matrix. For example, in the storage device MINT, a plurality of columns each including the memory cell MCL[1] to the memory cell MCL[m] can be arranged. In the storage device MINT in FIG. 11, K columns each including the memory cell MCL[1] to the memory cell MCL[m], and only the memory cell MCL[1] to the memory cell MCL[m] in the u-th column are illustrated.

In the storage device MINT in FIG. 11, each of the memory cell MCL[1] to the memory cell MCL[m] includes the transistor F4, an inverter circuit INV1 and an inverter circuit INV2. The first terminal of the transistor F4 is electrically connected to an output terminal of the inverter circuit INV1 and an input terminal of the inverter circuit INV2. An input terminal of the inverter circuit INV1 is electrically connected to an output terminal of the inverter circuit INV2. In other words, an inverter loop circuit is formed with the inverter circuit INV1 and the inverter circuit INV2 in each of the memory cell MCL[1] to the memory cell MCL[m].

The gate of the transistor F4 in the memory cell MCL[1] is electrically connected to the wiring WRL[1], and the gate of the transistor F4 in the memory cell MCL[m] is electrically connected to the wiring WRL[m]. The second terminal of the transistor F4 in each of the memory cell MCL[1] to the memory cell MCL[m] is electrically connected to the wiring RBL[u].

For the circuit WRD and the wiring WRL[1] to the wiring WRL[m] included in the storage device MINT in FIG. 11, the description of the storage device MINT in FIG. 10 is referred to.

The storage device MINT in FIG. 11 includes the switch WSW, the switch RSW, and the switch RSW2. For functions and electrical connections of the switch WSW, the switch RSW, the switch RSW2, the wiring WBL[u], the wiring VDL2, the wiring RBL[u], and the wiring DIL[u], the description of the storage device MINT in FIG. 7 is referred to.

When information read from the storage device MEXT is written to the memory cell MCL[1] to the memory cell MCL[m] included in the storage device MINT in FIG. 11, the transistor F4 in the written memory cell MCL and the switch WSW are turned on, and the switch RSW and the switch RSW2 are turned off. After that, the information read from the storage device MEXT is input to the inverter loop circuit in the written memory cell MCL through the wiring WBL[u], the switch WSW, and the wiring RBL[u]. When the information written to the inverter loop circuit is read from any one of the memory cell MCL[1] to the memory cell MCL[m] in the storage device MINT in FIG. 11, the switch WSW and the switch RSW2 are turned off, and the switch RSW is turned on as a first step, so that the potential of the wiring VDL2 (for example, a high-level potential) is supplied to the wiring RBL[u] for initialization. After that, the transistor F4 in any one of the memory cell MCL[1] to the memory cell MCL[m], where the data is read, is turned on, and the switch RSW2 is turned on. Accordingly, the read information can be input from the memory cell MCL where information is read to the circuit ILD through the wiring RBL[u], the switch RSW2, and the wiring DIL. The potential of the wiring DIL is determined depending on the information, and thus, the on/off state of the switch SW[u] included in the circuit WCS1 in the circuit ILD is determined. As a result, depending on the on/off state of each of the switch SW[1] to the switch SW[K] included in the circuit WCS1, the amount of current flowing in the wiring IL is determined.

Examples of storage devices applicable to the storage device MINT include a flash memory besides the above-described memory.

With use of the structure illustrated in FIG. 10, FIG. 11, or the like for the semiconductor device SDV1, data can be read from the storage device MINT and written to the multiplier cell in the arithmetic portion CLP in a manner similar to that in FIG. 3. This operation is performed at regular intervals, whereby data degraded (absolute value of charge amount reduced) by leakage current can be rewritten to be original data (original absolute value of data amount) regularly in the multiplier cell in the arithmetic portion CLP. In other words, with use of the structure illustrated in FIG. 10, FIG. 11, or the like for the semiconductor device SDV1, operation of rewriting of data retained in the storage element in the multiplier cell in the arithmetic portion CLP can be easily performed.

Structure Example 6 of Storage Device MINT and Circuit ILD

Here, an electrical connection between the storage device MINT applicable to the semiconductor device SDV1, the circuit ILD, and the arithmetic portion CLP, which is different from those illustrated in FIG. 3 to FIG. 10, is described.

Figure 12:
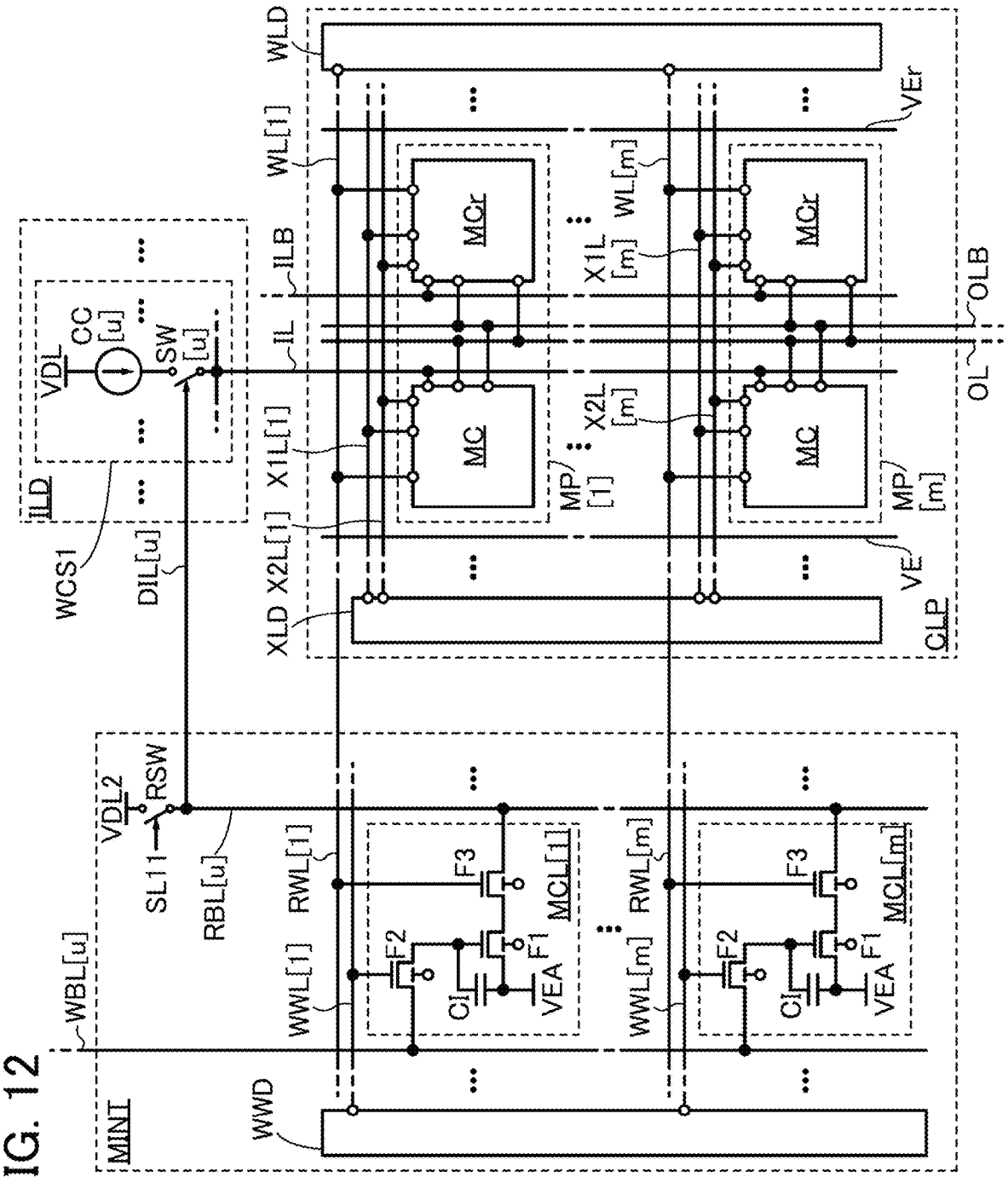
FIG. 12 is a circuit diagram illustrating a configuration example of a circuit included in a semiconductor device.

FIG. 12 illustrates a modification example of the storage device MINT illustrated in FIG. 3 and the electrical connection between the storage device MINT, the circuit ILD, and the arithmetic portion CLP. The connection structure in FIG. 12 is different from the connection structure in FIG. 3 in that the storage device MINT is not provided with the circuit RWD. The wiring RWL[1] to the wiring RWL[m] which are electrically connected to the memory cell MCL[1] to the memory cell MCL[m] in the storage device MINT are electrically connected to a wiring WL[1] to a wiring WL[m] in the arithmetic portion CLP, respectively.

Specifically, the wiring WL[1] to the wiring WL[m] function as write data lines that writes information to the multiplier cells (denoted as a circuit MP[1] to a circuit MP[m] in FIG. 12) in the arithmetic portion CLP. The wiring WL[1] to the wiring WL[m] will be described in Embodiment 2. Each of the wiring WL[1] to the wiring WL[m] is electrically connected to a circuit WLD. The circuit WLD has a function of a driver circuit that transmits a selection signal for selecting a multiplier cell (circuit MP) to which information is written in the arithmetic portion CLP.

In other words, in the connection structure of FIG. 12, the read word line in the storage device MINT, which corresponds to the wiring RWL[1] to the wiring RWL[m], and the write data line in the arithmetic portion CLP, which corresponds to the wiring WL[1] to the wiring WL[m], are a common line. The selection signal is transmitted to any of the wiring RWL[1] (the wiring WL[1]) to the wiring RWL[m] (the wiring WL[m]) by the circuit WLD in the arithmetic portion CLP, whereby information can be read from the predetermined memory cell MCL in the storage device MINT.

Since the read word line (the wiring RWL) in the storage device MINT and the write data line (the wiring WL) in the arithmetic portion CLP are combined to be one wiring, at the time of reading information from the predetermined memory cell MCL in the storage device MINT, the selection signal is input also to the multiplier cell (the circuit MP) in the arithmetic portion CLP, which is located in the same row as the memory cell MCL. In other words, when information is read from the predetermined memory cell MCL in the storage device MINT, the write transistor included in the multiplier cell (the circuit MP) is also brought into an on state.

For example, when information is read from K memory cells MCL[1] positioned in the first row in the storage device MINT, a selection signal is transmitted from the circuit WLD to the wiring RWL[1] (the wiring WL[1]). At this time, potentials comparable to the information retained in the K memory cells MCL[1] positioned in the first row are read and input to the circuit WCS1 in the circuit ILD. In the circuit WCS1, the on/off state of each of the switch SW[1] to the switch SW[K] is determined depending on the respective potentials. In other words, the amount of current flowing from the circuit WCS1 to the wiring IL is determined by the combination of the on/off states of the switch SW[1] to the switch SW[K]. In addition, since the selection signal is transmitted to the wiring WL[1] (the wiring RWL[1]) in the arithmetic portion CLP, the write transistors included in the multiplier cells (the circuit MP) positioned in the first row are turned on. Thus, the current whose amount is output by the circuit ILD flows to the multiplier cells (the circuit MP) positioned in the first row through the wiring IL. Accordingly, the information retained in the memory cell MCL in the storage device MINT can be written to the multiplier cell (the circuit MP) in the arithmetic portion CLP.

With use of the structure in FIG. 12 for the semiconductor device SDV1, the circuit RWD that is a driver circuit for reading data is not needed to be provided in the storage device MINT, which enables a reduction in the area of the storage device MINT.

The connection structure of the storage device MINT, the circuit ILD, and the arithmetic portion CLP, which is one embodiment of the present invention, is not limited to the circuit configuration in FIG. 12. As the connection structure of the storage device MINT, the circuit ILD, and the arithmetic portion CLP, the included circuit elements, the connection structure, and the like may be changed depending on the circumstances or conditions.

Figure 13:
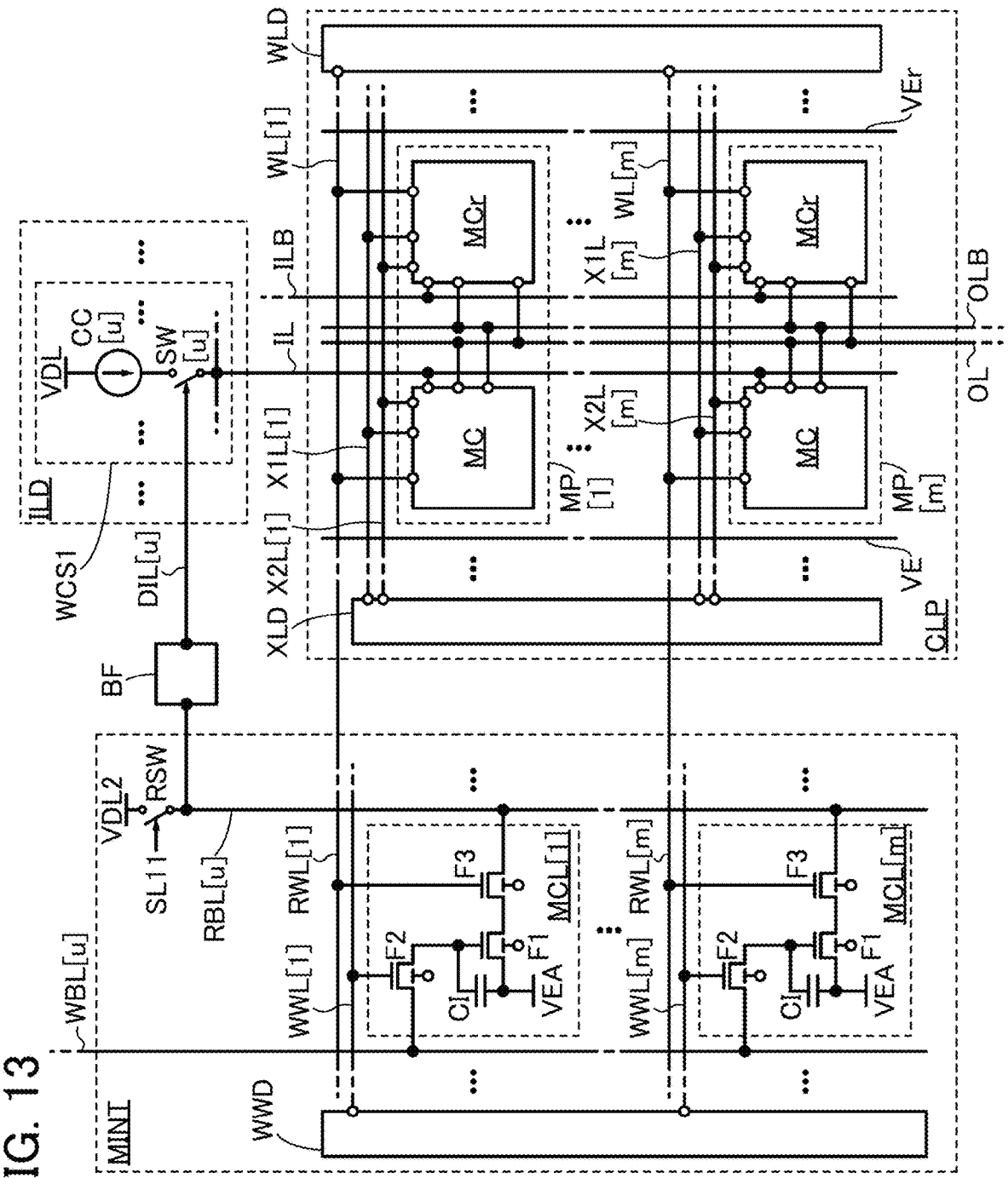
FIG. 13 is a circuit diagram illustrating a configuration example of a circuit included in a semiconductor device.

For example, as the connection structure of the storage device MINT, the circuit ILD, and the arithmetic portion CLP, as illustrated in FIG. 13, the circuit BF described with FIG. 4 may be provided between the storage device MINT and the circuit ILD in FIG. 12.

In the connection structure of the storage device MINT, the circuit ILD, and the arithmetic portion CLP in FIG. 13, the circuit BF is provided on an electrical path between the wiring RBL[u] and the wiring DIL[u]. The circuit BF can include an amplifier circuit such as a buffer circuit, an inverter circuit, or a latch circuit, for example, which is similar to the description with FIG. 4.

In particular, when the circuit BF has a structure of a latch circuit temporarily retaining a potential of the wiring RBL[u], the speed of writing information to the multiplier cell (the circuit MP) in the arithmetic portion CLP can be increased in some cases. In this case, for example, a wiring WL[0] may be provided in the arithmetic portion CLP as the connection structure of the storage device MINT, the circuit ILD, and the arithmetic portion CLP in FIG. 14A, so that the wiring WL[0] and the wiring RWL[1] may be electrically connected, and the wiring WL[1] may be electrically connected to the wiring RWL[2]. In other words, a wiring RWL[i] (here, i is greater than or equal to 1 and less than or equal to m) in the storage device MINT is electrically connected to a wiring WL[i−1] in the arithmetic portion CLP. Note that the multiplier cell (the circuit MP) is not necessarily provided for the wiring WL[0] in the arithmetic portion CLP.

Figure 14B:
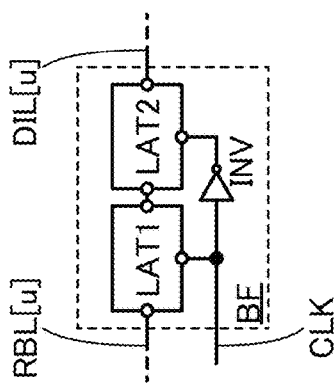
FIG. 14B is a circuit diagram illustrating a configuration example of part of a circuit included in the circuit.

The circuit BF can have a structure illustrated in FIG. 14B, for example. The circuit BF includes a latch circuit LAT1, a latch circuit LAT2, and an inverter circuit INV. An input terminal of the latch circuit LAT1 is electrically connected to the wiring RBL[u], an output terminal of the latch circuit LAT1 is electrically connected to an input terminal of the latch circuit LAT2, and an output terminal of the latch circuit LAT2 is electrically connected to the wiring DIL[u]. An enable signal input terminal (referred to a clock signal input terminal in some cases) of the latch circuit LAT1 is electrically connected to a wiring CLK, an input terminal of the inverter circuit INV is electrically connected to the wiring CLK, and an output terminal of the inverter circuit INV is electrically connected to an enable signal input terminal of the latch circuit LAT2.

Figure 14A:
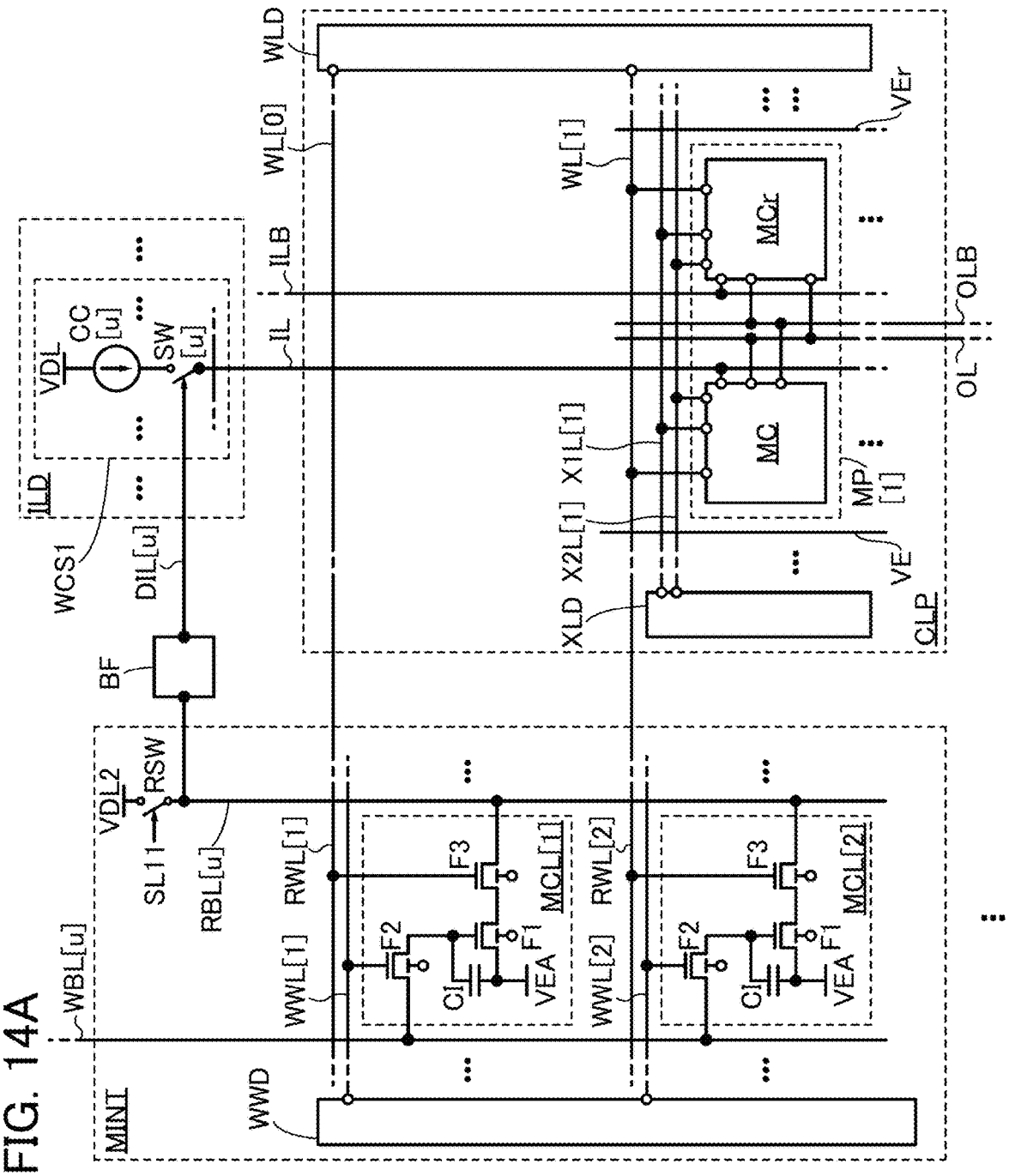
FIG. 14A is a circuit diagram illustrating a configuration example of a circuit included in a semiconductor device.

An operation example in the connection structure of the storage device MINT, the circuit ILD, and the arithmetic portion CLP in FIG. 14A is described. First, a selection signal is transmitted from the circuit WLD to the wiring WL[0], so that information retained in the memory cell MCL[1] positioned in the first row of the storage device MINT is read. The read information is input as a potential to the input terminal of the circuit BF through the wiring RBL[u]. In the circuit BF at this time, a first potential (for example, one of a high-level potential or a low-level potential) is input to the wiring CLK, whereby the latch circuit LAT1 retains the potential input from the wiring RBL[u] and outputs the potential to the output terminal of the latch circuit LAT1. Furthermore, a second potential (for example, the other of the high-level potential and the low-level potential) is input to the wiring CLK at this time, whereby the latch circuit LAT2 retains the potential from the output terminal of the latch circuit LAT1 and outputs the potential to the latch circuit LAT2. At the timing when the second potential (for example, the other of the high-level potential and the low-level potential) is input to the wiring CLK, a selection signal is transmitted from the circuit WLD to the wiring WL[1], so that the information retained in the memory cell MCL[1] positioned in the first row of the storage device MINT is read. Thus, the read information is input as a potential to the input terminal of the circuit BF through the wiring RBL[u]. On the other hand, in the arithmetic portion CLP, the write transistor in the multiplier cell (the circuit MP) in the first row is brought into an on state because the selection signal is transmitted to the wiring WL[1]. At this time, a potential comparable to the information read from the memory cell MCL[1] in the storage device MINT is output from the output terminal of the latch circuit LAT2 in the circuit BF; thus, the circuit ILD makes current corresponding to the potential flow in the wiring IL. Then, the current flows from the wiring IL to the multiplier cell (the circuit MP), so that the information is written to the multiplier cell (the circuit MP).

With use of the connection structure of the storage device MINT, the circuit ILD, and the arithmetic portion CLP in FIG. 14A for the semiconductor device SDV1, the speed of writing data retained in the storage device MINT to the multiplier cell in the arithmetic portion CLP can be increased in the rewriting operation of information retained in the multiplier cell in the arithmetic portion CLP.

Although the description of the above operation example is made on the assumption that the latch circuit LAT1 and the latch circuit LAT2 are connected in series in the circuit BF, two latch circuits in the circuit BF may be connected not in series but in parallel (not illustrated). For example, in one of the latch circuits, information (voltage) transmitted from the storage device MINT may be acquired, and in the other latch circuit, information (voltage) that is acquired in advance may be transmitted to the circuit ILD.

As the structure of the semiconductor device SDV1, any of the above structures illustrated in FIG. 3 to FIG. 9, FIG. 10A, FIG. 11 to FIG. 13, FIG. 14A, and the like may be selected and combined.

Structure Example 2 of Semiconductor Device

Next, a semiconductor device that can supply data to be retained in the arithmetic circuit, which is different from the semiconductor device SDV1 in FIG. 1, is described.

Figure 15:
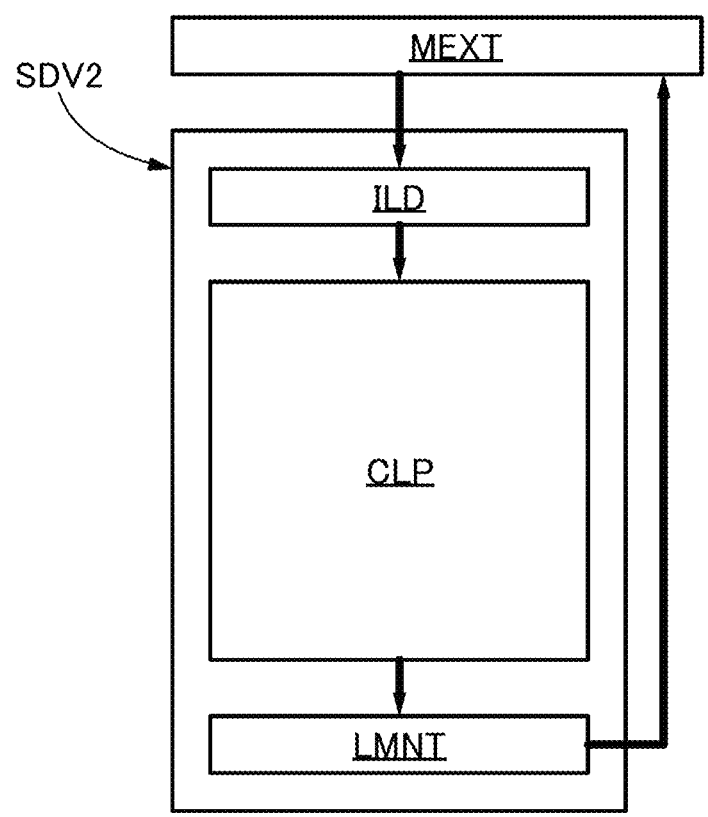
FIG. 15 is a block diagram illustrating a configuration example of a semiconductor device.

FIG. 15 is a block diagram illustrating a structure example of a semiconductor device SDV2 of one embodiment of the present invention. The semiconductor device SDV2 includes the circuit ILD, the arithmetic portion CLP, and a circuit LMNT, for example. In FIG. 15, the storage device MEXT is also illustrated to show the electrical connection with the semiconductor device SDV2.

The semiconductor device SDV2 can be manufactured with circuit elements and the like which can be formed on one substrate BSE in a manner similar to the case of the semiconductor device SDV1.

For example, when the substrate BSE is a semiconductor substrate containing silicon, a transistor included in the arithmetic portion CLP, a transistor included in the circuit ILD, and a transistor included in the circuit LMNT can be Si transistors formed on the substrate BSE.

The circuit ILD provided in the semiconductor device SDV2 acquires information read from the storage device MEXT provided outside the semiconductor device SDV2 and supplies current, a voltage, or the like, which is comparable to the information, to the arithmetic portion CLP described later. The information is used as data for performing arithmetic operation by the arithmetic portion CLP.

The semiconductor device SDV2 does not include the storage device MINT; thus, the structure of the semiconductor device SDV2 is different from that of the semiconductor device SDV1 in that information read by the storage device MEXT is directly input to the circuit ILD. Therefore, when the circuit ILD functions as a current source circuit, the circuit ILD directly supplies current comparable to the information read from the storage device MEXT to a circuit included in the arithmetic portion CLP. The circuit ILD may be, for example, provided not as a current source circuit for supplying current to the arithmetic portion CLP but as a voltage source circuit (voltage generation circuit) for inputting a voltage comparable to the information read from the storage device MEXT to the arithmetic portion CLP.

In the case where the circuit ILD functions as a current source circuit, for a specific structure of the circuit ILD, the description of the circuit ILD in FIG. 2A to FIG. 2C is referred to.

The arithmetic portion CLP includes a plurality of circuits each of which function as a multiplier cell. For the arithmetic portion CLP, the description of the arithmetic portion CLP included in the semiconductor device SDV1 in FIG. 1A is referred to. For the circuit configuration of the arithmetic portion CLP and a principle of the product-sum operation in the arithmetic portion CLP will be described in details in Embodiment 2.

The circuit LMNT has a function of monitoring information (e.g., current, voltage, or the like) retained in the multiplier cell (or a storage element included in the circuit LMNT) included in the arithmetic portion CLP. Specifically, the circuit LMNT transmits an instruction signal to the storage device MEXT or the like when the information (e.g., current, voltage, or the like) retained in the multiplier cell varies by leakage of electric charge or the like. When the storage device MEXT receives the instruction signal, the information is read out from the storage device MEXT and transmitted to the circuit ILD, whereby the information is rewritten from the circuit ILD to the multiplier cell (electric charge is supplied to the storage element). At this time, also in the storage element included in the circuit LMNT, rewriting to be the original information is similarly performed. Thus, information retained in the multiplier cell in the arithmetic portion CLP can be prevented from being degraded.

Configuration Example 1 of Circuit LMNT and Circuit ILD

Next, a configuration example of the circuit LMNT included in the semiconductor device SDV2 in FIG. 15 is described.

Figure 16:
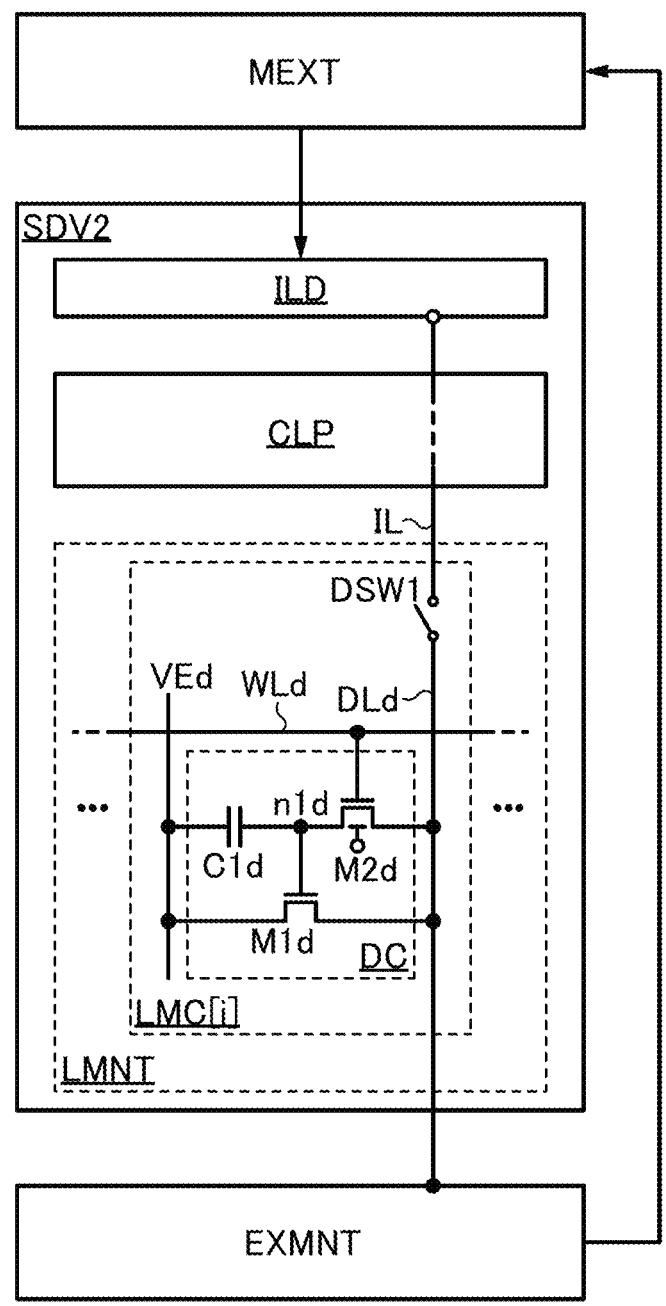
FIG. 16 is a block diagram illustrating a configuration example of a semiconductor device.

The circuit LMNT illustrated in FIG. 16 includes a circuit LMC[i] (i is an integer greater than or equal to 1 and less the or equal to a value the same as the number of wirings IL). The circuit LMC[i] includes a memory cell DC and a switch DSW1. The memory cell DC includes a transistor M1$d$, a transistor M2$d$, and a capacitor C1$d$. FIG. 16 also illustrates, in addition to circuit LMNT, the semiconductor device SDV2 including the circuit ILD and the arithmetic portion CLP, the storage device MEXT, and a circuit EXMNT.

In the circuit LMNT, a plurality of circuits LMC[i] may be provided. Specifically, the circuit LMNT can have a configuration where the number of circuits LMC[i] arranged in one row is the same as the number of wirings IL electrically connected to the circuit ILD. For example, when the number of wirings IL is 2m, the circuit LMNT can have a configuration where the circuit LMC[1] to a circuit LMC[2m] are arranged in one row.

As the switch DSW1, a switch that can be used as the above-described switch RSW can be used, for example.

The storage device MEXT is electrically connected to the circuit ILD. The circuit ILD is electrically connected to the wiring IL. The circuit EXMNT is electrically connected to the storage device MEXT.

The wiring IL is electrically connected to a first terminal of the switch DSW1, and a second terminal of the switch DSW1 is electrically connected to a wiring DL$d$. The wiring DL$d$ is illustrated to have electrical connection with the circuit EXMNT and the memory cell DC.

In the memory cell DC, a first terminal of the transistor M1*d* is electrically connected to a wiring VEd, a second terminal of the transistor M1*d* is electrically connected to the wiring DLd, and a gate of the transistor M1*d* is electrically connected to a first terminal of the capacitor C1*d* and a first terminal of the transistor M2*d*. A second terminal of the transistor M2*d* is electrically connected to the wiring DLd, and a gate of the transistor M2*d* is electrically connected to a wiring WLd. A second terminal of the capacitor C1*d* is electrically connected to the wiring VEd. In FIG. 16, an electrical connection point of the gate of the transistor M1*d*, the first terminal of the capacitor C1*d*, and the first terminal of the transistor M2*d* is a node n1*d*.

The wiring DLd functions as a wiring for transmitting data written to the first terminal of the capacitor C1*d* in the memory cell DC. In addition, the wiring DLd also functions as a wiring for supplying current comparable to a potential at the first terminal of the capacitor C1*d* in the memory cell DC, for example.

The wiring WLd functions as a write word line in the memory cell DC, for example.

The wiring VEd functions as a wiring supplying a constant voltage, for example. The constant voltage can be, for example, a low-level potential, a ground potential, or the like.

The transistor M1*d* preferably has a structure similar to that of a transistor M1 included in a multiplier cell (a circuit MC) in the arithmetic portion CLP, which will be described in Embodiment 2, for example. The transistor M2*d* preferably has a structure similar to that of a transistor M2 included in the multiplier cell (the circuit MC) in the arithmetic portion CLP, which will be described in Embodiment 2, for example. For example, in the case where the transistor M1 is a Si transistor and the transistor M2 is an OS transistor, the transistor M1*d* is preferably a Si transistor, and the transistor M2*d* is preferably an OS transistor. The capacitor C1*d* preferably have a structure similar to that of the capacitor C1 included in the multiplier cell (the circuit MC) in the arithmetic portion CLP, which will be described in Embodiment 2.

As the transistor M1*d*, a transistor that can be used as the transistor F1 can be used, for example. As the transistor M2*d*, a transistor that can be used as the transistor F2 can be used, for example.

The circuit EXMNT is provided outside the semiconductor device SDV2, for example. The circuit EXMNT has a function of monitoring a potential (or a charge amount) retained at the first terminal of the capacitor C1*d* in the memory cell DC included in the circuit LMC[i], for example. Specifically, the circuit EXMNT acquires the amount of current input from the wiring DLd and compares the amount of current with a desired amount of current. When the amount of current is less than or equal to the desired amount of current or less than the desired amount of current, the circuit EXMNT makes a determination that the voltage retained by the memory cell DC and the multiplier cell included in the arithmetic portion CLP is reduced (or an absolute value of charge amount is reduced), thereby transmitting, to the external storage device MEXT, the circuit ILD, or the like, an instruction signal for rewriting data that is the same as the original data retained in the memory cell DC and the multiplier cell included in the arithmetic portion CLP.

Next, an operation example of the circuit LMNT in FIG. 16 is described.

First, in the circuit LMC[i], the switch DSW1 is turned on, and the transistor M2*d* is turned on. When the transistor M2*d* is brought into an on state, electrical continuity is established between the node n1*d* and the second terminal of the transistor M1*d*, and the potential of the node n1*d* and the potential of the second terminal of the transistor M1*d* are substantially equal to each other.

For example, when the circuit ILD is a current source circuit in this case, the circuit ILD supplies current for initialization, the amount of which is denoted by $I_0$, to the wiring DLd through the wiring IL. The current for initialization can be current output from the circuit WCS1 or the circuit WCS2 included in the circuit ILD illustrated in FIG. 2A to FIG. 2C, for example. In this case, for example, the amount of current $I_0$ for initialization may be $I_{ut}$ denoting the minimum value of the amount of current that can be generated by the circuit WCS1 or the circuit WCS2 or may be $(2^K-1) \times I_{ut}$ that is the maximum value.

Since the transistor M2*d* is in an on state, the first terminal of the capacitor C1*d* is charged with electric charge supplied from the wiring DLd. In the end, the amount of current $I_0$ flows between the first terminal and the second terminal of the transistor M1*d* (between the wiring DLd and the wiring VEd), and the potential of the node n1*d* has a level corresponding to the amount of current $I_0$. The potential of the node n1*d* is $V_{nd}$ at this time.

For example, when the circuit ILD is a voltage source circuit, the voltage is written from the circuit ILD to the first terminal of the capacitor C1*d* through the wiring IL and the transistor M2*d*. In this case, the voltage written from the circuit ILD to the first terminal of the capacitor C1*d* is denoted by $V_{nd}$. At this time, the amount of current $I_0$ flows between the first terminal and the second terminal of the transistor M1*d* (between the wiring DLd and the wiring VEd). Note that the wiring VED has a low-level potential or a ground potential, and positive current flows from the wiring DLd to the wiring VEd.

In either case of the circuit ILD that is a current source circuit or the voltage source circuit, the transistor M2*d* is turned off at a time when the potential of the first terminal of the capacitor C1*d* becomes $V_{nd}$, whereby the first terminal of the capacitor C1*d* in the memory cell DC can retain the potential $V_{nd}$. In the case where the potential $V_{nd}$ is retained at the first terminal of the capacitor C1*d* in the memory cell DC, the transistor M1*d* functions as a current source supplying the amount of current $I_0$. After the transistor M2*d* is turned off, the switch DSW1 may be turned off.

When monitoring current flowing between the first terminal and the second terminal of the transistor M1*d* starts, the switch DSW1 is turned off. Accordingly, the amount of current $I_0$ flows from the memory cell DC to the circuit EXMNT through the wiring DLd. Specifically, positive current flows from the circuit EXMNT to the memory cell DC through the wiring DLd.

When the potential $V_{nd}$ retained at the first terminal of the capacitor C1*d* is reduced by leakage of electric charge or the like, the amount of current flowing between the first terminal and the second terminal of the transistor M1*d* is reduced from $I_0$. When the amount of current flowing from the memory cell DC to the circuit EXMNT through the wiring DLd is reduced to be less than or equal to a desired amount of current or less than the desired amount of current, the circuit EXMNT makes a determination that the data retained in the memory cell DC is degraded, thereby transmitting an instruction signal (for example, a pulse signal), to the storage device MEXT, for reading data that is to be written again to the multiplier cell in the arithmetic portion CLP and transmitting the data to the circuit ILD.

Note that the desired amount of current here refers to the amount of current that is smaller than the amount of current $I_0$ flowing from the circuit ILD to the wiring DLd through the wiring IL. The amount of current smaller than the amount of current $I_0$ can be, for example, 0.95 times, 0.90 times, 0.80 times, or the like of the amount of current $I_0$.

When the instruction signal is input to the storage device MEXT, the storage device MEXT reads the information retained in the storage device MEXT and transmits the data to the semiconductor device SDV2. Then, in the semiconductor device SDV2, the information is written to the multiplier cell included in the arithmetic portion CLP by the circuit ILD, and the original voltage (or current) is written to the memory cell DC. Accordingly, data rewriting (supply of electric charge) can be performed with respect to degraded data retained in the memory cell DC and the multiplier cell in the arithmetic portion CLP.

With use of the structure illustrated in FIG. 16 for the semiconductor device SDV2, the degradation of data (a reduction in the absolute value of the charge amount by the leakage current) retained in the storage element in the multiplier cell in the arithmetic portion CLP can be easily sensed. Sensing enables data rewriting (supply of electric charge) to the multiplier cell in the arithmetic portion CLP and the memory cell DC.

Configuration Example 2 of Circuit LMNT and Circuit ILD

Next, a configuration example of the circuit LMNT applicable to the semiconductor device SDV2 in FIG. 15, which is different from the circuit LMNT in FIG. 16, is described.

Figure 17A:
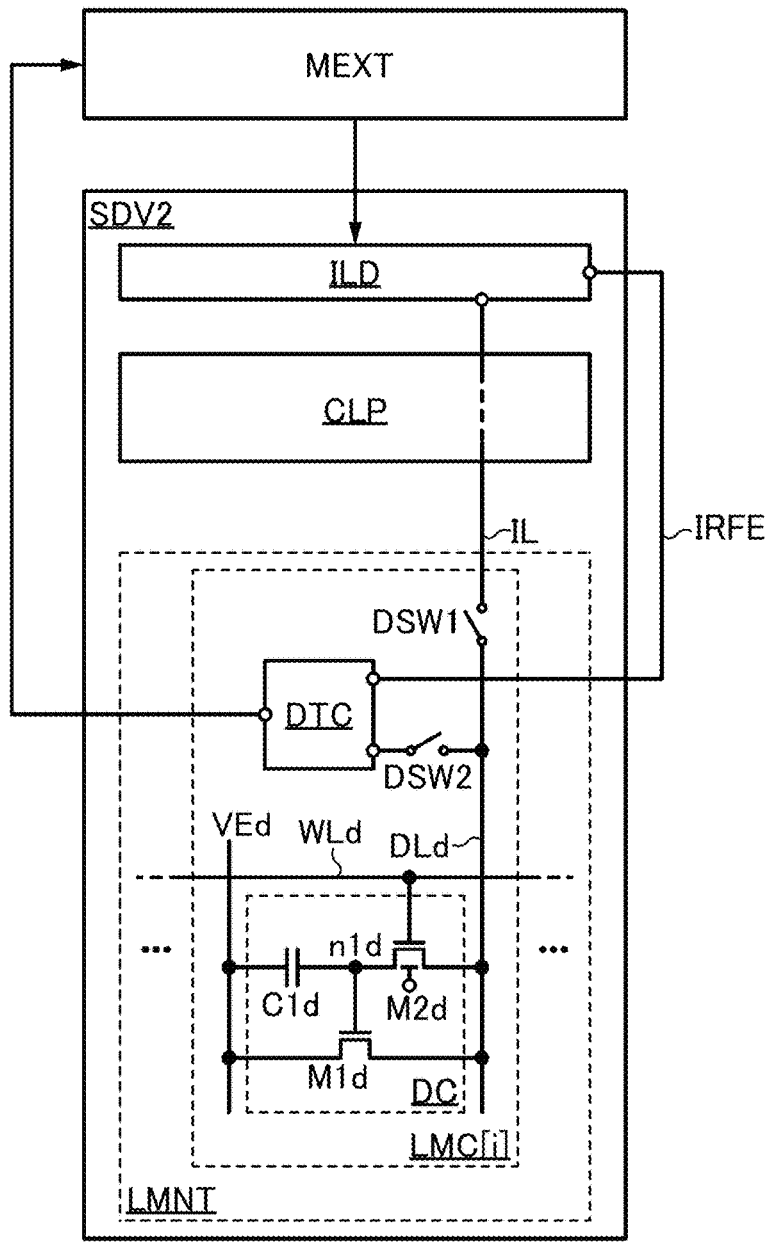
FIG. 17A is a block diagram illustrating a configuration example of a semiconductor device.

The circuit LMNT illustrated in FIG. 17A includes the circuit LMC[i] (i is an integer greater than or equal to 1 and less than or equal to a value the same as the number of wirings IL). The circuit LMC[i] includes the memory cell DC, a circuit DTC, the switch DSW1, and a switch DSW2. The memory cell DC includes the transistor M1$d$, the transistor M2$d$, and the capacitor C1$d$. FIG. 17A also illustrates, in addition to the circuit LMNT, the semiconductor device SDV2 including the circuit ILD and the arithmetic portion CLP and the storage device MEXT.

The memory cell DC illustrated in FIG. 17A has a structure similar to that of the memory cell DC in FIG. 16. Thus, the description of the circuit LMNT in FIG. 16 is referred to for the transistor M1$d$, the transistor M2$d$, and the capacitor C1$d$ included in the memory cell DC in FIG. 17A and the wiring VEd, the wiring WLd, and the wiring DLd illustrated in FIG. 17A.

The circuit LMNT in FIG. 17A can include a plurality of circuits LMC[i], like the circuit LMNT in FIG. 16. Specifically, the circuit LMNT can have a configuration where the number of circuits LMC[i] arranged in one row is the same as the number of wirings IL electrically connected to the circuit ILD.

As the switch DSW1 and the switch DSW2, a switch applicable to the above-described switch RSW can be used as in the case of the switch DSW1 in FIG. 16, for example.

The storage device MEXT is electrically connected to the circuit ILD. The circuit ILD is electrically connected to the wiring IL.

The wiring IL is electrically connected to a first terminal of the switch DSW1, and a second terminal of the switch DSW1 is electrically connected to the wiring DLd. The wiring DLd is electrically connected to a first terminal of the switch DSW2, a second terminal of the switch DSW2 is electrically connected to a first input terminal of the circuit DTC, a second input terminal of the circuit DTC is electrically connected to a wiring IRFE, and an output terminal of the circuit DTC is electrically connected to the storage device MEXT. The wiring IRFE is electrically connected to the circuit ILD, for example.

The circuit DTC has a function of monitoring current input to the first input terminal of the circuit DTC. As a specific example, the circuit DTC has a function of comparing the amount of current input to the first input terminal of the circuit DTC and the amount of current (hereinafter, referred to as the amount of reference current) input to the second input terminal of the circuit DTC and a function of outputting an instruction signal (for example, a pulse voltage or the like) to the storage device MEXT, for example, from the output terminal of the circuit DTC when the amount of current input to the first input terminal of the circuit DTC is reduced to be less than or equal to the amount of reference current or less than the amount of reference current. That is, the circuit DTC can includes a current comparator or the like. In the case where the circuit DTC includes a current comparator, a structure of a circuit ACTF[j] described in Embodiment 2 can be used for the circuit DTC, for example. Therefore, the circuit DTC can be shared with the circuit ACTF[j] described in Embodiment 2.

In the circuit LMNT in FIG. 17A, strictly, positive current flows from the first terminal of the circuit DTC to the memory cell DC through the switch DSW2 and the wiring DLd. Thus, the current input to the second terminal of the circuit DTC is preferably positive current flowing from the second terminal of the circuit DTC to the wiring IRFE.

Therefore, the wiring IRFE functions as a wiring supplying constant current as reference current, for example. The amount of current $I_0$ flowing between the first terminal and the second terminal of the transistor M1$d$ is input to the first input terminal of the circuit DTC, which is described in detail later. The constant current as the reference current can be set to be smaller than the amount of current $I_0$, for example. Specifically, the amount of current smaller than the amount of current $I_0$ can be 0.95 times, 0.90 times, 0.80 times, or the like of the amount of current $I_0$, for example.

The reference current can be generated by the circuit ILD. For example, in FIG. 17A, the circuit ILD is electrically connected to the wiring IRFE, and accordingly, the circuit ILD can generate and supply the reference current to the wiring IRFE.

The storage device MEXT receives an instruction signal from the circuit DTC, thereby reading data for rewriting (data originally written to the multiplier cell) from the storage device MEXT. The read data is input to the arithmetic portion CLP through the circuit ILD.

Figure 17B:
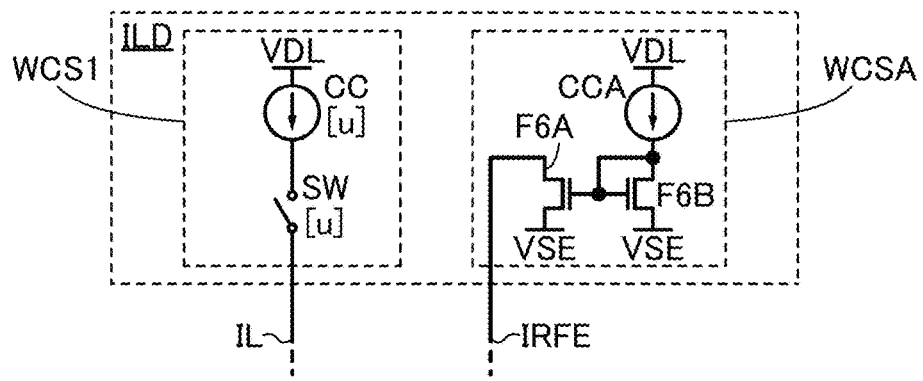
FIG. 17B is a circuit diagram illustrating a configuration example of a circuit included in the semiconductor device.

A configuration example of the circuit ILD in this case is illustrated in FIG. 17B. The circuit ILD illustrated in FIG. 17B includes the circuit WCS1 and a circuit WCSA, for example.

The circuit WCS1 in FIG. 17B is part of the circuit WCS1 in FIG. 2A from which a circuit element relating to writing to the memory cell DC is excerpted. Specifically, the current source CC[u] and the switch SW[u] which are excerpt from FIG. 2A are illustrated in the circuit WCS1 in FIG. 17B. Here, the switch SW[1] to the switch SW[K], other than the switch SW[u], are in an off state, and current generated by the current source CC[1] to the current source CC[K], other than the current source CC[u], does not flow in the wiring IL.

The circuit WCSA in FIG. 17B includes a current source CCA, a transistor F6A, and a transistor F6B. The input terminal of the current source CCA is electrically connected to the wiring VDL, an output terminal of the current source CCA is electrically connected to a first terminal of the transistor F6B, a gate of the transistor F6B, and a gate of the transistor F6A, and a second terminal of the transistor F6B is electrically connected to a wiring VSE. A first terminal of the transistor F6A is electrically connected to the wiring IRFE, and a second terminal of the transistor F6A is electrically connected to the wiring VSE.

The wiring VSE functions as a wiring supplying a constant voltage, for example. The constant voltage can be, for example, a low-level potential, a ground potential, or the like.

As each of the transistor F6A and the transistor F6B, a Si transistor is preferably used, for example. Other than the Si transistor, an OS transistor, a transistor including Ge or the like in a channel formation region, a transistor including a compound semiconductor in a channel formation region, a transistor including a carbon nanotube in a channel formation region, a transistor including an organic semiconductor in a channel formation region, and the like can be used.

The amounts of current generated by the current source CC[u] and the current source CCA are equal to each other.

The structure of the circuit WCSA including the transistor F6A and the transistor F6B is for a current mirror circuit. Thus, in the case where the sizes (e.g., channel lengths, channel widths, structures, or the like) of the transistor F6A and the transistor F6B are equal to or the same as each other, the amount of current flowing between the first terminal and the second terminal of the transistor F6B and the amount of current flowing between the first terminal and the second terminal of the transistor F6A are ideally equal to each other. In other words, the amount of current generated by the current source CCA and the amount of current flowing between the first terminal and the second terminal of the transistor F6A is equal to each other.

The circuit LMNT in FIG. 17A has a configuration where positive current flows from the second terminal of the circuit DTC to the wiring IRFE, and thus, the circuit WCSA in the circuit ILD illustrated in FIG. 17B has a configuration where positive current flows from the wiring IRFE toward the first terminal of the transistor F6A.

Here, the ratio of W length to the L length W/L of the transistor F6A is smaller than the ratio of the W length to the L length W/L of the transistor F6B, whereby the amount of current flowing between the first terminal and the second terminal of the transistor F6A can be made smaller than the amount of current flowing between the first terminal and the second terminal of the transistor F6B (that is, the amount of current generated by the current source CCA).

With use of the configuration in FIG. 17B for the circuit ILD, as described above, the amount of current flowing in the wiring IRFE can be made smaller than the amount of current flowing in the wiring IL. Note that the ratio of the W length to the L length W/L of the transistor F6A may be equal to the ratio of the W length to the L length W/L of the transistor F6B, and the amount of current generated by the current source CC[u] may be increased, so that the difference between the amount of current $I_0$ and the reference current is made larger.

Next, an operation example of the circuit LMNT in FIG. 17A is described.

First, in the circuit LMC[i], the switch DSW1 is turned on, the switch DSW2 is turned off, and the transistor M2$d$ is turned on. Next, as in the circuit LMNT in FIG. 16, the voltage $V_{nd}$ is written to the first terminal of the capacitor C1$d$ in the memory cell DC to turn the transistor M2$d$ off, so that the voltage at the node n1$d$ is retained.

At this time, current for initialization, the amount of which is $I_0$, flows between the first terminal and the second terminal of the transistor M1$d$ (between the wiring DLd and the wiring VEd). After that, the switch DSW1 is turned off, so that current flowing between the first terminal and the second terminal of the transistor M1$d$ is stopped.

When monitoring current flowing between the first terminal and the second terminal of the transistor M1$d$ starts, the switch DSW1 is brought into an off state, and the switch DSW2 is brought into an on state. Accordingly, the amount of current $I_0$ flowing between the first terminal and the second terminal of the transistor M1$d$ is supplied from the first input terminal of the circuit DTC to the wiring VEd through the switch DSW2 and the wiring DLd.

When the potential $V_{nd}$ retained at the first terminal of the capacitor C1$d$ is reduced by leakage of electric charge or the like, the amount of current flowing between the first terminal and the second terminal of the transistor M1$d$ is reduced from $I_0$. When the amount of current flowing from the first input terminal of the circuit DTC to the wiring VEd is reduced to be less than or equal to the amount of reference current flowing from the wiring IRFE or less than the reference current, the circuit DTC makes a determination that the data retained in the memory cell DC is degraded, thereby transmitting an instruction signal, from the output terminal of the circuit DTC to the storage device MEXT, for reading data (data originally written to the multiplier cell) that is to be rewritten from the storage device MEXT. Accordingly, the data read from the storage device MEXT is input to the arithmetic portion CLP through the circuit ILD, so that rewriting of the data with respect to the degraded data is performed. Also at this time, the potential retained in the memory cell DC is preferably modified to data before degradation (potential $V_{nd}$).

With use of the structure illustrated in FIG. 17A for the semiconductor device SDV2, the degradation of data (a reduction in the absolute value of the charge amount by the leakage current) retained in the storage element in the multiplier cell in the arithmetic portion CLP can be easily sensed. Sensing enables data rewriting (supply of electric charge) to the multiplier cell in the arithmetic portion CLP and the memory cell DC.

Configuration Example 3 of Circuit LMNT and Circuit ILD

Here, a configuration example of the circuit LMNT applicable to the semiconductor device SDV2, which is different from the circuits LMNT in FIG. 16 and FIG. 17A, is described.

Figure 18A:
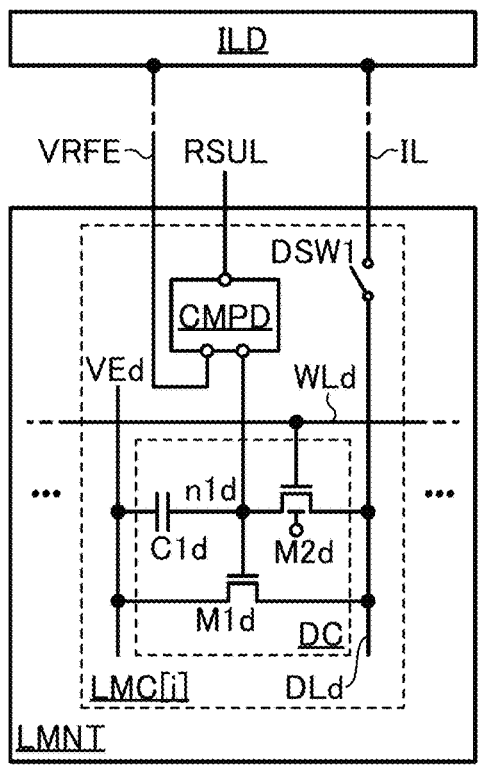
FIG. 18A to FIG. 18D are circuit diagrams each illustrating a structure example of a semiconductor device.

The circuit LMNT illustrated in FIG. 18A includes the circuit LMC[i] (i is an integer greater than or equal to 1 and less than or equal to a value the same as the number of wirings IL), like the circuit LMNT in FIG. 16. Note that the circuit LMC[i] in FIG. 18A is different from the circuit LMC[i] in FIG. 16 in that the memory cell DC, a circuit CMPD, and a switch DSW1 are provided. FIG. 18A also illustrates the circuit ILD.

The memory cell DC illustrated in FIG. 18A has a structure similar to that of the memory cell DC illustrated in FIG. 16. Thus, the description of the circuit LMNT in FIG. 16 is referred to for the transistor M1$d$, the transistor M2$d$, and the capacitor C1$d$ included in the memory cell DC in FIG. 18A and the wiring VEd, the wiring WLd, and the wiring DLd, which are illustrated in FIG. 18A.

The circuit LMNT in FIG. 18A can includes a plurality of circuits LMC[i], like the circuit LMNT in FIG. 16. Specifically, the circuit LMNT can have a configuration where the number of circuits LMC[i] arranged in one row is the same as the number of wirings IL electrically connected to the circuit ILD.

As the switch DSW1, a switch applicable to the above-described switch RSW can be used as in the case of the switch DSW1 in FIG. 16, for example.

The wiring IL is electrically connected to the first terminal of the switch DSW1, and the second terminal of the switch DSW1 is electrically connected to the wiring DLd. A first input terminal of the circuit CMPD is electrically connected to the gate of the transistor M1d, the second terminal of the transistor M2d, and the first terminal of the capacitor C1. The second input terminal of the circuit CMPD is electrically connected to a wiring VRFE. An output terminal of the circuit CMPD is electrically connected to a wiring RSUL. The wiring VRFE is electrically connected to the circuit ILD. Although not illustrated, the wiring RSUL is electrically connected to the storage device MEXT.

The wiring VRFE functions as a wiring for supplying a constant voltage, for example. The constant voltage can be, for example, lower than the voltage $V_{nd}$ written to the node n1d by the circuit ILD (the current source circuit or the voltage source circuit). Specifically, the voltage lower than the voltage $V_{nd}$ can be 0.95 times, 0.90 times, 0.80 times, or the like of the voltage $V_{nd}$, for example. Hereinafter, the constant voltage supplied by the wiring VRFE is referred to as a reference potential.

The reference potential may be generated by the circuit ILD. For example, in FIG. 18A, the circuit ILD is electrically connected to the wiring IRFE, so that circuit ILD can supply the reference current generated by the circuit ILD to the wiring IRFE.

Figure 19:
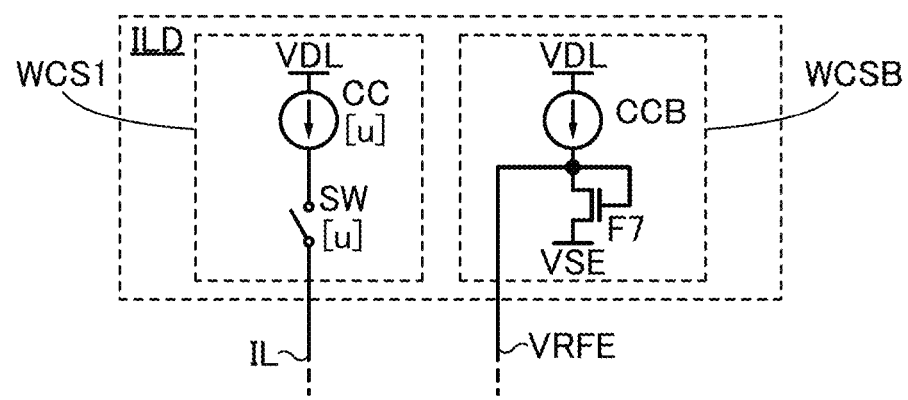
FIG. 19 is a circuit diagram illustrating a configuration example of a circuit included in a semiconductor device.

A configuration example of the circuit ILD in this case is illustrated in FIG. 19. The circuit ILD illustrated in FIG. 19 includes the circuit WCS1 and the circuit WCSA, for example.

The circuit WCS1 illustrated in FIG. 19 is part of the circuit WCS1 in FIG. 2A from which a circuit element relating to writing to the memory cell DC is excerpted. Specifically, the current source CC[u] and the switch SW[u] which are excerpt from FIG. 2A are illustrated in the circuit WCS1 in FIG. 19. Here, the switch SW[1] to the switch SW[K], other than the switch SW[u], are in an off state, and current generated by the current source CC[1] to the current source CC[K], other than the current source CC[u], does not flow in the wiring IL.

The circuit WCSA in FIG. 19 includes a current source CCB and a transistor F7. An input terminal of the current source CCB is electrically connected to a first terminal of the transistor F7, a gate of the transistor F7, and the wiring VRFE, and a second terminal of the transistor F7 is electrically connected to the wiring VSE.

As the transistor F7, a transistor applicable to the transistor F6A and the transistor F6B illustrated in FIG. 17B or the transistor M1d illustrated in FIG. 17A can be used, for example.

The amounts of current generated by the current source CC[u] and the current source CCB are equal to each other.

The transistor F7 in a circuit WCSB has a diode-connected structure. The connection between the transistor F7 and the current source CCB has substantially the same structure as the connection between the transistor M1d and the current source CC[u] when the transistor M2d is in an on state in the memory cell DC in FIG. 18A. In the case where the sizes (e.g., channel lengths, channel widths, structures, or the like) of the transistor F7 and the transistor M1d are equal to or the same as each other, the potential of the first terminal (gate) of the transistor F7 and the potential of the node n1d are ideally equal to each other.

Here, the ratio of W length to the L length W/L of the transistor F7 is higher than the ratio of the W length to the L length W/L of the transistor M1d, whereby the potential of the first terminal (gate) of the transistor F7 can be made smaller than the potential $V_{nd}$ of the node n1d. Note that the ratio of the W length to the L length W/L of the transistor F7A may be equal to the ratio of the W length to the L length W/L of the transistor M1d, whereby the amount of current generated by the current source CC[u] is increased, so that the difference between $V_{nd}$ retained at the node n1d and the reference current is made larger.

With use of the configuration in FIG. 19 for the circuit ILD, as described above, the potential supplied to the wiring VRFE can be made smaller than the potential $V_{nd}$ of the node n1d.

The circuit CMPD has a function of comparing the voltage input to the first input terminal of the circuit CMPD and the voltage input to the second input terminal of the circuit CMPD and a function of outputting the comparison result to the output terminal of the circuit CMPD. Thus, the circuit CMPD can includes a voltage comparator or the like, for example.

Next, an operation example of the circuit LMNT in FIG. 18A is described.

First, in the circuit LMC[i], the switch DSW1 is turned on, and the transistor M2d is turned on. Next, as in the circuit LMNT in FIG. 16, the voltage $V_{nd}$ is written to the first terminal of the capacitor C1d in the memory cell DC, so that the transistor M2d is brought into an off state, and the voltage of the node n1d is retained.

At this time, the voltage $V_{nd}$ of the node n1d is input to the first input terminal of the circuit CMPD. The reference potential lower than $V_{nd}$ is input to the second input terminal of the circuit CMPD.

Next, for example, when the voltage $V_{nd}$ of the node n1d is lower than the reference potential by leakage or the like over time or the like, a signal (voltage) output from the output terminal of the circuit CMPD is changed. For example, on the assumption that the circuit CMPD outputs a low-level potential from the output terminal when the potential of the node n1d is higher than the reference potential, and outputs a high-level potential form the output terminal when the potential of the node n1d is lower than the reference potential, the potential output from the output terminal of the circuit CMPD is changed from the low-level potential to the high-level potential when the voltage of the node n1d is lower than the reference potential. In other words, the circuit CMPD makes a determination that the data retained in the memory cell DC is degraded, and changes the signal (voltage) output from the output terminal of the circuit CMPD. Thus, the signal (voltage) can be used as a trigger signal for rewrite operation for the data retained in the multiplier cell in the arithmetic portion CLP and the potential retained in the memory cell DC.

A change in the signal (voltage) is input from the circuit CMPD to the storage device MEXT, whereby the storage device MEXT reads the data (originally written to the multiplier cell) retained in the storage device MEXT and transmits the data to the semiconductor device SDV2. Accordingly, the data read from the storage device MEXT is input to the arithmetic portion CLP through the circuit ILD, so that rewriting of the data with respect to the degraded data is performed. Also at this time, the potential retained in the memory cell DC is preferably modified to data before degradation (potential $V_{nd}$).

With FIG. 18A, the configuration of the circuit LMNT is described, where the potential of the node n1d in the memory cell DC is monitored and sensed when the potential is lower than the reference potential; however, a circuit provided in a semiconductor device of one embodiment of the present invention is not limited thereto. As a circuit provided in a semiconductor device of one embodiment of the present invention, for example, the configuration of the circuit LMNT in FIG. 18A may be changed depending on the circumstances or conditions.

Figure 18B:
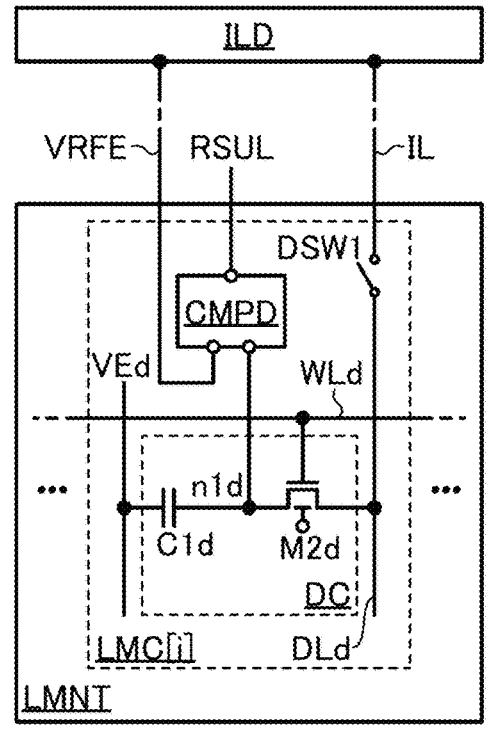

For example, since the circuit LMNT in FIG. 18A monitors the potential of the node n1d, the memory cell DC is not necessarily provided with the transistor M1d. Specifically, the circuit LMNT can have a configuration where the transistor M1d is not provided in the memory cell DC, as illustrated in FIG. 18B.

Figure 18C:
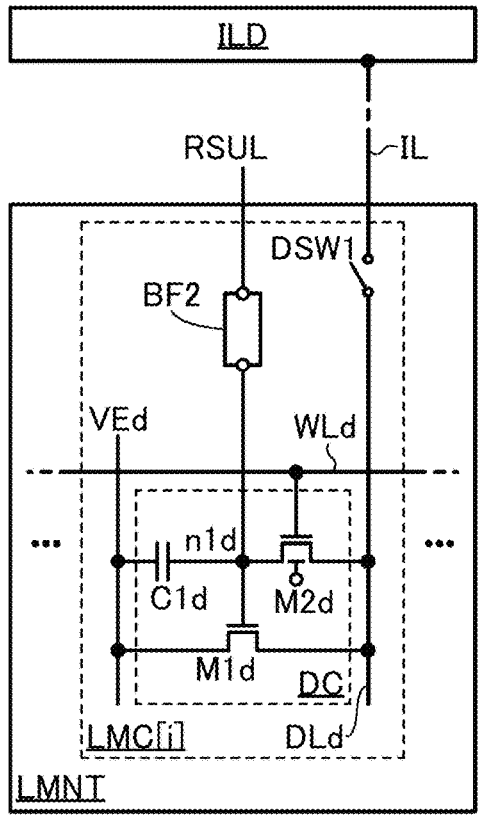

For example, as in the circuit LMNT illustrated in FIG. 18C, a circuit BF2 that functions as a buffer circuit may be provided instead of the circuit CMPD. Specifically, in the circuit LMNT in FIG. 18C, an input terminal of the circuit BF2 is electrically connected to the first terminal of the capacitor C1d, the gate of the transistor M1d, and the first terminal of the transistor M2d, and an output terminal of the circuit BF2 is electrically connected to the wiring RSUL. The circuit BF2 can include a source follower circuit, a voltage follower circuit using an operational amplifier, or the like, for example.

Figure 18D:
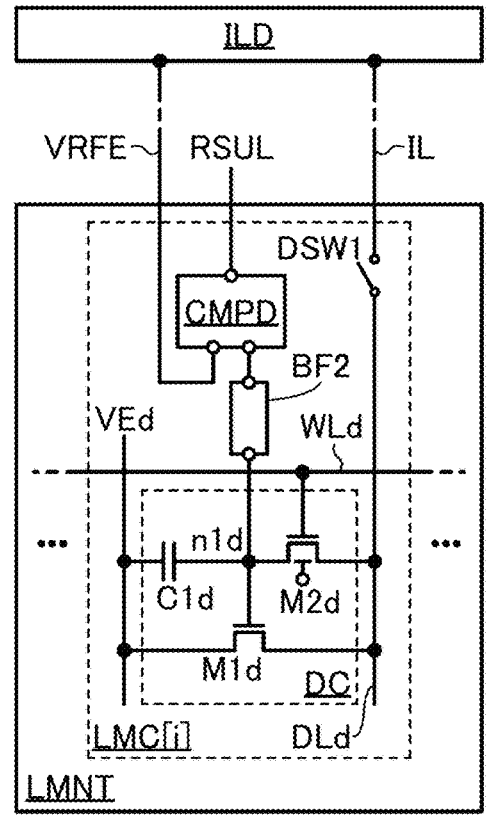

For example, as illustrated in FIG. 18D, the circuit LMNT may include the circuit CMPD and the circuit BF2. Specifically, in the circuit LMNT in FIG. 18D, the input terminal of the circuit BF2 is electrically connected to the first terminal of the capacitor C1d, the gate of the transistor M1d, and the first terminal of the transistor M2d, the output terminal of the circuit BF2 is electrically connected to the first input terminal of the circuit CMPD, the second input terminal of the circuit CMPD is electrically connected to the wiring VRFE, and the output terminal of the circuit CMPD is electrically connected to the wiring RSUL.

Configuration Example 4 of Circuit LMNT and Circuit ILD

Next, a configuration example of the circuit LMNT applicable to the semiconductor device SDV2, which is different from the circuits LMNT in FIG. 16, FIG. 17A, and FIG. 18A to FIG. 18D, is described.

Figure 20A:
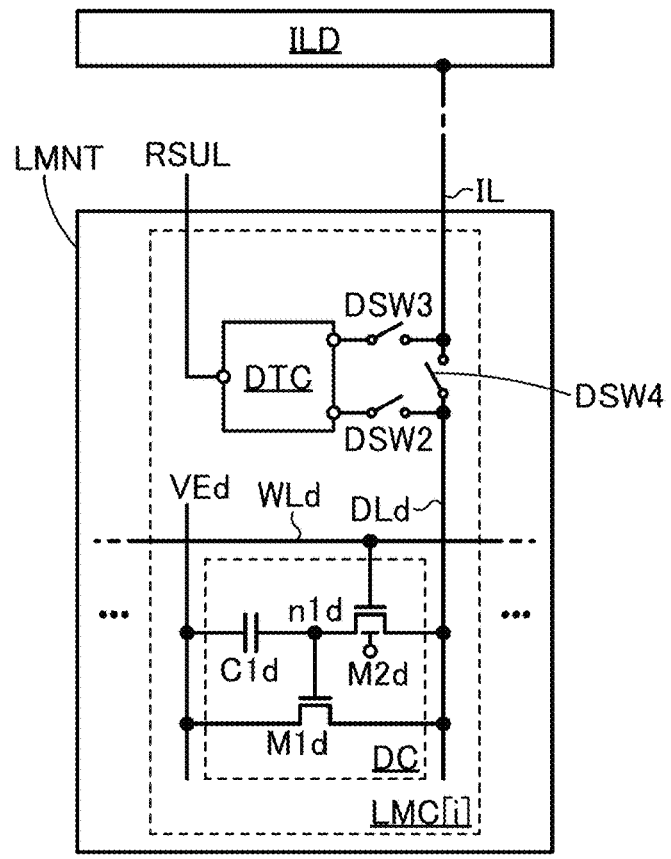
FIG. 20A is a circuit diagram illustrating a configuration example of a semiconductor device.

The circuit LMNT illustrated in FIG. 20A includes the circuit LMC[i] (i is an integer greater than or equal to 1 and less than or equal to a value the same as the number of wirings IL), like the circuit LMNT in FIG. 16. Note that the circuit LMC[i] in FIG. 20A is different from the circuit LMC[i] in FIG. 16 in that the memory cell DC, the circuit DTC, the switch DSW2, a switch DSW3, and a switch DSW4 are provided. FIG. 20 also illustrates the circuit ILD.

The memory cell DC illustrated in FIG. 20A has a structure similar to that of the memory cell DC in FIG. 16. Thus, the description of the circuit LMNT in FIG. 16 is referred to for the transistor M1d, the transistor M2d, and the capacitor C1d which are included in the memory cell DC in FIG. 16 and the wiring VEd, the wiring WLd, and the wiring DLd which are illustrated in FIG. 20A.

The circuit LMNT in FIG. 20A can includes a plurality of circuits LMC[i], like the circuit LMNT in FIG. 16. Specifically, the circuit LMNT can have a configuration where the number of circuits LMC[i] arranged in one row is the same as the number of wirings IL electrically connected to the circuit ILD.

As the switch DSW2 to the switch DSW4, a switch applicable to the above-described switch RSW can be used as in the case of the switch DSW1 in FIG. 16, for example.

The wiring IL is electrically connected to a first terminal of the switch DSW4, and a second terminal of the switch DSW4 is electrically connected to the wiring DLd. A first terminal of the switch DSW2 is electrically connected to the wiring DLd, and the first input terminal of the circuit DTC is electrically connected to a second terminal of the switch DSW2. A first terminal of the switch DSW3 is electrically connected to the wiring IL, and the second input terminal of the circuit DTC is electrically connected to the second input terminal of the switch DSW3. The output terminal of the circuit DTC is electrically connected to the wiring RSUL. Although not illustrated, the wiring RSUL is electrically connected to the storage device MEXT.

For the circuit DTC, the description of the circuit DTC included in the circuit LMNT illustrated in FIG. 16 is referred to.

Next, a configuration example of the circuit ILD when the circuit LMNT in FIG. 20A is employed.

Figure 20B:
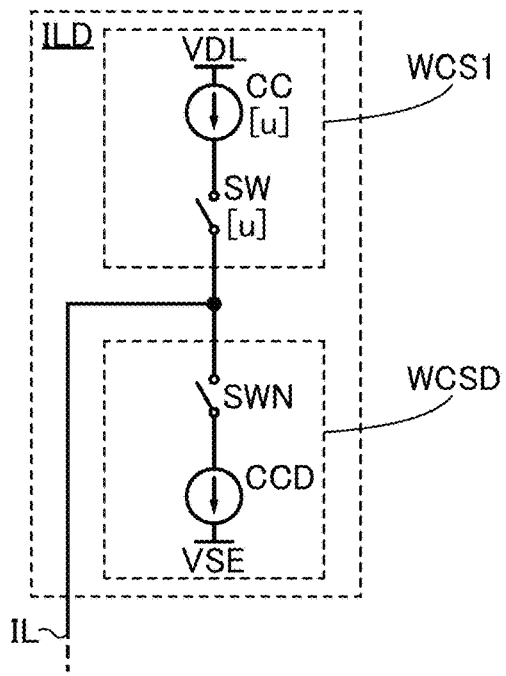
FIG. 20B is a circuit diagram illustrating a configuration example of a circuit included in the semiconductor device.

FIG. 20B illustrates a configuration example of the circuit ILD in the case where the circuit LMNT in FIG. 20A is employed, and includes the circuit WCS1 and a circuit WCSD.

The circuit WCS1 illustrated in FIG. 20B is part of the circuit WCS1 in FIG. 2A from which a circuit element relating to writing to the memory cell DC is excerpted. Specifically, the current source CC[u] and the switch SW[u] which are excerpt from FIG. 2A are illustrated in the circuit WCS1 in FIG. 20B. At this time, the switch SW[1] to the switch SW[K], other than the switch SW[u], are in an off state, and current generated by the current source CC[1] to the current source CC[K], other than the current source CC[u], does not flow in the wiring IL.

The circuit WCSD in FIG. 20B includes a current source CCD and a switch SWN. A first terminal of the switch SWN is electrically connected to the second terminal of the switch SW[u] and the wiring IL, a second terminal of the switch SWN is electrically connected to an input terminal of the current source CCD, and an output terminal of the current source CCD is electrically connected to the wiring VSE.

As the switch SWN, a switch applicable to the above-described switch RSW can be used. When a transistor is used as an electrical switch for the switch SWN, an n-channel transistor is preferably used.

The current source CCD preferably includes an n-channel transistor in which a gate is supplied with a bias voltage and a source is supplied with a low-level potential or a ground potential (potential supplied by the wiring VSE).

The amount of current generated by the current source CCD is smaller than the amount of current generated by the current source CC[u]. Specifically, on the assumption that the amount of current generated by the current source CC[u] is $I_0$, the amount of current generated by the current source CCD can be 0.95 times, 0.90 times, 0.80 times, or the like of the amount of current $I_0$, for example. Hereinafter, the current generated by the current source CCD is referred to as reference current.

Next, an operation example of the circuit LMNT in FIG. 20A is described.

First, in the circuit LMC[i], the switch DSW4 is turned on, the switch DSW2 and the switch DSW3 are turned off, and the transistor M2d is turned on. In this state, in FIG.

20B, the switch SW[u] is turned on, and the switch SWN is turned off. Accordingly, the amount of current $I_0$ flows from the circuit ILD to the memory cell DC through the wiring IL. Next, as in the circuit LMNT in FIG. 16, the voltage $V_{nd}$ is written to the first terminal of the capacitor C1d in the memory cell DC, so that the transistor M2d is turned off, and the voltage of the node n1d is retained.

At this time, current for initialization, the amount of which is $I_0$, flows between the first terminal and the second terminal of the transistor M1d (between the wiring DLd and the wiring VEd). After that, the switch DSW1 is turned off, so that current flowing between the first terminal and the second terminal of the transistor M1d is stopped.

When monitoring current flowing between the first terminal and the second terminal of the transistor M1d starts, the switch DSW4 is brought into an off state, and the switch DSW2 is brought into an on state. Accordingly, the amount of current $I_0$ flowing between the first terminal and the second terminal of the transistor M1d is supplied from the first input terminal of the circuit DTC to the wiring VEd through the switch DSW2 and the wiring DLd.

At a timing when the switch DSW2 is turned on, the switch DSW3 is turned on. In FIG. 20B, the switch SW[u] is turned off, and the switch SWN is turned on. Accordingly, the reference current flows from the second input terminal of the circuit DTC to the wiring VSE through the switch DSW3, the wiring IL, and the switch SWN.

When the $V_{nd}$ retained at the first terminal of the capacitor C1d is reduced by leakage of electric charge or the like, the amount of current flowing between the first terminal and the second terminal of the transistor M1d is reduced from $I_0$. When the amount of current flowing from the first input terminal of the circuit DTC to the wiring VEd is reduced to be less than or equal to the amount of reference current flowing from the wiring IL or less than the amount of reference current, the circuit DTC makes a determination that the data retained in the memory cell DC is degraded, thereby transmitting an instruction signal (e.g., pulse signal), to the storage device MEXT, for reading data that is to be rewritten to the multiplier cell in the arithmetic portion CLP and transmitting the data to the circuit ILD.

After that, the operation similar to that of the circuit LMNT in FIG. 16 is performed; receiving the instruction signal, the storage device MEXT reads data retained in the storage device MEXT and transmits the information to the semiconductor device SDV2. Then, in the semiconductor device SDV2, the information is written to the multiplier cell included in the arithmetic portion CLP by the circuit ILD, and the original voltage (or current) is written to the memory cell DC. Accordingly, data rewriting (supply of electric charge) can be performed with respect to degraded data retained in the memory cell DC and the multiplier cell in the arithmetic portion CLP.

With use of the structure illustrated in FIG. 20A for the semiconductor device SDV2, the degradation of data (a reduction in the absolute value of the charge amount by the leakage current) retained in the storage element in the multiplier cell in the arithmetic portion CLP can be easily sensed. Sensing enables data rewriting (supply of electric charge) to the multiplier cell in the arithmetic portion CLP and the memory cell DC.

Configuration Example 5 of Circuit LMNT and Circuit ILD

Next, a configuration example of the circuit LMNT applicable to the semiconductor device SDV2 in FIG. 15, which is different from the circuits LMNT in FIG. 15, FIG. 17A, FIG. 18A to FIG. 18D, and FIG. 20A, is described.

Figure 21A:
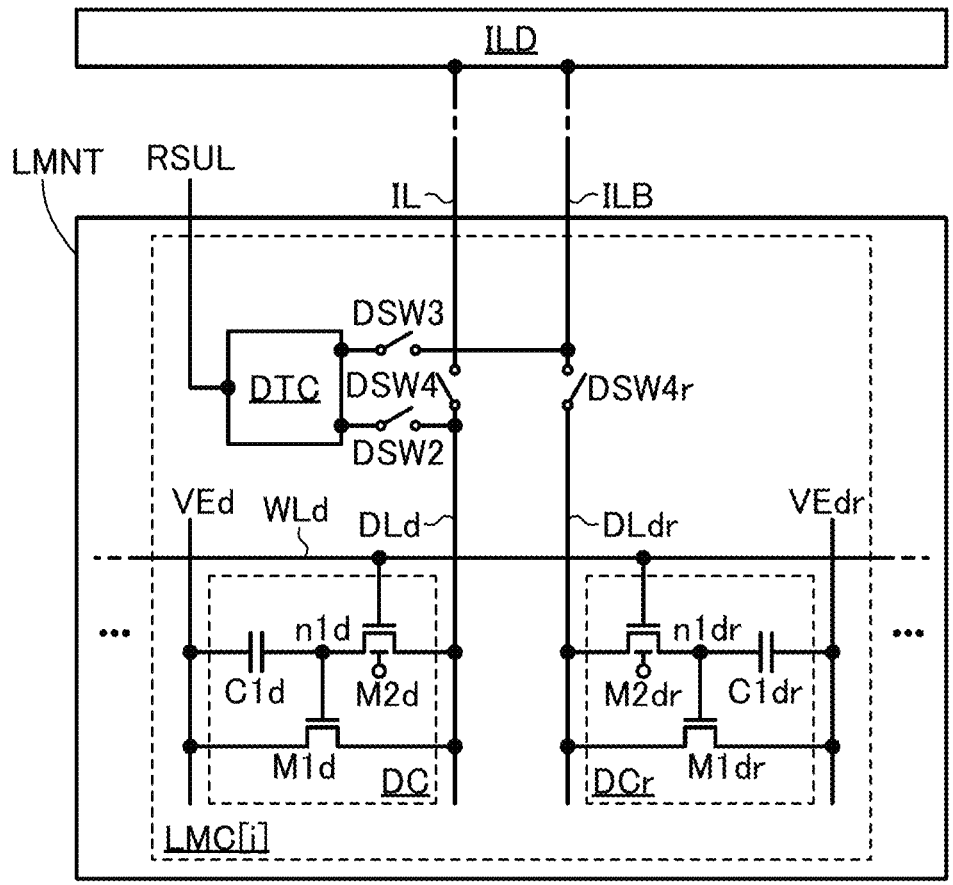
FIG. 21A is a circuit diagram illustrating a configuration example of a semiconductor device.

The circuit LMNT illustrated in FIG. 21A includes the circuit LMC[i] (i is an integer greater than or equal to 1 and less than or equal to a value the same as the number of wirings IL) and a circuit LMCr[i]. The circuit LMC[i] includes the memory cell DC, a memory cell DCr, the circuit DTC, the switch DSW1, the switch DSW2, the switch DSW3, the switch DSW4, and a switch DSW4r. FIG. 21A also illustrates the circuit ILD.

The memory cell DC includes the transistor M1d, the transistor M2d, and the capacitor C1d. The memory cell DCr may have a structure similar to that of the memory cell DC or different from that of the memory cell DC. In FIG. 21A, the memory cell DCr may have a structure similar to that of the memory cell DC. Thus, in order to distinguish from the memory cell DC, "r" is added to the reference numeral of the memory cell DCr. In addition, "r" is added to the reference numerals of circuit elements included in the circuit MCr and described below. For example, a transistor M1dr, a transistor M2dr, and a capacitor C1dr included in the memory cell DCr illustrated in FIG. 21A correspond to the transistor M1d, the transistor M2d, and the capacitor C1d included in the memory cell DC. For example, a wiring VEdr and a wiring DLdr that are electrically connected to the memory cell DCr illustrated in FIG. 21A correspond to the wiring VEd and the wiring DLd that are electrically connected to the memory cell DC.

The memory cell DC illustrated in FIG. 21A has a structure similar to that of the memory cell DC illustrated in FIG. 16. Thus, the description of the circuit LMNT in FIG. 16 is referred to for the transistor M1d, the transistor M2d, and the capacitor C1d which are included in the memory cell DC in FIG. 21A and the wiring VEd, the wiring WLd, and the wiring DLd which are illustrated in FIG. 21A.

The circuit LMNT in FIG. 21A can includes a plurality of circuits LMC[i], like the circuit LMNT in FIG. 16. Specifically, the circuit LMNT can have a configuration where the number of circuits LMC[i] arranged in one row is the same as the number of wirings IL electrically connected to the circuit ILD.

As the switch DSW2, the switch DSW3, the switch DSW4, and the switch DSW4, a switch applicable to the above-described switch RSW can be used, as in the case of the switch DSW1 in FIG. 16, for example.

The circuit ILD is electrically connected to the wiring IL and the wiring ILB.

The wiring IL is electrically connected to the first terminal of the switch DSW4, and the second terminal of the switch DSW4 is electrically connected to the wiring DLd. The wiring DLd is electrically connected to the first terminal of the switch DSW2, the second terminal of the switch DSW2 is electrically connected to the first input terminal of the circuit DTC, and the output terminal of the circuit DTC is electrically connected to the wiring RSUL. The wiring ILB is electrically connected to a first terminal of the switch DSW3 and a first terminal of the switch DSW4r, and a second terminal of the switch DSW4r is electrically connected to the wiring DLdr. The second input terminal of the circuit DTC is electrically connected to a second terminal of the switch DSW3. The output terminal of the circuit DTC is electrically connected to the wiring RSUL. Although not illustrated, the wiring RSUL is electrically connected to the storage device MEXT.

For the circuit DTC, the description of the circuit DTC illustrated in FIG. 17A is referred to.

Next, a configuration example of the circuit ILD in the case where the circuit LMNT in FIG. 21A is employed is described.

Figure 21B:
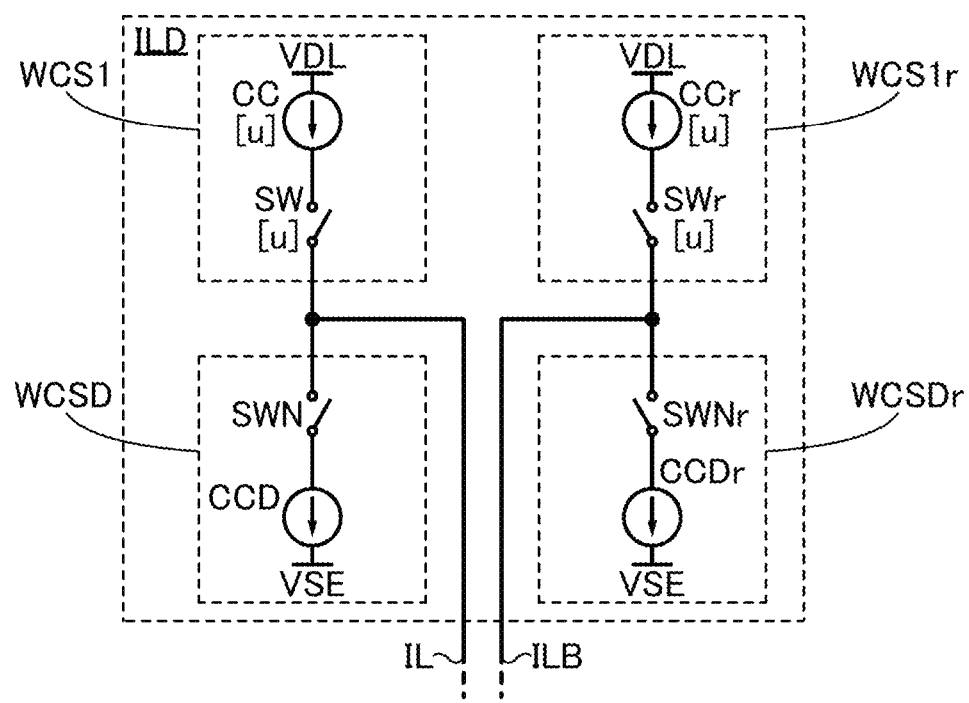
FIG. 21B is a circuit diagram illustrating a configuration example of a circuit included in the semiconductor device.

FIG. 21B illustrates a configuration example of the circuit ILD in the case where the circuit LMNT in FIG. 21A is employed, and includes the circuit WCS1, a circuit WCS1r, the circuit WCSD, and a circuit WCSDr.

Structures of the circuit WCS1 and the circuit WCSD illustrated in FIG. 21B are comparable to those of the circuit WCS1 and the circuit WCSD illustrated in FIG. 20B. Thus, the description of the circuit WCS1 and the circuit WCSD in FIG. 20B is referred to for the circuit WCS1 and the circuit WCSD in FIG. 21B Structures of the circuit WCS1r and the circuit WCSDr illustrated in FIG. 21B are comparable to those of the circuit WCS1 and the circuit WCSD in FIG. 21B. Thus, in order to distinguish from the circuit WCS1 and the circuit WCSD, "r" is added to the reference numerals of the circuit WCS1r and the circuit WCSDr. For example, a current source CCr[u] and a switch SWr[u] included in the circuit WCS1r illustrated in FIG. 21B correspond to the current source CC[u] and the switch SW[u] included in the circuit WCS1. In addition, for example, a current source CCDr[u] and a switch SWNr[u] included in the circuit WCSDr illustrated in FIG. 21B correspond to the current source CCD[u] and the switch SWN[u] included in the circuit WCSD.

The wiring IL is electrically connected to the second terminal of the switch SW[u] and the first terminal of the switch SWN. The wiring ILB is electrically connected to a second terminal of the switch SWr[u] and a first terminal of the switch SWNr.

Next, an operation example of the circuit LMNT in FIG. 21A is described.

First, in the circuit LMC[i], the switch DSW4 is turned on, the switch DSW2 and the switch DSW3 are turned off, and the transistor M2d is turned on. At this time, in FIG. 21B, the switch SW[u] is turned on, and the switch SWN is turned off. Thus, current the amount of which is $I_0$ flows from the circuit ILD to the memory cell DC through the wiring IL. Next, as in the case of the circuit LMNT in FIG. 16, the voltage $V_{nd}$ is written to the first terminal of the capacitor C1d in the memory cell DC, so that the transistor M2d is turned off, and the voltage of the node n1d is retained.

At this time, current for initialization, the amount of which is $I_0$, flows between the first terminal and the second terminal of the transistor M1d (between the wiring DLd and the wiring VEd). After that, the switch DSW1 is turned off, so that current flowing between the first terminal and the second terminal of the transistor M1d is stopped.

When monitoring current flowing between the first terminal and the second terminal of the transistor M1d starts, the switch DSW4 is brought into an off state, and the switch DSW2 is brought into an on state. Accordingly, the amount of current $I_0$ is supplied from the first input terminal of the circuit DTC to the wiring VEd through the switch DSW2, the wiring DLd, and the transistor M1d.

At a timing when the switch DSW2 is turned on, the switch DSW3 is turned on, and the switch DSW4r is turned off. In FIG. 21B, the switch SWr[u] is turned off, and the switch SWNr is turned on. Accordingly, the reference current flows from the second input terminal of the circuit DTC to the wiring VSE through the switch DSW3, the wiring ILB, and the switch SWNr.

When the potential $V_{nd}$ retained at the first terminal of the capacitor C1d is reduced by leakage of electric charge or the like, the amount of current flowing between the first terminal and the second terminal of the transistor M1d is reduced from $I_0$. When the amount of current flowing from the first input terminal of the circuit DTC to the wiring VEd is reduced to be less than or equal to the amount of reference current flowing from the wiring IL or less than the amount of reference current, the circuit DTC makes a determination that the data retained in the memory cell DC is degraded, thereby transmitting an instruction signal (e.g., pulse signal), to the storage device MEXT, for reading data that is to be rewritten to the multiplier cell in the arithmetic portion CLP and transmitting the data to the circuit ILD.

After that, the operation similar to that of the circuit LMNT in FIG. 16 is performed; receiving the instruction signal, the storage device MEXT reads information retained in the storage device MEXT and transmits the information to the semiconductor device SDV2. Then, in the semiconductor device SDV2, the information is written to the multiplier cell included in the arithmetic portion CLP by the circuit ILD, and the original voltage (or current) is written to the memory cell DC. Accordingly, data rewriting (supply of electric charge) can be performed with respect to degraded data retained in the memory cell DC and the multiplier cell in the arithmetic portion CLP.

With use of the structure illustrated in FIG. 21A for the semiconductor device SDV2, the degradation of data (a reduction in the absolute value of the charge amount by the leakage current) retained in the storage element in the multiplier cell in the arithmetic portion CLP can be easily sensed. Sensing enables data rewriting (supply of electric charge) to the multiplier cell in the arithmetic portion CLP and the memory cell DC.

Configuration Example 6 of Circuit LMNT and Circuit ILD

Next, as a modification example of the circuit LMNT in FIG. 21A, a configuration example of the circuit LMNT applicable to the semiconductor device SDV2 in FIG. 15 is described.

Figure 22A:
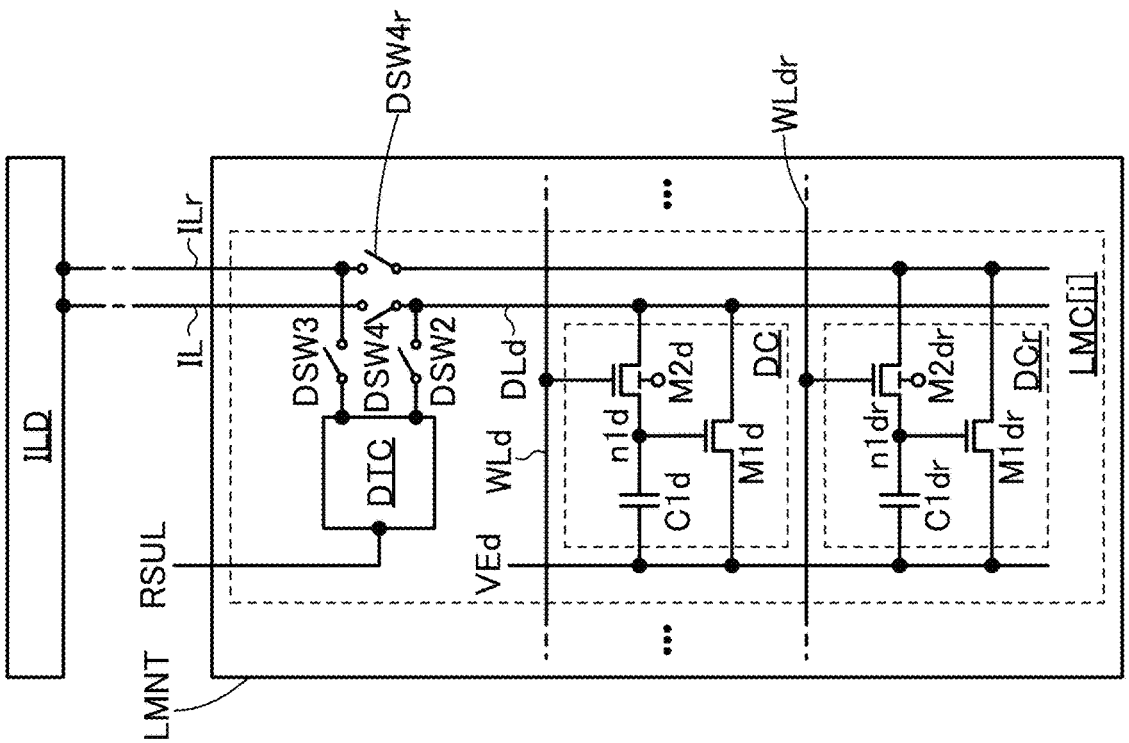
FIG. 22A and FIG. 22B are circuit diagrams each illustrating a configuration example of a semiconductor device.

The circuit LMNT illustrated in FIG. 22A is a modification example of the circuit LMNT illustrated in FIG. 21A, where the gate of the transistor M2d included in the memory cell DC is electrically connected to the wiring WLd, and the gate of the transistor M2dr included in the memory cell DCr is electrically connected to the wiring WLdr. In other words, the circuit LMNT in FIG. 22A has a configuration such that the gate of the transistor M2d and the gate of the transistor M2dr are not directly connected to each other. Thus, for portions of the circuit LMNT illustrated in FIG. 22A, which are common to those in the circuit LMNT in FIG. 21A, the description of the circuit LMNT in FIG. 21A is referred to.

As the circuit ILD in the circuit LMNT in FIG. 22A, the circuit ILD illustrated in FIG. 21B can be used, for example. Hereinafter, the description of the circuit ILD in FIG. 22A is made on the assumption that the circuit ILD in FIG. 21B is employed.

Next, an operation example of the circuit LMNT in FIG. 22A is described.

First, in the circuit LMC[i], the switch DSW4 is turned on, and the switch DSW2 is turned off. Next, a high-level potential is supplied to the wiring WLd, so that the transistor M2d is turned on. At this time, in FIG. 21B, the switch SW[u] is turned on, and the switch SWN is turned off. Thus, current the amount of which is $I_0$ flows from the circuit ILD to the memory cell DC through the wiring IL. Next, as in the case of the circuit LMNT in FIG. 16, the voltage $V_{nd}$ is written to the first terminal of the capacitor C1d in the memory cell DC, and a low-level potential is supplied to the wiring WLd, so that the transistor M2d is turned off, and the voltage of the node n1d is retained.

At this time, current for initialization, the amount of which is $I_0$, flows between the first terminal and the second terminal of the transistor M1d (between the wiring DLd and the wiring VEd). After that, the switch DSW1 is turned off, so that current flowing between the first terminal and the second terminal of the transistor M1d is stopped.

When monitoring current flowing between the first terminal and the second terminal of the transistor M1d starts, the switch DSW4r is brought into an off state, and the switch DSW3 is brought into an on state. Next, a high-level potential is applied to the wiring WLdr, so that the transistor M2dr is brought into an on state. At this time, in FIG. 21B, the switch SWr[u] is turned off, and the switch SWNr is turned on. Accordingly, the reference current flows from the circuit ILD to the transistor M1dr in the memory cell DCr through the wiring ILB. The potential of the node n1dr at this time is $V_{REF}$. Then, a low-level potential is applied to the wiring WLdr, so that the transistor M2dr is turned off, and the voltage $V_{REF}$ is retained at the node n1dr.

After that, the switch DSW4 is tuned off, and the switch DSW2 is turned on. Thus, current the amount of which is $I_0$ flows from the first input terminal of the circuit DTC to the wiring VEd through the switch DSW2, the wiring DLd, and the transistor M1d. Furthermore, the reference current flows from the second input terminal of the circuit DTC to the wiring VEdr through the witch DSW3, the switch DSW4r, the wiring DLdr, and the transistor M1dr.

When the potential $V_{nd}$ retained at the first terminal of the capacitor C1d is reduced by leakage of electric charge or the like, the amount of current flowing between the first terminal and the second terminal of the transistor M1d is reduced from $I_0$. When the amount of current flowing from the first input terminal of the circuit DTC to the wiring VEd is reduced to be less than or equal to the amount of reference current flowing from the second input terminal of the circuit DTC to the wiring VEdr or less than the amount of reference current, the circuit DTC makes a determination that the data retained in the memory cell DC is degraded, thereby transmitting an instruction signal (e.g., pulse signal), to the storage device MEXT, for reading data that is to be rewritten to the multiplier cell in the arithmetic portion CLP and transmitting the data to the circuit ILD.

After that, the operation similar to that of the circuit LMNT in FIG. 16 is performed; receiving the instruction signal, the storage device MEXT reads information retained in the storage device MEXT and transmits the information to the semiconductor device SDV2. Then, in the semiconductor device SDV2, the information is written to the multiplier cell included in the arithmetic portion CLP by the circuit ILD, and the original voltage (or current) is written to the memory cell DC. Accordingly, data rewriting (supply of electric charge) can be performed with respect to degraded data retained in the memory cell DC and the multiplier cell in the arithmetic portion CLP.

With use of the structure illustrated in FIG. 22A for the semiconductor device SDV2, the degradation of data (a reduction in the absolute value of the charge amount by the leakage current) retained in the storage element in the multiplier cell in the arithmetic portion CLP can be easily sensed. Sensing enables data rewriting (supply of electric charge) to the multiplier cell in the arithmetic portion CLP and the memory cell DC.

In the above operation example, the voltage $V_{REF}$ is retained in the memory cell DCr; thus, the degradation of data (the voltage $V_{REF}$ degradation or a reduction in the absolute value of the charge amount) in the memory cell DCr is caused in some cases. In that case, monitoring current flowing between the first terminal and the second terminal of the transistor M1d starts immediately after the voltage $V_{REF}$ is retained in the memory cell DCr, whereby the influence of the data degradation can be made small.

The configuration of the circuit LMNT according to one embodiment of the present invention is not limited to the circuit configuration illustrated in FIG. 22A. As the configuration of the circuit LMNT, the included circuit elements, the connection structures, and the like may be changed depending on the circumstances or conditions.

Figure 22B:
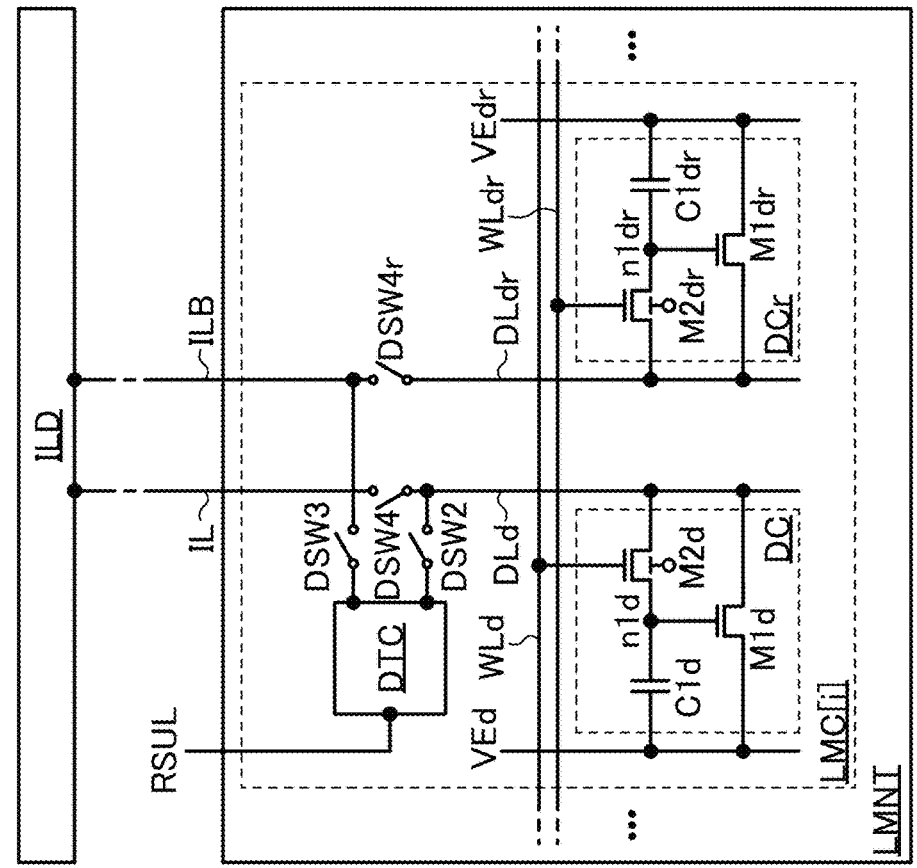

For example, the circuit LMNT may have a configuration such that the memory cell DC and the memory cell DCr are arranged not in one row but in one column as illustrated in FIG. 22B. In FIG. 22B, instead of the wiring VEdr, the wiring VEd is electrically connected to the memory cell DCr. Therefore, the wiring VEd and the wiring VEdr which are illustrated in FIG. 22A can be combined to one wiring when the circuit LMNT is modified to have the configuration in FIG. 22B.

The memory cell DC may be included not in the circuit LMNT but in the arithmetic portion CLP, for example. In this case, the memory cell DC is preferably formed with the multiplier cell (a circuit MC, a circuit MCr, or the like described in Embodiment 2). Alternatively, the multiplier cell (the circuit MC, the circuit MCr, or the like described in Embodiment 2) in the arithmetic portion CLP may be used as the memory cell DC.

As the structure of the semiconductor device SDV2, any of the above structures illustrated in FIG. 16, FIG. 17A, FIG. 18A to FIG. 18D, FIG. 21A, FIG. 22A, FIG. 22B, and the like may be selected and combined.

Figure 23:
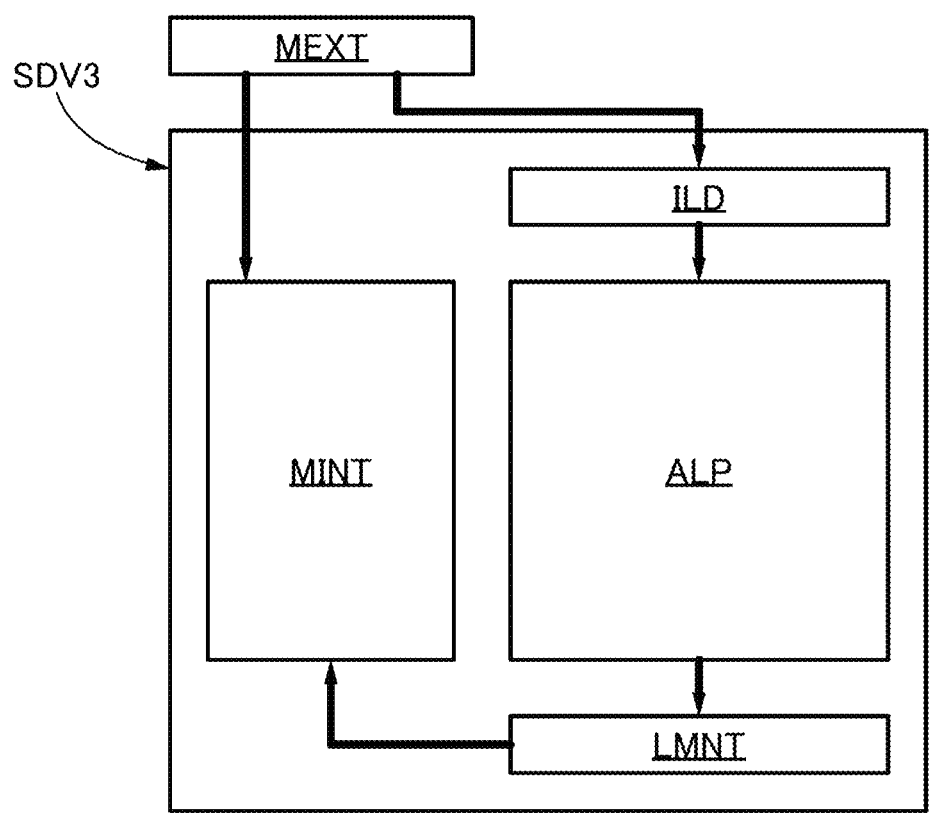
FIG. 23 is a block diagram illustrating a structure example of a semiconductor device.

In this embodiment, the structure example of the semiconductor device SDV1 illustrated in FIG. 1A to FIG. 1C and the structure example of the semiconductor device illustrated in FIG. 15 are described; however, one embodiment of the present invention is not limited thereto. One embodiment of the present invention may have a structure where the semiconductor device SDV1 includes the circuit LMNT included in the semiconductor device SDV2 as illustrated in FIG. 23, as a semiconductor device SDV3. In other words, the structure example of the semiconductor device SDV1 described in this embodiment can be combined with the structure example of the semiconductor device SDV2 as appropriate.

In the case where information (e.g., current, voltage, or the like) retained in a circuit included in the arithmetic portion CLP is changed by leakage or the like, it is preferable that operation of refresh or rewriting be regularly performed on the circuit. Specifically, when the information (e.g., current, voltage, or the like) retained in a circuit included in the arithmetic portion CLP is changed, for example, the information read from the storage device MINT may be transmitted to the circuit ILD again, and the circuit ILD may supply current (voltage in some cases) comparable to the information to the circuit.

Note that this embodiment can be combined with any of the other embodiments in this specification as appropriate.

Embodiment 2

In this embodiment, an example of the arithmetic portion CLP described in the above embodiment will be described.
<Hierarchical Neural Network>

Figure 24A:
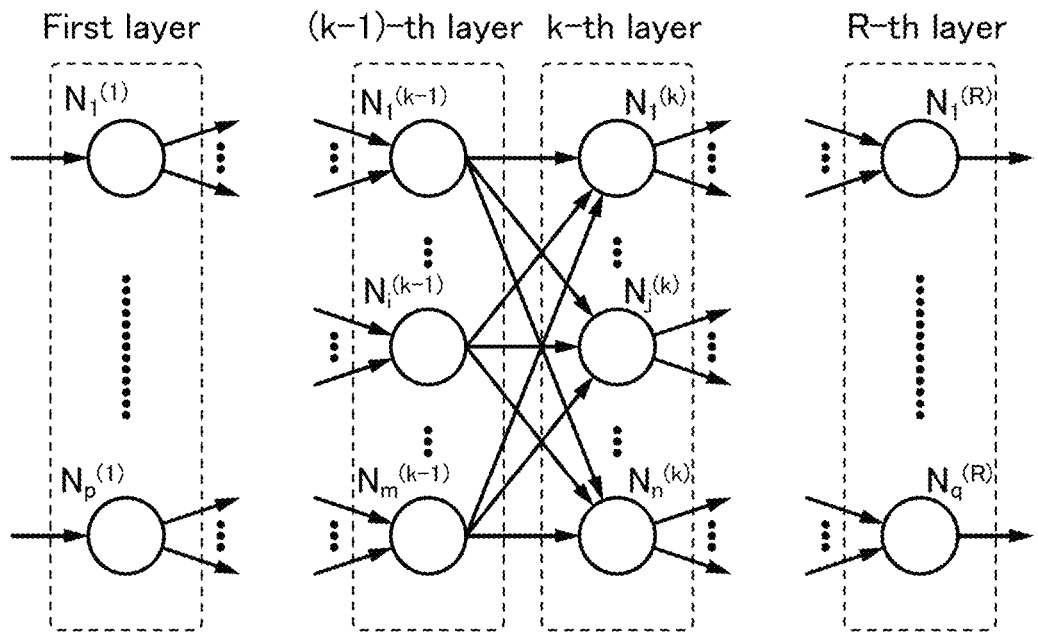
FIG. 24A and FIG. 24B are diagrams illustrating hierarchical neural networks.

Before, the arithmetic circuit is described, a hierarchical neural network is described. A hierarchical neural network includes one input layer, one or a plurality of intermediate layers (hidden layers), and one output layer, for example, and is configured with a total of at least three layers. A hierarchical neural network 100 illustrated in FIG. 24A is one example, and the neural network 100 includes a first layer to an R-th layer (here, R can be an integer greater than or equal to 4). Specifically, the first layer corresponds to the input layer, the R-th layer corresponds to the output layer, and the other layers correspond to the intermediate layers. Note that FIG. 24A illustrates the (k−1)-th layer and the k-th layer (here, k is an integer greater than or equal to 3 and less than or equal to R−1) as the intermediate layers, and does not illustrate the other intermediate layers.

Each of the layers of the neural network 100 includes one or a plurality of neurons. In FIG. 24A, the first layer includes a neuron $N_1^{(1)}$ to a neuron $N_p^{(1)}$ (here, p is an integer greater than or equal to 1); the (k−1)-th layer includes a neuron $N_1^{(k-1)}$ to a neuron $N_m^{(k-1)}$ (here, m is an integer greater than or equal to 1); the k-th layer includes a neuron $N_1^{(k)}$ to a neuron $N_n^{(k)}$ (here, n is an integer greater than or equal to 1); and the R-th layer includes a neuron $N_1^{(R)}$ to a neuron $N_q^{(R)}$ (here, q is an integer greater than or equal to 1).

FIG. 24A illustrates a neuron $N_i^{(k-1)}$ (here, i is an integer greater than or equal to 1 and less than or equal to m) in the (k−1)-th layer and a neuron $N_j^{(k)}$ (here, j is an integer greater than or equal to 1 and less than or equal to n) in the k-th layer, in addition to the neuron $N_1^{(1)}$, the neuron $N_p^{(1)}$, the neuron $N_1^{(k-1)}$, the neuron $N_m^{(k-1)}$, the neuron $N_1^{(k)}$, the neuron $N_n^{(k)}$, the neuron $N_1^{(R)}$, and the neuron $N_q^{(R)}$; the other neurons are not illustrated.

Next, signal transmission from a neuron in one layer to a neuron in the subsequent layer and signals input to and output from the neurons are described. Note that description here is made focusing on the neuron $N_j^{(k)}$ in the k-th layer.

Figure 24B:
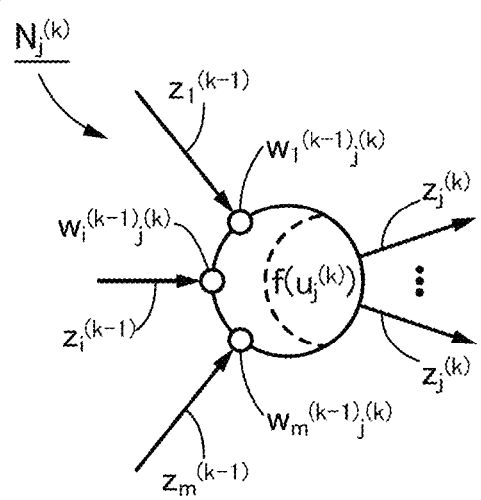

FIG. 24B illustrates the neuron $N_j^{(k)}$ in the k-th layer, signals input to the neuron $N_j^{(k)}$ and a signal output from the neuron $N_j^{(k)}$.

Specifically, $z_1^{(k-1)}$ to $z_m^{(k-1)}$ that are output signals from the neuron $N_1^{(k-1)}$ to the neuron $N_m^{(k-1)}$ in the (k−1)-th layer are output to the neuron $N_j^{(k)}$. Then, the neuron $N_j^{(k)}$ generates $z_j^{(k)}$ in accordance with $z_1^{(k-1)}$ to $z_m^{(k-1)}$, and outputs $z_j^{(k)}$ as the output signal to the neurons in the (k−1)-th layer (not illustrated).

The efficiency of transmitting a signal input from a neuron in one layer to a neuron in the subsequent layer depends on the connection strength (hereinafter, referred to as a weight coefficient) of the synapse that connects the neurons to each other. In the neural network 100, a signal output from a neuron in one layer is multiplied by the corresponding weight coefficient and then is input to a neuron in the subsequent layer. When i is an integer greater than or equal to 1 and less than or equal to m and the weight coefficient of the synapse between the neuron $N_i^{(k-1)}$ in the (k−1)-th layer and the neuron $N_j^{(k)}$ in the k-th layer is $w_i^{(k-1)(k)}_j$, a signal input to the neuron $N_j^{(k)}$ in the k-th layer can be expressed by Formula (2.1).

[Formula 1]

$$w_i^{(k-1)(k)}_j \cdot z_i^{(k-1)} \tag{2.1}$$

That is, when the signals are transmitted from the neuron $N_1^{(k-1)}$ to the neuron $N_m^{(k-1)}$ in the (k−1)-th layer to the neuron $N_j^{(k)}$ in the k-th layer, the signals $z_1^{(k-1)}$ to $z_m^{(k-1)}$ are multiplied by the corresponding weight coefficients $w_1^{(k-1)(k)}_j$ to $w_m^{(k-1)(k)}_j$. Then, $w_1^{(k-1)(k)}_j \cdot z_1^{(k-1)}$ to $w_m^{(k-1)(k)}_j \cdot z_m^{(k-1)}$ are input to the neuron $N_j^{(k)}$ in the k-th layer. At this time, the total sum $u_j^{(k)}$ of the signals input to the neuron $N_j^{(k)}$ in the k-th layer is expressed by Formula (2.2).

[Formula 2]

$$u_j^{(k)} = \sum_{i=1}^{m} w_i^{(k-1)(k)}_j \cdot z_i^{(k-1)} \tag{2.2}$$

In addition, a bias may be added to the product-sum result of the weight coefficients $w_1^{(k-1)(k)}_j$ to $w_m^{(k-1)(k)}_j$ and the signals $z_1^{(k-1)}$ to $z_m^{(k-1)}$ of the neurons. When the bias is denoted by b, Formula (2.2) can be rewritten to the following formula.

[Formula 3]

$$u_j^{(k)} = \sum_{i=1}^{m} w_i^{(k-1)(k)}_j \cdot z_i^{(k-1)} + b \tag{2.3}$$

The neuron $N_j^{(k)}$ generates the output signal $z_j^{(k)}$ in accordance with $u_j^{(k)}$. Here, the output signal $z_j^{(k)}$ from the neuron $N_j^{(k)}$ is defined by the following formula.

[Formula 4]

$$z_j^{(k)} = f(u_j^{(k)}) \tag{2.4}$$

A function $f(u_j^{(k)})$ is an activation function in a hierarchical neural network, and a step function, a ramp function (ReLU function), a sigmoid function, a tanh function, a softmax function, or the like can be used. Note that the activation function may be the same or different among all neurons. In addition, the neuron activation function may be the same or different between the layers.

Signals output from the neurons in the layers, the weight coefficients w, or the bias b may be an analog value or a digital value. For example, a binary or ternary digital value may be used as the digital value. A value having a larger number of bits may be used. In the case of an analog value, for example, a linear ramp function, a sigmoid function, or the like may be used as an activation function. In the case of a binary digital value, for example, a step function with an output of −1 or 1 or an output of 0 or 1 is used. Alternatively, the neurons in the layers may each output a ternary or higher-level signal; for example, as an activation function that outputs a ternary value, a step function with an output of −1, 0, or 1 or a step function with an output of 0, 1, or 2 is used, for example. Furthermore, as an activation function for outputting quinary values, a step function with an output of −2, −1, 0, 1, or 2 may be used, for example. The use of a digital value as at least one of the signals output from the neurons in the layers, the weight coefficient w, and the bias b enables a reduction of the circuit scale, a reduction of power consumption, or an increase of arithmetic operation speed, for example. Furthermore, the use of an analog value as at least one of the signals output from the neurons in the layers, the weight coefficient w, and the bias b can improve the arithmetic operation accuracy.

The neural network 100 performs operation in which by input of an input signal to the first layer (the input layer), output signals are sequentially generated in the layers from the first layer (the input layer) to the last layer (the output layer) according to Formula (2.1), Formula (2.2) (or Formula (2.3)), and Formula (2.4) on the basis of the signals input from the previous layers, and the output signals are output to the subsequent layers. The signal output from the last layer (the output layer) corresponds to the calculation results of the neural network 100.

Configuration Example 1 of Arithmetic Circuit

Described here is an example of an arithmetic circuit that is capable of performing the arithmetic operation of Formula (2.2) (or Formula (2.3)) and Formula (2.4) in the above-described neural network 100. Note that in the arithmetic circuit, for example, a weight coefficient of a synapse circuit of the neural network 100 has binary values (e.g., a combination of "−1" and "+1" or a combination of "0" and "+1"), ternary values (e.g., a combination of "−1", "0", and "1"), or multilevels of quaternary or more values (e.g., in the case of quinary values, a combination of "−2", "−1", "0", "1", and "2"), and a neuron activation function is a function that outputs binary values (e.g., a combination of "−1" and "+1" or a combination of "0" and "+1"), ternary values (e.g., a combination of "−1", "0", and "1"), or multilevels of quaternary or more values (e.g., in the case of quaternary values, a combination of "0", "1", "2", and "3"). In this specification and the like, one of a weight coefficient and a value of a signal (sometimes referred to as an arithmetic value) input from a neuron in one layer to a neuron in the subsequent layer is referred to as first data, and the other is referred to as second data in some cases. Note that the arithmetic value and the weight coefficient of the synapse circuit of the neural network 100 are not limited to digital values, and an analog value can be used as at least one of them.

Figure 25:
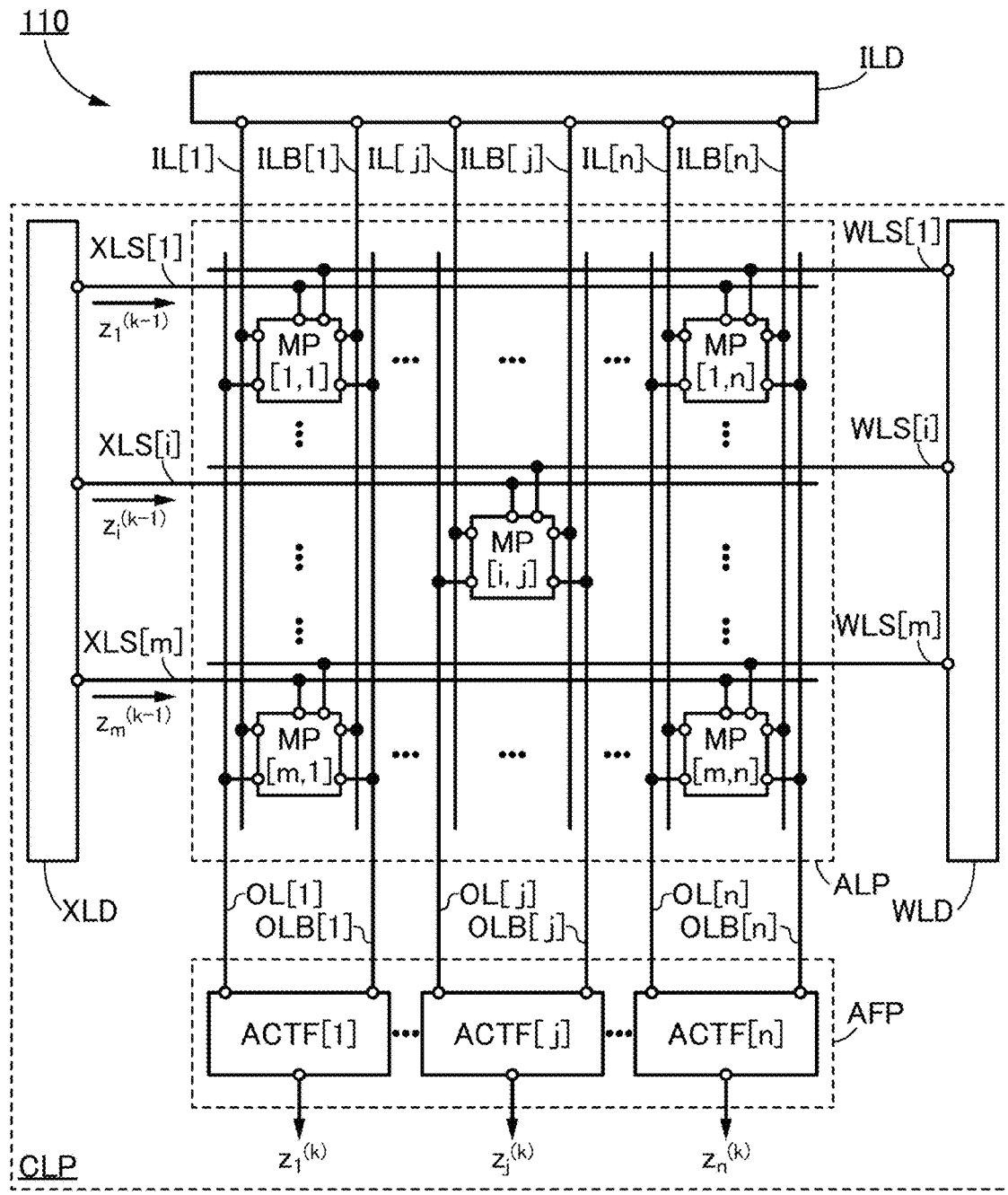
FIG. 25 is a circuit diagram illustrating a configuration example of a circuit included in a semiconductor device.

The arithmetic circuit 110 illustrated in FIG. 25 is a semiconductor device including the circuit ILD and the arithmetic portion CLP as an example. The arithmetic portion CLP includes an array portion ALP, the circuit WLD, a circuit XLD, and a circuit AFP. Note that in FIG. 25, the circuit LMNT electrically connected to the wiring IL and the wiring ILB and a wiring electrically connecting the wiring IL and the wiring ILB with the circuit LMNT are not illustrated. The arithmetic circuit 110 is a circuit that processes the signals $z_1^{(k-1)}$ to $z_m^{(k-1)}$ input to the neuron $N_1^{(k)}$ to the neuron $N_n^{(k)}$ in the k-th layer in FIG. 24A and FIG. 24B and generates signals $z_1^{(k)}$ to $z_n^{(k)}$ respectively output from the neuron $N_1^{(k)}$ to the neuron $N_n^{(k)}$.

Note that the whole of the arithmetic circuit 110 or part thereof may be used for applications other than a neural network (including CNN, RNN (recurrent neural network), and the like performing convolution processing) and AI. For example, in the case where product-sum operation processing, matrix operation processing, or the like is performed in calculation for graphics, scientific calculation, or the like, the processing may be performed using the whole or part of the arithmetic circuit 110. In other words, the whole or part of the arithmetic circuit 110 may be used for not only calculation for AI but also general calculation.

The circuit ILD is electrically connected to the wiring IL[1] to a wiring IL[n] and the wiring ILB[1] to a wiring ILB[n], for example. The circuit WLD is electrically connected to a wiring WLS[1] to a wiring WLS[m], for example. The circuit XLD is electrically connected to a wiring XLS[1] to a wiring XLS[m], for example. The circuit AFP is electrically connected to a wiring OL[1] to a wiring OL[n] and a wiring OLB[1] to a wiring OLB[n], for example.

<<Array Portion ALP>>

The array portion ALP includes m×n circuits MP, for example. The circuits MP are arranged in a matrix of m rows and n columns in the array portion ALP, for example. Note that in FIG. 25, the circuit MP positioned in the i-th row and the j-th column (here, i is an integer greater than or equal to 1 and less than or equal to m, and j is an integer greater than or equal to 1 and less than or equal to n) is denoted by a circuit MP[i,j]. Note that FIG. 25 illustrates only the circuit MP[1,1], the circuit MP[m,1], the circuit MP[i,j], the circuit MP[1,n], and the circuit MP[m,n].

The circuit MP[i,j] is electrically connected to the wiring IL[j], the wiring ILB[j], the wiring WLS[i], the wiring XLS[i], the wiring OL[j], and the wiring OLB[j], for example.

The circuit MP[i,j] has a function of holding a weight coefficient (sometimes referred to as one of the first data and the second data, and here referred to as the first data) between the neuron $N_i^{(k-1)}$ and the neuron $N_j^{(k)}$, for example. Specifically, the circuit MP[i,j] holds information (e.g., a potential, a resistance value, or a current value) corresponding to the first data (a weight coefficient) input from the wiring IL[j] and the wiring ILB[j]. In addition, the circuit MP[i,j] has a function of outputting the product of a signal $z_i^{(k-1)}$ output from the neuron $N_i^{(k-1)}$ (referred to as the other of the first data and the second data in some cases, and here referred to as the second data) and the first data. As a specific example, when the second data $z_i^{(k-1)}$ is input from the wiring XLS[i], the circuit MP[i,j] outputs, to the wiring OL[j] and the wiring OLB[j], information (e.g., a current or a voltage) comparable to the product of the first data and the second data or information (e.g., a current or a voltage) related to the product of the first data and the second data. Note that although FIG. 25 illustrates an example of the case where the wiring IL[U] and the wiring ILB[j] are provided, one embodiment of the present invention is not limited thereto. In one embodiment of the present invention, only one of the wiring IL[j] and the wiring ILB[j] may be provided in the arithmetic circuit 110 in FIG. 25.

Note that a specific configuration example of the circuit MP will be described later.

<<Circuit ILD>>

The circuit ILD has a function of inputting, to the circuit MP[1,1] to the circuit MP[m,n], information (e.g., a potential, a resistance value, or a current value) comparable to first data $w_1^{(k-1)}{}_1^{(k)}$ to $w_m^{(k-1)}{}_n^{(k)}$ that are weight coefficients, through the wiring IL[1] to the wiring IL[n] and the wiring ILB[1] to the wiring ILB[n], for example. As a specific example, the circuit ILD supplies, to the circuit MP[i,j], information (e.g., a potential, a resistance value, or a current value) comparable to the first data $w_i^{(k-1)}{}_j^{(k)}$, through the wiring IL[j] and the wiring ILB[U]. Specifically, the storage device MINT or the storage device MEXT described in Embodiment 1 retains the first data $w_1^{(k-1)}{}_1^{(k)}$ to $w_m^{(k-1)}{}_n^{(k)}$. When the first data is transmitted from the storage device MINT or the storage device MEXT to the circuit ILD, the circuit ILD supplies information (e.g., a potential, a resistance value, or a current value) comparable to one data $w_i^{(k-1)}{}_j^{(k)}$, through the wiring IL[U] and the wiring ILB[j]. Note that a specific circuit configuration of the circuit ILD is described in Embodiment 1 and the like.

<<Circuit XLD>>

The circuit XLD has a function of supplying, to the circuit MP[1,1] to the circuit MP[m,n], second data $z_1^{(k-1)}$ to $z_m^{(k-1)}$ through the wiring XLS[1] to the wiring XLS[m], for example. Specifically, the circuit XLD supplies, to the circuit MP[i,1] to the circuit MP[i,n], information (e.g., a potential or a current value) comparable to the second data $z_i^{(k-1)}$ through the wiring XLS[i]. Although an example of the case where the wiring XLS[i] is provided is described, one embodiment of the present invention is not limited thereto. In one embodiment of the present invention, for example, the arithmetic circuit 110 illustrated in FIG. 25 may have a configuration where information (e.g., a potential or a current value) comparable to the second data $z_i^{(k-1)}$ is supplied through a plurality of wirings XLS[i].

<<Circuit WLD>>

The circuit WLD has a function of selecting the circuit MP to which information (e.g., a potential, a resistance value, or a current value) comparable to the first data input from the circuit ILD is to be written, for example. In the case where information (e.g., a potential, a resistance value, or a current value) is written to the circuit MP[i,1] to the circuit MP[i, n] positioned in the i-th row of the array portion ALP, for example, the circuit WLD supplies, to the wiring WLS[i], a signal for bringing writing switching elements included in the circuit MP[i,1] to the circuit MP[i,n] into an on state or an off state, and supplies, to the other wirings WLS, a potential for bringing writing switching elements included in the circuits MP in rows other than the i-th row into an off state, for example. Although an example of the case where the wiring WLS[i] is provided is described, one embodiment of the present invention is not limited thereto. For example, in addition to the wiring WLS[i], a wiring transmitting an inverted signal of a signal input to the wiring WLS[i] may be additionally provided.

Although FIG. 25 shows a configuration example of the arithmetic circuit 110 provided with the wiring WLS[i], one embodiment of the present invention is not limited thereto. For example, the wiring WLS[i] may be replaced with a plurality of wirings. Furthermore, for example, a plurality of wirings XLS[i] may be provided, and part of the wirings XLS[i] may serve as selection signal lines for writing information to the circuit MP[i,1] to the circuit MP[i,n]. Specifically, as in an arithmetic circuit 130 illustrated in FIG. 26, the wiring XLS[i] of the arithmetic circuit 110 may be replaced with a wiring WX1L[i] and a wiring X2L[i], and the wiring WX1L[i] may be electrically connected to the circuit WLD and the circuit XLD. Note that in the case where a signal for bringing the writing switching elements included in the circuit MP[i,1] to the circuit MP[i,n] into an on state or an off state is supplied from the circuit WLD to the wiring WX1L[i], the circuit XLD preferably has a function of establishing a non-conduction state between the circuit XLD and the wiring WX1L. In addition, in the case where signals of the second data $z_1^{(k-1)}$ to $z_m^{(k-1)}$ are supplied from the circuit WLD to the circuit MP[i,1] to the circuit MP[i,n] through the wiring WX1L[i], the circuit WLD preferably has a function of establishing a non-conduction state between the circuit WLD and the wiring WX1L.

<<Circuit AFP>>

The circuit AFP includes a circuit ACTF[1] to a circuit ACTF[n], for example. The circuit ACTF[j] is electrically connected to the wiring OL[j] and the wiring OLB[j], for example. The circuit ACTF[j] generates, for example, a signal corresponding to information (e.g., a potential or a current value) input from the wiring OL[j] and the wiring OLB[j]. For example, information input from the wiring OL[j] and information input from the wiring OLB[j] (e.g., potentials or current values) are compared and a signal based on the comparison result is generated. That is, the circuit ACTF[1] to the circuit ACTF[n] function as circuits that perform arithmetic operation of an activation function of the above-described neural network, for example. However, one embodiment of the present invention is not limited thereto. For example, the circuit ACTF[1] to the circuit ACTF[n] may have a function of converting an analog signal into a digital signal. Alternatively, for example, the circuit ACTF[1] to the circuit ACTF[n] may have a function of amplifying an analog signal and outputting the amplified signal, i.e., a function of converting output impedance. Alternatively, for example, the circuit ACTF[1] to the circuit ACTF[n] may have a function of converting a current or a charge into a voltage. Alternatively, for example, the circuit ACTF[1] to the circuit ACTF[n] may have a function of initializing potentials of the wiring OL[j] and the wiring OLB[j].

Note that although an example of the case where the circuit ACTF is provided in the arithmetic circuit 110 illustrated in FIG. 25 is described, one embodiment of the present invention is not limited thereto. For example, the circuit ACTF is not necessarily provided in the circuit AFP.

A configuration example of the circuit ACTF will be described later.

<<Circuit MP>>

Figure 27A:
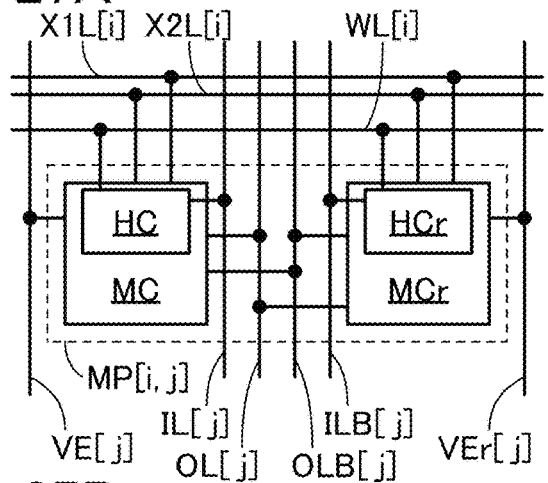
FIG. 27A to FIG. 27C are circuit diagrams each illustrating a configuration example of a circuit included in a semiconductor device.

FIG. 27A illustrates a configuration example of the circuit MP[i, j] that can be used for the arithmetic circuit 110. The circuit MP[i,j] includes a circuit MC and a circuit MCr as an example. The circuit MC and the circuit MCr are circuits that calculate the product of a weight coefficient and an input signal from a neuron (an arithmetic value) in the circuit MP. The circuit MC can have a structure similar to that of the circuit MCr or a structure different from that of the circuit MCr. Thus, "r" is added to the reference numeral to differentiate the circuit MCr from the circuit MC. In addition, "r" is added to the reference numerals of circuit elements included in the circuit MCr and described below.

The circuit MC includes a circuit HC and the circuit MCr includes a circuit HCr, for example. The circuit HC and the circuit HCr each have a function of retaining information (e.g., a potential, a resistance value, or a current value). Note that the first data $w_i^{(k-1)}{}_j^{(k)}$ set in the circuit MP[i,j] is determined in accordance with information (e.g., a potential, a resistance value, or a current value) retained in the circuit HC and the circuit HCr. Therefore, the circuit HC and the circuit HCr are respectively electrically connected to the wiring IL[j] and the wiring ILB[j] that supply information (e.g., a potential, a resistance value, and a current value) corresponding to the first data $w_i^{(k-1)}{}_j^{(k)}$.

In FIG. 27A, the circuit MP[i,j] is electrically connected to a wiring VE[j] and a wiring VEr[j]. The circuit MC and the circuit MCr are electrically connected to the wiring OL[j] and the wiring OLB[j], respectively. The wiring VE[j] and the wiring VEr[j] each function as a wiring for supplying a constant voltage. In addition, the wiring VE[j] also functions as a wiring for releasing a current supplied from the wiring OL through the circuit MC. In addition, the wiring VEr[j] also functions as a wiring for releasing a current supplied from the wiring OLB through the circuit MCr. That is, each of the wiring VE[j] and the wiring VEr[j] functions as a wiring for supplying a constant voltage. The constant voltage can be the ground potential or a low-level potential, for example.

A wiring WL[i] illustrated in FIG. 27A corresponds to the wiring WLS[i] in FIG. 25. The wiring WL[i] is electrically connected to each of the circuit HC and the circuit HCr. To write information (e.g., a potential, a resistance value, or a current value) comparable to the first data $w_i^{(k-1)}{}_j^{(k)}$ to the circuit HC and the circuit HCr included in the circuit MP[i,j], a predetermined potential is supplied to the wiring WL[i] so that electrical continuity is established between the wiring IL[j] and the circuit HC and electrical continuity is established between the wiring ILB[j] and the circuit HCr. Then, the potential or the like comparable to the first data $w_i^{(k-1)}{}_j^{(k)}$ is supplied to the wiring IL[j] and the wiring ILB[j], whereby the potential or the like can be input to the circuit HC and the circuit HCr. After that, a predetermined potential is supplied to the wiring WL[i], so that electrical continuity is not established between the wiring IL[j] and the circuit HC and electrical continuity is not established between the wiring ILB[j] and the circuit HCr. Thus, the current or the like comparable to the first data $w_i^{(k-1)}{}_j^{(k)}$ is retained in each of the circuit HC and the circuit HCr.

The case where the first data $w_i^{(k-1)}{}_j^{(k)}$ has any one of three values "−1", "0", and "1" is considered, for example. In the case where the first data $w_i^{(k-1)}{}_j^{(k)}$ is "1", for example, a predetermined potential is retained in the circuit HC so that a current comparable to "1" flows from the wiring OL[j] to the wiring OLB[j] through the circuit MC, and a potential $V_0$ is retained in the circuit HCr so that a current does not flow from the wiring OL[j] to the wiring OLB[j] through the circuit MCr. In the case where the first data $w_i^{(k-1)}{}_j^{(k)}$ is "−1", for example, the potential $V_0$ is retained in the circuit HC so that a current does not flow from the wiring OL[j] to the wiring OLB[j] through the circuit MC, and a predetermined potential is retained in the circuit HCr so that a current comparable to "−1" flows from the wiring OL[j] to the wiring OLB[j] through the circuit MCr. In the case where the first data $w_i^{(k-1)}{}_j^{(k)}$ is "0", for example, the potential $V_0$ is retained in the circuit HC so that a current does not flow from the wiring OL[j] to the wiring VE[j] through the circuit MC, and the potential $V_0$ is retained in the circuit HCr so that a current does not flow from the wiring OLB[j] to the wiring VEr[j] through the circuit MC. Note that the potential $V_0$ can be, for example, a potential that is equal to the potential supplied by the wiring VE and/or the wiring VEr. The circuit ILD preferably has a function of supplying the potential $V_0$ to the wiring IL and the wiring ILB.

Figure 28:
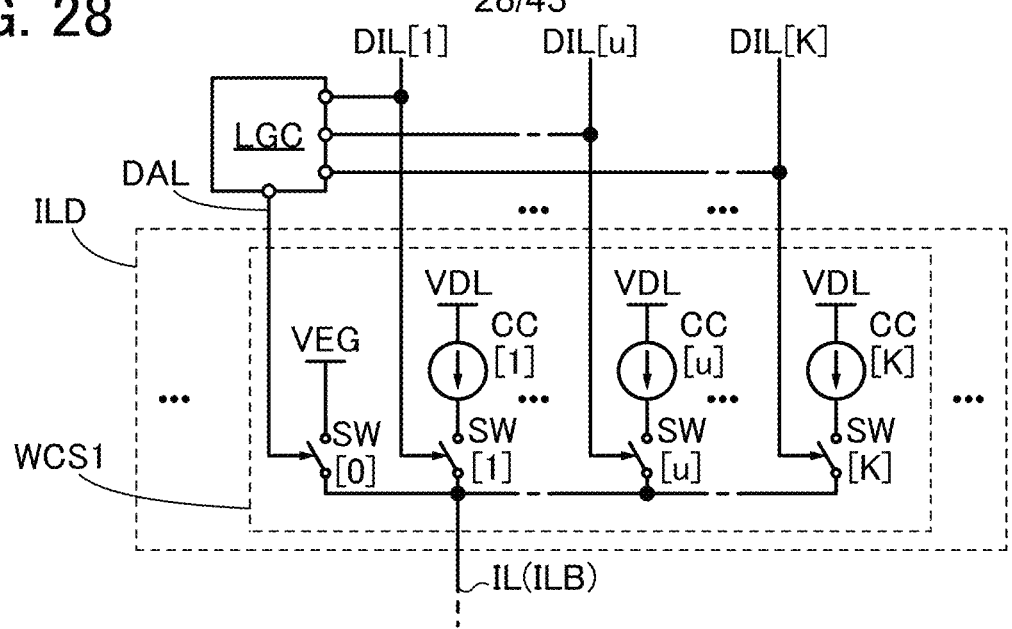
FIG. 28 is a circuit diagram illustrating a configuration example of a circuit included in a semiconductor device.

Thus, for the circuit ILD, the configuration in FIG. 2A may be modified to a configuration in FIG. 28. The configuration of the circuit ILD in FIG. 28 is such that a circuit LGC is provided and the circuit WCS1 includes a switch SW[0] in the circuit ILD in FIG. 2A. A first terminal of the switch SW[0] is electrically connected to the wiring IL (wiring ILB), and a second terminal of the switch SW[0] is electrically connected to a wiring VEG. The wiring DIL[1] to the wiring DIL[K] are electrically connected to input terminals of the circuit LGC, and an output terminal of the circuit LGC is electrically connected to a control terminal of the switch SW[0] through a wiring DAL. The wiring VEG functions as a wiring supplying a potential (e.g., a low-level potential, a ground potential, or the like) equal to the potential supplied by the wiring VE and/or the wiring VEr, for example.

As the switch SW[0], for example, a transistor that can be used as the switch SW[1] to the switch SW[K] is preferably used.

The circuit LGC has a function of transmitting a signal for bringing the switch SW[0] to be an on state from the output terminal of the circuit LGC when the wiring DIL[1] to the wiring DIL[K] transmit signals for bringing the switch SW[1] to the switch SW[K] into an off state, for example. In other words, the circuit LGC has a function of transmitting a signal for bringing the switch SW[0] to be an off state from the output terminal of the circuit LGC when the wiring DIL[1] to the wiring DIL[K] transmit a signal for bringing any one of the switch SW[1] to the switch SW[K] to be an on state. Thus, for example, the circuit LGC can serve as a logic circuit including an NAND gate when the switch SW[0] to the switch SW[K] are p-channel transistors, or can serve as a logic circuit including a NOR gate when the switch SW[0] to the switch SW[K] are n-channel transistors.

As another example, the case where the first data $w_i^{(k-1)}{}_j^{(k)}$ is not a multivalue such as "−1", "0", or "1" but an analog value, specifically, a "negative analog value", "0", or a "positive analog value" is considered. In the case where the first data $w_i^{(k-1)}{}_j^{(k)}$ is a "positive analog value", for example, a predetermined potential is retained in the circuit HC so that an analog current corresponding to the "positive analog value" flows from the wiring OL[j] to the wiring VE[j] through the circuit MC, and the potential $V_0$ is retained in the circuit HCr so that a current does not flow from the wiring OLB[j] to the wiring VEr[j] through the circuit MCr. In the case where the first data $w_i^{(k-1)}{}_j^{(k)}$ is a "negative analog value", for example, the potential $V_0$ is retained in the circuit HC so that a current does not flow from the wiring OL[j] to the wiring VE[j] through the circuit MC, and a predetermined potential is retained in the circuit HCr so that an analog current corresponding to the "negative analog value" flows from the wiring OLB[j] to the wiring VEr[j] through the circuit MCr. In the case where the first data $w_i^{(k-1)}{}_j^{(k)}$ is "0", for example, the potential $V_0$ is retained in the circuit HC so that a current does not flow from the wiring OL[j] to the wiring VE[j] through the circuit MC, and the potential $V_0$ is retained in the circuit HCr so that a current does not flow from the wiring OLB[j] to the wiring VEr[j] through the circuit MC. As in the above example, the potential $V_0$ is preferably supplied from the circuit ILD through the wiring IL and the wiring ILB.

In addition, for example, the circuit MC has a function of outputting a current or the like comparable to information (e.g., a potential, a resistance value, or a current value) retained in the circuit HC to one of the wiring OL[j] and the wiring OLB[j], and the circuit MCr has a function of outputting a current or the like comparable to information (e.g., a potential, a resistance value, or a current value) retained in the circuit HCr to the other of the wiring OL[j] and the wiring OLB[j]. For example, in the case where a first potential is held in the circuit HC, the circuit MC supplies current having a first current value from the wiring OL[j] or the wiring OLB[j] to the wiring VE, and in the case where a second potential is retained in the circuit HC, the circuit MC supplies current having a second current value from the wiring OL[j] or the wiring OLB[j] to the wiring VE. Similarly, in the case where the first potential is retained in the circuit HCr, the circuit MCr supplies current having the first current value from the wiring OL[j] or the wiring OLB[j] to the wiring VEr, and in the case where the second potential is retained in the circuit HCr, the circuit MCr supplies current having the second current value from the wiring OL[j] or the wiring OLB[j] to the wiring VE. Note that the levels of the first current value and the second current value are each determined in accordance with the value of the first data $w_i^{(k-1)}{}_j^{(k)}$. For example, the first current value may be larger than or smaller than the second current value. In addition, for example, one of the first current value and the second current value may be zero current; that is, the current value may be 0. Moreover, the direction in which current flows may be different between current having the first current value and current having the second current value.

In particular, in the case where the first data $w_i^{(k-1)}{}_j^{(k)}$ has any one of ternary values "−1", "0", and "1", the circuit MC and the circuit MCr are preferably configured so that one of the first current value and the second current value is 0. Note that in the case where the first data $w_i^{(k-1)}{}_j^{(k)}$ is an analog value, e.g., a "negative analog value", "0", or a "positive analog value", the first current value or the second current value can be an analog value, for example.

In the case where a current flowing from the wiring OL[j] or the wiring OLB[j] to the wiring VE through the circuit MC and a current flowing from the wiring OL[j] or the wiring OLB[j] to the wiring VEr through the circuit MCr are equal to each other, a potential retained in the circuit MC and a potential retained in the circuit MCr might not be equal to each other because transistors therein sometimes have variations in their characteristics caused in a fabrication process or the like of the transistors. In the arithmetic circuit described in one embodiment of the present invention, the amount of current flowing from the wiring OL[j] or the wiring OLB[j] to the wiring VE through the circuit MC can be almost equal to the amount of current flowing from the wiring OL[j] or the wiring OLB[j] to the wiring VEr through the circuit MCr, even when there are variations in characteristics of the transistors.

Note that in this specification and the like, a current, a voltage, or the like comparable to information (e.g., a potential, a resistance value, or a current value) retained in the circuit HC and the circuit HCr may be a positive current, voltage, or the like, may be a negative current, voltage, or the like, may be a zero current, a zero voltage, or the like; alternatively, a positive one, a negative one, and 0 may be mixed. That is, for example, the above description "the circuit MC has a function of outputting a current, a voltage, or the like comparable to information (e.g., a potential, a resistance value, or a current value) retained in the circuit HC to one of the wiring OL[j] and the wiring OLB[j], and the circuit MCr has a function of outputting a current, a voltage, or the like comparable to information (e.g., a potential, a resistance value, or a current value) retained in the circuit HCr to the other of the wiring OL[j] and the wiring OLB[j]" can be rephrased as a description "the circuit MC has a function of releasing a current, a voltage, or the like comparable to information (e.g., a potential, a resistance value, or a current value) retained in the circuit HC from one of the wiring OL[j] and the wiring OLB[j], and the circuit MCr has a function of releasing a current comparable to information (e.g., a potential, a resistance value, or a current value) retained in the circuit HCr from the other of the wiring OL[j] and the wiring OLB[j]".

A wiring X1L[i] and a wiring X2L[i] illustrated in FIG. 27A correspond to the wiring XLS[i] in FIG. 25. Note that, for example, the second data $z_i^{(k-1)}$ input to the circuit MP[i,j] is determined in accordance with the potentials, current, or the like of the wiring X1L[i] and the wiring X2L[i]. Thus, potentials corresponding to the second data $z_i^{(k-1)}$ are input to the circuit MC and the circuit MCr through the wiring X1L[i] and the wiring X2L[i], for example.

The circuit MC is electrically connected to the wiring OL[j] and the wiring OLB[j], and the circuit MCr is electrically connected to the wiring OL[j] and the wiring OLB[j]. The circuit MC and the circuit MCr output current, potentials, or the like corresponding to the product of the first data $w_i^{(k-1)}{}_j^{(k)}$ and the second data $z_i^{(k-1)}$ to the wiring OL[j] and the wiring OLB[j] in accordance with the potentials, current, or the like input to the wiring X1L[i] and the wiring X2L[i], for example. As a specific example, the destinations of the current output from the circuit MC and the circuit MCr are determined in accordance with the potentials of the wiring X1L[i] and the wiring X2L[i]. For example, the circuit MC and the circuit MCr have a circuit configuration in which current output from the circuit MC flows to one of the wiring OL[j] and the wiring OLB[j], and current output from the circuit MCr flows to the other of the wiring OL[j] and the wiring OLB[j]. That is, the currents output from the circuit MC and the circuit MCr flow to not the same wiring but different wirings. Note that for example, the currents from the circuit MC and the circuit MCr flow to neither the wiring OL[j] nor the wiring OLB[j] in some cases.

The case where the second data $z_i^{(k-1)}$ has any one of three values "−1", "0", and "1" is considered, for example. In the case where the second data $z_i^{(k-1))}$ is "1", for example, the circuit MP establishes a conduction state between the circuit MC and the wiring OL[j] and establishes a conduction state between the circuit MCr and the wiring OLB[j]. In the case where the second data $z_i^{(k-1)}$ is "−1", for example, the circuit MP establishes a conduction state between the circuit MC and the wiring OL[j] and establishes a conduction state between the circuit MCr and the wiring OL[j]. In the case where the second data $z_i^{(k-1)}$ is "0", for example, the circuit MP establishes a non-conduction state between the circuit MC and the wiring OL[j] and between the circuit MC and the wiring OLB[j] and establishes a non-conduction state between the circuit MCr and the wiring OL[j] and between the circuit MC and the wiring OLB[j] so that currents output from the circuit MC and the circuit MCr flow to neither the wiring OL[j] nor the wiring OLB[j].

An example in which the above-described operations are combined is shown. In the case where the first data $w_i^{(k-1)}{}_j^{(k)}$ is "1", current flows from the wiring OL[j] or the wiring OLB[j] to the wiring VE[j] through the circuit MC in some cases, and current does not flow from the wiring OL[j] or the wiring OLB[j] to the wiring VEr[j] through the circuit MCr. In the case where the first data $w_i^{(k-1)}{}_j^{(k)}$ is "−1", current does not flow from the wiring OL[j] or the wiring OLB[j] to the wiring VE[j] through the circuit MC, and current flows from the wiring OL[j] or the wiring OLB[j] to the wiring VEr[j] through the circuit MCr in some cases. In the case where the second data $z_i^{(k-1)}$ is "1", electrical continuity is established between the circuit MC and the wiring OL[j] and between the circuit MCr and the wiring OLB[j]. In the case where the second data $z_i^{(k-1)}$ is "−1", electrical continuity is established between the circuit MC and the wiring OLB[j] and between the circuit MCr and the wiring OLB[j]. From the above, in the case where the product of the first data $w_i^{(k-1)}{}_j^{(k)}$ and the second data $z_i^{(k-1)}$ is a positive value, current flows from the wiring OL[j] to the wiring VE[j] through the circuit MCr or current flows from the wiring OL[j] to the wiring VEr[j] through the circuit MCr. In the case where the product of the first data $w_i^{(k-1)}{}_j^{(k)}$ and the second data $z_i^{(k-1)}$ is a negative value, current flows from the wiring OL[j] to the wiring VEr[j] through the circuit MCr or current flows from the wiring OLB[j] to the wiring VE[j] through the circuit MC. In the case where the product of the first data $w_i^{(k-1)}{}_j^{(k)}$ and the second data $z_i^{(k-1)}$ is a value of 0, current does not flow from the wiring OL[j] or the wiring OLB[j] to the wiring VE[j] and current does not flow from the wiring OL[j] or the wiring OLB[j] to the wiring VEr[j].

A specific example of the above-described example is as follows: in the case where the first data $w_i^{(k-1)}{}_j^{(k)}$ is "1" and the second data $z_i^{(k-1)}$ is "1", current I1[i,j] having the first current value flows from the circuit MC to the wiring OL[j] and current I2[i,j] having the second current value flows from the circuit MCr to the wiring OLB[j], for example. Here, the second current value is zero, for example. In the case where the first data $w_i^{(k-1)}{}_j^{(k)}$ is "−1" and the second data $z_i^{(k-1)}$ is "1", the current I1[i,j] having the second current value flows from the circuit MC to the wiring OL[j] and the current I2[i,j] having the first current value flows from the circuit MCr to the wiring OLB[j], for example. Here, the second current value is zero, for example. In the case where the first data $w_i^{(k-1)}{}_j^{(k)}$ is "0" and the second data $z_i^{(k-1)}$ is "1", the current I1[i,j] having the second current value flows from the circuit MC to the wiring OL[j] and the current I2[i,j] having the second current value flows from the circuit MCr to the wiring OLB[j]. Here, the second current value is zero, for example.

In the case where the first data $w_i^{(k-1)}{}_j^{(k)}$ is "1" and the second data $z_i^{(k-1)}$ is "−1", the current I1[i,j] having the first current value flows from the circuit MC to the wiring OLB[j] and the current I2[i,j] having the second current value flows from the circuit MCr to the wiring OL[j]. Here, the second current value is zero, for example. In the case where the first data $w_i^{(k-1)}{}_j^{(k)}$ is "−1" and the second data $z_i^{(k-1)}$ is "−1", the current I1[i,j] having the second current value flows from the circuit MC to the wiring OLB[j] and the current I2[i,j] having the first current value flows from the circuit MCr to the wiring OL[j]. Here, the second current value is zero, for example. In the case where the first data $w_i^{(k-1)}{}_j^{(k)}$ is "0" and the second data $z_i^{(k-1)}$ is "−1", the current I1[i,j] having the second current value flows from the circuit MC to the wiring OLB[j] and the current I2[i,j] having the second current value flows from the circuit MCr to the wiring OL[j]. Here, the second current value is zero, for example.

In the case where the second data $z_i^{(k-1)}$ is "0", electrical continuity is not established between the circuit MC and the wiring OL[j] and between the circuit MC and the wiring OLB[j], for example. Similarly, electrical continuity is not established between the circuit MCr and the wiring OL[j] and between the circuit MCr and the wiring OLB[j]. Therefore, regardless of the value of the first data $w_i^{(k-1)}{}_j^{(k)}$, current is not output from the circuit MC and the circuit MCr to the wiring OL[j] and the wiring OLB[j].

As described above, in the case where the product value of the first data $w_i^{(k-1)}{}_j^{(k)}$ and the second data $z_i^{(k-1)}$ is a positive value, for example, current flows from the circuit MC or the circuit MCr to the wiring OL[j]. Here, in the case where the first data $w_i^{(k-1)}{}_j^{(k)}$ is a positive value, current flows from the circuit MC to the wiring OL[j], and in the case where the first data $w_i^{(k-1)}{}_j^{(k)}$ is a negative value, current flows from the circuit MCr to the wiring OL[j]. By contrast, in the case where the product value of the first data $w_i^{(k-1)}{}_j^{(k)}$ and the second data $z_i^{(k-1)}$ is a negative value, current flows from the circuit MC or the circuit MCr to the wiring OLB[j]. Here, in the case where the first data $w_i^{(k-1)}{}_j^{(k)}$ is a positive value, current flows from the circuit MC to the wiring OLB[j], and in the case where the first data $w_i^{(k-1)}{}_j^{(k)}$ is a negative value, current flows from the circuit MCr to the wiring OLB[j]. Accordingly, the total amount of current output from a plurality of circuits MC or a plurality of circuits MCr connected to the wiring OL[j] flows to the wiring OL[j]. That is, current having a value which is the sum of positive values flows through the wiring OL[j]. By contrast, the total amount of current output from a plurality of circuits MC or a plurality of circuits MCr connected to the wiring OLB[j] flows to the wiring OLB[j]. That is, current having a value which is the sum of negative values flows through the wiring OLB[j]. As a result of the above-described operation, the total value of the current flowing through the wiring OL[j], that is, the sum total of positive values, and the total value of the current flowing through the wiring OLB[j], that is, the sum total of negative values, are utilized, so that product-sum operation processing can be performed. For example, in the case where the total value of the current flowing through the wiring OL[j] is larger than the total value of the current flowing through the wiring OLB[j], it can be determined that the product-sum operation result has a positive value. In the case where the total value of the current flowing through the wiring OL[j] is smaller than the total value of the current flowing through the wiring OLB[j], it can be determined that the product-sum operation result has a negative value. In the case where the total value of the current flowing through the wiring OL[j] is almost equal to the total value of the current flowing through the wiring OLB[j], it can be determined that the product-sum operation result has a value of 0.

Note that even in the case where the second data $z_i^{(k-1)}$ has any two values among "−1", "0", and "1", for example, two values "−1" and "1" or two values "0" and "1", operation can be performed in a similar manner. Similarly, even in the case where the first data $w_i^{(k-1)}{}_j^{(k)}$ has any binary values among "−1", "0", and "1", for example, binary values "−1" and "1" or binary values "0" and "1", operation can be performed in a similar manner.

Note that the first data $w_i^{(k-1)}{}_j^{(k)}$ may be a multi-bit (multilevel) digital value. As a specific example, the first data $w_i^{(k-1)}{}_j(k)$ may have quinary values, "−2", "−1", "0", "1", and "2". In the case where the first data $w_i^{(k-1)}{}_j^{(k)}$ is "+2", the magnitude of current flowing from the circuit MC may be set to the amount of current which is twice as large as that in the case where the first data $w_i^{(k-1)}{}_j^{(k)}$ is "+1", and the circuit HC and the circuit HCr in the circuit MP may retain voltages so that the amount of current flowing from the circuit MCr is zero. In the case where the first data $w_i^{-(k-1)}{}_j^{(k)}$ is "−2", the magnitude of current flowing from the circuit MCr may be set to the amount of current which is twice as large as that in the case where the first data $w_i^{(k-1)}{}_j^{(k)}$ is "−1", and the circuit HC and the circuit HCr in the circuit MP may retain voltages so that the amount of current flowing from the circuit MC is zero.

The first data $w_i^{(k-1)}{}_j^{(k)}$ may be a be an analog value. As a specific example, "−1" can be replaced with a "negative analog value", and "1" can be replaced with a "positive analog value". In this case, the amount of current flowing from the circuit MC or the circuit MCr is, for example, an analog value corresponding to the absolute value of the value of the first data $w_i^{(k-1)}{}_j^{(k)}$.

In the case where the second data $z_i^{(k-1)}$ is a quaternary value of or more or an analog value, for example, an integrator circuit for converting charge flowing as current to a voltage may be provided in the circuit ACTF[j], and an input time based on the value of the second data $z_i^{(k-1)}$ may be determined so that a voltage is applied to the wiring X1L[i] and the wiring X2L[i] during the input time. Specifically, for example, when the second data $z_i^{(k-1)}$ is a positive value, the high-level potential may be applied to the wiring X1L[i] and the low-level potential may be applied to the wiring X2L[i] for the time based on the second data $z_i^{(k-1)}$. For example, when the second data $z_i^{(k-1)}$ is a negative value, the low-level potential may be applied to the wiring X1L[i] and the high-level potential may be applied to the wiring X2L[i] for the time based on the second data $z_i^{(k-1)}$. At this time, the charge amount flowing between the memory cell MC and the wiring OL[j] or the wiring OLB[j] is determined by the product of the amount of current comparable to the first data $w_i^{(k-1)}{}_j^{(k)}$ and the time for applying voltage to the wiring X1L[i] and the wiring X2L[i]. The charge amount flowing in the wiring OL[j] or the wiring OLB[j] is converted into a voltage by the integrator circuit, whereby a voltage corresponding to the product of the first data $w_i^{(k-1)}{}_j^{(k)}$ and the second data $z_i^{(k-1)}$ can be obtained. In other words, with use of the above configuration, the product operation where the first data $w_i^{(k-1)(k)}$ is a multivalue or an analog value and the second data $z_i^{(k-1)}$ is a multivalue or an analog value.

Not only one but also two or more circuits may be provided as the circuit HC in the circuit MC and the circuit HCr in the circuit MC. When two or more circuits HC (circuits HCr) are included in the circuit MC (circuit MCr), two or more pieces of the first data can be retained in the circuit MP. Furthermore, when a driver circuit or the like, which selects one circuit from two or more circuits HC (circuits HCr), is provided in the arithmetic portion CLP or the like, the first data calculated in the arithmetic portion CLP can be selected. Thus, with use of the circuit MP with such a configuration, the circuit MP can perform a product of one selected from two or more pieces of the first data and the input second data when switching the two or more circuits HC (circuits HCr) provided in the circuit MC (circuit MCr). With use of such circuits MP in the whole of the array portion ALP, in the product-sum operation of a plurality of pieces of the first data and a plurality of pieces of the second data, the plurality of pieces of the first data can be changed to different pieces of the first data.

Figure 27B:
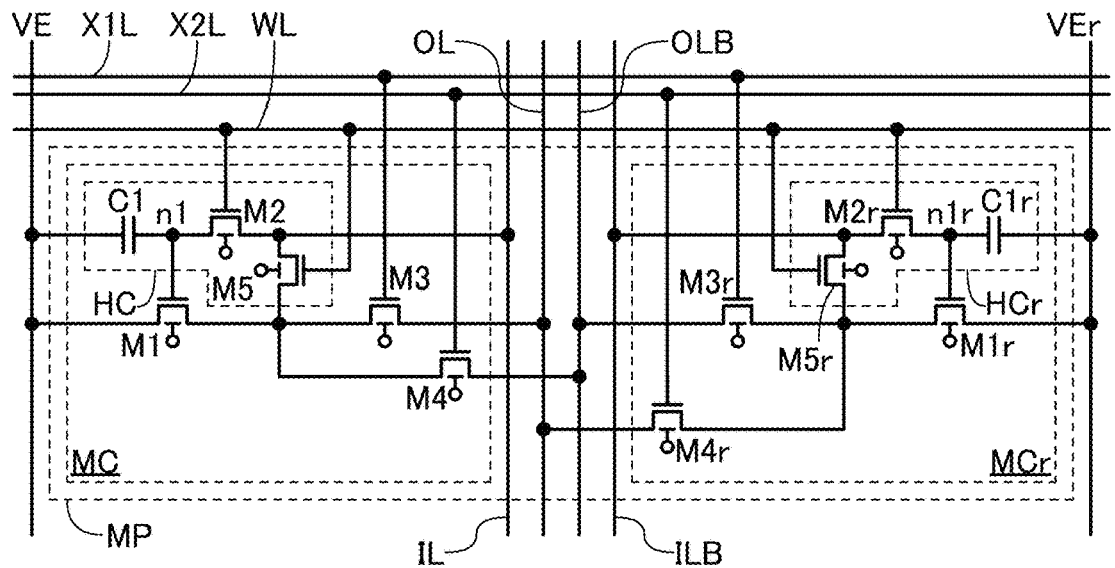

Next, a specific example of a circuit configuration in FIG. 27A is described. A circuit configuration of the circuit MP in FIG. 27B is an example of the circuit configuration in FIG. 27A. The circuit MC included in the circuit MP in FIG. 27B includes a transistor M1 to a transistor M5 that are n-channel transistors and the capacitor C1, for example. Note that, for example, the circuit HC includes the transistor M2 and the capacitor C1.

In the circuit MP in FIG. 27B, the circuit MCr has substantially the same circuit configuration as the circuit MC. Thus, "r" is added to the reference numerals of the circuit elements and the like included in the circuit MCr to differentiate them from the circuit elements and the like included in the circuit MC. Thus, for the transistor M1r to the transistor M5r, the capacitor C1r, and a node n1r, the description of the transistor M1 to the transistor M5, the capacitor C1, and a node n1 below is referred to.

In this specification and the like, unless otherwise specified, the transistor M1 in an on state may operate in a saturation region in the end. In other words, the gate voltage, the source voltage, and the drain voltage of each of the above transistors may be appropriately biased to voltages in the range where the transistor operates in a saturation region. However, one embodiment of the present invention is not limited thereto. The transistor M1 may operate in a linear region so that the amplitude value of a voltage to be supplied is decreased. To reduce the amount of current flowing in the transistor M1, the transistor M1 may operate in a subthreshold region. Alternatively, the operation may be performed around the boundary between the saturation region and the subthreshold region. Note that in the case where the first data (a weight coefficient) is an analog value, for example, the transistor M1 may operate in a linear region in some cases and may operate in a saturation region in other cases depending on the magnitude of the first data (a weight coefficient). Alternatively, the transistor M1 may operate both in a linear region and in a saturation region, may operate both in a saturation region and in a subthreshold region, and may operate both in a linear region and in a subthreshold region.

In this specification and the like, unless otherwise specified, the transistor M2 to the transistor M5 in an on state may operate in a linear region in the end. In other words, the gate voltage, the source voltage, and the drain voltage of each of the above transistors may be appropriately biased to voltages in the range where the transistor operates in the linear region. However, one embodiment of the present invention is not limited thereto. For example, the transistor M2 to the transistor M5 in an on state may operation in a saturation region or in a subthreshold region. Alternatively, the operation may be performed around the boundary between the saturation region and the subthreshold region. Alternatively, the transistor M2 to the transistor M5 may operate both in the linear region and in the saturation region, may operate both in the saturation region and in the subthreshold region, may operate both in the linear region and in the subthreshold region, and may operate both in the linear region, in the saturation region, and in the subthreshold region.

It is preferable that the sizes of the transistor M3 and the transistor M4, for example, the channel lengths and the channel widths thereof, illustrated in FIG. 27B be equal to each other. Such a circuit configuration might enable efficient layout. In addition, there is a possibility that currents flowing through the transistor M3 and the transistor M4 can be equal to each other. Similarly, it is preferable that the sizes of the transistor M1 and the transistor M1r illustrated in FIG. 27B be equal to each other. Similarly, it is preferable that the sizes of the transistor M2 and the transistor M2r illustrated in FIG. 27B be equal to each other. Similarly, it is preferable that the sizes of the transistor M5 and the transistor M5r illustrated in FIG. 27B be equal to each other. Similarly, it is preferable that the sizes of the transistor M3, the transistor M3r, the transistor M4, and the transistor M4r illustrated in FIG. 27B be equal to each other.

Although each of the transistor M1 to the transistor M5 in FIG. 27B is illustrates as an n-channel transistor, each of the transistor M1 to the transistor M5 may be a p-channel transistor. In this case, a p-channel transistor with an SOI (Silicon On Insulator) structure can be used as each of the transistors, for example. The constant voltages supplied from the wiring VE and the wiring VEr are each preferably a high-level potential. When the amplitude of the voltage applied to the gate of the transistor M2 (OS transistor, for example) is made small, the transistor M1 (Si transistor, for example) is preferably an n-channel transistor.

Furthermore, in FIG. 27B, each of the transistor M2 to the transistor M5 may be replaced with an analog switch or a mechanical switch. The analog switch can have a CMOS structure using an n-channel transistor and a p-channel transistor, for example.

The transistor M1 to the transistor M5 illustrated in FIG. 27B are each an n-channel transistor having a multi-gate structure including gates over and under a channel, and the transistor M1 to the transistor M5 each include a first gate and a second gate. Note that in this specification and the like, for convenience, the first gate is referred to as a gate (referred to as a front gate in some cases) and the second gate is referred to as a back gate so that they are distinguished from each other, for example; however, the first gate and the second gate can be interchanged with each other. Therefore, in this specification and the like, the term "gate" can be replaced with the term "back gate". Similarly, the term "back gate" can be replaced with the term "gate". As a specific example, a connection structure in which "a gate is electrically connected to a first wiring and a back gate is electrically connected to a second wiring" can be replaced with a connection structure in which "a back gate is electrically connected to a first wiring and a gate is electrically connected to a second wiring".

The semiconductor device of one embodiment of the present invention does not depend on the connection structure of a back gate of a transistor. In the transistor M1 to the transistor M5 illustrated in FIG. 27B, the back gate is illustrated and the connection configuration of the back gate is not illustrated; however, a target to which the back gate is electrically connected can be determined at the design stage. That is, for example, in a transistor including a back gate, a gate and the back gate may be electrically connected to each other to increase the on-state current of the transistor. In other words, the gate and the back gate of a transistor M2 may be electrically connected to each other, for example. Alternatively, for example, in a transistor including aback gate, a wiring electrically connected to an external circuit or the like may be provided and a fixed potential or a variable potential may be supplied to the back gate of the transistor by the external circuit or the like to change the threshold voltage of the transistor or to reduce the off-state current of the transistor. Note that the same applies to a transistor described in other parts of the specification and a transistor illustrated in other drawings, not only to that in FIG. 27B.

The semiconductor device of one embodiment of the present invention does not depend on the structure of a transistor included in the semiconductor device. For example, the transistor M1 to the transistor M5 illustrated in FIG. 27B may each be a transistor having a structure not including a back gate, i.e., a single-gate structure. It is also possible that some transistors have a structure including a back gate and the other transistors have a structure not including a back gate.

In this specification and the like, transistors with a variety of structures can be used as a transistor. Thus, there is no limitation on the type of transistors used. Examples of the transistor include a transistor including single crystal silicon and a transistor including a non-single-crystal semiconductor film typified by amorphous silicon, polycrystalline silicon, microcrystalline (also referred to as microcrystal, nanocrystal, or semi-amorphous) silicon, or the like. Alternatively, a thin film transistor (TFT) including a thin film of any of these semiconductors can be used, for example. The use of the TFT has various advantages. For example, since the TFT can be manufactured at a lower temperature than the case of using single crystal silicon, manufacturing costs can be reduced or a larger manufacturing apparatus can be used. Since a larger manufacturing apparatus can be used, TFTs can be manufactured over a large substrate. This enables a large number of display devices to be manufactured at a time, resulting in low cost manufacturing. Alternatively, a low manufacturing temperature allows the use of a low heat-resistance substrate. Thus, transistors can be manufactured over a light-transmitting substrate. Alternatively, transmission of light in a display element can be controlled using the transistor over a light-transmitting substrate. Alternatively, some of the films included in the transistor can transmit light because the transistor is thin. Accordingly, the aperture ratio can be improved.

For example, a transistor including a compound semiconductor (e.g., SiGe or GaAs) or an oxide semiconductor (e.g., Zn—O, In—Ga—Zn—O, In—Zn—O, In—Sn—O (ITO), Sn—O, Ti—O, Al—Zn—Sn—O (AZTO), or In—Sn—Zn—O) can be used. Alternatively, a thin film transistor including a thin film of such a compound semiconductor or oxide semiconductor can be used, for example. Accordingly, manufacturing temperature can be lowered and, for example, such a transistor can be manufactured at room temperature. As a result, the transistor can be formed directly on a substrate having low heat resistance, such as a plastic substrate or a film substrate. Note that such a compound semiconductor or oxide semiconductor can be used not only for a channel portion of the transistor but also for other applications. For example, such a compound semiconductor or oxide semiconductor can be used for a wiring, a resistor, a pixel electrode, or a light-transmitting electrode. Since such components can be deposited or formed at the same time as the transistor, the cost can be reduced.

As another example, a transistor formed by an inkjet method or a printing method, or the like, can be used. The transistor can be manufactured at room temperature, manufactured at a low vacuum degree, or manufactured over a large substrate. Accordingly, the transistor can be manufactured without using a mask (reticle), so that the layout of the transistor can be easily changed. Alternatively, since the transistor can be manufactured without using a resist, the material cost is reduced, and the number of steps can be reduced. Alternatively, since a film can be formed only where needed, a material is not wasted as compared with a manufacturing method by which etching is performed after the film is formed over the entire surface; thus, the cost can be reduced.

As another example, a transistor containing an organic semiconductor, a carbon nanotube, or the like, can be used. Thus, a transistor can be formed over a bendable substrate. A device using a transistor containing an organic semiconductor or a carbon nanotube can be highly resistant to impact.

Note that a transistor with any of a variety of other structures can also be used. For example, a MOS transistor, a junction transistor, a bipolar transistor, or the like can be used as the transistor. By using a MOS transistor as the transistor, the size of the transistor can be reduced. Thus, a large number of transistors can be mounted. By using a bipolar transistor as the transistor, a large amount of current can flow therethrough. Thus, a circuit can operate at high speed. Note that a MOS transistor and a bipolar transistor may be formed over one substrate. Thus, a reduction in power consumption, a reduction in size, high-speed operation, and the like can be achieved.

As another example, it is possible to use a transistor having a structure in which gate electrodes are placed over and under an active layer. With the structure in which the gate electrodes are placed over and under the active layer, a circuit configuration is such that a plurality of transistors are connected in parallel. Thus, a channel formation region is increased, so that the amount of current can be increased. Alternatively, with the structure in which the gate electrodes are placed over and under the active layer, a depletion layer can be easily formed, so that subthreshold swing can be improved.

As another example, it is possible to use a transistor having a structure in which a gate electrode is placed over an active layer, a structure in which a gate electrode is placed under an active layer, a staggered structure, an inverted staggered structure, a structure in which a channel region is divided into a plurality of regions, a structure in which active layers are connected in parallel, a structure in which active layers are connected in series, or the like. Alternatively, a transistor can have a variety of structures such as a planar type, a FIN-type, a TRI-GATE type, a top-gate type, a bottom-gate type, and a double-gate type (with gates placed over and under a channel).

As another example, it is possible to use a transistor having a structure in which a source electrode and a drain electrode overlaps with an active layer (or part thereof). Employing the structure in which the source electrode and the drain electrode overlaps with the active layer (or part thereof) can prevent unstable operation due to charge accumulation in part of the active layer.

As another example, it is possible to use a transistor having a structure in which an LDD region is provided. By providing the LDD region, it is possible to achieve a reduction in off-state current or an increase in withstand voltage (an improvement in reliability) of the transistor. Alternatively, by providing the LDD region, in the case of operation in a saturation region, the drain current does not change much even if the drain-source voltage changes, and thus the voltage-current characteristics having a flat slope can be obtained.

The above-described modification example of connection, a structure, and the like of terminals of a transistor can be applied not only to the circuit diagram illustrated in FIG. 27B but also to transistors described in other parts of the specification or transistors illustrated in other diagrams.

In the circuit MP in FIG. 27B, the first terminal of the transistor M1 is electrically connected to the wiring VE. The second terminal of the transistor M1 is electrically connected to the first terminal of the transistor M3, the first terminal of the transistor M4, and the first terminal of the transistor M5. A gate of the transistor M1 is electrically connected to the first terminal of the capacitor C1 and the first terminal of the transistor M2. The second terminal of the capacitor C1 is electrically connected to the wiring VE. The second terminal of the transistor M2 is electrically connected to the second terminal of the transistor M5 and the wiring IL. The gate of the transistor M2 is electrically connected to the wiring WL. The second terminal of the transistor M3 is electrically connected to the wiring OL and the gate of the transistor M3 is electrically connected to the wiring X1L. The second terminal of the transistor M4 is electrically connected to the wiring OLB and the gate of the transistor M4 is electrically connected to the wiring X2L.

The connection structure of the circuit MCr different from that of the circuit MC is described. A second terminal of a transistor M3r is electrically connected to not the wiring OL but the wiring OLB, and a second terminal of a transistor M4r is electrically connected to not the wiring OLB but the wiring OL. A first terminal of a transistor M1r and a first terminal of a capacitor C1r are electrically connected to the wiring VEr.

The first terminal of the transistor M1 may be electrically connected to not the wiring VE but another wiring. Similarly, the first terminal of the transistor M1r may be electrically connected to not the wiring VEr but another wiring. The wiring VE may be the same wiring as the wiring VEr. Note that the first terminal of the transistor M1 may be electrically connected to not the wiring VE but another wiring, and/or the first terminal of the transistor M1r may be electrically connected to not the wiring VEr but another wiring, in a circuit diagram in another drawing.

Note that in the circuit HC illustrated in FIG. 27B, an electrical connection point of the gate of the transistor M1, the first terminal of the capacitor C1, and the first terminal of the transistor M2 is the node n1.

As described above, the circuit HC has a function of retaining a potential corresponding to the first data, for example. The potential is held in the circuit HC included in the circuit MC in FIG. 27B in the following manner: when the transistor M5 is brought into an on state, the potential is input from the wiring IL to be written to the capacitor C1, and then the transistor M2 is brought into an off state. Thus, the potential of the node n1 can be held as the potential corresponding to the first data. At this time, current is input from the wiring OL and a potential having a level corresponding to the amount of current can be held in the capacitor C1. Thus, the influence of variations in current characteristics of the transistor M1 can be reduced.

As the transistor M1, a transistor with a low off-state current is preferably used for a long-term holding of the potential of the node n1. As the transistor with a low off-state current, an OS transistor can be used, for example. Alternatively, a transistor including a back gate may be used as the transistor M1, and an off-state current may be reduced by applying a low-level potential to the back gate to shift the threshold voltage to the positive side.

Figure 27C:
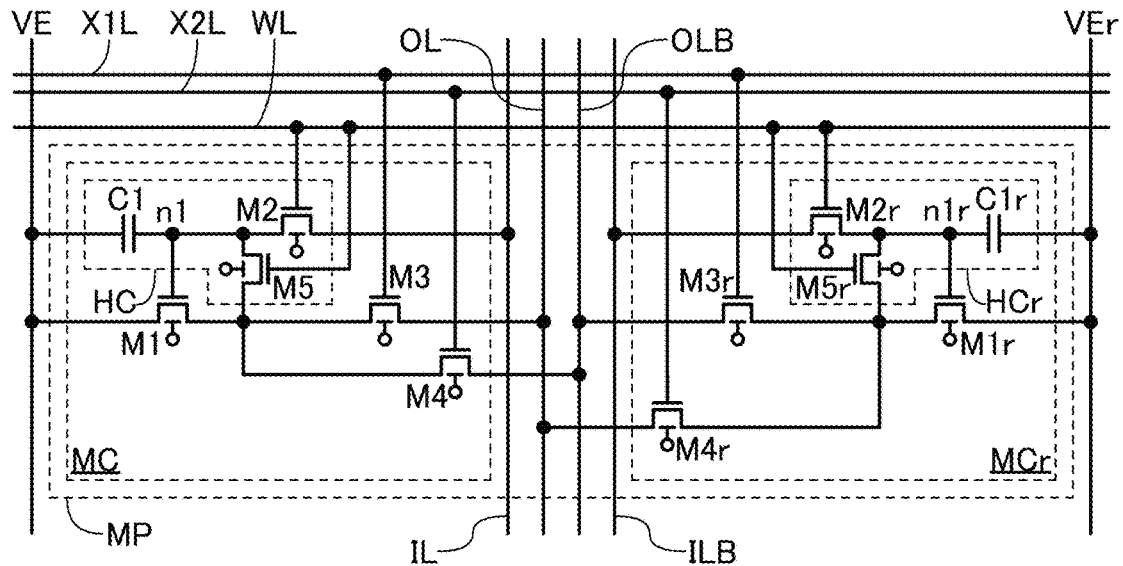

A circuit configuration that can be used as the circuit MP in FIG. 27A is not limited to the configuration of the circuit MP in FIG. 27B. For example, the configuration of the circuit MP in FIG. 27C can be used for the circuit MP of FIG. 27A. The circuit MP illustrated in FIG. 27C has a configuration in which the electrical connections of the first terminals of the transistor M5 and transistor M5r are changed from those of the circuit MP in FIG. 27B. Specifically, in the circuit MP in FIG. 27C, the first terminal of the transistor M5 is electrically connected to the first terminal of the transistor M2, the gate of the transistor M1, and the first terminal of the capacitor C1. When the circuit MP is configured as shown in FIG. 27C, the circuit MP in FIG. 27C operates in substantially the same manner as the circuit MP in FIG. 27B.

<<Circuit ACTF>>

Figure 29A:
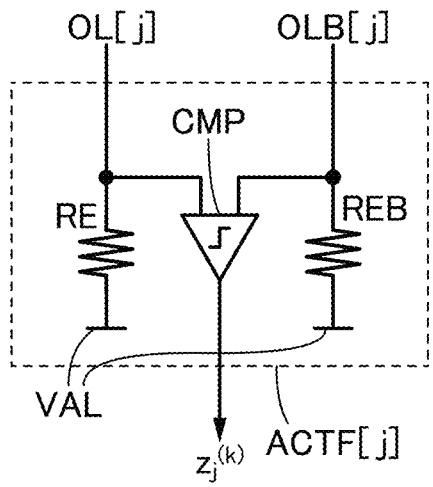
FIG. 29A to FIG. 29F are circuit diagrams each illustrating a configuration example of a circuit included in a semiconductor device.

Next, the circuit ACTF[1] to the circuit ACTF[n] are described. The circuit ACTF[1] to the circuit ACTF[n] can have a circuit configuration illustrated in FIG. 29A, for example. FIG. 29A is a circuit that generates the signal $z_j^{(k)}$ in accordance with currents input from the wiring OL[j] and the wiring OLB[j], for example. Specifically, FIG. 29A shows an example of a circuit that performs arithmetic operation of an activation function and outputs the output signal $z_j^{(k)}$ expressed by a binary value.

In FIG. 29A, the circuit ACTF[j] includes a resistor RE, a resistor REB, and a comparator CMP, for example. The resistor RE and the resistor REB have a function of converting a current into a voltage. Therefore, without limitation to the resistor, an element or a circuit can be used as long as it has a function of converting a current into a voltage. The wiring OL[j] is electrically connected to a first terminal of the resistor RE and a first input terminal of the comparator CMP, and the wiring OLB[j] is electrically connected to a first terminal of the resistor REB and a second input terminal of the comparator CMP. A second terminal of the resistor RE is electrically connected to a wiring VAL, and a second terminal of the resistor REB is electrically connected to the wiring VAL. Note that the second terminal of the resistor RE and the second terminal of the resistor REB may be connected to the same wiring. Alternatively, they may be connected to different wirings having the same potential.

The resistance values of the resistor RE and the resistor REB are preferably equal to each other. For example, the difference between the resistance values of the resistor RE and the resistor REB is desirably within 10%, further preferably within 5% of the resistance value of the resistor RE. However, one embodiment of the present invention is not limited thereto. Depending on the case or according to circumstances, the resistance values of the resistor RE and the resistor REB may be different values.

The wiring VAL functions as a wiring for supplying a constant voltage, for example. The constant voltage can be VDD that is a high-level potential, VSS that is a low-level potential, or a ground potential (GND), for example. The constant voltage is preferably set as appropriate in accordance with the configuration of the circuit MP. Alternatively, the wiring VAL may be supplied with not a constant voltage but a pulse signal, for example.

A voltage between the first terminal and the second terminal of the resistor RE is determined in accordance with a current flowing from the wiring OL[j]. Thus, a voltage based on the resistance value of the resistor RE and the current is input to the first input terminal of the comparator CMP. Similarly, a voltage between the first terminal and the second terminal of the resistor REB is determined in accordance with a current flowing from the wiring OLB[j]. Thus, a voltage based on the resistance value of the resistor REB and the current is input to the second input terminal of the comparator CMP.

The comparator CMP has a function of, for example, comparing voltages input to the first input terminal and the second input terminal and outputting a signal from an output terminal of the comparator CMP on the basis of the comparison result. For example, the comparator CMP can output a high-level potential from the output terminal of the comparator CMP in the case where the voltage input to the second input terminal is higher than the voltage input to the first input terminal, and can output a low-level potential from the output terminal of the comparator CMP in the case where the voltage input to the first input terminal is higher than the voltage input to the second input terminal. In other words, since two potentials, a high-level potential and a low-level potential, are output from the output terminal of the comparator CMP, the circuit ACTF[j] can output the binary output signal $z_j^{(k)}$. For example, the high-level potential and the low-level potential output from the output terminal of the comparator CMP can correspond to "+1" and "−1" of the output signal $z_j^{(k)}$, respectively. Depending on the case, the high-level potential and the low-level potential output from the output terminal of the comparator CMP may correspond to "+1" and "0" of the output signal $z_j^{(k)}$, respectively.

Figure 29B:
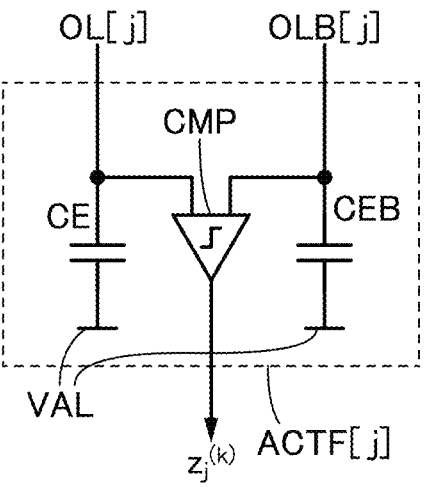
Figure 29C:
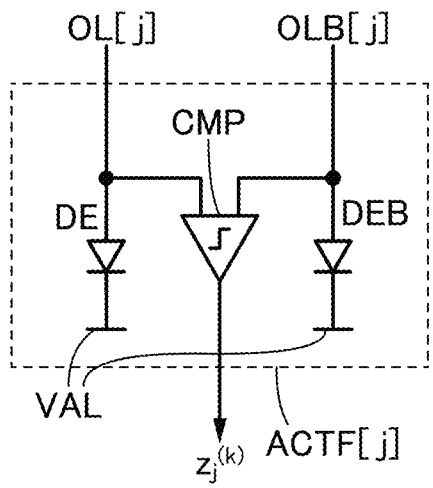

Although the resistor RE and the resistor REB are used for the circuit ACTF[j] in FIG. 29A, without limitation to the resistor, an element or a circuit can be used as long as it has a function of converting a current into a voltage. Thus, each of the resistor RE and the resistor REB of the circuit ACTF[j] in FIG. 29A can be replaced with another circuit element. For example, the circuit ACTF[j] illustrated in FIG. 29B is a circuit in which the resistor RE and the resistor REB included in the circuit ACTF[j] in FIG. 29A are replaced with a capacitor CE and a capacitor CEB, and can perform operation substantially the same as that of the circuit ACTF[j] in FIG. 29A. Note that the capacitance values of the capacitor CE and the capacitor CEB are preferably equal to each other. For example, the difference between the capacitance values of the capacitor CE and the capacitor CEB is desirably within 10%, further preferably within 5% of the electrostatic capacitance value of the capacitor CE. However, one embodiment of the present invention is not limited thereto. A circuit for initializing charge accumulated in the capacitor CE and the capacitor CEB may be provided. For example, a switch may be provided in parallel to the capacitor CE. In other words, a second terminal of the switch may be connected to the wiring VAL, and a first terminal of the switch may be connected to a first terminal of the capacitor CE, the wiring OL[j], and the first input terminal of the comparator CMP. Alternatively, the second terminal of the switch may be connected to a wiring different from the wiring VAL, and the first terminal of the switch may be connected to the first terminal of the capacitor CE, the wiring OL[j], and the first input terminal of the comparator CMP. In addition, the circuit ACTF[j] illustrated in FIG. 29C is a circuit in which the resistor RE and the resistor REB included in the circuit ACTF[j] in FIG. 29A are replaced with a diode element DE and a diode element DEB, and can perform operation substantially the same as that of the circuit ACTF[j] in FIG. 29A. The directions of the diode element DE and the diode element DEB (connection portions of an anode and a cathode) are desirably changed as appropriate in accordance with the level of a potential of the wiring VAL.

Figure 29D:
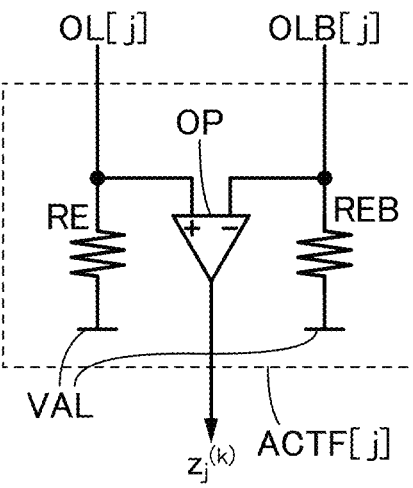

The comparator CMP included in each of the circuits ACTF[j] in FIG. 29A to FIG. 29C can be replaced with an operational amplifier OP, for example. FIG. 29D shows a circuit diagram illustrating the circuit ACTF[j] in which the comparator CMP of the circuit ACTF[j] in FIG. 29A is replaced with the operational amplifier OP.

Figure 29E:
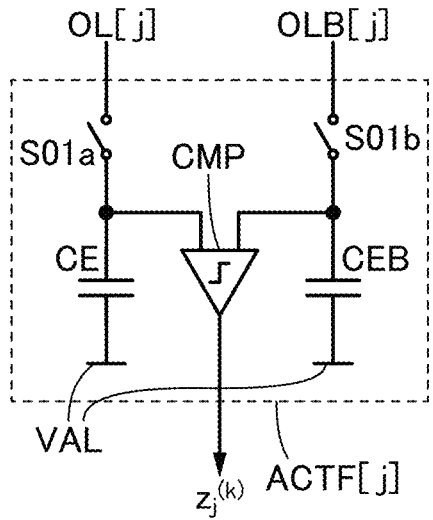

A switch S01a and a switch S01b may be provided in the circuit ACTF[j] in FIG. 29B. Thus, the circuit ACTF[j] can hold, in the capacitor CE and the capacitor CEB, potentials corresponding to currents input from the wiring OL[j] and the wiring OLB[j]. As a specific circuit example, a configuration may be employed in which the wiring OL[j] is electrically connected to a first terminal of the switch S01a, the first terminal of the capacitor CE and the first input terminal of the comparator CMP are electrically connected to a second terminal of the switch S01a, the wiring OLB[j] is electrically connected to a first terminal of the switch S01b, and a first terminal of the capacitor CEB and the second input terminal of the comparator CMP are electrically connected to a second terminal of the switch S01b, as illustrated in FIG. 29E. In the circuit ACTF[j] in FIG. 29E, the potentials of the wiring OL[j] and the wiring OLB[j] can be respectively input to the first input terminal and the second input terminal of the comparator CMP by bringing the switch S01a and the switch S01b into an on state. Then, the switch S01a and the switch S01b are brought into an off state, whereby the potentials input to the first input terminal and the second input terminal of the comparator CMP can be held in the capacitor CE and the capacitor CEB. Note that as each of the switch S01a and the switch S01b, an electrical switch such as an analog switch or a transistor can be used, for example. As another example, a mechanical switch may be used as each of the switch S01a and the switch S01b. Note that in the case of using a transistor as each of the switch S01a and the switch S01b, the transistor can be an OS transistor or a transistor containing silicon in a channel formation region (hereinafter, referred to as a Si transistor). Moreover, by controlling the on-state periods of the switch S01a and the switch S01b, the voltage values of the capacitor CE and the capacitor CEB can be controlled. For example, in the case where the values of currents flowing through the capacitor CE and the capacitor CEB are large, the on-state periods of the switch S01a and the switch S01b are set short, whereby the voltage values of the capacitor CE and the capacitor CEB can be prevented from being too large.

Figure 29F:
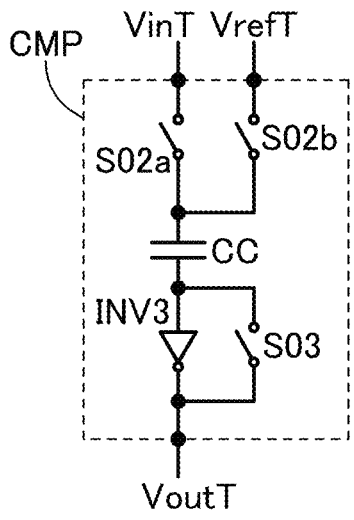

The comparator CMP included in each of the circuits ACTF[j] in FIG. 29A to FIG. 29C and FIG. 29E can be a chopper comparator, for example. The comparator CMP illustrated in FIG. 29F shows a chopper comparator, and the comparator CMP includes a switch S02a, a switch S02b, a switch S03, a capacitor CC, and an inverter circuit INV3. Like the above-described switch S01a and switch S01b, each of the switch S02a, the switch S02b, and the switch S03 can be a mechanical switch or a transistor such as an OS transistor or a Si transistor.

A first terminal of the switch S02a is electrically connected to a terminal VinT, a first terminal of the switch S02b is electrically connected to a terminal VrefT, and a second terminal of the switch S02a is electrically connected to a second terminal of the switch S02b and a first terminal of the capacitor CC. A second terminal of the capacitor CC is electrically connected to an input terminal of the inverter circuit INV3 and a first terminal of the switch S03. A terminal VoutT is electrically connected to an output terminal of the inverter circuit INV3 and a second terminal of the switch S03.

The terminal VinT functions as a terminal for inputting an input potential to the comparator CMP, the terminal VrefT functions as a terminal for inputting a reference potential to the comparator CMP, and the terminal VoutT functions as a terminal for outputting an output potential from the comparator CMP. Note that the terminal VinT can correspond to one of the first terminal and the second terminal of each of the comparators CMP in FIG. 29A to FIG. 29C and FIG. 29E, and the terminal VrefT can correspond to the other of the first terminal and the second terminal of each of the comparators CMP in FIG. 29A to FIG. 29C and FIG. 29E.

Although the circuits ACTF[j] in FIG. 29A to FIG. 29E are each a circuit that performs arithmetic operation of an activation function and outputs the output signal $z_j^{(k)}$ expressed by a binary value, the circuit ACTF[j] may output the output signal $z_j^{(k)}$ as a ternary or higher-level signal or an analog value. Although the circuits ACTF[j] in FIG. 29A to FIG. 29E each have a configuration outputting one signal of $z_j^{(k)}$, the configuration outputting two or more signals of $z_j^{(k)}$ may be employed.

The circuits ACTF[j] in FIG. 29A to FIG. 29E are each a circuit comparing two currents and outputting a comparison result, and accordingly can be used for the circuit DTC described in Embodiment 1. Alternatively, a circuit configuration is made so that the circuit ACTF[j] also serves as the circuit DTC described in Embodiment 1.

<Operation Example of Arithmetic Circuit>

Next, an operation example of the arithmetic circuit 110 in FIG. 25 is described. Note that in the description of this operation example, the arithmetic circuit 110 illustrated in FIG. 30 is used as an example.

Figure 30:
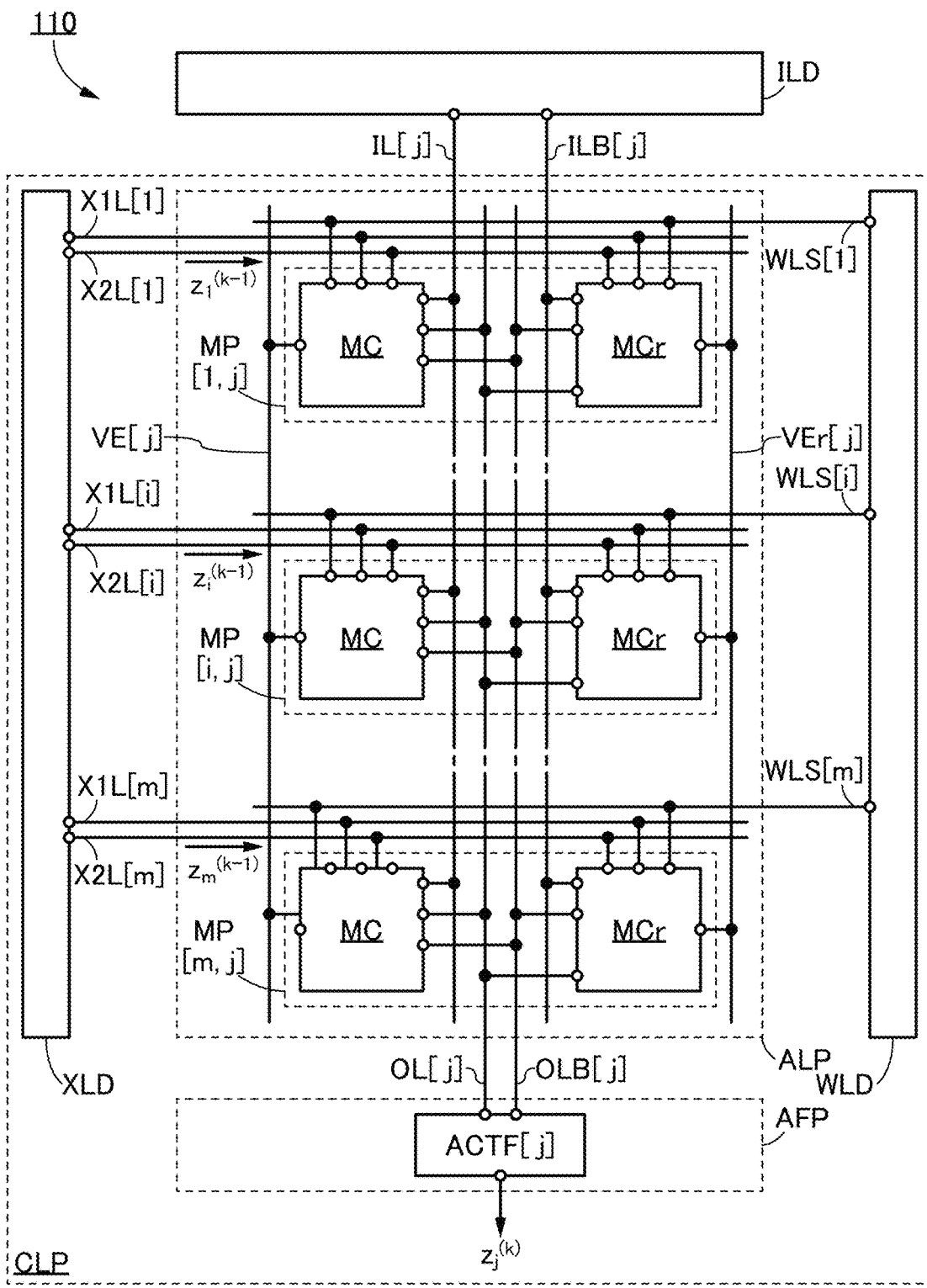
FIG. 30 is a circuit diagram illustrating a configuration example of a circuit included in a semiconductor device.

The arithmetic circuit 110 in FIG. 30 is illustrated focusing on a circuit positioned in the j-th column of the arithmetic circuit 110 in FIG. 25. That is, the arithmetic circuit 110 in FIG. 30 corresponds to a circuit that performs product-sum operation of the weight coefficients $w_1^{(k-1)(k)}{}_j$ to $w_m^{(k-1)(k)}{}_j$ and the signals $z_1^{(k-1)}$ to $z_m^{(k-1)}$ input from the neuron $N_1^{(k-1)}$ to the neuron $N_m^{(k-1)}$ to the neuron $N_j^{(k)}$ in the neural network 100 illustrated in FIG. 24A and arithmetic operation of an activation function using the result of the product-sum operation. Furthermore, the circuit MP in FIG. 27B is used as the circuit MP included in the array portion ALP of the arithmetic circuit 110 in FIG. 30. In addition, the circuit ILD in FIG. 28 is used for the circuit ILD of the arithmetic circuit 110 in FIG. 30.

First, in the arithmetic circuit 110, the first data $w_1^{(k-1)(k)}{}_j$ to $w_m^{(k-1)(k)}{}_j$ are set in a circuit MP[1,j] to a circuit MP[m,j]. The first data $w_1^{(k-1)(k)}{}_j$ is set in the following manner: a predetermined potential is input to the wiring WLS[1] to the wiring WLS[m] sequentially by the circuit WLD to select the circuit MP[1,j] to the circuit MP[m,j] sequentially, and a potential, current, or the like corresponding to the first data is supplied from the circuit ILD through the wiring IL[j] and the wiring ILB[U] to the circuit HC and the circuit HCr of the circuit MC and the circuit MCr that are included in each of the selected circuits MP. After the supply of the potential, the current, or the like, the circuit WLD makes the circuit MP[1,j] to the circuit MP[m,j] unselected, so that the potential, the current, or the like corresponding to the first data $w_1^{(k-1)(k)}{}_j$ to $w_m^{(k-1)(k)}{}_j$ can be held in the circuit HC of the circuit MC and the circuit HCr of the circuit MCr that are included in each of the circuit MP[1,j] to the circuit MP[m, j]. For example, in the case where the first data $w_1^{(k-1)(k)}{}_j$ to $w_m^{(k-1)(k)}{}_j$ each be a positive value, a value corresponding to the positive value is input to the circuit HC and a value corresponding to zero is input to the circuit HCr. In contrast, in the case where the first data $w_1^{(k-1)(k)}{}_j$ to $w_m^{(k-1)(k)}{}_j$ each be a negative value, a value corresponding to zero is input to the circuit HC and a value corresponding to the absolute value of the negative value is input to the circuit HCr. Note that the value corresponding to zero described above can be a voltage applied to the wiring VEG described with FIG. 28, for example.

Next, the second data $z_1^{(k-1)}$ to $z_m^{(k-1)}$ are supplied to the wiring X1L[1] to the wiring X1L[m] and the wiring X2L[1] to the wiring X2L[m] by the circuit XLD. As a specific example, the second data $z_1^{(k-1)}$ is supplied to the wiring X1L[i] and the wiring X2L[i].

The conduction state between the circuit MC and the circuit MCr included in each of the circuit MP[1,j] to the circuit MP[m,j] and the wiring OL[j] and the wiring OLB[j] is determined in accordance with the second data $z_1^{(k-1)}$ to $z_m^{(k-1)}$ respectively input to the circuit MP[1,j] to the circuit MP[m,j]. As a specific example, in accordance with the second data $z_i^{(k-1)}$, the circuit MP[i,j] is in any one of a state where "electrical continuity is established between the circuit MC and the wiring OL[j] and electrical continuity is established between the circuit MCr and the wiring OLB[j]", a state where "electrical continuity is established between the circuit MC and the wiring OLB[j] and electrical continuity is established between the circuit MCr and the wiring OL[j]", and a state where "the circuit MC and the circuit MCr are each electrically disconnected to the wiring OL[j] and the wiring OLB[j]". For example, in the case where the second data $z_1^{(k-1)}$ has a positive value, a value with which electrical continuity can be established between the circuit MC and the wiring OL[j] and electrical continuity can be established between the circuit MCr and the wiring OLB[j] is input to the wiring X1L[1]. Then, a value with which electrical continuity cannot be established between the circuit MC and the wiring OLB[j] and electrical continuity cannot be established between the circuit MCr and the wiring OL[j] is input to the wiring X2L[1]. In the case where the second data $z_1^{(k-1)}$ has a negative value, a value with which electrical continuity can be established between the circuit MC and the wiring OLB[j] and electrical continuity can be established between the circuit MCr and the wiring OL[j] is input to the wiring X1L[1]. Then, a value with which electrical continuity cannot be established between the circuit MC and the wiring OL[j] and electrical continuity cannot be established between the circuit MCr and the wiring OLB[j] is input to the wiring X2L[1]. In the case where the second data $z_1^{(k-1)}$ has a value of 0, a value with which electrical continuity cannot be established between the circuit MC and the wiring OLB[j] and electrical continuity cannot be established between the circuit MCr and the wiring OL[j] is input to the wiring X1L[1]. Then, a value with which electrical continuity cannot be established between the circuit MC and the wiring OL[j] and electrical continuity cannot be established between the circuit MCr and the wiring OLB[j] is input to the wiring X2L[1].

A conduction state or a non-conduction state between the circuit MC and the circuit MCr that are included in the circuit MP[i,j] and the wiring OL[j] and the wiring OLB[j] is determined in accordance with the second data $z_i^{(k-1)}$ input to the circuit MP[i,j], whereby currents are input and output between the circuit MC and the circuit MCr and the wiring OL[j] and the wiring OLB[j]. Furthermore, the amount of current is determined in accordance with the first data $w_i^{(k-1)}{}_j^{(k)}$ and/or the second data $z_i^{(k-1)}$ set in the circuit MP[i,j].

For example, in the circuit MP[i,j], current flowing from the wiring OL[j] to the circuit MC or the circuit MCr is I[i,j], and current flowing from the wiring OLB[j] to the circuit MC or the circuit MCr is $I_B$[i,j]. When current flowing from the circuit ACTF[j] to the wiring OL[j] is $I_{out}$[j] and current flowing from the wiring OLB[j] to the circuit ACTF[j] is $I_{Bout}$[j], $I_{out}$[j] and $I_{Bout}$[j] can be expressed by the following formulae.

[Formula 5]

$$I_{out}[j] = \sum_{i=1}^{m} I[i,j] \qquad (2.5)$$

$$I_{Bout}[j] = \sum_{i=1}^{m} I_B[i,j] \qquad (2.6)$$

In the circuit MP[i,j], the circuit MC releases I(+1) and the circuit MCr releases I(−1) in the case where the first data $w_i^{(k-1)}{}_j^{(k)}$ is "+1", the circuit MC releases I(−1) and the circuit MCr releases I(+1) in the case where the first data $w_i^{(k-1)}{}_j^{(k)}$ is "−1", and the circuit MC releases I(−1) and the circuit MCr releases I(−1) in the case where the first data $w_i^{(k-1)}{}_j^{(k)}$ is "0", for example.

Furthermore, the circuit MP[i,j] is in a state where "electrical continuity is established between the circuit MC and the wiring OL[j], electrical continuity is established between the circuit MCr and the wiring OLB[j], electrical continuity is broken between the circuit MC and the wiring OLB[j], and electrical continuity is broken between the circuit MCr and the wiring OL[j]" in the case where the second data $z_i^{(k-1)}$ is "+1"; the circuit MP[i,j] is in a state where "electrical continuity is established between the circuit MC and the wiring OLB[j], electrical continuity is established between the circuit MCr and the wiring OL[j], electrical continuity is broken between the circuit MC and the wiring OL[j], and electrical continuity is broken between the circuit MCr and the wiring OLB[j]" in the case where the second data $z_i^{(k-1))}$ is "−1"; and the circuit MP[i,j] is in a state where "electrical continuity is broken between the circuit MC and the wiring OL[j] and between the circuit MC and the wiring OLB[j], electrical continuity is broken between the circuit MCr and the wiring OL[j] and between the circuit MCr and the wiring OLB[j], and electrical continuity is broken between the circuit MC and the wiring OL[j] and between the circuit MCr and OLB[j]" in the case where the second data $z_i^{(k-1)}$ is "0".

In this case, in the circuit MP[i,j], the current I[i,j] flowing from the wiring OL[j] to the circuit MC or the circuit MCr and the current $I_B$[i,j] flowing from the wiring OLB[j] to the circuit MC or the circuit MCr are as shown in the following table. Note that depending on the case, the circuit MP[i,j] may be configured such that the amount of current I(−1) is 0. Note that the current I[i,j] may be current flowing from the circuit MC or the circuit MCr to the wiring OL[j]. Similarly, the current $I_B$[i,j] may be current flowing from the circuit MC or the circuit MCr to the wiring OLB[j].

TABLE 1

| $w_i^{(k-1)}{}_j^{(k)}$ | $z_i^{(k-1)}$ | I[i, j] | $I_B$[i, j] |
|---|---|---|---|
| 0 | +1 | I(−1) | I(−1) |
| +1 | +1 | I(+1) | I(−1) |
| −1 | +1 | I(−1) | I(+1) |
| 0 | −1 | I(−1) | I(−1) |
| +1 | −1 | I(−1) | I(+1) |
| −1 | −1 | I(+1) | I(−1) |
| 0 | 0 | 0 | 0 |
| +1 | 0 | 0 | 0 |
| −1 | 0 | 0 | 0 |

Then, $I_{out}$[j] and $I_{Bout}$[j] respectively flowing from the wiring OL[j] and the wiring OLB[j] are input to the circuit ACTF[U], and the circuit ACTF[j] compares $I_{out}$[j] and $I_{Bout}$[j], for example. On the basis of the comparison result, the circuit ACTF[j] outputs the signal $z_j^{(k)}$ to be transmitted from the neuron $N_j^{(k)}$ to a neuron in the (k+1)-th layer, for example.

The arithmetic circuit 110 in FIG. 30 can perform, for example, product-sum operation of the weight coefficients $w_1^{(k-1)}{}_j^{(k)}$ to $w_m^{(k-1)}{}_j^{(k)}$ and the signals $z_1^{(k-1)}$ to $z_m^{(k-1)}$ input from the neuron $N_1^{(k-1)}$ to the neuron $N_m^{(k-1)}$ to the neuron $N_j^{(k)}$ and arithmetic operation of an activation function using the result of the product-sum operation. Furthermore, a circuit comparable to the arithmetic circuit 110 in FIG. 25 can be formed by providing the circuits MP in n columns in the array portion ALP of the arithmetic circuit in FIG. 30. In other words, with the arithmetic circuit 110 in FIG. 25, the product-sum operation and the arithmetic operation of an activation function using the result of the product-sum operation can be performed in the neuron $N_1^{(k)}$ to the neuron $N_n^{(k)}$ concurrently.

Modification Example 1 of Circuit in Arithmetic Circuit or the Like

The arithmetic circuit 110 and the arithmetic circuit 130 described above can be modified to perform not arithmetic operation of Formula (2.2) but arithmetic operation of Formula (2.3). Formula (2.3) corresponds to arithmetic operation in which a bias is applied to the product-sum result of Formula (2.2). Thus, for each of the arithmetic circuit 110 and the arithmetic circuit 130, a circuit applying a bias value to the wiring OL and the wiring OLB may be provided.

Figure 31:
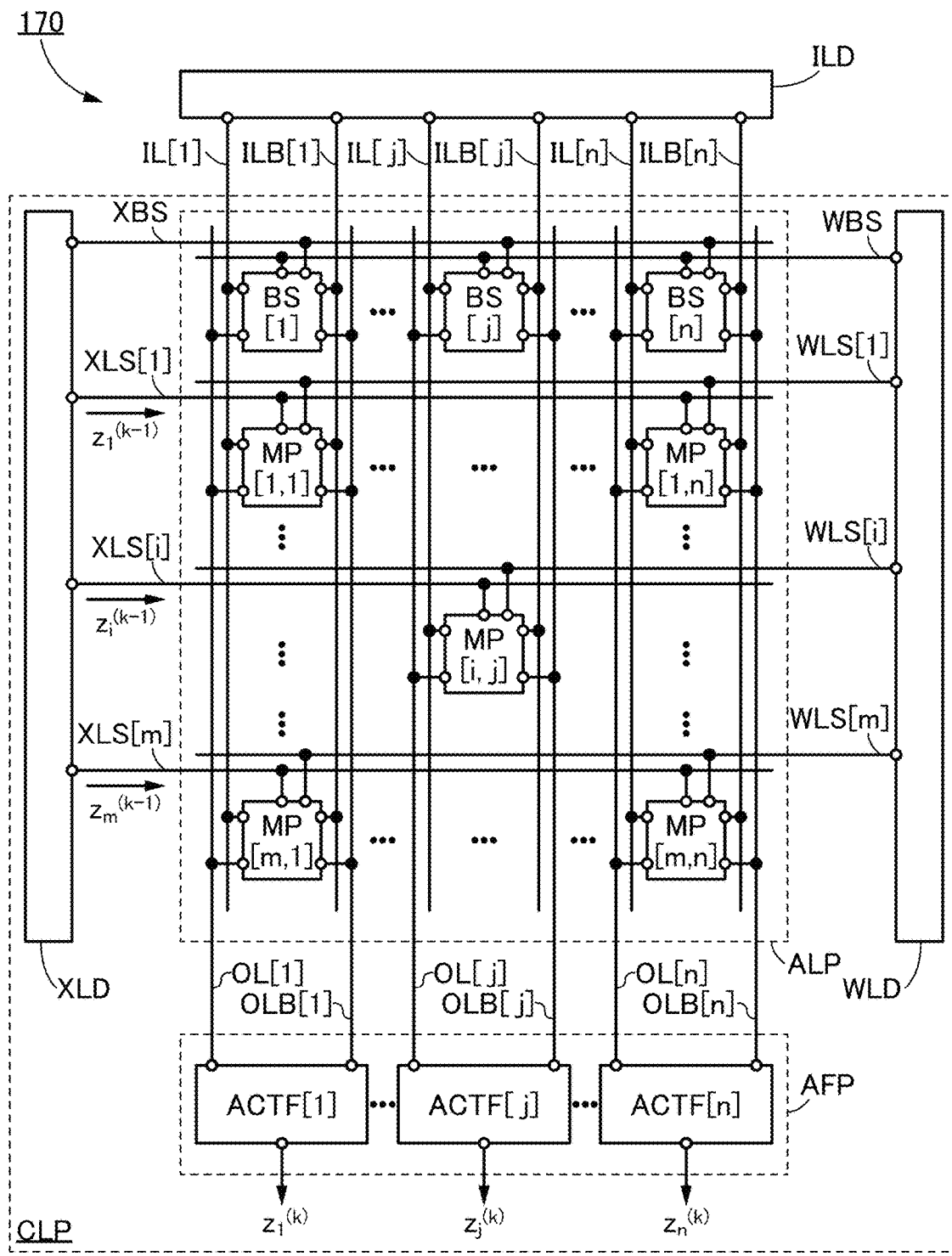
FIG. 31 is a circuit diagram illustrating a configuration example of a circuit included in a semiconductor device.

An arithmetic circuit 170 illustrated in FIG. 31 has a circuit configuration in which a circuit BS[1] to a circuit BS[n] are added to the array portion ALP of the arithmetic circuit 110 in FIG. 25. For the circuit BS[1] to the circuit BS[n], the circuit configuration similar to those in FIG. 27A to FIG. 27C can be used in some cases.

The circuit BS[j] is electrically connected to the wiring OL[j], the wiring OLB[j], a wiring WBS, and a wiring XBS.

Like the wiring WLS[1] to the wiring WLS[m] of the arithmetic circuit 110 in FIG. 25, for example, the wiring WBS functions as a wiring for supplying a signal that brings writing switching elements included in the circuit BS[1] to the circuit BS[n] into an on state or an off state. Thus, the signal can be supplied from the circuit WLD to the wiring WBS when the wiring WBS is electrically connected to the circuit WLD.

Like the wiring XLS[1] to the wiring XLS[m] of the arithmetic circuit 110 in FIG. 25, for example, the wiring XBS functions as a wiring for supplying, to the circuit BS[1] to the circuit BS[n], information (e.g., a potential or a current value) comparable to the second data $z_i^{(k-1)}$ output from the neuron $N_i^{(k-1))}$. Thus, the information can be supplied from the circuit XLD to the wiring XBS when the wiring XBS is electrically connected to the circuit XLD.

Figure 26:
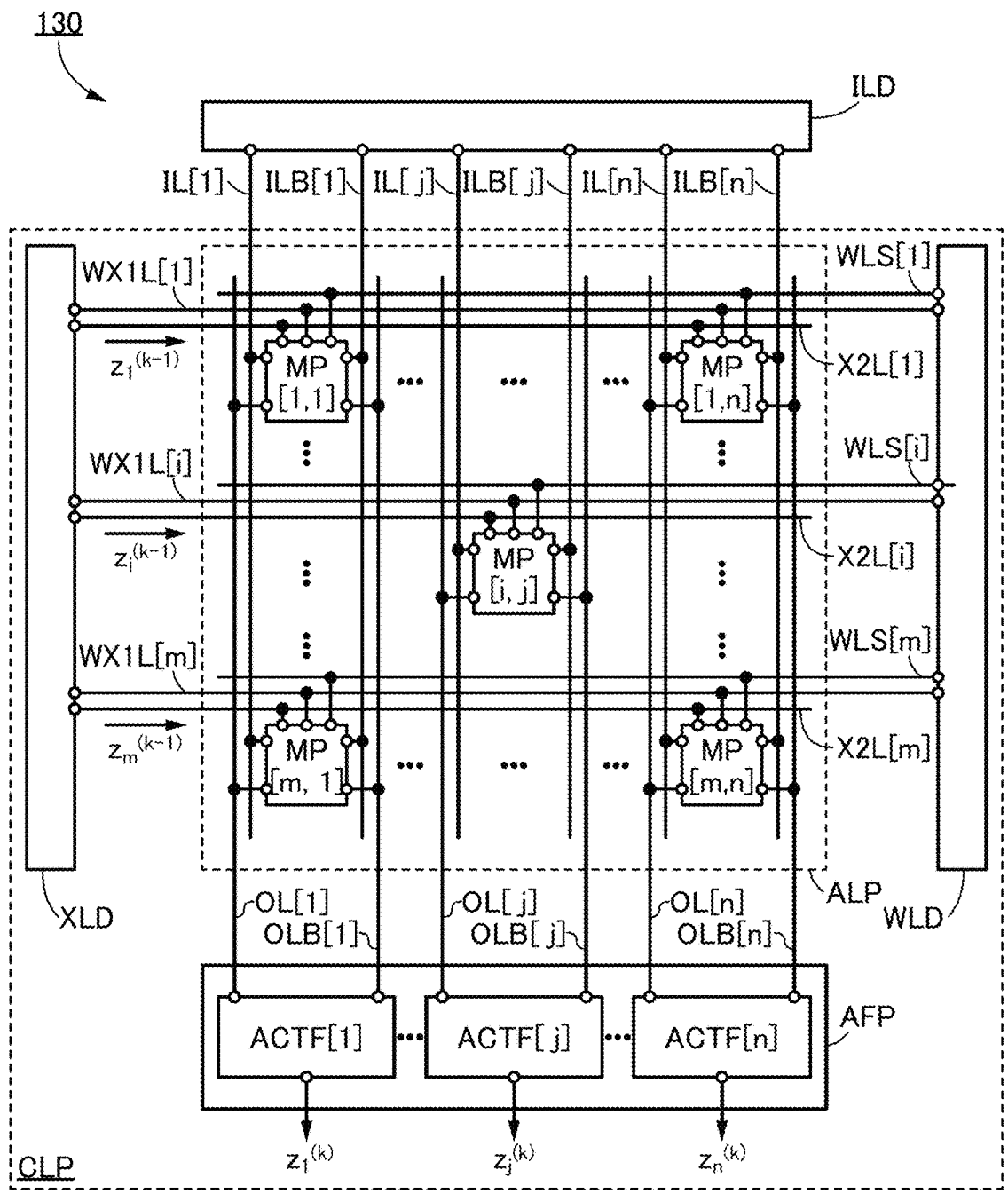
FIG. 26 is a circuit diagram illustrating a configuration example of a circuit included in a semiconductor device.

In addition, like the wiring WX1L[1] to the wiring WX1L[m] of the arithmetic circuit 130 or the like in FIG. 26, for example, the wiring XBS may also be used as a selection signal line for writing information to the circuit BS[1] to the circuit BS[n]. In the case of such a configuration, the circuit WLD can supply, to each of the wiring WBS and the wiring XBS, a signal that brings the writing switching elements included in the circuit BS[1] to the circuit BS[n] into an on state or an off state.

In the j-th column of the array portion ALP of the arithmetic circuit 170, the amount of current flowing from the circuit MP[1,j] to the circuit MP[m,j] to the wiring OL[j] or the wiring OLB[j] can be expressed by Formula (2.5) and Formula (2.6). In addition, the wiring OL[j] and the wiring OLB[j] are each electrically connected to the circuit BS[j]; thus, when a current flowing from the circuit BS[j] to the wiring OL[j] is $I_{BIAS}[j]$ and a current flowing from the circuit BS[j] to the wiring OLB[j] is $I_{BIASB}[j]$, Formula (2.5) and Formula (2.6) can be rewritten as the following formulae.

[Formula 6]

$$I_{out}[j] = \sum_{i=1}^{m} I[i, j] + I_{BIAS}[j] \quad (2.7)$$

$$I_{Bout}[j] = \sum_{i=1}^{m} I_B[i, j] + I_{BIASB}[j] \quad (2.8)$$

Accordingly, $I_{out}[j]$ and $I_{Bout}[j]$ each including a bias can be generated as the arithmetic operation of Formula (2.3). In addition, when $I_{out}[j]$ and $I_{Bout}[j]$ each including a bias are input to the circuit ACTF[j], the biased output signal $z_j^{(k)}$ from the neuron $N_j^{(k)}$ can be generated.

Although the arithmetic circuit 170 in FIG. 31 has a configuration in which the circuit BS[1] to the circuit BS[n] are provided for one row in the array portion ALP, one embodiment of the present invention is not limited thereto. For example, the circuit BS[1] to the circuit BS[n] may be provided for two or more rows in the array portion ALP.

Modification Example 2 of Circuit Included in Arithmetic Circuit or the Like

Here a configuration of the circuit MP that can be used in the arithmetic circuit 110 and is different from the circuits MP illustrated in FIG. 27B and FIG. 27C is described.

Figure 32:
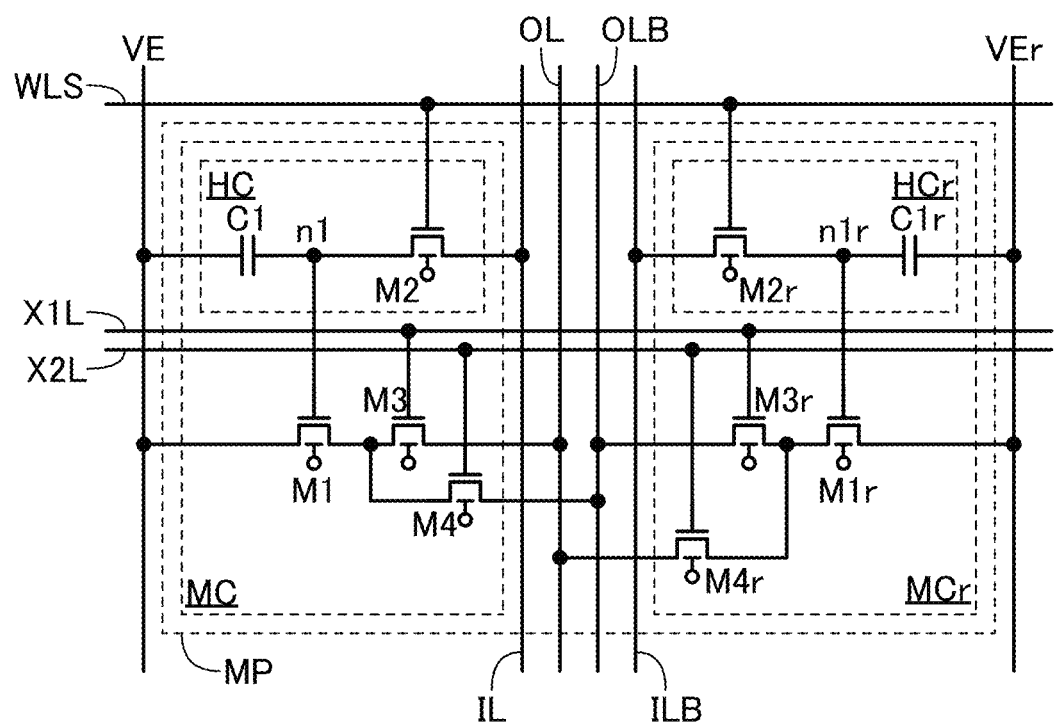
FIG. 32 is a circuit diagram illustrating a configuration example of a circuit included in a semiconductor device.

The circuit MP illustrated in FIG. 32 includes a storage circuit called NOSRAM (registered trademark). Note that FIG. 32 illustrates the whole circuit MP to show the electrical connection configuration of the circuit elements included in the circuit HC and the circuit HCr.

The circuit MP in FIG. 32 has a configuration such that the transistor M5 and the transistor M5r are removed from the configuration in FIG. 27B or FIG. 27C. Thus, the circuit MP in FIG. 32 has a configuration where a voltage is written to the first terminal of the capacitor C1 in the circuit HC and the first terminal of the capacitor C1r in the circuit HCr.

For example, the potential supplied from the wiring VE is set to a low-level potential, and a high-level potential is retained at the first terminal of the capacitor C1 in the circuit HC, whereby the transistor M1 is brought into an on state. Alternatively, a low-level potential is retained at the first terminal of the capacitor C1 in the circuit HC, whereby the transistor M1 is brought into an off state.

Here, for example, the case where a value of "−1", "0", or "+1" is written to the circuit MP as first data is considered. In the case of writing "+1" as the first data to the circuit MP, a high-level potential and a low-level potential may be retained at the circuit HC and the circuit HCr, respectively. In the case of writing "−1" as the first data to the circuit MP, a low-level potential and a high-level potential may be retained at the circuit HC and the circuit HCr, respectively. In the case of writing "0" as the first data to the circuit MP, a low-level potential and a high-level potential may be retained at the circuit HC and the circuit HCr, respectively. Note that instead of a binary value of a high-level potential or a low-level potential, a ternary or higher-level potential, an analog value, or the like may be retained in the circuit HC and the circuit HCr.

Next, after the first data is written to the circuit MP as described above, a voltage corresponding to the second data is input to the wiring X1L and the wiring X2L in a manner described in the above operation example, whereby as a result of the product of the first data and the second data, current flows (sometimes does not flow) from the wiring OL or the wiring OLB to the wiring VE through the circuit MC, and current flows (sometimes does not flow) from the wiring OL or the wiring OLB to the wiring VEr through the circuit MCr.

Next, a configuration of the circuit MP that can be used in the arithmetic circuit 110, which is different from the circuits MP illustrated in FIG. 27B, FIG. 27C, and FIG. 32, is described.

Figure 33A:
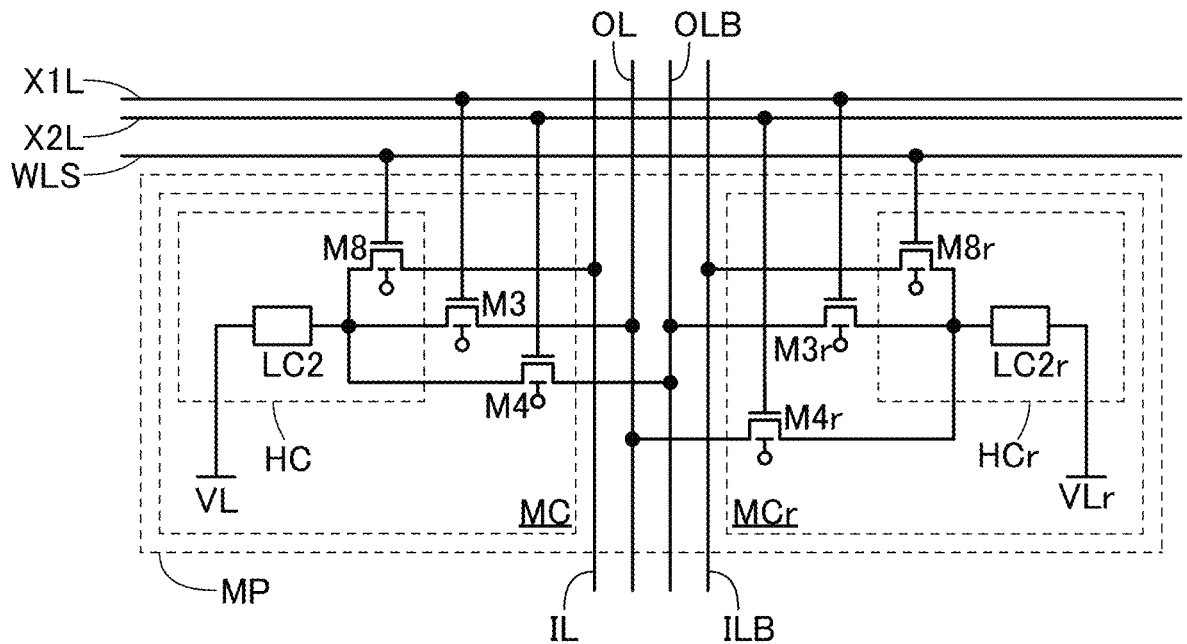
FIG. 33A to FIG. 33E are circuit diagrams each illustrating a configuration example of a circuit included in a semiconductor device.

The circuit MP illustrated in FIG. 33A includes a storage circuit including elements similar to that of the load circuit LC described with FIG. 10. Note that FIG. 33 illustrates the whole circuit MP to show the electrical connection configuration of the circuit elements included in the circuit HC and the circuit HCr.

In the circuit MP in FIG. 33A, the circuit MC includes the circuit HC, the transistor M3, and the transistor M4. The circuit HC includes a load circuit LC2 and a transistor M8.

Note that as the transistor M8, a transistor that can be used as the transistor M2 can be used, for example. Therefore, for the transistor M8, the description of the transistor M2 is referred to.

For structures of the transistor M3, the transistor M4, the transistor M3r, and the transistor M4r, the description of the transistor M3, the transistor M4, the transistor M3r, and the transistor M4r mentioned in a different place is referred to.

In the circuit MC of the circuit MP in FIG. 33A, a first terminal of the load circuit LC2 is electrically connected to the first terminal of the transistor M8, the first terminal of the transistor M3, and the first terminal of the transistor M4, and a second terminal of the load circuit LC2 is electrically connected to the wiring VL. The second terminal of the transistor M8 is electrically connected to the wiring IL, the second terminal of the transistor M3 is electrically connected to the wiring OL, and the second terminal of the transistor M4 is electrically connected to the wiring OLB. The gate of the transistor M8 is electrically connected to the wiring WLS, the gate of the transistor M3 is electrically connected to the wiring X1L, and the gate of the transistor M4 is electrically connected to the wiring X2L.

The circuit MCr of the circuit MP in FIG. 33A has substantially the same circuit configuration as the circuit MC. Thus, "r" is added to the reference numerals of the circuit elements included in the circuit MCr to differentiate them from the circuit elements included in the circuit MC. In addition, the first terminal of a transistor M8r is electrically connected to the wiring ILB, the second terminal of the transistor M3r is electrically connected to the wiring OLB, and the second terminal of the transistor M4r is electrically connected to the wiring OL.

Here, the wiring VL and the wiring VLr each function as a wiring for supplying a constant voltage. As the constant voltage, for example, a ground potential (GND) or a low potential in a range where the load circuit LC2 and the load circuit LC2r normally operate.

The load circuit LC2 and the load circuit LC2r are each a circuit capable of changing a resistance value between a first terminal and a second terminal, for example, like the load circuit LC in FIG. 10. By changing the resistance value between the first terminal and the second terminal of each of the load circuit LC2 and the load circuit LC2r, the amount of current flowing between the first terminal and the second terminal of each of the load circuit LC2 and the load circuit LC2r can be changed.

Here, a method for changing the resistance value between the first terminal and the second terminal of each of the load circuit LC2 and the load circuit LC2r in the circuit MP in FIG. 33A is described. First, a low-level potential is input to each of the wiring X1L and the wiring X2L to bring the transistor M3, the transistor M3r, the transistor M4, and the transistor M4r into an off state. Next, a high-level potential is input to the wiring WL to bring the transistor M8 and the transistor M8r into an on state and the potential of the wiring IL (the wiring ILB) is changed, so that the resistance value between the first terminal and the second terminal of the load circuit LC2 (the load circuit LC2r) is set. For example, there is a method for inputting to the wiring IL (the wiring ILB) a potential for resetting the resistance value between the first terminal and the second terminal of the load circuit LC2 (the load circuit LC2r), and then inputting to the wiring IL (the wiring ILB) a potential at which the resistance value between the first terminal and the second terminal of the load circuit LC2 (the load circuit LC2r) is set to a desired value. After the resistance value between the first terminal and the second terminal of the load circuit LC2 (the load circuit LC2r) is set to a desired value, a low-level potential is input to the wiring WL to bring the transistor M8 and the transistor M8r into an off state.

Figure 33B:
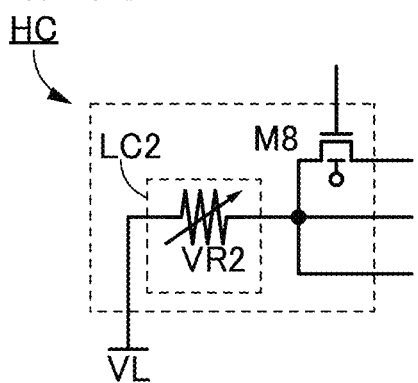
Figure 33C:
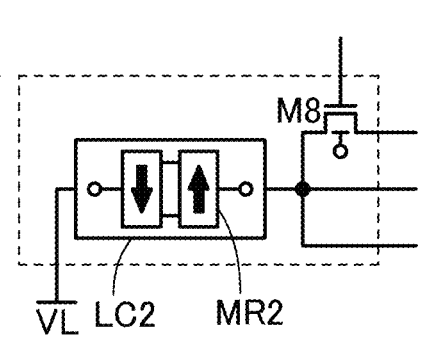
Figure 33D:
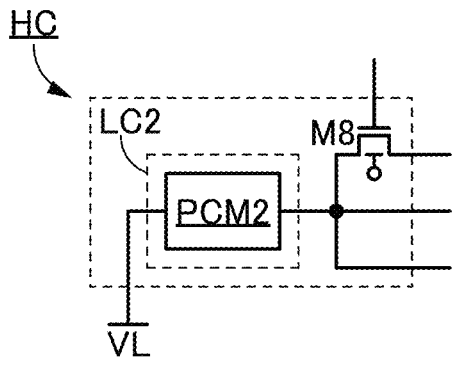

As each of the load circuit LC2 and the load circuit LC2r, for example, a variable resistor VR2 included in ReRAM or the like can be used as illustrated in FIG. 33B. The load circuit LC2 and the load circuit LC2r can each be, for example, the load circuit LC2 including a MTJ element MR2 included in MRAM or the like as illustrated in FIG. 33C. As each of the load circuit LC2 and the load circuit LC2r, for example, a resistor containing a phase-change material that is used for a phase-change memory (PCM) or the like (referred to as a phase-change memory PCM2 in this specification and the like for convenience) as illustrated in FIG. 33D.

Figure 33E:
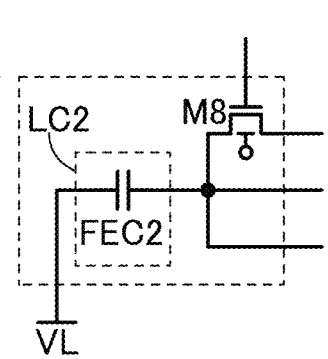

Alternatively, each of the load circuit LC2 and the load circuit LC2r can be a ferroelectric capacitor FEC sandwiched between a pair of electrodes, which is used for FeRAM or the like, as illustrated in FIG. 33E, for example. In this case, the wiring VL functions not as a wiring applying a constant voltage but as a plate line.

Next, a configuration of the circuit MP that can be used in the arithmetic circuit 110 or the like and is different from the circuits MP illustrated in FIG. 27B, FIG. 27C, FIG. 32, and FIG. 33A is described.

Figure 34A:
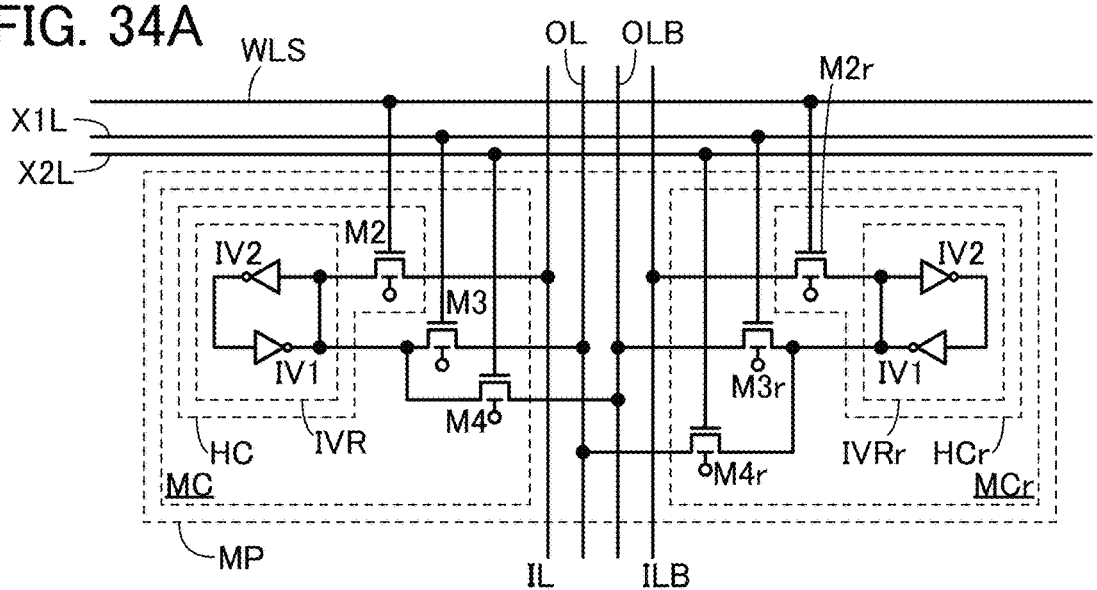
FIG. 34A to FIG. 34C are circuit diagrams each illustrating a configuration example of a circuit included in a semiconductor device.

The circuit MP illustrated in FIG. 34A has a configuration modified from that of FIG. 32 in such a way that an inverter loop circuit IVR is provided instead of the transistor M1 and the capacitor C1 in the circuit HC and an inverter loop circuit IVRr is provided instead of the transistor M1r and the capacitor C1r in the circuit HCr. In other words, the circuit MP illustrated in FIG. 34A includes a storage circuit of SRAM. In the circuit MP in FIG. 34A, the wiring VE and the wiring VEr are omitted.

The inverter loop circuit IVR includes an inverter circuit IV1 and an inverter circuit IV2, and the inverter loop circuit IVRr includes an inverter circuit IV1r and an inverter circuit IV2r.

The output terminal of the inverter circuit IV1 is electrically connected to the input terminal of the inverter circuit IV2, the first terminal of the transistor M3, the first terminal of the transistor M4, and the first terminal of the transistor M1, and the output terminal of the inverter circuit IV2 is electrically connected to the input terminal of the inverter circuit IV1. The second terminal of the transistor M3 is electrically connected to the wiring OL and the gate of the transistor M3 is electrically connected to the wiring X1L. The second terminal of the transistor M4 is electrically connected to the wiring OLB and the gate of the transistor M4 is electrically connected to the wiring X2L. The second terminal of the transistor M2 is electrically connected to the wiring IL, and the gate of the transistor M2 is electrically connected to the wiring WLS. The output terminal of the inverter circuit IV1r is electrically connected to the input terminal of the inverter circuit IV2r, the first terminal of the transistor M3r, the first terminal of the transistor M4r, and the first terminal of the transistor M2r, and the output terminal of the inverter circuit IV2r is electrically connected to an input terminal of the inverter circuit IV1r. The second terminal of the transistor M3r is electrically connected to the wiring OLB, and the gate of the transistor M3r is electrically connected to the wiring X1L. The second terminal of the transistor M4r is electrically connected to the wiring OL, and the gate of the transistor M4r is electrically connected to the wiring X2L. The second terminal of the transistor M2r is electrically connected to the wiring ILB, and the gate of the transistor M2r is electrically connected to the wiring WLS.

The circuit HC has a function of retaining one of a high-level potential and a low-level potential at the output terminal of the inverter circuit IV1 of the inverter loop circuit IVR, and the circuit HCr has a function of retaining one of a high-level potential and a low-level potential at the output terminal of the inverter circuit IV1 of the inverter loop circuit IVRr. Thus, for example, a high-level potential is retained at the output terminal of the inverter circuit IV1 and a low-level potential is retained at the output terminal of the inverter circuit IV1r when the first data (a weight coefficient) set in the circuit MP is "+1"; a low-level potential is retained at the output terminal of the inverter circuit IV1 and a high-level potential is retained at the output terminal of the inverter circuit IV1r when the first data (a weight coefficient) set in the circuit MP is "−1"; and a low-level potential is retained at the output terminal of the inverter circuit IV1 and a low-level potential is retained at the output terminal of the inverter circuit IV1r when the first data (a weight coefficient) set in the circuit MP is "0".

For the input of the second data (a value of a signal of a neuron) to the circuit MP in FIG. 34A, a high-level potential may be input to one of the wiring X1L and the wiring X2L.

The circuit MP in FIG. 34A has a configuration in which a current is made to flow from the wiring OL or the wiring OLB to the circuit MC using a transistor included in the inverter loop circuit IVR of the circuit HC and a current is made to flow from the wiring OL or the wiring OLB to the circuit MCr using a transistor included in the inverter loop circuit IVRr of the circuit HCr, which is different from the circuits MP described above.

Figure 34B:
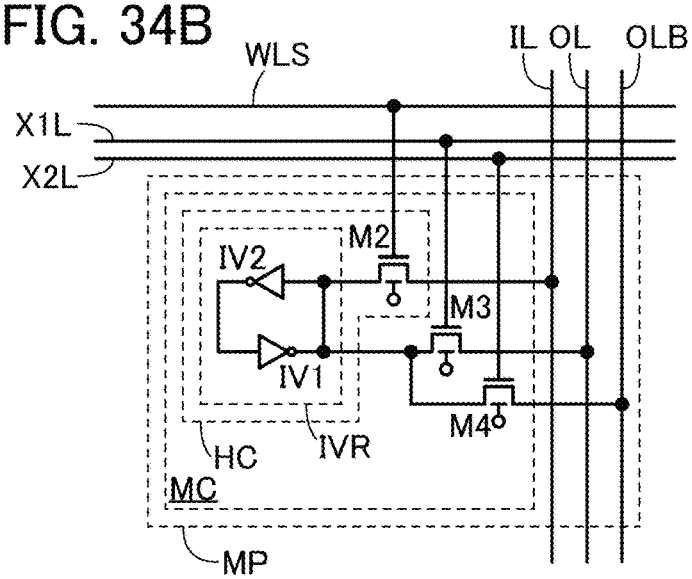

The configuration of the circuit MP in FIG. 34A can be changed into that of the circuit MP illustrated in FIG. 34B. The circuit MP in FIG. 34B has a configuration in which the circuit MCr included in the circuit MP in FIG. 34A is removed. That is, a configuration is employed in which a current is made to flow from the wiring OL or the wiring OLB to the circuit MC using the transistor included in the inverter loop circuit IVR of the circuit HC. In this case, for example, the first data (a weight coefficient) set in the circuit MP can be "+1" when a high-level potential is supplied to the output terminal of the inverter circuit IV1, and the first data (a weight coefficient) set in the circuit MP can be "0" when a low-level potential is supplied to the output terminal of the inverter circuit IV1.

Figure 34C:
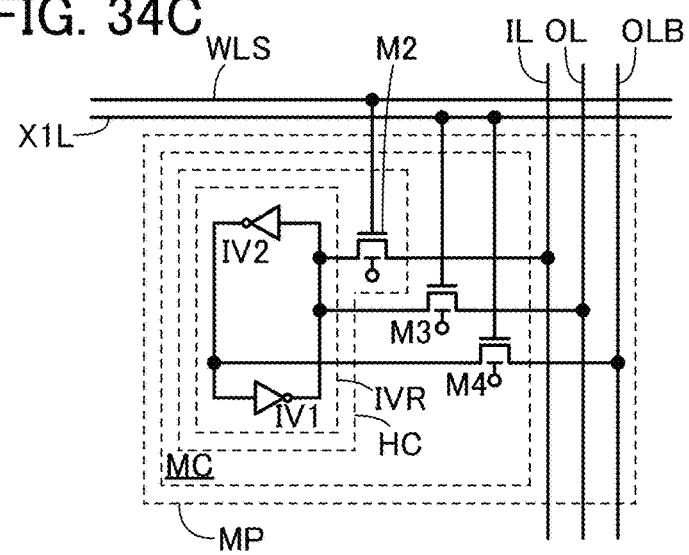

The circuit MP in FIG. 34C has a configuration in which the wiring X2L is removed from the circuit MP in FIG. 34B and the first terminal of the transistor M4 is electrically connected to the input terminal of the inverter circuit IV1 and the output terminal of the inverter circuit IV2. When the potential of the wiring X1L is a high-level potential, the inverted signal is output to the wiring OL or the wiring OLB. In this case, for example, the first data (a weight coefficient) set in the circuit MP can be "+1" when a high-level potential is supplied to the output terminal of the inverter circuit IV1, and the first data (a weight coefficient) set in the circuit MP can be "−1" when a low-level potential is supplied to the output terminal of the inverter circuit IV1. As another example, in supplying information (e.g., a current or a voltage) from the circuit MP to the circuit AFP, the second data (a value of a signal of a neuron) input to the circuit MP can be "+1" when a high-level potential is input to the wiring X1L, and the second data (a value of a signal of a neuron) input to the circuit MP can be "0" when a low-level potential is input to the wiring X1L.

Other than the above, examples of the storage element that can be used in the circuit MP includes a flash memory.

When any of the circuits MP in FIG. 32, FIG. 33A, and FIG. 34A to FIG. 34C is used in the arithmetic circuit 110 as illustrated in FIG. 25, values of products calculated on one column in the circuits MP can be summed up. Thus, the product sum of the first data and the second data can be calculated.

Some of or all of transistors included in the arithmetic portion CLP, described above, are preferably OS transistors. For example, in the case of a transistor whose off-state current is desired to be low, specifically a transistor having a function of holding charge accumulated in a capacitor or the like, is preferably an OS transistor. In particular, in the case where an OS transistor is used as the transistor, the OS transistor preferably has a transistor structure described particularly in Embodiment 4. For a metal oxide included in a channel formation region of the OS transistor, one or more materials selected from indium, an element M (M is aluminum, gallium, yttrium, or tin), and zinc can be used, for example. In particular, a metal oxide containing indium, gallium, and zinc is an intrinsic (also referred to as i-type) or substantially intrinsic semiconductor that has a wide bandgap, and the carrier concentration of the metal oxide is preferably lower than or equal to $1 \times 10^{18}$ cm$^{-3}$, further preferably lower than $1 \times 10^{17}$ cm$^{-3}$, still further preferably lower than $1 \times 10^{16}$ cm$^{-3}$, yet further preferably lower than $1 \times 10^{13}$ cm$^{-3}$, yet still further preferably lower than $1 \times 10^{12}$ cm$^{-3}$. The off-state current per micrometer of channel width of the OS transistor including the metal oxide in the channel formation region can be lower than or equal to 10 aA ($1 \times 10^{-17}$ A), preferably lower than or equal to 1 aA ($1 \times 10^{-18}$ A), further preferably lower than or equal to 10 zA ($1 \times 10^{-20}$ A), still further preferably lower than or equal to 1 zA ($1 \times 10^{-21}$ A), yet further preferably lower than or equal to 100 yA ($1 \times 10^{-22}$ A). Since the carrier concentration of the metal oxide in the OS transistor is low, the off-state current remains low even when the temperature of the OS transistor is changed. For example, even when the temperature of the OS transistor is 150° C., the off-state current per micrometer of channel width can be 100 zA.

However, one embodiment of the present invention is not limited to the above, and the transistor included in the arithmetic portion CLP is not necessarily an OS transistor. Other than the OS transistor, a transistor containing silicon in a channel formation region (hereinafter, referred to as a Si transistor) may be used, for example. As silicon, single-crystal silicon, amorphous silicon (referred to as hydrogenated amorphous silicon in some cases), microcrystalline silicon, or polycrystalline silicon can be used, for example. Furthermore, a transistor other than an OS transistor and a Si transistor can be, for example, a transistor including Ge or the like in a channel formation region, a transistor including a compound semiconductor such as ZnSe, CdS, GaAs, InP, GaN, or SiGe in a channel formation region, a transistor including a carbon nanotube in a channel formation region, a transistor including an organic semiconductor in a channel formation region, or the like.

Note that for the metal oxides in the semiconductor layers of OS transistors, n-type semiconductors of a metal oxide containing indium (e.g., In oxide) and a metal oxide containing zinc (e.g., Zn oxide) have been manufactured but p-type semiconductors thereof are difficult to manufacture in terms of mobility and reliability in some cases. For that reason, in the arithmetic circuit 110, the arithmetic circuit 130, and the arithmetic circuit 170, OS transistors may be used as the n-channel transistors included in the arithmetic portion CLP and the like, and Si transistors may be used as the p-channel transistors.

Note that this embodiment can be combined with any of the other embodiments in this specification as appropriate.

Embodiment 3

This embodiment describes structure examples of the semiconductor device described in the above embodiment and structure examples of transistors that can be used in the semiconductor device described in the above embodiment.

<Structure Example of Semiconductor Device>

Figure 35:
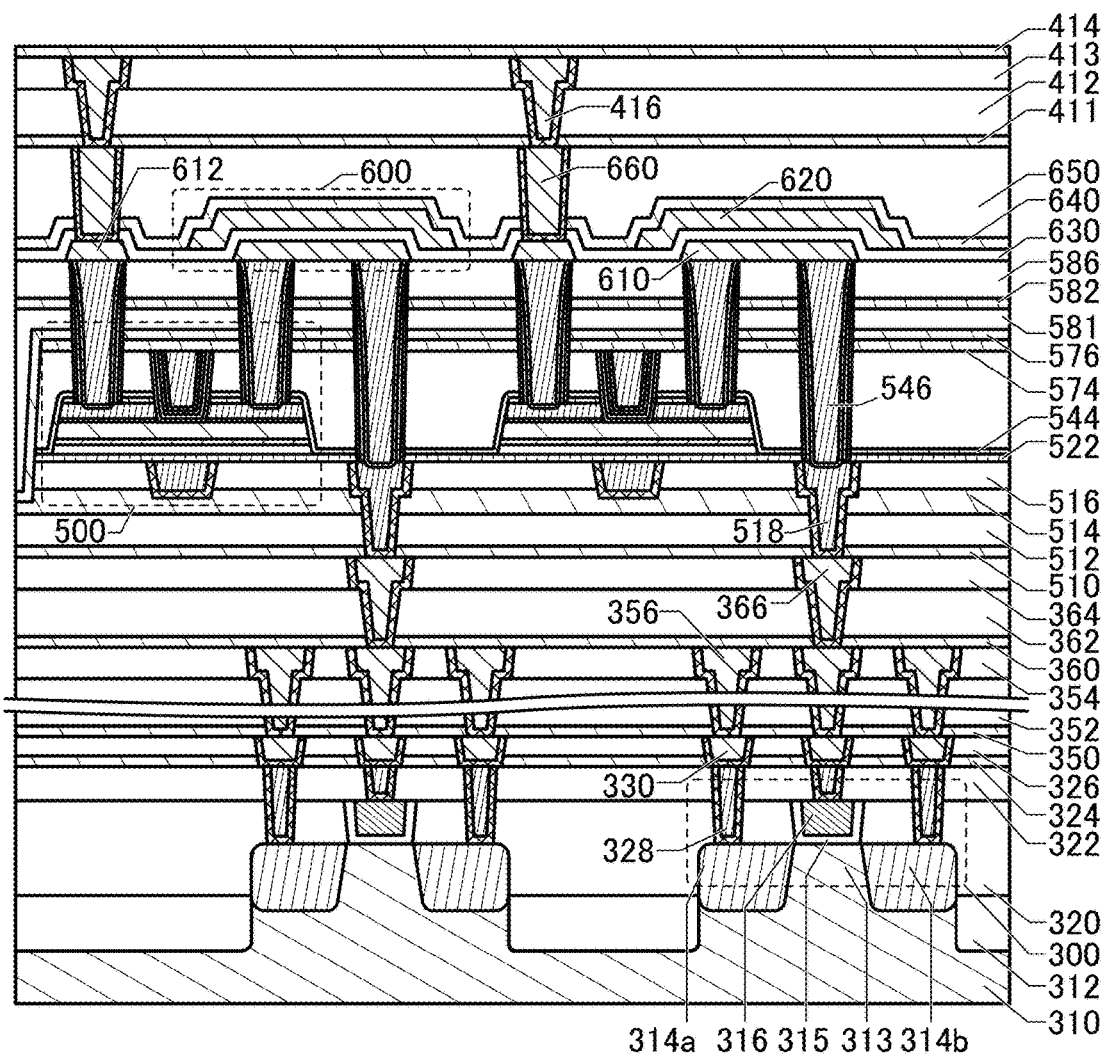
FIG. 35 is a schematic cross-sectional view showing a structure example of a semiconductor device.
Figure 36A:
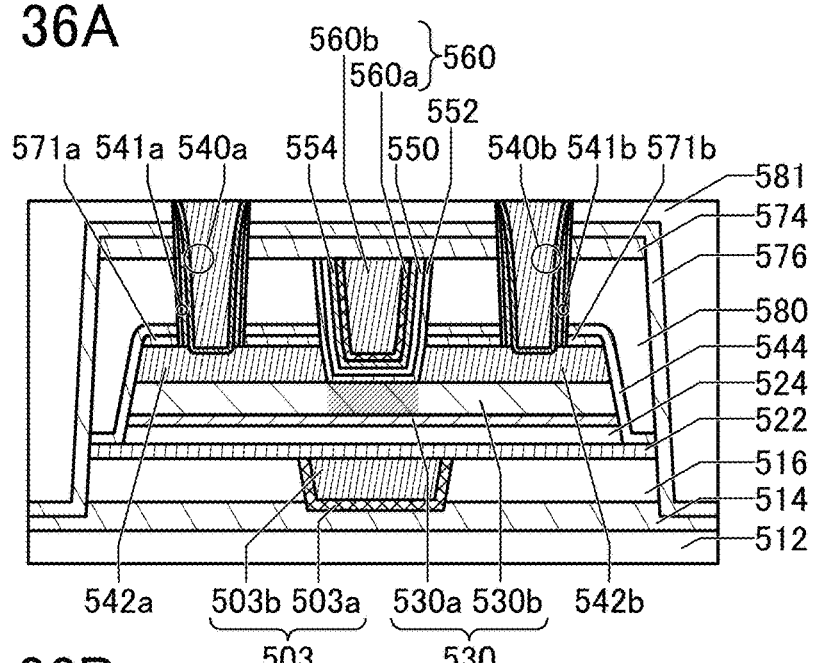
FIG. 36A to FIG. 36C are schematic cross-sectional views illustrating a structure example of a transistor.
Figure 36B:
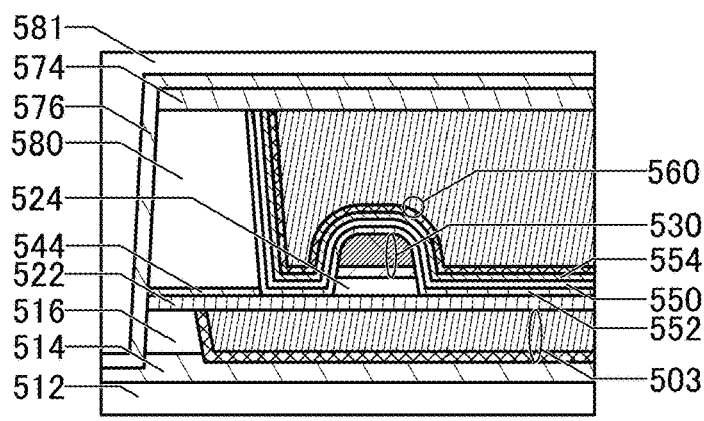
Figure 36C:
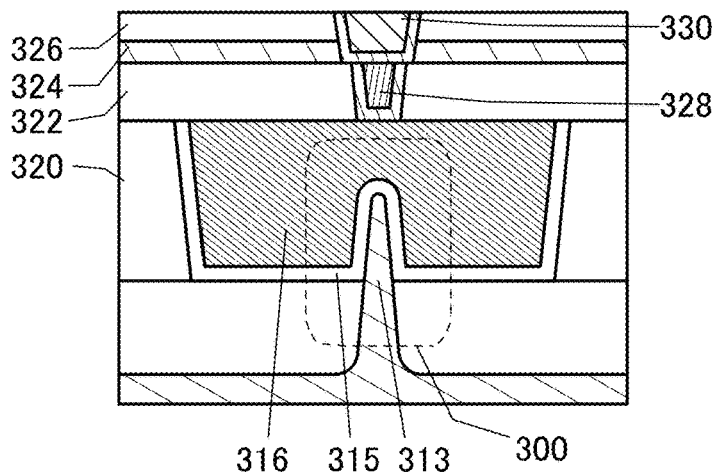

FIG. 35 illustrates the semiconductor device described in the above embodiment as an example, and the semiconductor device includes a transistor 300, a transistor 500, and a capacitor 600. FIG. 36A is a cross-sectional view of the transistor 500 in the channel length direction, FIG. 36B is a cross-sectional view of the transistor 500 in the channel width direction, and FIG. 36C is a cross-sectional view of the transistor 300 in the channel width direction.

The transistor 500 is a transistor containing a metal oxide in a channel formation region (an OS transistor). The transistor 500 has features that the off-state current is low and that the field-effect mobility hardly changes even at high temperatures. The transistor 500 is used as a transistor included in a semiconductor device, for example, arithmetic circuit 110, the arithmetic circuit 130, the arithmetic circuit 170, or the like described in the above embodiment, whereby a semiconductor device whose operating capability does not deteriorate even at a high temperature can be obtained. In particular, the transistor 500 is used, to utilize its feature of low off-state current, as the transistor F1 to the transistor F4, the transistor M1d, the transistor M2d, the transistor M1 to the transistor M5, the transistor M8, or the like, whereby the potential written to the circuit HC, the circuit HCr, or the like can be retained for a long time.

The transistor 500 is provided above the transistor 300, and the capacitor 600 is provided above the transistor 300 and the transistor 500, for example. Note that the capacitor 600 can be a capacitor included in the arithmetic circuit 110, the arithmetic circuit 130, the arithmetic circuit 170, or the like, described in the above embodiment. Note that depending on a circuit configuration, the capacitor 600 illustrated in FIG. 35 is not necessarily provided.

The transistor 300 is provided on a substrate 310 and includes an element isolation layer 312, a conductor 316, an insulator 315, a semiconductor region 313 that is part of the substrate 310, and a low-resistance region 314a and a low-resistance region 314b functioning as a source region and a drain region. Note that the transistor 300 can be used as, for example, the transistor included in the arithmetic circuit 110, the arithmetic circuit 130, the arithmetic circuit 170, or the like, described in the above embodiment. Specifically, the transistor 300 can be used as any of transistors included in the current source CC[1] to the current source CC[K] (the current source CC[1] to the current source CC[$2^K$−1]) and the switch SW[1] to the switch SW[K] (the switch SW[1] to the switch SW[$2^K$−1]) included in the circuit ILD illustrated in FIG. 2A to FIG. 2C, the circuit BF illustrated in FIG. 4, the decoder DEC illustrated in FIG. 5, the circuit SA illustrated in FIG. 8, the circuit IVC illustrated in FIG. 10, the inverter circuit INV1 and the inverter circuit INV2 illustrated in FIG. 11, the latch circuit LAT1 and the latch circuit LAT2 illustrated in FIG. 14, the circuit DTC illustrated in FIG. 17, the circuit CMPD illustrated in FIG. 18, the comparator CMP, the operational amplifier OP, included in the circuit ACTF illustrated in FIG. 7A to FIG. 7E, and the like. Moreover, the transistor 300 can be used as the transistors such as the transistor M1 and the transistor M1d and the switches described in the above embodiment. Note that FIG. 35 illustrates a structure where a gate of the transistor 300 is electrically connected to one of a source and a drain of the transistor 500 through a pair of electrodes of the capacitor 600. However, depending on the configurations of the arithmetic circuit 110, the arithmetic circuit 130, the arithmetic circuit 170, and the like, it is possible to employ a structure where one of a source and a drain of the transistor 300 is electrically connected to one of the source and the drain of the transistor 500 through the pair of electrodes of the capacitor 600, a structure where one of the source and the drain of the transistor 300 is electrically connected to a gate of the transistor 500 through the pair of electrodes of the capacitor 600, or a structure where each terminal of the transistor 300 is not electrically connected to each terminal of the transistor 500 or each terminal of the capacitor 600.

A semiconductor substrate (e.g., a single crystal substrate or a silicon substrate) is preferably used as the substrate 310.

In the transistor 300, the top surface and the side surface in the channel width direction of the semiconductor region 313 are covered with the conductor 316 with the insulator 315 therebetween, as illustrated in FIG. 36C. Such a Fin-type transistor 300 can have an increased effective channel width, and thus the transistor 300 can have improved on-state characteristics. In addition, since contribution of an electric field of a gate electrode can be increased, the off-state characteristics of the transistor 300 can be improved.

Note that the transistor 300 may be either a p-channel transistor or an n-channel transistor.

A region of the semiconductor region 313 where a channel is formed, a region in the vicinity thereof, the low-resistance region 314a and the low-resistance region 314b functioning as the source region and the drain region, and the like preferably contain a semiconductor such as a silicon-based semiconductor, further preferably contain single crystal silicon. Alternatively, the regions may be formed using a material containing Ge (germanium), SiGe (silicon germanium), GaAs (gallium arsenide), GaAlAs (gallium aluminum arsenide), GaN (gallium nitride), or the like. A structure may be employed in which silicon whose effective mass is controlled by applying stress to the crystal lattice and changing the lattice spacing is used. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to a semiconductor material used for the semiconductor region 313.

For the conductor 316 functioning as a gate electrode, a semiconductor material such as silicon containing an element that imparts n-type conductivity, such as arsenic or phosphorus, or an element that imparts p-type conductivity, such as boron, or a conductive material such as a metal material, an alloy material, or a metal oxide material can be used.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

The element isolation layer 312 is provided to separate a plurality of transistors on the substrate 310 from each other. The element isolation layer can be formed by, for example, a LOCOS (Local Oxidation of Silicon) method, an STI (Shallow Trench Isolation) method, a mesa isolation method, or the like.

Figure 37:
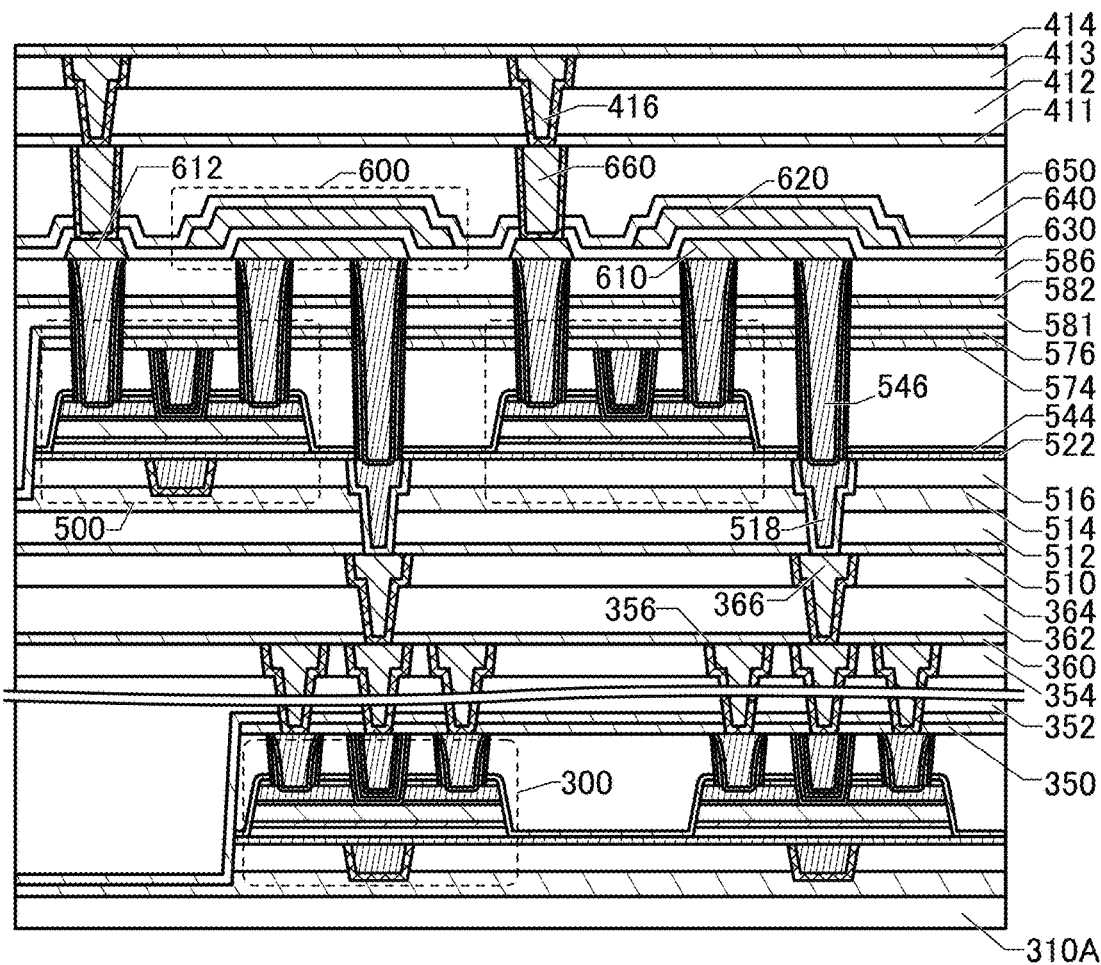
FIG. 37 is a schematic cross-sectional view illustrating a structure example of a semiconductor device.

Note that the transistor 300 illustrated in FIG. 35 is only an example and the structure is not limited thereto; an appropriate transistor can be used in accordance with a circuit configuration, a driving method, or the like. For example, the transistor 300 may have a planar structure instead of a FIN-type structure illustrated in FIG. 36C. For example, when a semiconductor device is configured as a single-polarity circuit using only OS transistors, the transistor 300 can have a structure similar to that of the transistor 500 using an oxide semiconductor, as illustrated in FIG. 37. Note that the details of the transistor 500 will be described later. In this specification and the like, the term "single-polarity circuit" refers to a circuit in which all transistors are only either n-channel transistors or p-channel transistors.

Note that in FIG. 37, the transistor 300 is provided over a substrate 310A; in this case, a semiconductor substrate may be used as the substrate 310A as in the case of the substrate 310 in the semiconductor device in FIG. 35. As the substrate 310A, for example, an SOI substrate, a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used. Examples of the glass substrate include barium borosilicate glass, aluminoborosilicate glass, and soda lime glass. As examples of the flexible substrate, the attachment film, the base material film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as acrylic. Other examples include polypropylene, polyester, polyvinyl fluoride, and polyvinyl chloride. Other examples include polyamide, polyimide, aramid, an epoxy resin, an inorganic vapor deposition film, and paper.

Over the transistor 300 illustrated in FIG. 35, an insulator 320, an insulator 322, an insulator 324, and an insulator 326 are sequentially stacked from the substrate 310 side.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, or aluminum nitride can be used, for example.

Note that in this specification, silicon oxynitride refers to a material that contains oxygen at a higher proportion than nitrogen in its composition, and silicon nitride oxide refers to a material that contains nitrogen at a higher proportion than oxygen in its composition. Furthermore, in this specification, aluminum oxynitride refers to a material that contains oxygen at a higher proportion than nitrogen in its composition, and aluminum nitride oxide refers to a material that contains nitrogen at a higher proportion than oxygen in its composition.

The insulator 322 may have a function of a planarization film for planarizing a level difference caused by the transistor 300 or the like covered with the insulator 320 and the insulator 322. For example, atop surface of the insulator 322 may be planarized by planarization treatment using a chemical mechanical polishing (CMP) method or the like to improve planarity.

As the insulator 324, it is preferable to use a film having a barrier property that prevents diffusion of hydrogen, impurities, or the like from the substrate 310, the transistor 300, or the like into a region where the transistor 500 is provided.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. The relative permittivity of the insulator 326 is, for example, preferably 0.7 times or less, further preferably 0.6 times or less the dielectric constant of the insulator 324. When a material with a low permittivity is used for an interlayer film, parasitic capacitance generated between wirings can be reduced.

A conductor 328, a conductor 330, and the like that are connected to the capacitor 600 or the transistor 500 are embedded in the insulator 320, the insulator 322, the insulator 324, and the insulator 326. Note that the conductor 328 and the conductor 330 have a function of a plug or a wiring. A plurality of conductors having a function of a plug or a wiring are collectively denoted by the same reference numeral in some cases. Moreover, in this specification and the like, a wiring and a plug connected to the wiring may be a single component. That is, in some cases, part of a conductor functions as a wiring or part of a conductor functions as a plug.

As a material of each of plugs and wirings (e.g., the conductor 328 and the conductor 330), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 35, an insulator 350, an insulator 352, and an insulator 354 are provided to be stacked in this order above the insulator 326 and the conductor 330. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

For example, like the insulator 324, the insulator 350 is preferably formed using an insulator having a barrier property against impurities such as hydrogen and water. The insulator 352 and the insulator 354 are preferably formed using an insulator having a relatively low dielectric constant to reduce the parasitic capacitance generated between wirings, like the insulator 326. Furthermore, the conductor 356 preferably contains a conductor having a barrier property against impurities such as hydrogen and water. In particular, the conductor having a barrier property against hydrogen is formed in an opening portion of the insulator 350 having a barrier property against hydrogen. With this structure, the transistor 300 and the transistor 500 can be separated by the barrier layer, so that diffusion of hydrogen from the transistor 300 into the transistor 500 can be inhibited.

Note that for the conductor having a barrier property against hydrogen, tantalum nitride is preferably used, for example. In addition, the use of a stack including tantalum nitride and tungsten, which has high conductivity, can inhibit diffusion of hydrogen from the transistor 300 while the conductivity of a wiring is kept. In that case, a structure is preferable in which a tantalum nitride layer having a barrier property against hydrogen is in contact with the insulator 350 having a barrier property against hydrogen.

An insulator 360, an insulator 362, and an insulator 364 are sequentially stacked over the insulator 354 and the conductor 356.

Like the insulator 324 or the like, the insulator 360 is preferably formed using an insulator having a barrier property against impurities such as water and hydrogen. Thus, the insulator 360 can be formed using any of the materials usable for the insulator 324 or the like, for example.

The insulator 362 and the insulator 364 have functions of an interlayer insulating film and a planarization film. For example, like the insulator 324, the insulator 362 and the insulator 364 are preferably formed using an insulator having a barrier property against impurities such as water and hydrogen. Thus, the insulator 362 and/or the insulator 364 can be formed using any of the materials usable for the insulator 324.

An opening portion is provided in regions of the insulator 360, the insulator 362, and the insulator 364 that overlap with part of the conductor 356, and the conductor 366 is embedded to fill the opening portion. The conductor 366 is also formed over the insulator 362. The conductor 366 has a function of a plug or a wiring connected to the transistor 300, for example. Note that the conductor 366 can be provided using a material similar to those for the conductor 328 and the conductor 330.

An insulator 510, an insulator 512, an insulator 514, and an insulator 516 are stacked sequentially over the insulator 364 and the conductor 366. A substance with a barrier property against oxygen or hydrogen is preferably used for any of the insulator 510, the insulator 512, the insulator 514, and the insulator 516.

For example, as the insulator 510 and the insulator 514, it is preferable to use a film having a barrier property that prevents diffusion of hydrogen, impurities, or the like from the substrate 310, a region where the transistor 300 is provided, or the like into the region where the transistor 500 is provided. Therefore, a material similar to that for the insulator 324 can be used.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

For the film having a barrier property against hydrogen used for the insulator 510 and the insulator 514, a metal oxide such as aluminum oxide, hafnium oxide, or tantalum oxide is preferably used, for example.

In particular, aluminum oxide has an excellent blocking effect that prevents passage of oxygen and impurities such as hydrogen and moisture that would cause a change in the electrical characteristics of the transistor. Accordingly, aluminum oxide can prevent entry of impurities such as hydrogen and moisture into the transistor 500 in and after the manufacturing process of the transistor. In addition, release of oxygen from the oxide included in the transistor 500 can be inhibited. Therefore, aluminum oxide is suitably used for a protective film of the transistor 500.

For the insulator 512 and the insulator 516, a material similar to that for the insulator 320 can be used, for example. Furthermore, when a material with a comparatively low permittivity is used for these insulators, parasitic capacitance generated between wirings can be reduced. A silicon oxide film, a silicon oxynitride film, or the like can be used for the insulator 512 and the insulator 516, for example.

Furthermore, a conductor 518, a conductor included in the transistor 500 (e.g., a conductor 503 illustrated in FIG. 36A and FIG. 36B), and the like are embedded in the insulator 510, the insulator 512, the insulator 514, and the insulator 516. Note that the conductor 518 has a function of a plug or a wiring that is connected to the capacitor 600 or the transistor 300. The conductor 518 can be provided using a material similar to those for the conductor 328 and the conductor 330.

In particular, a region of the conductor 518 that is in contact with the insulator 510 and the insulator 514 is preferably a conductor having a barrier property against oxygen, hydrogen, and water. With this structure, the transistor 300 and the transistor 500 can be separated by the layer having a barrier property against oxygen, hydrogen, and water; hence, the diffusion of hydrogen from the transistor 300 into the transistor 500 can be inhibited.

The transistor 500 is provided above the insulator 516.

As illustrated in FIG. 36A and FIG. 36B, the transistor 500 includes the insulator 516 over the insulator 514, a conductor 503 (a conductor 503a and a conductor 503b) provided to be embedded in the insulator 514 or the insulator 516, an insulator 522 over the insulator 516 and the conductor 503, an insulator 524 over the insulator 522, an oxide 530a over the insulator 524, an oxide 530b over the oxide 530a, a conductor 542a over the oxide 530b, an insulator 571a over the conductor 542a, a conductor 542b over the oxide 530b, an insulator 571b over the conductor 542b, an insulator 552 over the oxide 530b, an insulator 550 over the insulator 552, an insulator 554 over the insulator 550, a conductor 560 (a conductor 560a and a conductor 560b) over the insulator 554 and overlapping with part of the oxide 530b, and an insulator 544 placed over the insulator 522, the insulator 524, the oxide 530a, the oxide 530b, the conductor 542a, the conductor 542b, the insulator 571a, and insulator 571b. Note that in this specification and the like, the conductor 542a and the conductor 542b are collectively referred to as a conductor 542, and the insulators 571a and 571b are collectively referred to as an insulator 571. Here, as illustrated in FIG. 36A and FIG. 36B, the insulator 552 is in contact with the top surface of the insulator 522, the side surface of the insulator 524, the side surface of the oxide 530a, the side surface and the top surface of the oxide 530b, the side surface of the conductor 542, the side surface of the insulator 571, the side surface of the insulator 544, the side surface of the insulator 580, and the bottom surface of the insulator 550. The top surface of the conductor 560 is placed to be substantially level with the uppermost portion of the insulator 554, the uppermost portion of the insulator 550, the uppermost portion of the insulator 552, and the top surface of the insulator 580. An insulator 574 is in contact with part of at least one of the top surface of the conductor 560, the upper portion of the insulator 552, the upper portion of the insulator 550, the upper portion of the insulator 554, and the top surface of the insulator 580.

An opening reaching the oxide 530b is provided in the insulator 580 and the insulator 544. The insulator 552, the insulator 550, the insulator 554, and the conductor 560 are positioned in the opening. The conductor 560, the insulator 552, the insulator 550, and the insulator 554 are provided between the conductor 542a and the conductor 542b and between the insulator 571a and the insulator 571b in the channel length direction of the transistor 500. The insulator 554 includes a region in contact with the side surface of the conductor 560 and a region in contact with the bottom surface of the conductor 560.

The oxide 530 preferably includes the oxide 530a placed over the insulator 524 and the oxide 530b placed over the oxide 530a. Including the oxide 530a under the oxide 530b makes it possible to inhibit diffusion of impurities into the oxide 530b from the components formed below the oxide 530a.

Although a structure in which two layers, the oxide 530a and the oxide 530b, are stacked as the oxide 530 in the transistor 500 is described, the present invention is not limited thereto. For example, the oxide 530 may be provided as a single layer of the oxide 530b or to have a stacked-layer structure of three or more layers, or the oxide 530a and the oxide 530b may each have a stacked-layer structure.

The conductor 560 functions as a first gate (also referred to as a top gate) electrode, and the conductor 503 functions as a second gate (also referred to as a back gate) electrode. The insulator 552, the insulator 550, and the insulator 554 function as a first gate insulator, and the insulator 522 and the insulator 524 function as a second gate insulator. Note that the gate insulator is also referred to as a gate insulating layer or a gate insulating film in some cases. The conductor 542a functions as one of a source and a drain, and the conductor 5242b functions as the other of the source and the drain. At least part of a region of the oxide 530 overlapping with the conductor 560 functions as a channel formation region.

Figure 38A:
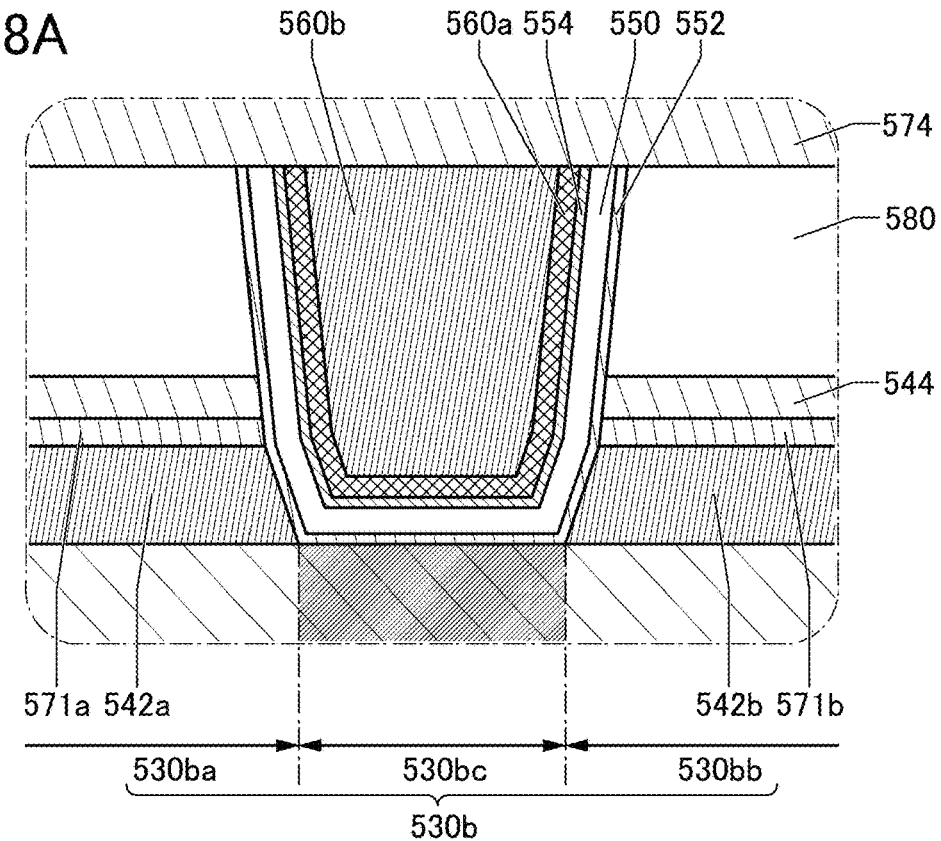
FIG. 38A and FIG. 38B are schematic cross-sectional views illustrating a structure example of a transistor.

FIG. 38A is an enlarged view of the vicinity of the channel formation region in FIG. 36A. Supply of oxygen to the oxide 530b forms the channel formation region in a region between the conductor 542a and the conductor 542b. As illustrated in FIG. 38A, the oxide 530b includes a region 530bc functioning as the channel formation region of the transistor 500 and a region 530ba and a region 530bb that are provided to sandwich the region 530bc and function as a source region and a drain region. At least part of the region 530bc overlaps with the conductor 560. In other words, the region 530bc is provided between the conductor 542a and the conductor 542b. The region 530ba is provided to overlap with the conductor 542a, and the region 530bb is provided to overlap with the conductor 542b.

The region 530bc functioning as the channel formation region contains fewer oxygen vacancies (an oxygen vacancy in a metal oxide is sometimes referred to as $V_O$ in this specification and the like) or a lower impurity concentration than the regions 530ba and 530bb to have higher resistance and a lower carrier concentration. Thus, the region 530bc can be regarded as being i-type (intrinsic) or substantially i-type.

A transistor using a metal oxide is likely to change its electrical characteristics when impurities or oxygen vacancies ($V_O$) exist in a region of the metal oxide where a channel is formed, which might degrade the reliability. In some cases, hydrogen in the vicinity of an oxygen vacancy ($V_O$) forms a defect that is an oxygen vacancy ($V_O$) into which hydrogen enters (hereinafter sometimes referred to as $V_OH$), which generates an electron serving as a carrier. Therefore, when the region of the oxide semiconductor where a channel is formed includes oxygen vacancies, the transistor tends to have normally-on characteristics (characteristics with which, even when no voltage is applied to the gate electrode, the channel exists and current flows through the transistor). Thus, impurities, oxygen vacancies, and $V_OH$ are preferably reduced as much as possible in the region of the oxide semiconductor where a channel is formed.

The region 530ba and the region 530bb functioning as the source region and the drain region are each a low-resistance region with an increased carrier concentration because it includes a large amount of oxygen vacancies ($V_O$) or has a high concentration of an impurity such as hydrogen, nitrogen, or a metal element. In other words, the region 530ba and the region 530bb are each an n-type region having a higher carrier concentration and a lower resistance than those of the region 530bc.

The carrier concentration in the region 530bc functioning as the channel formation region is preferably lower than or equal to $1 \times 10^{18}$ cm$^{-3}$, further preferably lower than $1 \times 10^{17}$ cm$^{-3}$, still further preferably lower than $1 \times 10^{16}$ cm$^{-3}$, yet further preferably lower than $1 \times 10^{13}$ cm$^{-3}$, yet still further preferably lower than $1 \times 10^{12}$ cm$^{-3}$. Note that the lower limit of the carrier concentration in the region 530bc functioning as the channel formation region is not particularly limited and can be, for example, $1 \times 10^{-9}$ cm$^{-3}$.

Between the region 530bc and the region 530ba or the region 530bb, a region having a carrier concentration that is lower than or substantially equal to the carrier concentrations in the region 530ba and the region 530bb and higher than or substantially equal to the carrier concentration in the region 530bc may be formed. That is, the region functions as a junction region between the region 530bc and the region 530ba or the region 530bb. The hydrogen concentration in the junction region is lower than or substantially equal to the hydrogen concentrations in the region 530ba and the region 530bb and higher than or substantially equal to the hydrogen concentration in the region 530bc in some cases. The amount of oxygen vacancies in the junction region is smaller than or substantially equal to the amounts of oxygen vacancies in the region 530ba and the region 530bb and larger than or substantially equal to the amount of oxygen vacancies in the region 530bc in some cases.

Although FIG. 38A illustrates an example in which the region 530ba, the region 530bb, and the region 530bc are formed in the oxide 530b, the present invention is not limited thereto. For example, the above regions may be formed not only in the oxide 530b but also in the oxide 530a.

In the oxide 530, the boundaries between the regions are difficult to detect clearly in some cases. The concentration of a metal element and an impurity element such as hydrogen or nitrogen, which is detected in each region, may be gradually changed not only between the regions but also in each region. That is, the region closer to the channel formation region preferably has a lower concentration of a metal element and an impurity element such as hydrogen or nitrogen.

In the transistor 500, a metal oxide functioning as a semiconductor (such a metal oxide is hereinafter also referred to as an oxide semiconductor) is preferably used for the oxide 530 (the oxide 530a and the oxide 530b) including the channel formation region.

The metal oxide functioning as a semiconductor preferably has a band gap of 2 eV or more, further preferably 2.5 eV or more. With use of a metal oxide having such a large bandgap, the off-state current of the transistor can be reduced.

As the oxide 530, it is preferable to use, for example, a metal oxide such as an In-M-Zn oxide containing indium, an element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like). Alternatively, an In—Ga oxide, an In—Zn oxide, or an indium oxide may be used as the oxide 530.

The atomic ratio of In to the element M in the metal oxide used as the oxide 530b is preferably greater than the atomic ratio of In to the element M in the metal oxide used as the oxide 530a.

The oxide 530a is placed under the oxide 530b, whereby impurities and oxygen can be inhibited from diffusing into the oxide 530b from components formed below the oxide 530a.

When the oxide 530a and the oxide 530b contain a common element (as the main component) besides oxygen, the density of defect states at an interface between the oxide 530a and the oxide 530b can be made low. Since the density of defect states at the interface between the oxide 530a and the oxide 530b can be made low, the influence of interface scattering on carrier conduction is small, and a high on-state current can be obtained.

The oxide 530b preferably exhibits crystallinity. It is particularly preferable to use a CAAC-OS (c-axis aligned crystalline oxide semiconductor) as the oxide 530b.

The CAAC-OS is a metal oxide having a dense structure with high crystallinity and a small amount of impurities or defects (e.g., oxygen vacancies ($V_O$)). In particular, after the formation of a metal oxide, heat treatment is performed at a temperature at which the metal oxide does not become a polycrystal (e.g., 400° C. to 600° C., inclusive), whereby a CAAC-OS having a dense structure with higher crystallinity can be obtained. When the density of the CAAC-OS is increased in such a manner, diffusion of impurities or oxygen in the CAAC-OS can be further reduced.

On the other hand, a clear crystal grain boundary cannot be observed in the CAAC-OS; thus, it can be said that a reduction in electron mobility due to the crystal grain boundary is less likely to occur. Thus, a metal oxide including a CAAC-OS is physically stable. Therefore, the metal oxide including a CAAC-OS is resistant to heat and has high reliability.

If impurities and oxygen vacancies exist in a region of an oxide semiconductor where a channel is formed, a transistor using the oxide semiconductor might have variable electrical characteristics and poor reliability. In some cases, hydrogen in the vicinity of an oxygen vacancy forms a defect that is the oxygen vacancy into which hydrogen enters (hereinafter sometimes referred to as $V_OH$), which generates an electron serving as a carrier. Therefore, when the region of the oxide semiconductor where a channel is formed includes oxygen vacancies, the transistor tends to have normally-on characteristics (characteristics with which, even when no voltage is applied to the gate electrode, the channel exists and current flows through the transistor). Thus, impurities, oxygen vacancies, and $V_OH$ are preferably reduced as much as possible in the region of the oxide semiconductor where a channel is formed. In other words, it is preferable that the region of the oxide semiconductor where a channel is formed have a reduced carrier concentration and be of an i-type (intrinsic) or substantially i-type.

As a countermeasure to the above, an insulator containing oxygen that is released by heating (hereinafter, sometimes referred to as excess oxygen) is provided in the vicinity of the oxide semiconductor and heat treatment is performed, so that oxygen can be supplied from the insulator to the oxide semiconductor to reduce oxygen vacancies and $V_OH$. However, supply of an excess amount of oxygen to the source region or the drain region might cause a decrease in the on-state current or field-effect mobility of the transistor 500. Furthermore, a variation of oxygen supplied to the source region or the drain region in the substrate plane leads to a variation in characteristics of the semiconductor device including the transistor.

Therefore, the region 530bc functioning as the channel formation region in the oxide semiconductor is preferably an i-type or substantially i-type region with reduced carrier concentration, whereas the region 530ba and the region 530bb functioning as the source region and the drain region are preferably n-type regions with high carrier concentrations. That is, it is preferable that oxygen vacancies and $V_OH$ in the region 530bc of the oxide semiconductor be reduced and the region 530ba and the region 530bb not be supplied with an excess amount of oxygen.

Thus, in this embodiment, microwave treatment is performed in an oxygen-containing atmosphere in a state where the conductor 542a and the conductor 542b are provided over the oxide 530b so that oxygen vacancies and $V_OH$ in the region 530bc can be reduced. Here, the microwave treatment refers to, for example, treatment using an apparatus including a power source that generates high-density plasma with use of a microwave.

The microwave treatment in an oxygen-containing atmosphere converts an oxygen gas into plasma using a high-frequency wave such as a microwave or RF and activates the oxygen plasma. At this time, the region 530bc can also be irradiated with the high-frequency wave such as the microwave or RF. By the effect of the plasma, the microwave, or the like, $V_OH$ in the region 530bc can be cut; thus, hydrogen H can be removed from the region 530bc and an oxygen vacancy $V_O$ can be filled with oxygen. That is, the reaction "$V_OH \rightarrow H + V_O$" occurs in the region 530bc, so that the hydrogen concentration in the region 530bc can be reduced. As a result, oxygen vacancies and $V_OH$ in the region 530bc can be reduced to lower the carrier concentration.

In the microwave treatment in an oxygen-containing atmosphere, the high-frequency wave such as the microwave or RF, the oxygen plasma, or the like is blocked by the conductor 542a and the conductor 542b and does not affect the region 530ba nor the region 530bb. In addition, the effect of the oxygen plasma can be reduced by the insulator 571 and the insulator 580 that are provided to cover the oxide 530b and the conductor 542. Hence, a reduction in $V_OH$ and supply of an excess amount of oxygen do not occur in the region 530ba or the region 530bb in the microwave treatment, preventing a decrease in carrier concentration.

In particular, microwave treatment is preferably performed in an oxygen-containing atmosphere after deposition of an insulating film to be the insulator 552 or after deposition of an insulating film to be the insulator 550. By performing the microwave treatment in an oxygen-containing atmosphere through the insulator 552 or the insulator 550 in such a manner, oxygen can be efficiently supplied into the region 530bc. In addition, the insulator 552 is provided to be in contact with the side surface of the conductor 542 and the surface of the region 530bc, thereby preventing oxygen more than necessary from being supplied to the region 530bc and preventing the side surface of the conductor 542 from being oxidized. Furthermore, the side surface of the conductor 542 can be prevented from being oxidized when an insulating film to be the insulator 550 is formed.

The oxygen supplied into the region 530bc has any of a variety of forms such as an oxygen atom, an oxygen molecule, an oxygen radical (an O radical, an atom or a molecule having an unpaired electron, or an ion). Note that the oxygen supplied into the region 530bc has any one or more of the above forms, particularly preferably an oxygen radical. Furthermore, the film quality of the insulator 552 and the insulator 550 can be improved, leading to higher reliability of the transistor 500.

In the above manner, oxygen vacancies and $V_OH$ can be selectively removed from the region 530bc of the oxide semiconductor, whereby the region 530bc can be an i-type or substantially i-type region. Furthermore, supply of an excess amount of oxygen to the region 530ba and the region 530bb functioning as the source region and the drain region can be inhibited and the n-type conductivity can be maintained. As a result, a change in the electrical characteristics of the transistor 500 can be inhibited, and thus a variation in the electrical characteristics of the transistors 500 in the substrate plane can be inhibited.

With the above structure, a semiconductor device with a small variation in transistor characteristics can be provided. A semiconductor device with favorable reliability can also be provided. A semiconductor device having favorable electrical characteristics can be provided.

As illustrated in FIG. 36B, a curved surface may be provided between a side surface of the oxide 530b and a top surface of the oxide 530b in a cross-sectional view in the channel width direction of the transistor 500. In other words, an end portion of the side surface and an end portion of the top surface may be curved (hereinafter referred to as rounded).

The radius of curvature of the curved surface is preferably greater than 0 nm and less than the thickness of the oxide 530b in a region overlapping with the conductor 542, or less than half of the length of a region that does not have the curved surface. Specifically, the radius of curvature of the curved surface is greater than 0 nm and less than or equal to 20 nm, preferably greater than or equal to 1 nm and less than or equal to 15 nm, and further preferably greater than or equal to 2 nm and less than or equal to 10 nm. Such a shape can improve the coverage of the oxide 530b with the insulator 552, the insulator 550, the insulator 554, and the conductor 560.

The oxide 530 preferably has a stacked-layer structure of a plurality of oxide layers with different chemical compositions. Specifically, the atomic ratio of the element M to a metal element that is a main component of the metal oxide used as the oxide 530a is preferably greater than the atomic ratio of the element M to a metal element that is a main component of the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a.

The oxide 530b is preferably an oxide having crystallinity, such as a CAAC-OS. An oxide having crystallinity, such as a CAAC-OS, has a dense structure with small amounts of impurities and defects (e.g., oxygen vacancies) and high crystallinity. This can inhibit extraction of oxygen from the oxide 530b by the source electrode or the drain electrode. This can reduce extraction of oxygen from the oxide 530b even when heat treatment is performed; hence, the transistor 500 is stable against high temperatures in the manufacturing process (what is called thermal budget).

Here, the conduction band minimum gradually changes at a junction portion of the oxide 530a and the oxide 530b. In other words, the conduction band minimum at the junction portion of the oxide 530a and the oxide 530b continuously changes or is continuously connected. This can be obtained by decreasing the density of defect states in a mixed layer formed at the interface between the oxide 530a and the oxide 530b.

Specifically, when the oxide 530a and the oxide 530b include the same element as a main component in addition to oxygen, a mixed layer with a low density of defect states can be formed. For example, in the case where the oxide 530b is an In-M-Zn oxide, an In-M-Zn oxide, an M-Zn oxide, an oxide of the element M, an In—Zn oxide, indium oxide, or the like may be used as the oxide 530a.

Specifically, as the oxide 530a, a metal oxide with a composition of In:M:Zn=1:3:4 [atomic ratio] or in the neighborhood thereof, or a composition of In:M:Zn=1:1:0.5 [atomic ratio] or in the neighborhood thereof is used. As the oxide 530b, a metal oxide with a composition of In:M:Zn=1:1:1 [atomic ratio] or in the neighborhood thereof, or a composition of In:M:Zn=4:2:3 [atomic ratio] or in the neighborhood thereof can be used. Note that a composition in the neighborhood includes the range of ±30% of an intended atomic ratio. Gallium is preferably used as the element M.

When the metal oxide is deposited by a sputtering method, the above atomic ratio is not limited to the atomic ratio of the deposited metal oxide and may be the atomic ratio of a sputtering target used for depositing the metal oxide.

As illustrated in FIG. 36A or the like, the insulator 552 formed using aluminum oxide or the like is provided in contact with the top and side surfaces of the oxide 530, whereby indium contained in the oxide 530 is unevenly distributed, in some cases, at the interface between the oxide 530 and the insulator 552 and in its vicinity. Accordingly, the vicinity of the surface of the oxide 530 comes to have an atomic ratio close to that of an indium oxide or that of an In—Zn oxide. Such an increase in the atomic ratio of indium in the vicinity of the surface of the oxide 530, especially the vicinity of a surface of the oxide 530b, can increase the field-effect mobility of the transistor 500.

When the oxide 530a and the oxide 530b have the above-described structure, the density of defect states at the interface between the oxide 530a and the oxide 530b can be made low. Thus, the influence of interface scattering on carrier conduction is small, and the transistor 500 can have a high on-state current and excellent frequency characteristics.

At least one of the insulator 512, the insulator 514, the insulator 544, the insulator 571, the insulator 574, the insulator 576, and the insulator 581 preferably functions as a barrier insulating film, which inhibits diffusion of impurities such as water and hydrogen from the substrate side or above the transistor 500 into the transistor 500. Thus, for at least one of the insulator 512, the insulator 514, the insulator 544, the insulator 571, the insulator 574, the insulator 576, and the insulator 581, an insulating material which has a function of inhibiting diffusion of impurities such as hydrogen atoms, hydrogen molecules, water molecules, nitrogen atoms, nitrogen molecules, nitrogen oxide molecules (e.g., $N_2O$, NO, or $NO_2$), or copper atoms (through which the impurities are less likely to pass) is preferably used. Alternatively, it is preferable to use an insulating material having a function of inhibiting diffusion of oxygen (e.g., at least one of oxygen atoms, oxygen molecules, and the like) (an insulating material through which the oxygen is less likely to pass).

Note that in this specification, a barrier insulating film refers to an insulating film having a barrier property. A barrier property in this specification means a function of inhibiting diffusion of a targeted substance (also referred to as having low permeability). In addition, a barrier property in this specification means a function of capturing and fixing (also referred to as gettering) a targeted substance.

An insulator having a function of inhibiting diffusion of impurities, such as water and hydrogen, and oxygen is preferably used for the insulator 512, the insulator 514, the insulator 544, the insulator 571, the insulator 574, the insulator 576, and the insulator 581; for example, aluminum oxide, magnesium oxide, hafnium oxide, gallium oxide, indium gallium zinc oxide, silicon nitride, or silicon nitride oxide can be used. For example, silicon nitride, which has a higher hydrogen barrier property, is preferably used for the insulator 512, the insulator 544, and the insulator 576. For example, aluminum oxide or magnesium oxide, which has a function of capturing or fixing hydrogen, is preferably used for the insulator 514, the insulator 571, the insulator 574, and the insulator 581. In this case, impurities such as water and hydrogen can be inhibited from diffusing to the transistor 500 side from the substrate side through the insulator 512 and the insulator 514. Impurities such as water and hydrogen can be inhibited from diffusing to the transistor 500 side from an interlayer insulating film and the like which are provided outside the insulator 581. Alternatively, oxygen contained in the insulator 524 and the like can be inhibited from diffusing to the substrate side through the insulator 512 and the insulator 514. Alternatively, oxygen contained in the insulator 580 and the like can be inhibited from diffusing to above the transistor 500 through the insulator 574 and the like. In this manner, it is preferable that the transistor 500 be surrounded by the insulator 512, the insulator 514, the insulator 571, the insulator 544, the insulator 574, the insulator 576, and the insulator 581, which have a function of inhibiting diffusion of oxygen and impurities such as water and hydrogen.

Here, an oxide having an amorphous structure is preferably used for the insulator 512, the insulator 514, the insulator 544, the insulator 571, the insulator 574, the insulator 576, and the insulator 581. For example, a metal oxide such as $AlO_x$ (x is a given number greater than 0) or $MgO_y$ (y is a given number greater than 0) is preferably used. In such a metal oxide having an amorphous structure, an oxygen atom has a dangling bond and sometimes has a property of capturing or fixing hydrogen with the dangling bond. When such a metal oxide having an amorphous structure is used as the component of the transistor 500 or provided around the transistor 500, hydrogen contained in the transistor 500 or hydrogen present around the transistor 500 can be captured or fixed. In particular, hydrogen contained in the channel formation region of the transistor 500 is preferably captured or fixed. The metal oxide having an amorphous structure is used as the component of the transistor 500 or provided around the transistor 500, whereby the transistor 500 and a semiconductor device which have favorable characteristics and high reliability can be manufactured.

Although the insulator 512, the insulator 514, the insulator 544, the insulator 571, the insulator 574, the insulator 576, and the insulator 581 preferably have an amorphous structure, they may partly include a region having a polycrystalline structure. Alternatively, the insulator 512, the insulator 514, the insulator 544, the insulator 571, the insulator 574, the insulator 576, and the insulator 581 may have a multilayer structure in which a layer having an amorphous structure and a layer having a polycrystalline structure are stacked. For example, a stacked-layer structure in which a layer having a polycrystalline structure is formed over a layer having an amorphous structure may be employed.

The insulator 512, the insulator 514, the insulator 544, the insulator 571, the insulator 574, the insulator 576, and the insulator 581 are deposited by a sputtering method, for example. Since a sputtering method does not need to use a molecule containing hydrogen as a deposition gas, the hydrogen concentrations in the insulator 512, the insulator 514, the insulator 544, the insulator 571, the insulator 574, the insulator 576, and the insulator 581 can be reduced. Note that the deposition method is not limited to a sputtering method, and a chemical vapor deposition (CVD) method, a molecular beam epitaxy (MBE) method, a pulsed laser deposition (PLD) method, an atomic layer deposition (ALD) method, or the like can be used as appropriate.

The resistivities of the insulator 512, the insulator 544, and the insulator 576 are preferably low in some cases. For example, by setting the resistivities of the insulator 512, the insulator 544, and the insulator 576 to approximately $1\times10^{13}$ Ωcm, the insulator 512, the insulator 544, and the insulator 576 can sometimes reduce charge up of the conductor 503, the conductor 542, the conductor 560, or the like in treatment using plasma or the like in the manufacturing process of a semiconductor device. The resistivities of the insulator 512, the insulator 544, and the insulator 576 are preferably higher than or equal to $1\times10^{10}$ Ωcm and lower than or equal to $1\times10^{15}$ Ωcm.

The insulator 516, the insulator 574, the insulator 580, and the insulator 581 preferably have a lower permittivity than the insulator 514. When a material with a low permittivity is used for an interlayer film, parasitic capacitance generated between wirings can be reduced. For the insulator 516, the insulator 580, and the insulator 581, silicon oxide, silicon oxynitride, silicon oxide to which fluorine is added, silicon oxide to which carbon is added, silicon oxide to which carbon and nitrogen are added, porous silicon oxide, or the like is used as appropriate, for example.

The insulator 581 preferably functions as an interlayer film, a planarization film, or the like.

The conductor 503 is placed to overlap with the oxide 530 and the conductor 560. Here, the conductor 503 is preferably provided to be embedded in an opening formed in the insulator 516. Part of the conductor 503 is embedded in the insulator 514 in some cases.

The conductor 503 includes the conductor 503a and the conductor 503b. The conductor 503a is provided in contact with a bottom surface and a sidewall of the opening. The conductor 503b is provided to be embedded in a recessed portion formed in the conductor 503a. Here, the top surface of the conductor 503b is substantially level with the top surfaces of the conductor 503a and the insulator 516.

Here, for the conductor 503a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material that has a function of inhibiting diffusion of oxygen (e.g., at least one of an oxygen atom, an oxygen molecule, and the like).

When the conductor 503a is formed using a conductive material having a function of inhibiting diffusion of hydrogen, impurities such as hydrogen contained in the conductor 503b can be prevented from diffusing into the oxide 530 through the insulator 524 and the like. When the conductor 503a is formed using a conductive material having a function of inhibiting diffusion of oxygen, the conductivity of the conductor 503b can be inhibited from being lowered because of oxidation. As the conductive material having a function of inhibiting diffusion of oxygen, for example, titanium, titanium nitride, tantalum, tantalum nitride, ruthenium, or ruthenium oxide is preferably used. Thus, a single layer or a stacked layer of the above conductive material is used as the conductor 503a. For example, titanium nitride is used for the conductor 503a.

In addition, a conductive material containing tungsten, copper, or aluminum as its main component is preferably used for the conductor 503b. For example, tungsten is used for the conductor 503b.

In addition, the conductor 503 sometimes functions as a second gate electrode. In that case, the threshold voltage ($V_{th}$) of the transistor 500 can be controlled by changing a potential applied to the conductor 503 not in synchronization with but independently of a potential applied to the conductor 560. In particular, $V_{th}$ of the transistor 500 can be made higher and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The electric resistivity of the conductor 503 is designed in consideration of the potential applied to the conductor 503, and the thickness of the conductor 503 is determined in accordance with the electric resistivity. The thickness of the insulator 516 is substantially equal to that of the conductor 503. The conductor 503 and the insulator 516 are preferably as thin as possible in the allowable range of the design of the conductor 503. When the thickness of the insulator 516 is reduced, the absolute amount of impurities such as hydrogen contained in the insulator 516 can be reduced, reducing the amount of the impurities to be diffused into the oxide 530.

Seen from the above, the conductor 503 is preferably provided to be larger than a region of the oxide 530 that does not overlap with the conductor 542a or the conductor 542b. As illustrated in FIG. 36B, it is particularly preferable that the conductor 503 extend to a region outside end portions of the oxide 530a and the oxide 530b in the channel width direction. That is, the conductor 503 and the conductor 560 preferably overlap each other with the insulators therebetween on the outer side of a side surface of the oxide 530 in the channel width direction. With this structure, the channel formation region of the oxide 530 can be electrically surrounded by the electric field of the conductor 560 functioning as a first gate electrode and the electric field of the conductor 503 functioning as the second gate electrode. In this specification, a transistor structure in which a channel formation region is electrically surrounded by electric fields of the first gate and the second gate is referred to as a surrounded channel (S-channel) structure.

In this specification and the like, a transistor having the S-channel structure refers to a transistor having a structure in which a channel formation region is electrically surrounded by the electric fields of a pair of gate electrodes. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

Furthermore, as illustrated in FIG. 36B, the conductor 503 extends to have a function of a wiring as well. However, without limitation to this structure, a structure in which a conductor functioning as a wiring is provided below the conductor 503 may be employed. In addition, the conductor 503 is not necessarily provided in each transistor. For example, the conductor 503 may be shared by a plurality of transistors.

Note that although the transistor 500 having a structure in which the conductor 503a and the conductor 503b are stacked to be the conductor 503 is illustrated, the present invention is not limited thereto. For example, the conductor 503 may be provided as a single layer or to have a stacked-layer structure of three or more layers.

The insulator 522 and the insulator 524 function as a gate insulator.

It is preferable that the insulator 522 have a function of inhibiting diffusion of hydrogen (e.g., at least one of a hydrogen atom, a hydrogen molecule, and the like). In addition, it is preferable that the insulator 522 have a function of inhibiting diffusion of oxygen (e.g., at least one of an oxygen atom, an oxygen molecule, and the like). For example, the insulator 522 preferably has a function of inhibiting diffusion of one or both of hydrogen and oxygen more than the insulator 524.

As the insulator 522, an insulator containing an oxide of one or both of aluminum and hafnium, which is an insulating material, is preferably used. For the insulator, aluminum oxide, hafnium oxide, an oxide containing aluminum and hafnium (hafnium aluminate), or the like is preferably used. In the case where the insulator 522 is formed using such a material, the insulator 522 functions as a layer that inhibits, for example, release of oxygen from the oxide 530 to the substrate side and diffusion of impurities such as hydrogen from the periphery of the transistor 500 into the oxide 530. Thus, providing the insulator 522 can inhibit diffusion of impurities such as hydrogen into the transistor 500 and inhibit generation of oxygen vacancies in the oxide 530. Furthermore, the conductor 503 can be inhibited from reacting with oxygen contained in the insulator 524, the oxide 530, or the like.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, the insulator may be subjected to nitriding treatment. A stack of silicon oxide, silicon oxynitride, or silicon nitride over these insulators may be used for the insulator 522.

For example, a single layer or stacked layers of an insulator(s) containing what is called a high-k material such as aluminum oxide, hafnium oxide, tantalum oxide, or zirconium oxide may be used for the insulator 522. As miniaturization and high integration of transistors progress, a problem such as a leakage current may arise because of a thinner gate insulator. When a high-k material is used for an insulator functioning as the gate insulator, a gate potential at the time when the transistor operates can be reduced while the physical thickness is maintained. Furthermore, a substance with a high permittivity such as lead zirconate titanate (PZT), strontium titanate ($SrTiO_3$), or $(Ba,Sr)TiO_3$ (BST) may be used for the insulator 522.

Silicon oxide or silicon oxynitride, for example, can be used as appropriate for the insulator 524 that is in contact with the oxide 530.

In a manufacturing process of the transistor 500, heat treatment is preferably performed with the surface of the oxide 530 exposed. For example, the heat treatment is performed at a temperature higher than or equal to 100° C. and lower than or equal to 600° C., preferably higher than or equal to 350° C. and lower than or equal to 550° C. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies ($V_O$). The heat treatment may be performed under reduced pressure. Alternatively, heat treatment may be performed in an atmosphere containing an oxidizing gas at 10 ppm or more, 1% or more, or 10% or more in order to compensate for released oxygen after heat treatment in a nitrogen gas or inert gas atmosphere. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the oxide 530 can promote a reaction in which oxygen vacancies in the oxide 530 are filled with supplied oxygen, i.e., a reaction of "$V_O+O\rightarrow null$". Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of $V_OH$.

Note that the insulator 522 and the insulator 524 may each have a stacked-layer structure of two or more layers. In such cases, without limitation to a stacked-layer structure formed of the same material, a stacked-layer structure formed of different materials may be employed. The insulator 524 may be formed into an island shape so as to overlap with the oxide 530*a*. In this case, the insulator 544 is in contact with a side surface of the insulator 524 and a top surface of the insulator 522.

The conductor 542*a* and the conductor 542*b* are provided in contact with a top surface of the oxide 530*b*. Each of the conductor 542*a* and the conductor 542*b* functions as a source electrode or a drain electrode of the transistor 500.

For the conductor 542 (the conductor 542*a* and the conductor 542*b*), for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. As another example, ruthenium oxide, ruthenium nitride, an oxide containing strontium and ruthenium, or an oxide containing lanthanum and nickel may be used. These materials are preferable because they are each a conductive material that is not easily oxidized or a material that maintains the conductivity even after absorbing oxygen.

Note that hydrogen contained in the oxide 530*b* or the like diffuses into the conductor 542*a* or the conductor 542*b* in some cases. In particular, when a nitride containing tantalum is used for the conductor 542*a* and the conductor 542*b*, hydrogen contained in the oxide 530*b* or the like is likely to diffuse into the conductor 542*a* or the conductor 542*b*, and the diffused hydrogen is bonded to nitrogen contained in the conductor 542*a* or the conductor 542*b* in some cases. That is, hydrogen contained in the oxide 530*b* or the like is absorbed by the conductor 542*a* or the conductor 542*b* in some cases.

No curved surface is preferably formed between a side surface of the conductor 542 and a top surface of the conductor 542. When no curved surface is formed in the conductor 542, the conductor 542 can have a large cross-sectional area in the channel width direction. Accordingly, the conductivity of the conductor 542 is increased, so that the on-state current of the transistor 500 can be increased.

The insulator 571*a* is provided in contact with the top surface of the conductor 542*a*, and the insulator 571*b* is provided in contact with the top surface of the conductor 542*b*. The insulator 571 preferably functions as at least a barrier insulating film against oxygen. Thus, the insulator 571 preferably has a function of inhibiting oxygen diffusion. For example, the insulator 571 preferably has a function of inhibiting diffusion of oxygen more than the insulator 580. For example, a nitride containing silicon such as silicon nitride may be used for the insulator 571. The insulator 571 preferably has a function of capturing impurities such as hydrogen. In that case, for the insulator 571, a metal oxide having an amorphous structure, for example, an insulator such as aluminum oxide or magnesium oxide, may be used. It is particularly preferable to use aluminum oxide having an amorphous structure or amorphous aluminum oxide for the insulator 571 because hydrogen can be captured or fixed more effectively in some cases. Accordingly, the transistor 500 and a semiconductor device which have favorable characteristics and high reliability can be manufactured.

The insulator 544 is provided to cover the insulator 524, the oxide 530*a*, the oxide 530*b*, the conductor 542, and the insulator 571. The insulator 544 preferably has a function of capturing and fixing hydrogen. In that case, the insulator 544 preferably includes silicon nitride, or a metal oxide having an amorphous structure, for example, an insulator such as aluminum oxide or magnesium oxide. Alternatively, for example, a stacked-layer film of aluminum oxide and silicon nitride over the aluminum oxide may be used as the insulator 544.

When the above insulator 571 and the insulator 544 are provided, the conductor 542 can be surrounded by the insulators having a barrier property against oxygen. That is, oxygen contained in the insulator 524 and the insulator 580 can be prevented from diffusing into the conductor 542. As a result, the conductor 542 can be inhibited from being directly oxidized by oxygen contained in the insulator 524 and the insulator 580, so that an increase in resistivity and a reduction in on-state current can be inhibited.

The insulator 552 functions as part of the gate insulator. As the insulator 552, a barrier insulating film against oxygen is preferably used. As the insulator 552, an insulator that can be used as the insulator 574 described above may be used. An insulator containing an oxide of one or both of aluminum and hafnium may be used as the insulator 552. As the insulator, aluminum oxide, hafnium oxide, an oxide containing aluminum and hafnium (hafnium aluminate), an oxide containing hafnium and silicon (hafnium silicate), or the like can be used. In this embodiment, aluminum oxide is used for the insulator 552. In this case, the insulator 552 is an insulator containing at least oxygen and aluminum.

As illustrated in FIG. 36B, the insulator 552 is provided in contact with the top surface and the side surface of the oxide 530*b*, the side surface of the oxide 530*a*, the side surface of the insulator 524, and the top surface of the insulator 522. That is, the regions of the oxide 530*a*, the oxide 530*b*, and the insulator 524 that overlap with the conductor 560 are covered with the insulator 552 in the cross section in the channel width direction. With this structure, the insulator 552 having a barrier property against oxygen can prevent release of oxygen from the oxide 530*a* and the oxide 530*b* at the time of heat treatment or the like. This can inhibit formation of oxygen vacancies ($V_O$) in the oxide 530a and the oxide 530b. Therefore, oxygen vacancies (V_O) and V_OH formed in the region 530bc can be reduced. Thus, the transistor 500 can have good electrical characteristics and higher reliability.

Even when an excess amount of oxygen is contained in the insulator 580, the insulator 550 and the like, oxygen can be inhibited from being excessively supplied to the oxide 530a and the oxide 530b. Thus, the region 530ba and the region 530bb are prevented from being excessively oxidized by oxygen through the region 530bc; a reduction in on-state current or field-effect mobility of the transistor 500 can be inhibited.

As illustrated in FIG. 36A, the insulator 552 is provided in contact with the side surfaces of the conductor 542, the insulator 571, and the insulator 580. This can inhibit formation of an oxide film on the side surface of the conductor 542 by oxidization of the side surface. Accordingly, a reduction in on-state current or field-effect mobility of the transistor 500 can be inhibited.

Furthermore, the insulator 552 needs to be provided in an opening formed in the insulator 580, and the like, together with the insulator 554, the insulator 550, and the conductor 560. The thickness of the insulator 552 is preferably thin for miniaturization of the transistor 500. The thickness of the insulator 552 is preferably greater than or equal to 0.1 nm, greater than or equal to 0.5 nm, or greater than or equal to 1.0 nm, and less than or equal to 1.0 nm, less than or equal to 3.0 nm, or less than or equal to 5.0 nm. Note that any of the above minimum values and maximum values can be combined with each other. In that case, at least part of the insulator 552 preferably includes a region having the above-described thickness. The thickness of the insulator 552 is preferably smaller than that of the insulator 550. In that case, at least part of the insulator 552 preferably includes a region having a thickness smaller than that of the insulator 550.

To form the insulator 552 having a small thickness like the above-described thickness, an ALD method is preferably used for deposition. Examples of an ALD method include a thermal ALD method, in which a precursor and a reactant react with each other only by a thermal energy, and a PEALD (Plasma Enhanced ALD) method, in which a reactant excited by plasma is used. The use of plasma in a PEALD method is sometimes preferable because deposition at a lower temperature is possible.

An ALD method, which enables an atomic layer to be deposited one by one using self-limiting characteristics by atoms, has advantages such as deposition of an extremely thin film, deposition on a component with a high aspect ratio, deposition of a film with a small number of defects such as pinholes, deposition with excellent coverage, and low-temperature deposition. Therefore, the insulator 552 can be formed on the side surface of the opening formed in the insulator 580 and the like to have a small thickness like the above-described thickness and to have favorable coverage.

Note that some of precursors usable in an ALD method contain carbon or the like. Thus, in some cases, a film provided by an ALD method contains impurities such as carbon in a larger amount than a film provided by another deposition method. Note that impurities can be quantified by secondary ion mass spectrometry (SIMS) or X-ray photoelectron spectroscopy (XPS).

The insulator 550 functions as part of the gate insulator. The insulator 550 is preferably in contact with a top surface of the insulator 552. The insulator 550 can be formed using silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like. In particular, silicon oxide and silicon oxynitride are preferable because they are thermally stable. The insulator 550 in this case is an insulator containing at least oxygen and silicon.

As in the insulator 524, the concentration of impurities such as water and hydrogen in the insulator 550 is preferably reduced. The thickness of the insulator 550 is preferably greater than or equal to 1 nm or greater than or equal to 0.5 nm and less than or equal to 15.0 nm or less than or equal to 20 nm. Note that any of the above minimum values and maximum values can be combined with each other. In this case, it is acceptable that at least part of the insulator 550 has a region with a thickness like the above-described thickness.

Although FIG. 36A, FIG. 36B, or the like illustrates a single-layer structure of the insulator 550, the present invention is not limited to this structure, and a stacked-layer structure of two or more layers may be employed. For example, as illustrated in FIG. 38B, the insulator 550 may have a stacked-layer structure including two layers of an insulator 550a and an insulator 550b over the insulator 550a.

Figure 38B:
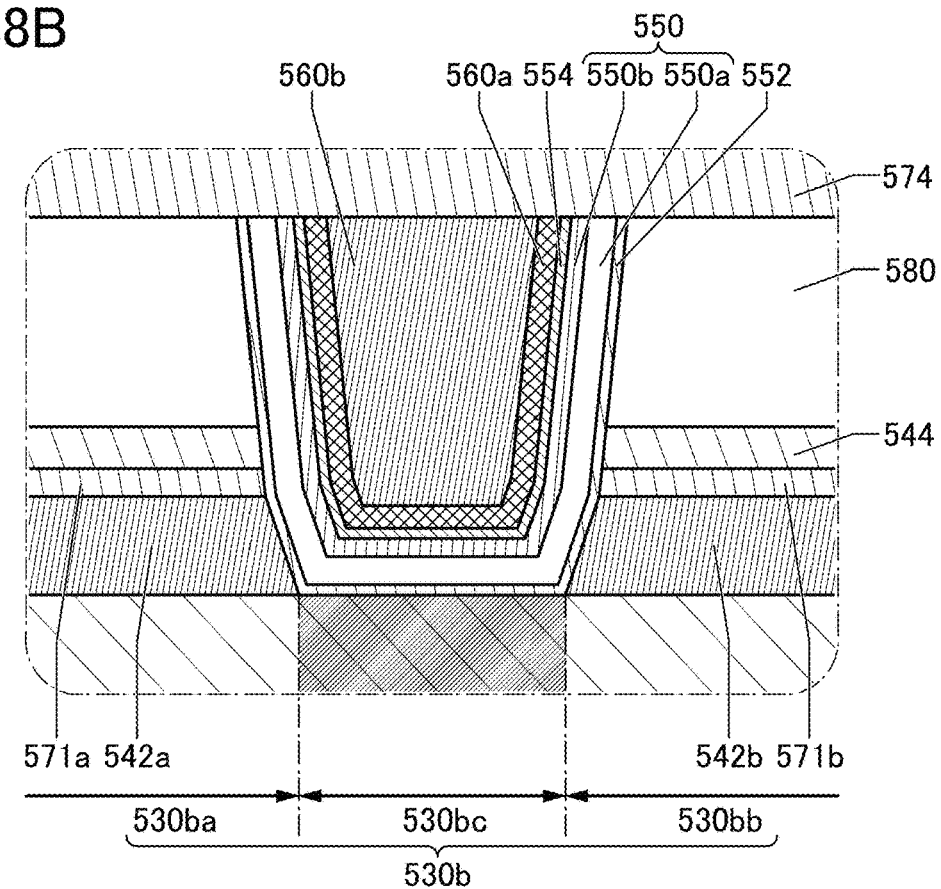

In the case where the insulator 550 has a stacked-layer structure of two layers as illustrated in FIG. 38B, it is preferable that the insulator 550a in a lower layer be formed using an insulator that is likely to transmit oxygen and the insulator 550b in an upper layer be formed using an insulator having a function of inhibiting oxygen diffusion. With such a structure, oxygen contained in the insulator 550a can be inhibited from diffusing into the conductor 560. That is, a reduction in the amount of oxygen supplied to the oxide 530 can be inhibited. In addition, oxidation of the conductor 560 due to oxygen contained in the insulator 550a can be inhibited. For example, it is preferable that the insulator 550a be provided using any of the above-described materials that can be used for the insulator 550 and the insulator 550b be provided using an insulator containing an oxide of one or both of aluminum and hafnium. As the insulator, aluminum oxide, hafnium oxide, an oxide containing aluminum and hafnium (hafnium aluminate), an oxide containing hafnium and silicon (hafnium silicate), or the like can be used. In this embodiment, hafnium oxide is used as the insulator 550b. In this case, the insulator 550b is an insulator containing at least oxygen and hafnium. The thickness of the insulator 550b is preferably greater than or equal to 0.5 nm or greater than or equal to 1.0 nm, and less than or equal to 3.0 nm or less than or equal to 5.0 nm. Note that any of the above minimum values and maximum values can be combined with each other. In that case, at least part of the insulator 550b may include a region having a thickness like the above-described thickness.

In the case where silicon oxide, silicon oxynitride, or the like is used for the insulator 550a, the insulator 550b may be formed using an insulating material that is a high-k material having a high dielectric constant. The gate insulator having a stacked-layer structure of the insulator 550a and the insulator 550b can be thermally stable and can have a high dielectric constant. Thus, a gate potential that is applied during operation of the transistor can be reduced while the physical thickness of the gate insulator is maintained. In addition, the equivalent oxide thickness (EOT) of the insulator functioning as the gate insulator can be reduced. Therefore, the withstand voltage of the insulator 550 can be increased.

The insulator 554 functions as part of a gate insulator. As the insulator 554, a barrier insulating film against hydrogen is preferably used. This can prevent diffusion of impurities such as hydrogen contained in the conductor 560 into the insulator 550 and the oxide 530*b*. As the insulator 554, an insulator that can be used as the insulator 576 described above may be used. For example, silicon nitride deposited by a PEALD method may be used as the insulator 554. In this case, the insulator 554 is an insulator containing at least nitrogen and silicon.

Furthermore, the insulator 554 may have a barrier property against oxygen. Thus, diffusion of oxygen contained in the insulator 550 into the conductor 560 can be inhibited.

Furthermore, the insulator 554 needs to be provided in an opening formed in the insulator 580 and the like, together with the insulator 552, the insulator 550, and the conductor 560. The thickness of the insulator 554 is preferably thin for miniaturization of the transistor 500. The thickness of the insulator 554 is preferably greater than or equal to 0.1 nm, greater than or equal to 0.5 nm, or greater than or equal to 1.0 nm, and less than or equal to 3.0 nm or less than or equal to 5.0 nm. Note that any of the above minimum values and maximum values can be combined with each other. In that case, at least part of the insulator 554 preferably includes a region having the above-described thickness. The thickness of the insulator 554 is preferably smaller than that of the insulator 550. In that case, at least part of the insulator 554 may include a region having a thickness that is smaller than that of the insulator 550.

The conductor 560 functions as the first gate electrode of the transistor 500. The conductor 560 preferably includes the conductor 560*a* and the conductor 560*b* placed over the conductor 560*a*. For example, the conductor 560*a* is preferably placed to cover a bottom surface and a side surface of the conductor 560*b*. As illustrated in FIGS. 36A and 36B, the top portion of the conductor 560 is substantially level with the top portion of the insulator 550. Note that the conductor 560 is illustrated to have a two-layer structure of the conductor 560*a* and the conductor 560*b* in FIG. 36A and FIG. 36B, but may have a single-layer structure or a stacked-layer structure of three or more layers.

For the conductor 560*a*, a conductive material having a function of inhibiting diffusion of impurities such as a hydrogen atom, a hydrogen molecule, a water molecule, a nitrogen atom, a nitrogen molecule, a nitrogen oxide molecule, and a copper atom is preferably used. Alternatively, it is preferable to use a conductive material that has a function of inhibiting diffusion of oxygen (e.g., at least one of an oxygen atom, an oxygen molecule, and the like).

When the conductor 560*a* has a function of inhibiting diffusion of oxygen, it is possible to inhibit a reduction in conductivity of the conductor 560*b* due to oxidation caused by oxygen contained in the insulator 550. As the conductive material having a function of inhibiting diffusion of oxygen, for example, titanium, titanium nitride, tantalum, tantalum nitride, ruthenium, or ruthenium oxide is preferably used.

Furthermore, the conductor 560 also functions as a wiring and thus a conductor having high conductivity is preferably used as the conductor 560. For example, a conductive material containing tungsten, copper, or aluminum as its main component can be used for the conductor 560*b*. Moreover, the conductor 560*b* may have a stacked-layer structure, for example, a stacked-layer structure of the above conductive material and titanium or titanium nitride.

In the transistor 500, the conductor 560 is formed in a self-aligned manner to fill the opening formed in the insulator 580 and the like. The formation of the conductor 560 in this manner allows the conductor 560 to be placed properly in a region between the conductor 542*a* and the conductor 542*b* without alignment.

As illustrated in FIG. 36B, in the channel width direction of the transistor 500, with reference to a bottom surface of the insulator 522, the level of the bottom surface of the conductor 560 in a region where the conductor 560 and the oxide 530*b* do not overlap is preferably lower than the level of a bottom surface of the oxide 530*b*. When the conductor 560 functioning as the gate electrode covers the side surface and the top surface of the channel formation region of the oxide 530*b* with the insulator 550 and the like therebetween, the electric field of the conductor 560 can easily act on the entire channel formation region of the oxide 530*b*. Thus, the on-state current of the transistor 500 can be increased and the frequency characteristics of the transistor 500 can be improved. The difference between the level of the bottom surface of the conductor 560 in the region where the oxides 530*a* and 530*b* do not overlap with the conductor 560 and the level of the bottom surface of the oxide 530*b*, with the level of the bottom surface of the insulator 522 as a reference, is preferably greater than or equal to 0 nm, greater than or equal to 3 nm, or greater than or equal to 5 nm, and less than or equal to 20 nm, less than or equal to 50 nm, or less than or equal to 100 nm. Note that any of the above minimum values and maximum values can be combined with each other.

The insulator 580 is provided over the insulator 544, and the opening is formed in a region where the insulator 550 and the conductor 560 are to be provided. In addition, the top surface of the insulator 580 may be planarized.

The insulator 580 functioning as an interlayer film preferably has a low permittivity. When a material with a low permittivity is used for an interlayer film, parasitic capacitance generated between wirings can be reduced. The insulator 580 is preferably provided using a material similar to that for the insulator 516, for example. In particular, silicon oxide and silicon oxynitride, which have thermal stability, are preferable. Materials such as silicon oxide, silicon oxynitride, and porous silicon oxide are particularly preferable because a region containing oxygen to be released by heating can be easily formed.

As for the insulator 580, the concentration of impurities such as water and hydrogen in the insulator 580 is preferably reduced. Oxide containing silicon such as silicon oxide, silicon oxynitride, or the like is used as appropriate for the insulator 580, for example.

The insulator 574 preferably functions as barrier insulating films that inhibit impurities such as water and hydrogen from diffusing into the insulator 580 from above and preferably have a function of capturing impurities such as hydrogen. The insulator 574 preferably functions as a barrier insulating film that inhibits passage of oxygen. For each of the insulator 574, a metal oxide having an amorphous structure, for example, an insulator such as aluminum oxide can be used. In this case, the insulator 574 is an insulator containing at least oxygen and aluminum. The insulator 574, which has a function of capturing impurities such as hydrogen, is provided in contact with the insulator 580 in a region sandwiched between the insulator 512 and the insulator 581, whereby impurities such as hydrogen contained in the insulator 580 and the like can be captured and the amount of hydrogen in the region can be constant. It is preferable to use, in particular, aluminum oxide having an amorphous structure for the insulator 574, for hydrogen can be captured or fixed more effectively in some cases. Accordingly, the transistor 500 and a semiconductor device which have favorable characteristics and high reliability can be manufactured.

The insulator 576 functions as a barrier insulating film that inhibits impurities such as water and hydrogen from diffusing into the insulator 580 from above. The insulator 576 is provided over the insulator 574. The insulator 576 is preferably formed using a nitride containing silicon such as silicon nitride or silicon nitride oxide. For example, silicon nitride deposited by a sputtering method is used for the insulator 576. When the insulator 576 is deposited by a sputtering method, a high-density silicon nitride film can be formed. To obtain the insulator 576, silicon nitride deposited by a PEALD method or a CVD method may be stacked over silicon nitride deposited by a sputtering method.

One of a first terminal and a second terminal of the transistor 500 is electrically connected to a conductor 540a serving as a plug, and the other of the first terminal and the second terminal of the transistor 500 is electrically connected to a conductor 540b. Note that in this specification and the like, the conductor 540a and the conductor 540b are collectively referred to as the conductor 540.

The conductor 540a is provided in a region overlapping with the conductor 542a, for example. Specifically, an opening portion is provided in the insulator 571, the insulator 544, the insulator 580, the insulator 574, the insulator 576, and the insulator 581 illustrated in FIG. 36A and in the insulator 582 and the insulator 586 illustrated in FIG. 35 in the region overlapping with the conductor 542a, and the conductor 540a is provided inside the opening portion. The conductor 540b is provided in a region overlapping with the conductor 542b, for example. Specifically, an opening portion is provided in the insulator 571, the insulator 544, the insulator 580, the insulator 574, the insulator 576, and the insulator 581 illustrated in FIG. 36A and in the insulator 582 and the insulator 586 illustrated in FIG. 35 in the region overlapping with the conductor 542b, and the conductor 540b is provided inside the opening portion. Note that the insulator 582 and the insulator 586 are described later.

As illustrated in FIG. 36A, an insulator 541a having an impurity barrier property may be provided between the conductor 540a and a side surface of the opening portion in the region overlapping with the conductor 542a. In a similar manner, an insulator 541b having an impurity barrier property may be provided between the conductor 540b and a side surface of the opening portion in the region overlapping with the conductor 542b. Note that in this specification and the like, the insulator 541a and the insulator 541b are collectively referred to as the insulator 541.

For the conductor 540a and the conductor 540b, a conductive material containing tungsten, copper, or aluminum as its main component is preferably used. The conductor 540a and the conductor 540b may each have a stacked-layer structure.

In the case where the conductor 540 has a stacked-layer structure, a conductive material having a function of inhibiting passage of impurities such as water and hydrogen is preferably used for a first conductor placed in the vicinity of the insulator 574, the insulator 576, the insulator 581, the insulator 580, the insulator 544, and the insulator 571. For example, tantalum, tantalum nitride, titanium, titanium nitride, ruthenium, ruthenium oxide, or the like is preferably used. The conductive material having a function of inhibiting passage of impurities such as water and hydrogen may be used as a single layer or stacked layers. Moreover, impurities such as water and hydrogen contained in a layer above the insulator 576 can be inhibited from entering the oxide 530 through the conductor 540a and the conductor 540b.

For the insulator 541a and the insulator 541b, for example, a barrier insulating film that can be used for the insulator 544 or the like may be used. For the insulator 541a and the insulator 541b, for example, an insulator such as silicon nitride, aluminum oxide, or silicon nitride oxide may be used. Since the insulator 541a and the insulator 541b are provided in contact with the insulator 574, the insulator 576, and the insulator 571, impurities such as water and hydrogen contained in the insulator 580 or the like can be inhibited from entering the oxide 530 through the conductor 540a and the conductor 540b. In particular, silicon nitride is suitable because of its high blocking property against hydrogen. Furthermore, oxygen contained in the insulator 580 can be prevented from being absorbed by the conductor 540a and the conductor 540b.

When the insulator 541a and the insulator 541b each have a stacked-layer structure illustrated in FIG. 36A, a first insulator in contact with an inner wall of the opening formed in the insulator 580 and the like and a second insulator on the inner side of the first insulator are preferably formed using a combination of a barrier insulating film against oxygen and a barrier insulating film against hydrogen.

For example, aluminum oxide deposited by an ALD method may be used as the first insulator and silicon nitride deposited by a PEALD method may be used as the second insulator. With this structure, oxidation of the conductor 540 can be inhibited, and hydrogen can be prevented from entering the conductor 540.

Although the first insulator of the insulator 541 and the second conductor of the insulator 541 are stacked in the transistor 500, the present invention is not limited thereto. For example, the insulator 541 may have a single-layer structure or a stacked-layer structure of three or more layers. Although the first conductor of the conductor 540 and the second conductor of the conductor 540 are stacked in the transistor 500, the present invention is not limited thereto. For example, the conductor 540 may have a single-layer structure or a stacked-layer structure of three or more layers.

As illustrated in FIG. 35, a conductor 610 and a conductor 612, and the like, serving as wirings may be provided in contact with top portions of the conductor 540a and the conductor 540b. For the conductor 610 and the conductor 612, a conductive material containing tungsten, copper, or aluminum as its main component is preferably used. Furthermore, the conductor may have a stacked-layer structure and may be a stack of titanium or titanium nitride and the conductive material, for example. Note that the conductor may be formed to be embedded in an opening provided in an insulator.

The structure of the transistor included in the semiconductor device of one embodiment of the present invention is not limited to the structures of the transistors 500 illustrated in FIG. 35, FIG. 36A, FIG. 36B, and FIG. 37. The structure of the transistor included in the semiconductor device of one embodiment of the present invention may be changed in accordance with circumstances.

Figure 39:
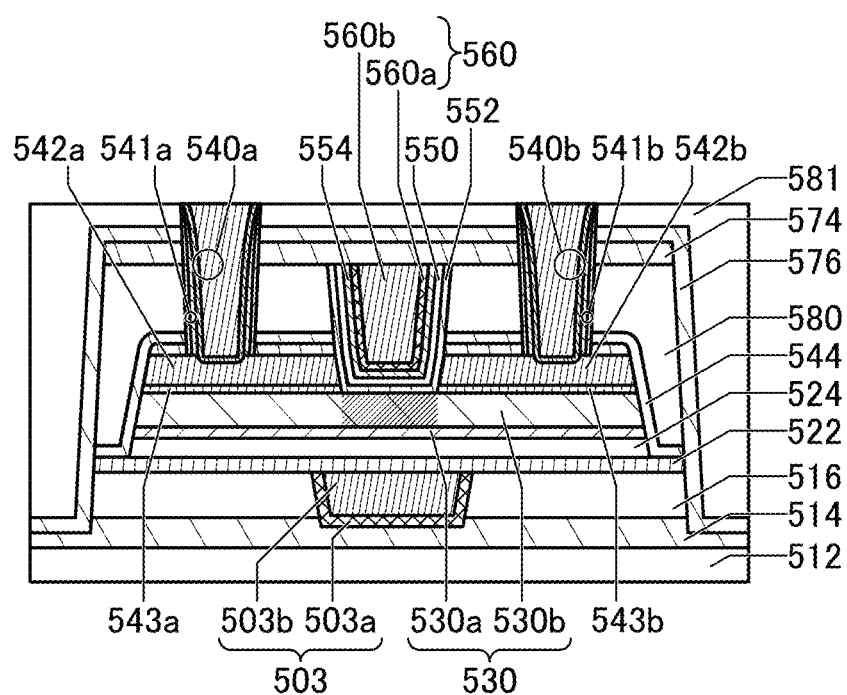
FIG. 39 is a schematic cross-sectional view illustrating a structure example of a transistor.

For example, the transistor 500 illustrated in FIG. 35, FIG. 36A, FIG. 36B, and FIG. 37 may have a structure illustrated in FIG. 39. The transistor in FIG. 39 is different from the transistor 500 illustrated in FIG. 35, FIG. 36A, FIG. 36B, and FIG. 37 in that an oxide 543a and an oxide 543b are provided. Note that in this specification and the like, the oxide 543a and the oxide 543b are collectively referred to as an oxide 543. The cross section in the channel-width direction of the transistor in FIG. 39 can have a structure similar to the cross section of the transistor 500 illustrated in FIG. 36B.

The oxide 543a is provided between the oxide 530b and the conductor 542a, and the oxide 543b is provided between the oxide 530b and the conductor 542b. The oxide 543a is preferably in contact with the top surface of the oxide 530b and the bottom surface of the conductor 542a. The oxide 543b is preferably in contact with the top surface of the oxide 530b and the bottom surface of the conductor 542b.

The oxide 543 preferably has a function of inhibiting passage of oxygen. The oxide 543 having a function of inhibiting passage of oxygen is preferably placed between the oxide 530b and the conductor 542 functioning as the source electrode or the drain electrode, in which case the electric resistance between the conductor 542 and the oxide 530b can be reduced. Such a structure can improve the electrical characteristics, the field-effect mobility, and the reliability of the transistor 500 in some cases.

A metal oxide containing the element M may be used as the oxide 543. In particular, aluminum, gallium, yttrium, or tin is preferably used as the element M. The concentration of the element M in the oxide 543 is preferably higher than that in the oxide 530b. Furthermore, gallium oxide may be used for the oxide 543. A metal oxide such as an In-M-Zn oxide may be used as the oxide 543. Specifically, the atomic ratio of the element M to In in the metal oxide used as the oxide 543 is preferably greater than the atomic ratio of the element M to In in the metal oxide used as the oxide 530b. The thickness of the oxide 543 is preferably greater than or equal to 0.5 nm or greater than or equal to 1 nm, and less than or equal to 2 nm, less than or equal to 3 nm, or less than or equal to 5 nm. Note that any of the above minimum values and maximum values can be combined with each other. The oxide 543 preferably has crystallinity. In the case where the oxide 543 has crystallinity, release of oxygen from the oxide 530 can be favorably inhibited. When the oxide 543 has a hexagonal crystal structure, for example, release of oxygen from the oxide 530 can sometimes be inhibited.

An insulator 582 is provided over the insulator 581, and an insulator 586 is provided over the insulator 582.

A substance having a barrier property against oxygen, hydrogen, or the like is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

For the insulator 586, a material similar to that for the insulator 320 can be used. Furthermore, when a material with a comparatively low permittivity is used for these insulators, parasitic capacitance generated between wirings can be reduced. A silicon oxide film, a silicon oxynitride film, or the like can be used for the insulator 586, for example.

Next, the capacitor 600 and a peripheral wiring or plug included the semiconductor device illustrated in FIG. 35 and FIG. 37 are described. The capacitor 600 and the wiring and/or the plug are provided above the transistor 500 illustrated in FIG. 35 and FIG. 37.

The capacitor 600 includes, for example, a conductor 610, a conductor 620, and an insulator 630.

The conductor 610 is provided over one of the conductor 540a and the conductor 540b, the conductor 546, and the insulator 586. The conductor 610 has a function of one of the pair of electrodes of the capacitor 600.

A conductor 612 is provided over the other of the conductor 540a and the conductor 540b and the insulator 586. The conductor 612 has a function of a plug, a wiring, a terminal, or the like that electrically connects the transistor 500 to the circuit element, wiring, terminal, or the like that can be provided above the transistor 500. Specifically, for example, the conductor 612 can be the wiring IL or the wiring ILB in the arithmetic circuit 110 or the like described in the above embodiment.

Note that the conductor 612 and the conductor 610 can be formed at the same time.

As the conductor 612 and the conductor 610, it is possible to use a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 612 and the conductor 610 are each illustrated to have a single-layer structure in FIG. 35; however, the structure is not limited thereto, and a stacked-layer structure of two or more layers may be employed. For example, between a conductor having a barrier property and a conductor having high conductivity, a conductor that is highly adhesive to the conductor having a barrier property and the conductor having high conductivity may be formed.

The insulator 630 is provided over the insulator 586 and the conductor 610. The insulator 630 serves as a dielectric sandwiched between the pair of electrodes of the capacitor 600.

The insulator 630 can be provided to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or zirconium oxide.

Alternatively, for the insulator 630, a stacked-layer structure using a material with high dielectric strength such as silicon oxynitride and a high permittivity (high-k) material may be used, for example. In the capacitor 600 having such a structure, a sufficient capacitance can be ensured owing to the high permittivity (high-k) insulator, and the dielectric strength can be increased owing to the insulator with high dielectric strength, so that the electrostatic breakdown of the capacitor 600 can be inhibited.

Examples of the insulator of a high permittivity (high-k) material (high dielectric constant material) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Alternatively, for example, a single layer or stacked layers of an insulator containing a high-k material such as aluminum oxide, hafnium oxide, tantalum oxide, zirconium oxide, lead zirconate titanate (PZT), strontium titanate ($SrTiO_3$), or $(Ba,Sr)TiO_3$ (BST) may be used as the insulator 630. For the insulator 630, a compound containing hafnium and zirconium may be used, for example. As miniaturization and high integration of semiconductor devices progress, a problem such as a leakage current from a transistor and a capacitor might arise because of a thinner gate insulator and a thinner dielectric used in the capacitor. When a high-k material is used as a gate insulator and an insulator functioning as a dielectric used for a capacitor, a gate potential during operation of the transistor can be lowered and capacitance of the capacitor can be ensured while the physical thickness is maintained.

The conductor 620 is provided to overlap with the conductor 610 with the insulator 630 therebetween. The conductor 610 has a function of one of the pair of electrodes of the capacitor 600. For example, the conductor 620 can be the wiring XLS of the arithmetic circuit 110 described in the above embodiment.

For the conductor 620, a conductive material such as a metal material, an alloy material, or a metal oxide material can be used. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, may be used. For example, the conductor 620 can be formed using a material that can be used for the conductor 610. Furthermore, the conductor 620 may have a single-layer structure or a stacked structure of two or more layers.

An insulator 640 is provided over the conductor 620 and the insulator 630. As the insulator 640, a film having a barrier property that prevents diffusion of hydrogen or impurities into the region where the transistor 500 is formed is preferably used. Therefore, a material similar to that for the insulator 324 can be used.

An insulator 650 is provided over the insulator 640. The insulator 650 can be provided using a material similar to that for the insulator 320. The insulator 650 may function as a planarization film that covers an uneven shape thereunder. Thus, the insulator 650 can be formed using any of the materials usable for the insulator 324, for example.

Although the capacitor 600 illustrated in FIG. 35 and FIG. 37 is a planar capacitor, the shape of the capacitor is not limited thereto. For example, the capacitor 600 may be a cylindrical capacitor.

A wiring layer may be provided above the capacitor 600. For example, in FIG. 35, the insulator 411, the insulator 412, the insulator 413, and the insulator 414 are provided in this order above the insulator 650. In addition, a conductor 416 serving as a plug or a wiring is provided in the insulator 411, the insulator 412, and the insulator 413. The conductor 416 can be provided, for example, in a region overlapping with a conductor 660 to be described below.

In addition, an opening portion is provided in regions of the insulator 630, the insulator 640, and the insulator 650 that overlap with the conductor 612, and a conductor 660 is provided to fill the opening portion. The conductor 660 serves as a plug or a wiring that is electrically connected to the conductor 416 included in the above-described wiring layer.

For example, like the insulator 324 or the like, the insulator 411 and the insulator 414 are each preferably formed using an insulator having a barrier property against impurities such as water and hydrogen. Thus, the insulator 411 and the insulator 414 can be each formed using any of the materials usable for the insulator 324 or the like, for example.

Like the insulator 326, the insulator 412 and the insulator 413 are each preferably formed using, for example, an insulator having a relatively low dielectric constant to reduce the parasitic capacitance generated between wirings.

The conductor 612 and the conductor 416 can be provided using materials similar to those for the conductor 328 and the conductor 330.

With use of the structure described in this embodiment for a semiconductor device using a transistor including an oxide semiconductor, a change in electrical characteristics of the transistor can be inhibited, and the reliability of the transistor can be improved. Alternatively, the semiconductor device using a transistor including an oxide semiconductor can be miniaturized or highly integrated.

Note that this embodiment can be combined with any of the other embodiments in this specification as appropriate.

Embodiment 4

Described in this embodiment is a metal oxide (hereinafter, also referred to as an oxide semiconductor) that can be used in the OS transistor described in the above embodiment.

The metal oxide preferably contains at least indium or zinc. It is particularly preferable that indium and zinc be contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, the classification of crystal structures of an oxide semiconductor is described with reference to FIG. 40A. FIG. 40A is a diagram showing the classification of crystal structures of an oxide semiconductor, typically IGZO (a metal oxide containing In, Ga, and Zn).

As shown in FIG. 40A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (Cloud-Aligned Composite) (excluding single crystal and poly crystal). Note that the term "Crystalline" excludes single crystal, poly crystal, and completely amorphous. The term "Crystal" includes single crystal and poly crystal.

Note that the structures in the thick frame in FIG. 40A are in an intermediate state between "Amorphous" and "Crystal", and belong to a new crystalline phase. That is, these structures are completely different from "Amorphous", which is energetically unstable, and "Crystal".

A crystal structure of a film or a substrate can be analyzed with an X-ray diffraction (XRD) spectrum. FIG. 40B shows an XRD spectrum, which is obtained by GIXD (Grazing-Incidence XRD) measurement, of a CAAC-IGZO film classified into "Crystalline" (the vertical axis represents intensity in arbitrary unit (a. u.)). Note that a GIXD method is also referred to as a thin film method or a Seemann-Bohlin method. The XRD spectrum that is shown in FIG. 40B and obtained by GIXD measurement is hereinafter simply referred to as an XRD spectrum. The CAAC-IGZO film in FIG. 40B has a composition in the neighborhood of In:Ga:Zn=4:2:3 [atomic ratio]. The CAAC-IGZO film in FIG. 40B has a thickness of 500 nm.

As shown in FIG. 40B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 40B, the peak at 2θ of around 31° is asymmetric with respect to the axis of the angle at which the peak intensity is detected.

A crystal structure of a film or a substrate can also be evaluated with a diffraction pattern observed by a nanobeam electron diffraction (NBED) method (such a pattern is also referred to as a nanobeam electron diffraction pattern). FIG. 40C shows a diffraction pattern of the CAAC-IGZO film. FIG. 40C shows a diffraction pattern obtained by the NBED in which an electron beam is incident in the direction parallel to the substrate. The CAAC-IGZO film in FIG. 40C has a composition in the neighborhood of In:Ga:Zn=4:2:3 [atomic ratio]. In addition, in the nanobeam electron diffraction method, electron diffraction is performed with a probe diameter of 1 nm.

As shown in FIG. 40C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 40A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter an In layer) and a layer containing the element M, zinc (Zn), and oxygen (hereinafter an (M,Zn) layer) are stacked. Indium and the element M can be replaced with each other. Therefore, indium may be contained in the (M,Zn) layer. In addition, the element M may be contained in the In layer. Note that Zn may be contained in the In layer.

Such a layered structure is observed as a lattice image in a high-resolution TEM image, for example.

When the CAAC-OS film is subjected to structural analysis by Out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of an incident electron beam passing through a sample (also referred to as a direct spot) as a symmetric center.

When the crystal region is observed from the particular direction, a lattice arrangement in the crystal region is basically a hexagonal lattice arrangement; however, a unit lattice is not always a regular hexagon and is a non-regular hexagon in some cases. Furthermore, a pentagonal or heptagonal lattice arrangement, for example, is included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear crystal grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is less likely to occur. Moreover, since the crystallinity of an oxide semiconductor might be decreased by entry of impurities, formation of defects, or the like, the CAAC-OS can be regarded as an oxide semiconductor that has a small amount of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by Out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., larger than or equal to 1 nm and smaller than or equal to 30 nm).

[a-Like OS]

The a-like OS is an oxide semiconductor having a structure between those of the nc-OS and the amorphous oxide semiconductor. The a-like OS includes a void or a low-density region. That is, the a-like OS has lower crystallinity than the nc-OS and the CAAC-OS. Moreover, the a-like OS has higher hydrogen concentration in the film than the nc-OS and the CAAC-OS.

<<Composition of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Accordingly, a transistor including an oxide semiconductor that contains an alkali metal or an alkaline earth metal tends to have normally-on characteristics. Thus, the concentration of an alkali metal or an alkaline earth metal in the oxide semiconductor, which is obtained by SIMS, is lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type by generation of electrons serving as carriers and an increase in carrier concentration. Thus, a transistor using an oxide semiconductor containing nitrogen as the semiconductor tends to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

Note that this embodiment can be combined with any of the other embodiments in this specification as appropriate.

Embodiment 5

This embodiment will show examples of a semiconductor wafer where the semiconductor device or the like described in the above embodiment is formed and electronic components incorporating the semiconductor device.

<Semiconductor Wafer>

First, an example of a semiconductor wafer where a semiconductor device or the like is formed is described with reference to FIG. 41A.

Figure 41A:
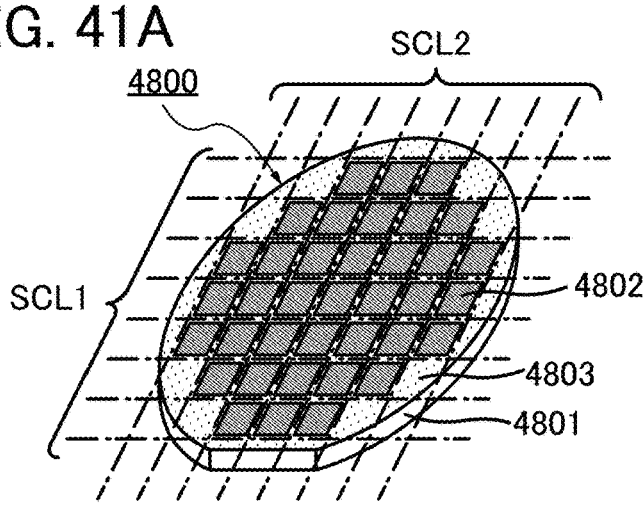
FIG. 41A is a perspective view illustrating an example of a semiconductor wafer.

A semiconductor wafer 4800 illustrated in FIG. 41A includes a wafer 4801 and a plurality of circuit portions 4802 provided on a top surface of the wafer 4801. A portion without the circuit portion 4802 on the top surface of the wafer 4801 is a spacing 4803 that is a region for dicing.

The semiconductor wafer 4800 can be fabricated by forming the plurality of circuit portions 4802 on the surface of the wafer 4801 by a pre-process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

A dicing step is performed as the next step. The dicing is performed along scribe lines SCL1 and scribe lines SCL2 (referred to as dicing lines or cutting lines in some cases) indicated by dashed-dotted lines. Note that to perform the dicing step easily, it is preferable that the spacing 4803 be provided such that the plurality of scribe lines SCL1 are parallel to each other, the plurality of scribe lines SCL2 are parallel to each other, and the scribe lines SCL1 are perpendicular to the scribe lines SCL2.

Figure 41B:
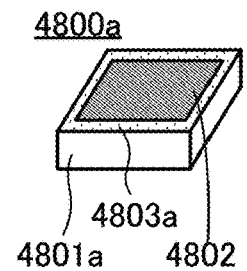
FIG. 41B is a perspective view illustrating an example of a chip.

With the dicing step, a chip 4800a as illustrated in FIG. 41B can be cut out from the semiconductor wafer 4800. The chip 4800a includes a wafer 4801a, the circuit portion 4802, and a spacing 4803a. Note that it is preferable to make the spacing 4803a as small as possible. In this case, the width of the spacing 4803 between adjacent circuit portions 4802 is substantially the same as a cutting allowance of the scribe line SCL1 or a cutting allowance of the scribe line SCL2.

Note that the shape of the element substrate of one embodiment of the present invention is not limited to the shape of the semiconductor wafer 4800 illustrated in FIG. 41A. The element substrate may be a rectangular semiconductor wafer, for example. The shape of the element substrate can be changed as appropriate, depending on a manufacturing process of an element and an apparatus for manufacturing the element.

<Electronic Component>

Figure 41C:
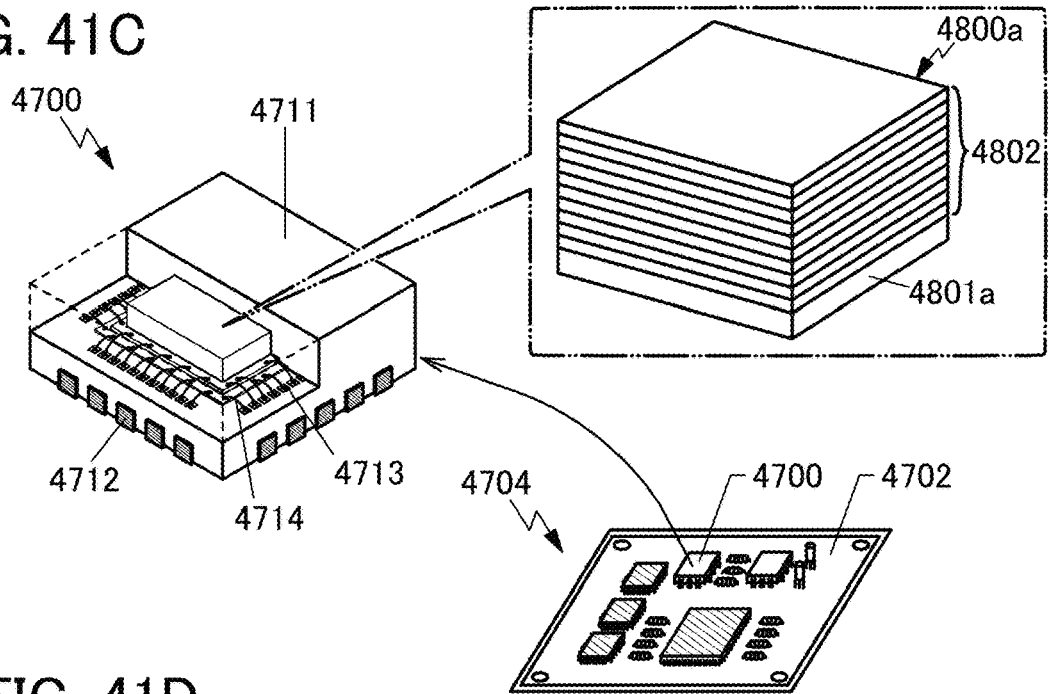
FIG. 41C and FIG. 41D are perspective views illustrating examples of electronic components.

FIG. 41C illustrates a perspective view of an electronic component 4700 and a substrate (a mounting board 4704) on which the electronic component 4700 is mounted. The electronic component 4700 illustrated in FIG. 41C includes a chip 4800a in a mold 4711. Note that the chip 4800a may have a structure in which the circuit portions 4802 are stacked as illustrated in FIG. 41C. To illustrate the inside of the electronic component 4700, some portions are omitted in FIG. 41C. The electronic component 4700 includes a land 4712 outside the mold 4711. The land 4712 is electrically connected to an electrode pad 4713, and the electrode pad 4713 is electrically connected to the chip 4800a through a wire 4714. The electronic component 4700 is mounted on a printed circuit board 4702, for example. A plurality of such electronic components are combined and electrically connected to each other on the printed circuit board 4702, whereby the mounting board 4704 is completed.

Figure 41D:
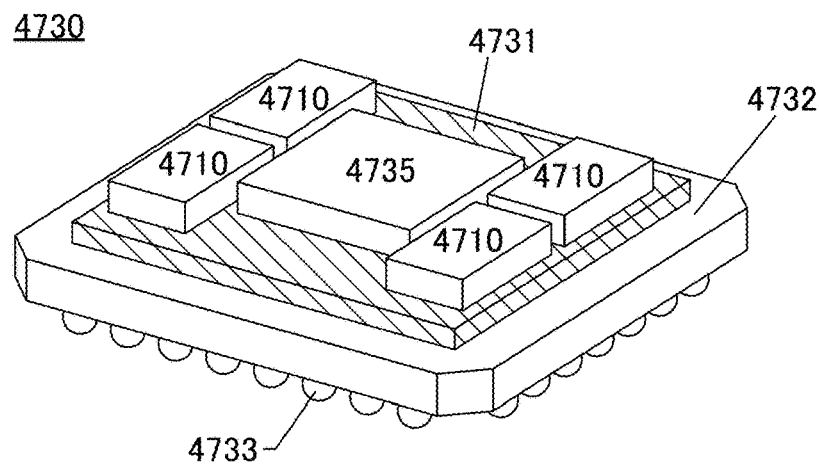

FIG. 41D illustrates a perspective view of an electronic component 4730. The electronic component 4730 is an example of a SiP (System in package) or an MCM (Multi Chip Module). In the electronic component 4730, an interposer 4731 is provided on a package substrate 4732 (a printed circuit board), and a semiconductor device 4735 and a plurality of semiconductor devices 4710 are provided on the interposer 4731.

The electronic component 4730 includes the semiconductor devices 4710. Examples of the semiconductor devices 4710 include the semiconductor device described in the above embodiment and a high bandwidth memory (HBM). An integrated circuit (a semiconductor device) such as a CPU, a GPU, an FPGA, or a storage device can be used as the semiconductor device 4735.

As the package substrate 4732, a ceramic substrate, a plastic substrate, a glass epoxy substrate, or the like can be used. As the interposer 4731, a silicon interposer, a resin interposer, or the like can be used.

The interposer 4731 includes a plurality of wirings and has a function of electrically connecting a plurality of integrated circuits with different terminal pitches. The plurality of wirings are provided in a single layer or multiple layers. Moreover, the interposer 4731 has a function of electrically connecting an integrated circuit provided on the interposer 4731 to an electrode provided on the package substrate 4732. Accordingly, the interposer is referred to as a "redistribution substrate" or an "intermediate substrate" in some cases. A through electrode is provided in the interposer 4731 and the through electrode is used to electrically connect an integrated circuit and the package substrate 4732 in some cases. In a silicon interposer, a TSV (Through Silicon Via) can also be used as the through electrode.

A silicon interposer is preferably used as the interposer 4731. A silicon interposer can be manufactured at lower cost than an integrated circuit because it is not necessary to provide an active element. Meanwhile, since wirings of a silicon interposer can be formed through a semiconductor process, formation of minute wirings, which is difficult for a resin interposer, is easy.

In order to achieve a wide memory bandwidth, many wirings need to be connected to an HBM. Therefore, formation of minute and high-density wirings is required for an interposer on which an HBM is mounted. For this reason, a silicon interposer is preferably used as the interposer on which an HBM is mounted.

In a SiP, an MCM, or the like using a silicon interposer, a decrease in reliability due to a difference in expansion coefficient between an integrated circuit and the interposer is less likely to occur. Furthermore, the surface of a silicon interposer has high planarity, so that a poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on an interposer.

A heat sink (a radiator plate) may be provided to overlap with the electronic component 4730. In the case of providing a heat sink, the heights of integrated circuits provided on the interposer 4731 are preferably equal to each other. For example, in the electronic component 4730 described in this embodiment, the heights of the semiconductor devices 4710 and the semiconductor device 4735 are preferably equal to each other.

To mount the electronic component 4730 on another substrate, an electrode 4733 may be provided on the bottom portion of the package substrate 4732. FIG. 41D illustrates an example in which the electrode 4733 is formed of a solder ball. Solder balls are provided in a matrix on the bottom portion of the package substrate 4732, whereby BGA (Ball Grid Array) mounting can be achieved. Alternatively, the electrode 4733 may be formed of a conductive pin. When conductive pins are provided in a matrix on the bottom portion of the package substrate 4732, PGA (Pin Grid Array) mounting can be achieved.

The electronic component 4730 can be mounted on another substrate by various mounting methods other than BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

Note that this embodiment can be combined with any of the other embodiments in this specification as appropriate.

Embodiment 6

Figure 42:
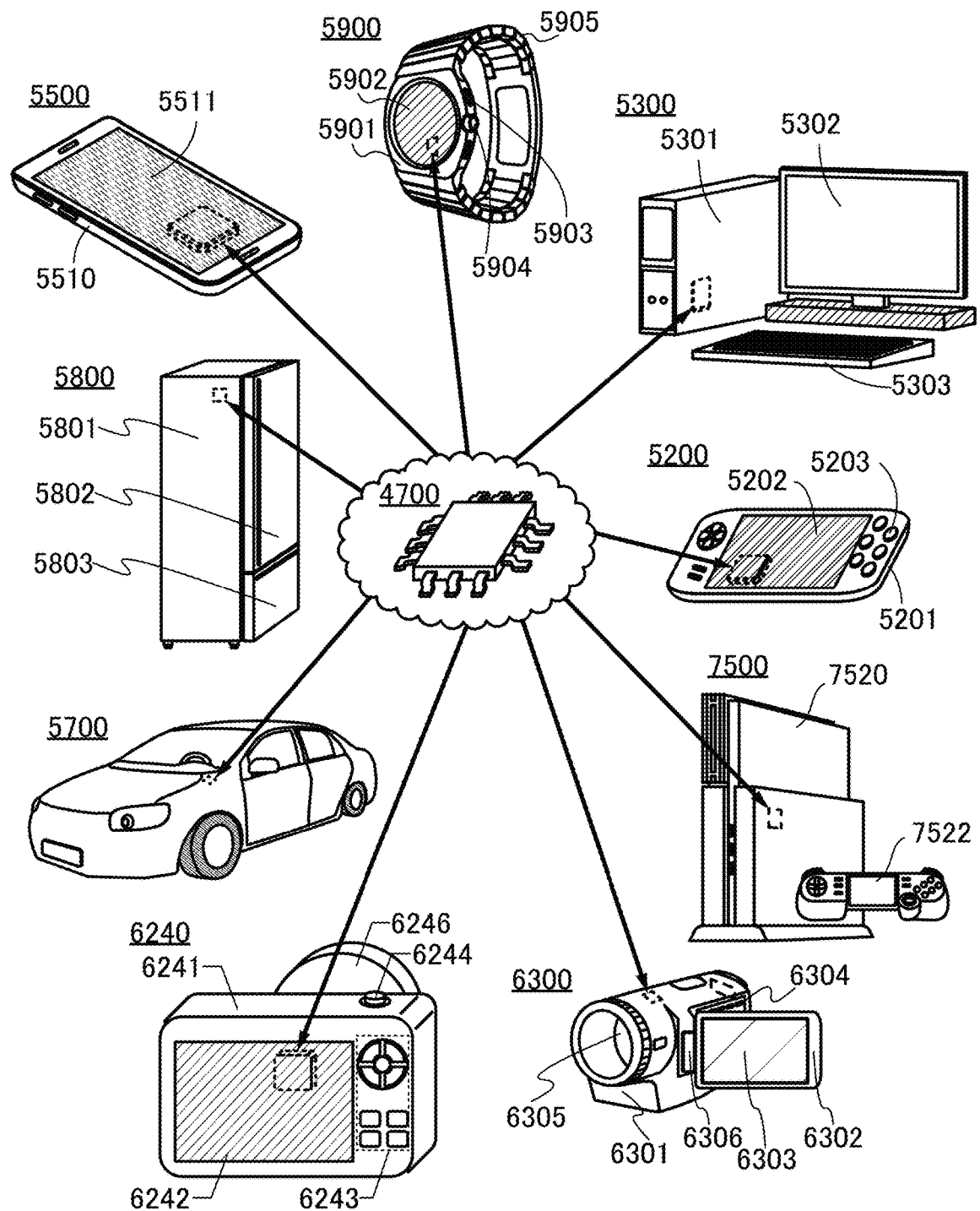
FIG. 42 is a schematic diagram illustrating examples of electronic devices.

This embodiment will show examples of electronic devices each including the semiconductor device described in the above embodiment. FIG. 42 illustrates electronic devices each including the electronic component 4700 including the semiconductor device.

[Mobile Phone]

An information terminal 5500 illustrated in FIG. 42 is a mobile phone (smartphone), which is a type of information terminal. The information terminal 5500 includes a housing 5510 and a display portion 5511, and as input interfaces, a touch panel is provided in the display portion 5511 and a button is provided in the housing 5510.

The information terminal 5500 can execute an application utilizing artificial intelligence with the use of the semiconductor device described in the above embodiment. Examples of the application utilizing artificial intelligence include an application for interpreting a conversation and displaying its content on the display portion 5511; an application for recognizing letters, diagrams, and the like input to the touch panel of the display portion 5511 by a user and displaying them on the display portion 5511; and an application for biometric authentication using fingerprints, voice prints, or the like. In addition, for example, when an image is captured by an imaging device (not illustrated) provided for the information terminal 5500, convolutional processing can be performed on the image with use of the semiconductor device described in the above embodiment. In other words, a feature can be extracted from the image.

[Wearable Terminal]

FIG. 42 illustrates a watch-type information terminal 5900 as an example of a wearable terminal. The information terminal 5900 includes a housing 5901, a display portion 5902, an operation button 5903, an operator 5904, a band 5905, and the like.

The wearable terminal can execute an application utilizing artificial intelligence with use of the semiconductor device described in the above embodiment, like the information terminal 5500. Examples of the application utilizing artificial intelligence include an application for managing the health condition of the user of the wearable terminal and a navigation system that selects the optimal route and navigates the user on the basis of the input of the destination.

[Information Terminal]

FIG. 42 illustrates a desktop information terminal 5300. The desktop information terminal 5300 includes a main body 5301 of the information terminal, a display 5302, and a keyboard 5303.

The desktop information terminal 5300 can execute an application utilizing artificial intelligence with use of the semiconductor device described in the above embodiment, like the information terminal 5500. Examples of the application utilizing artificial intelligence include design-support software, text correction software, and software for automatic menu generation. Furthermore, with use of the desktop information terminal 5300, novel artificial intelligence can be developed. In addition, for example, when an image is captured by an imaging device (not illustrated) provided for the information terminal 5500, convolutional processing can be performed on the image with use of the semiconductor device described in the above embodiment. In other words, a feature can be extracted from the image.

Note that although FIG. 42 illustrates the smartphone, the desktop information terminal, and the wearable terminal as examples of electronic devices, one embodiment of the present invention can also be applied to information terminals other than smartphones, desktop information terminals, and wearable terminals. Examples of information terminals other than smartphones, desktop information terminals, and wearable terminals include a PDA (Personal Digital Assistant), a laptop information terminal, and a workstation.

[Household Appliance]

FIG. 42 illustrates an electric refrigerator-freezer 5800 as an example of a household appliance. The electric refrigerator-freezer 5800 includes a housing 5801, a refrigerator door 5802, a freezer door 5803, and the like.

When the semiconductor device described in the above embodiment is used for the electric refrigerator-freezer 5800, the electric refrigerator-freezer 5800 including artificial intelligence can be achieved. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting temperature to be appropriate for the foods stored in the electric refrigerator-freezer 5800, and the like.

Although the electric refrigerator-freezer is described as a household appliance in this example, other examples of the household appliance include a vacuum cleaner, a microwave oven, an electric oven, a rice cooker, a water heater, an IH (Induction Heating) cooker, a water server, a heating-cooling combination appliance such as an air conditioner, a washing machine, a drying machine, and an audio visual appliance.

[Game Machines]

FIG. 42 illustrates a portable game machine 5200 as an example of a game machine. The portable game machine 5200 includes a housing 5201, a display portion 5202, a button 5203, and the like.

FIG. 42 illustrates a stationary game machine 7500 as another example of a game machine. The stationary game machine 7500 includes a main body 7520 and a controller 7522. The controller 7522 can be connected to the main body 7520 with or without a wire. Although not illustrated in FIG. 42, the controller 7522 can include a display portion that displays a game image, and an input interface besides a button, such as a touch panel, a stick, a rotating knob, or a sliding knob, for example. The shape of the controller 7522 is not limited to that shown in FIG. 42, and the shape of the controller 7522 may be changed variously in accordance with the genres of games. For example, for a shooting game such as an FPS (First Person Shooter) game, a gun-shaped controller having a trigger button can be used. As another example, for a music game or the like, a controller having a shape of a musical instrument, audio equipment, or the like can be used. Furthermore, the stationary game machine may include a camera, a depth sensor, a microphone, and the like so that the game player can play a game using a gesture and/or a voice instead of a controller.

A video of the game machine can be output with a display device such as a television device, a personal computer display, a game display, or a head-mounted display.

When the semiconductor device described in the above embodiment is used in the portable game machine 5200, the portable game machine 5200 with low power consumption can be achieved. Furthermore, heat generation from a circuit can be reduced owing to low power consumption; thus, the influence of heat generation on the circuit itself, the peripheral circuit, and the module can be reduced.

Furthermore, when the semiconductor device described in the above embodiment is used for the portable game machine 5200, the portable game machine 5200 including artificial intelligence can be achieved.

In general, the progress of a game, the actions and words of game characters, and expressions of a phenomenon and the like in the game are programed in the game; however, the use of artificial intelligence in the portable game machine 5200 enables expressions not limited by the game program. For example, it becomes possible to change expressions such as questions posed by the player, the progress of the game, time, and actions and words of game characters.

When a game requiring a plurality of players is played on the portable game machine 5200, the artificial intelligence can create a virtual game player; thus, the game can be played alone with the game player created by the artificial intelligence as an opponent.

Although FIG. 42 illustrates the portable game machine as an example of a game machine, the electronic device of one embodiment of the present invention is not limited thereto. Examples of the electronic device of one embodiment of the present invention include a home stationary game machine, an arcade game machine installed in entertainment facilities (e.g., a game center and an amusement park), and a throwing machine for batting practice installed in sports facilities.

[Moving Vehicle]

The semiconductor device described in the above embodiment can be used for an automobile, which is a moving vehicle, and around the driver's seat in an automobile.

FIG. 42 illustrates an automobile 5700 as an example of a moving vehicle.

An instrument panel that can display a speedometer, a tachometer, a mileage, a fuel meter, a gearshift state, air-conditioning setting, and the like is provided around the driver's seat in the automobile 5700. In addition, a display device showing the above information may be provided around the driver's seat.

In particular, the display device can compensate for the view obstructed by the pillar or the like, the blind areas for the driver's seat, and the like by displaying a video taken by an imaging device (not illustrated) provided for the automobile 5700, thereby providing a high level of safety. That is, display of an image taken by an imaging device provided on the outside of the automobile 5700 can compensate for blind areas and enhance safety.

Since the semiconductor device described in the above embodiment can be used as the components of artificial intelligence, the semiconductor device can be used for an automatic driving system of the automobile 5700, for example. The semiconductor device can also be used for a system for navigation, risk prediction, or the like. The display device may display navigation information, risk prediction information, or the like.

Note that although an automobile is described above as an example of a moving vehicle, the moving vehicle is not limited to an automobile. Examples of the moving vehicle include a train, a monorail train, a ship, and a flying object (a helicopter, an unmanned aircraft (a drone), an airplane, and a rocket), and these moving vehicles can include a system utilizing artificial intelligence when equipped with the semiconductor device of one embodiment of the present invention.

[Camera]

The semiconductor device described in the above embodiment can be used for a camera.

FIG. 42 illustrates a digital camera 6240 as an example of an image capturing device. The digital camera 6240 includes a housing 6241, a display portion 6242, operation buttons 6243, a shutter button 6244, and the like, and an attachable lens 6246 is attached to the digital camera 6240. Although the lens 6246 of the digital camera 6240 is detachable from the housing 6241 for replacement here, the lens 6246 may be integrated with the housing 6241. A stroboscope, a viewfinder, or the like may be additionally attached to the digital camera 6240.

When the semiconductor device described in the above embodiment is used in the digital camera 6240, the digital camera 6240 with low power consumption can be achieved. Furthermore, heat generation from a circuit can be reduced owing to low power consumption; thus, the influence of heat generation on the circuit itself, the peripheral circuit, and the module can be reduced.

Furthermore, when the semiconductor device described in the above embodiment is used for the digital camera 6240, the digital camera 6240 including artificial intelligence can be achieved. Utilizing the artificial intelligence enables the digital camera 6240 to have a function of automatically recognizing a subject such as a face or an object, a function of adjusting a focus on the subject, a function of automatically using a flash in accordance with environments, a function of toning a taken image, and the like. In addition, for example, when an image is captured by the digital camera 6240, convolutional processing can be performed on the image with use of the semiconductor device described in the above embodiment. In other words, a feature can be extracted from the image.

[Video Camera]

The semiconductor device described in the above embodiment can be used for a video camera.

FIG. 42 illustrates a video camera 6300 as an example of an image capturing device. The video camera 6300 includes a first housing 6301, a second housing 6302, a display portion 6303, operation keys 6304, a lens 6305, a joint 6306, and the like. The operation keys 6304 and the lens 6305 are provided in the first housing 6301, and the display portion 6303 is provided in the second housing 6302. The first housing 6301 and the second housing 6302 are connected to each other with the joint 6306, and the angle between the first housing 6301 and the second housing 6302 can be changed with the joint 6306. Videos displayed on the display portion 6303 may be switched in accordance with the angle at the joint 6306 between the first housing 6301 and the second housing 6302.

When videos taken by the video camera 6300 are recorded, the videos need to be encoded in accordance with a data recording format. With use of artificial intelligence, the video camera 6300 can perform the pattern recognition by artificial intelligence in encoding of the videos. The pattern recognition is used to calculate a difference in the human, the animal, the object, and the like between continuously taken image data, so that the data can be compressed. In addition, for example, convolutional processing may be performed on the image data with use of the semiconductor device described in the above embodiment.

[Expansion Device for PC]

The semiconductor device described in the above embodiment can be used in a calculator such as a PC (Personal Computer) and an expansion device for an information terminal.

Figure 43A:
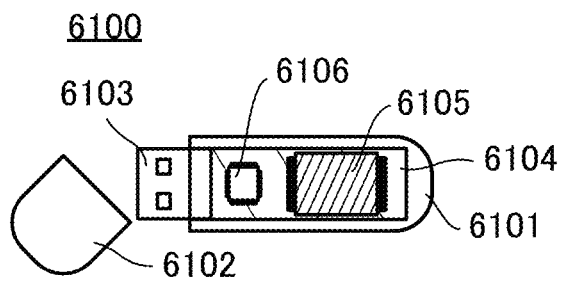
FIG. 43A to FIG. 43C are schematic diagrams illustrating examples of electronic devices.

FIG. 43A illustrates, as an example of the expansion device, a portable expansion device 6100 that includes a chip capable of arithmetic processing and is externally attached to a PC. The expansion device 6100 can perform arithmetic processing using the chip when connected to a PC with a USB (Universal Serial Bus), for example. FIG. 43A illustrates the portable expansion device 6100; however, the expansion device of one embodiment of the present invention is not limited thereto and may be a comparatively large expansion device including a cooling fan or the like, for example.

The expansion device 6100 includes a housing 6101, a cap 6102, a USB connector 6103, and a substrate 6104. The substrate 6104 is held in the housing 6101. The substrate 6104 is provided with a circuit for driving the semiconductor device or the like described in the above embodiment. For example, a chip 6105 (e.g., the semiconductor device described in the above embodiment, the electronic component 4700, or a memory chip) and a controller chip 6106 are attached to the substrate 6104. The USB connector 6103 functions as an interface for connection to an external device.

The use of the expansion device 6100 for the PC and the like can increase the arithmetic processing performance of the PC. Thus, a PC with insufficient processing performance can perform arithmetic operation of artificial intelligence, moving image processing, and the like.

[Broadcasting System]

The semiconductor device described in the above embodiment can be used for a broadcasting system.

Figure 43B:
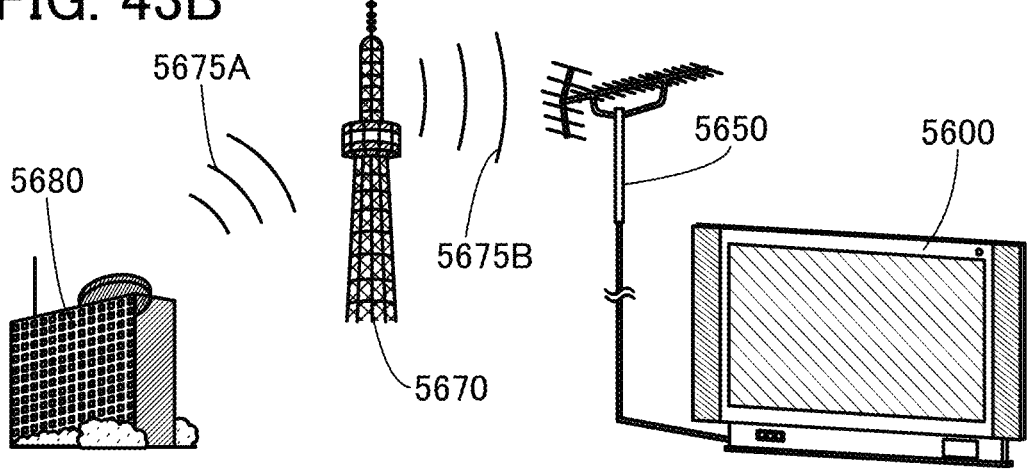

FIG. 43B schematically illustrates data transmission in a broadcasting system. Specifically, FIG. 43B illustrates a path in which a radio wave (a broadcasting signal) transmitted from a broadcast station 5680 reaches a television receiver (TV) 5600 of each household. The TV 5600 includes a receiving device (not illustrated), and the broadcasting signal received by an antenna 5650 is transmitted to the TV 5600 through the receiving device.

Although a UHF (Ultra High Frequency) antenna is illustrated as the antenna 5650 in FIG. 43B, a BS/110° CS antenna, a CS antenna, or the like can also be used as the antenna 5650.

A radio wave 5675A and a radio wave 5675B are broadcasting signals for terrestrial broadcasting; a radio wave tower 5670 amplifies the received radio wave 5675A and transmits the radio wave 5675B. Each household can view terrestrial TV broadcasting on the TV 5600 by receiving the radio wave 5675B with the antenna 5650. Note that the broadcasting system is not limited to the terrestrial broadcasting illustrated in FIG. 43B and may be satellite broadcasting using an artificial satellite, data broadcasting using an optical line, or the like.

The above-described broadcasting system may be a broadcasting system that utilizes artificial intelligence by including the semiconductor device described in the above embodiment. When the broadcast data is transmitted from the broadcast station 5680 to the TV 5600 of each household, the broadcast data is compressed with an encoder. When the antenna 5650 receives the compressed broadcast data, the compressed broadcast data is decompressed with a decoder of the receiving device in the TV 5600. Utilizing the artificial intelligence enables, for example, recognition of a display pattern included in a displayed image in motion compensation prediction, which is one of the compressing methods for the encoder. In-frame prediction utilizing artificial intelligence, for example, can also be performed. As another example, when the broadcast data with low resolution is received and the broadcast data is displayed on the TV 5600 with high resolution, image interpolation such as upconversion can be performed in the broadcast data decompression by the decoder.

The above-described broadcasting system utilizing artificial intelligence is suitable for ultra-high definition television (UHDTV: 4K and 8K) broadcasting, which needs a large amount of broadcast data.

As the application of artificial intelligence in the TV 5600, a recording device with artificial intelligence may be provided in the TV 5600, for example. With such a structure, the artificial intelligence can learn the user's preference, so that TV programs that suit the user's preference can be recorded automatically in the recording device.

[Authentication System]

The semiconductor device described in the above embodiment can be used for an authentication system.

Figure 43C:
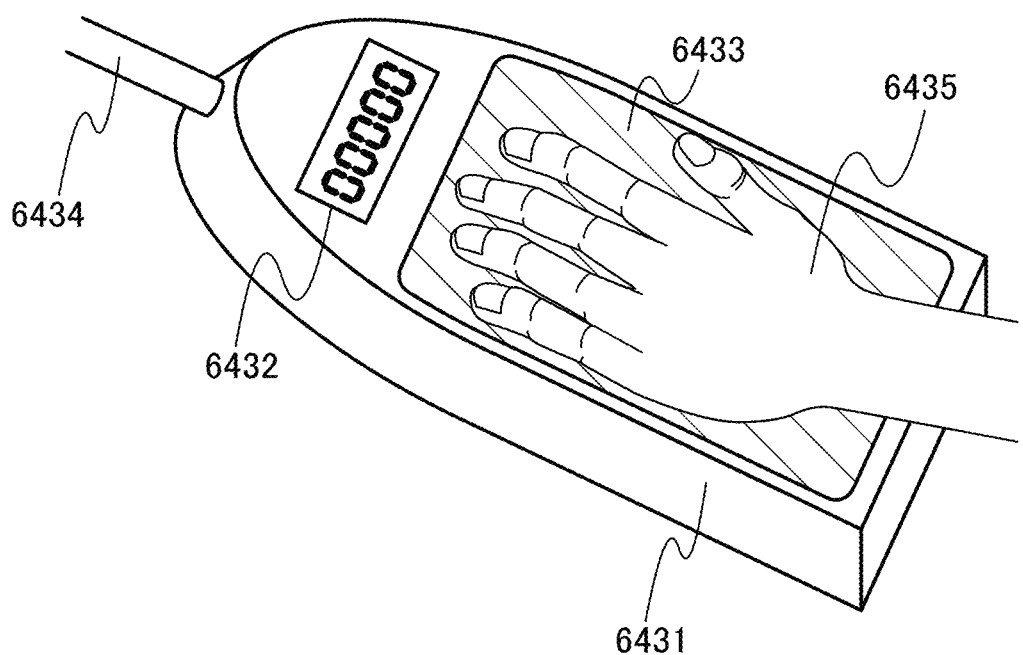

FIG. 43C illustrates a palm print authentication device including a housing 6431, a display portion 6432, a palm print reading portion 6433, and a wiring 6434.

In FIG. 43C, a palm print of a hand 6435 is obtained using the palm print authentication device. The obtained palm print is subjected to the pattern recognition utilizing artificial intelligence, so that personal authentication of the palm print can be performed. Thus, a system that performs highly secure authentication can be constructed. Without limitation to the palm print authentication device, the authentication system of one embodiment of the present invention may be a device that performs biometric authentication by obtaining biological information of fingerprints, veins, faces, iris, voice prints, genes, physiques, or the like.

Note that this embodiment can be combined with any of the other embodiments in this specification as appropriate.

REFERENCE NUMERALS

SDV1: semiconductor device, SDV2: semiconductor device, SDV3: semiconductor device, MEXT: storage device, MINT: storage device, ILD: circuit, CLP: arithmetic portion, CLPa: arithmetic portion, CLPb: arithmetic portion, BSE: substrate, WCS1: circuit, WCS2: circuit, DEC: decoder, CC[1]: current source, CC[u]: current source, CC[K]: current source, CC[t]: current source, CC[$2^K-1$]: current source, SW[1]: switch, SW[u]: switch, SW[K]: switch, SW[t]: switch, SW[$2^K-1$]: switch, CTr[1]: transistor, CTr[u]: transistor, CTr[K]: transistor, STr[1]: transistor, STr[u]: transistor, STr[K]: transistor, DIL[1]: wiring, DIL[u]: wiring, DIL[K]: wiring, DEL[1]: wiring, DEL[t]: wiring, DEL[$2^K-1$]: wiring, IL: wiring, ILB: wiring, SL11: wiring, BIAL: wiring, VDL: wiring, WWD: circuit, RWD: circuit, WRD: circuit, BF: circuit, SA: circuit, SA[1]: circuit, SA[K]: circuit, LC: load circuit, IVC: circuit, MCL[1]: memory cell, MCL[m]: memory cell, MCL[1,1]: memory cell, MCL[1,K]: memory cell, MCL[m,1]: memory cell, MCL[m,k]: memory cell, INV: inverter circuit, INV1: inverter circuit, INV2: inverter circuit, LAT1: latch circuit, LAT2: latch circuit, F1: transistor, F2: transistor, F3: transistor, F4: transistor, CI: capacitor, CI2: capacitor, RSW: switch, RSW[1]: switch, RSW[K]: switch, RSW2: switch, WSW: switch, VR: variable resistor, MR: MTJ element, PCM: phase-change memory, FEC: ferroelectric capacitor, WBL[1]: wiring, WBL[u]: wiring, WBL[K]: wiring, RBL: wiring, RBL[1]: wiring, RBL[u]: wiring, RBL[K]: wiring, WWL[1]: wiring, WWL[m]: wiring, RWL[1]: wiring, RWL[m]: wiring, WRL: wiring, WRL[1]: wiring, WRL[m]: wiring, VDL2: wiring, VEA: wiring, CLK: wiring, LMNT: circuit, EXMNT: circuit, LMC[i]: circuit, WCSA: circuit, WCSB: circuit, WCSD: circuit, WCSDr: circuit, WCS1r: circuit, DTC: circuit, CMPD: circuit, BF2: circuit, CCA: current source, CCB: current source, CCD: current source, CCDr: current source, F6A: transistor, F6B: transistor, F7: transistor, DC: memory cell, DCr: memory cell, M1d: transistor, M1dr: transistor, M2d: transistor, M2dr: transistor, C1d: capacitor, C1dr: capacitor, n1d: node, n1dr: node, DSW1: switch, DSW2: switch, DSW3: switch, DSW4: switch, DSW4r: switch, SWN: switch, SWNr: switch, RSUL: wiring, WLd: wiring, WLdr: wiring, DLd: wiring, VE: wiring, IRFE: wiring, VRFE: wiring, WLD: circuit, XLD: circuit, ALP: array portion, AFP: circuit, ACTF[1]: circuit, ACTF[j]: circuit, ACTF[n]: circuit, LGC: circuit, MP: circuit, MP[1,1]: circuit, MP[1,n]: circuit, MP[i,j]: circuit, MP[m,1]: circuit, MP[m,n]: circuit, MC: circuit, MCr: circuit, HC: circuit, HCr: circuit, M1: transistor, M1r: transistor, M2: transistor, M2r: transistor, M3: transistor, M3r: transistor, M4: transistor, M4r: transistor, M5: transistor, M5r: transistor, M8: transistor, M8r: transistor, LC2: load circuit, LC2r: load circuit, C1: capacitor, C1r: capacitor, n1: node, n1r: node, IL[1]: wiring, IL[j]: wiring, IL[n]: wiring, ILB[1]: wiring, ILB[j]: wiring, ILB[n]: wiring, OL[1]: wiring, OL[j]: wiring, OL[n]: wiring, OLB[1]: wiring, OLB[j]: wiring, OLB[n]: wiring, WLS[1]: wiring, WLS[i]: wiring, WLS[m]: wiring, WX1L[1]: wiring, WX1L[i]: wiring, WX1L[m]: wiring, XLS[1]: wiring, XLS[i]: wiring, XLS[m]: wiring, X1L: wiring, X1L[i]: wiring, X2L: wiring, X2L[1]: wiring, X2L[i]: wiring, X2L[m]: wiring, VE[j]: wiring, VEr[j]: wiring, VEG: wiring, CMP: comparator, RE: resistor, REB: resistor, CE: capacitor, CEB: capacitor, DE: diode element, DEB: diode element, OP: operational amplifier, S01a: switch, S01b: switch, S02a: switch, S02b: switch, S03: switch, SW[0]: switch, INV3: inverter circuit, VinT: terminal, VrefT: terminal, VoutT: terminal, BS[1]: circuit, BS[j]: circuit, BS[n]: circuit, IVR: inverter loop circuit, IVRr: inverter loop circuit, IV1: inverter circuit, IV2: inverter circuit, SCL1: scribe line, SCL2: scribe line, 100: neural network, 110: arithmetic circuit, 130: arithmetic circuit, 170: arithmetic circuit, 300: transistor, 310: substrate, 310A: substrate, 312: element isolation layer, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 411: insulator, 412: insulator, 413: insulator, 414: insulator, 416: conductor, 500: transistor, 503: conductor, 503a: conductor, 503b: conductor, 510: insulator, 512: insulator, 514: insulator, 516: insulator, 518: conductor, 522: insulator, 524: insulator, 530: oxide, 530a: oxide, 530b: oxide, 530ba: region, 530bb: region, 530bc: region, 540a: conductor, 540b: conductor, 541a: insulator, 541b: insulator, 542a: conductor, 542b: conductor, 543a: oxide, 543b: oxide, 544: insulator, 546: conductor, 550: insulator, 550a: insulator, 550b: insulator, 552: insulator, 554: insulator, 560: conductor, 560a: conductor, 560b: conductor, 571a: insulator, 571b: insulator, 574: insulator, 576: insulator, 580: insulator, 581: insulator, 582: insulator, 586: insulator, 600: capacitor, 610: conductor, 612: conductor, 620: conductor, 630: insulator, 640: insulator, 650: insulator, 660: conductor, 4700: electronic component, 4702: printed circuit board, 4704: mounting board, 4710: semiconductor device, 4711: mold, 4712: land, 4713: electrode pad, 4714: wire, 4730: electronic component, 4731: interposer, 4732: package substrate, 4733: electrode, 4735: semiconductor device, 4800: semiconductor wafer, 4800a: chip, 4801: wafer, 4801a: wafer, 4802: circuit portion, 4803: spacing, 4803a: spacing, 5200: portable game machine, 5201: housing, 5202: display portion, 5203: button, 5300: desktop information terminal, 5301: main body, 5302: display, 5303: keyboard, 5500: information terminal, 5510: housing, 5511: display portion, 5600: TV, 5650: antenna, 5670: radio wave tower, 5675A: radio wave, 5675B: radio wave, 5680: broadcast station, 5700: automobile, 5800: electric refrigerator-freezer, 5801: housing, 5802: refrigerator door, 5803: freezer door, 5900: information terminal, 5901: housing, 5902: display portion, 5903: operation button, 5904: operator, 5905: band, 6100: expansion device, 6101: housing, 6102: cap, 6103: USB connector, 6104: substrate, 6105: chip, 6106: controller chip, 6240: digital camera, 6241: housing, 6242: display portion, 6243: operation button, 6244: shutter button, 6246: lens, 6300: video camera, 6301: first housing, 6302: second housing, 6303: display portion, 6304: operation key, 6305: lens, 6306: joint, 6431: housing, 6432: display portion, 6433: palm print reading portion, 6434: wiring, 6435: hand, 7500: stationary game machine, 7520: main body, 7522: controller

The invention claimed is:

1. A semiconductor device comprising:
a first circuit;
a second circuit; and
a third circuit,
wherein the first circuit comprises a current source and a first switch,
wherein the second circuit comprises a first transistor, a third transistor, a fourth transistor, and a first capacitor,
wherein the third circuit comprises a second transistor,
wherein a first terminal of the first transistor is electrically connected to a control terminal of the first switch,
wherein a second terminal of the first transistor is electrically connected to a first terminal of the fourth transistor,
wherein a second terminal of the fourth transistor is electrically connected to a first terminal of the first capacitor,
wherein a gate of the fourth transistor is electrically connected to a second terminal of the first capacitor and a first terminal of the third transistor,
wherein a first terminal of the first switch is electrically connected to an output terminal of the current source, and
wherein a second terminal of the first switch is electrically connected to a first terminal of the second transistor.

2. The semiconductor device according to claim 1, further comprising a fourth circuit,
wherein the fourth circuit comprises a latch circuit.

3. A semiconductor device comprising:
a first circuit;
a second circuit;
a third circuit; and
a sense amplifier,
wherein the first circuit comprises a current source and a first switch,
wherein the second circuit comprises a first transistor and a first capacitor,
wherein the third circuit comprises a second transistor,
wherein a first terminal of the first transistor is electrically connected to a control terminal of the first switch through the sense amplifier,
wherein a second terminal of the first transistor is electrically connected to a first terminal of the first capacitor,
wherein a first terminal of the first switch is electrically connected to an output terminal of the current source, and
wherein a second terminal of the first switch is electrically connected to a first terminal of the second transistor.

4. The semiconductor device according to claim 1, wherein a gate of the first transistor is electrically connected to a gate of the second transistor.

5. A semiconductor device comprising:
a first circuit;
a second circuit; and
a third circuit;
wherein the first circuit comprises a current source and a first switch,
wherein the second circuit comprises a first transistor, a third transistor, and a first capacitor,
wherein the third circuit comprises a second transistor,
wherein a first terminal of the first transistor is electrically connected to a control terminal of the first switch,
wherein a first terminal of the third transistor is electrically connected to a first terminal of the first capacitor and a gate of the first transistor,
wherein a first terminal of the first switch is electrically connected to an output terminal of the current source, and
wherein a second terminal of the first switch is electrically connected to a first terminal of the second transistor.

6. The semiconductor device according to claim 5, further comprising a fourth circuit,
wherein the fourth circuit comprises a latch circuit.

7. The semiconductor device according to claim 5, wherein a second terminal of the first capacitor is electrically connected to a gate of the second transistor.

8. A semiconductor device, comprising:
a first circuit; and
a fifth circuit,
wherein the first circuit comprises a first current source, a second current source, a first switch, a fifth transistor, and a sixth transistor,
wherein the fifth circuit comprises a seventh transistor, an eighth transistor, a second capacitor, a second switch, a third switch, and a current comparison circuit, wherein an output terminal of the first current source is electrically connected to a first terminal of the first switch,
wherein an output terminal of the second current source is electrically connected to a gate of the fifth transistor, a gate of the sixth transistor, and a first terminal of the sixth transistor,
wherein a first terminal of the seventh transistor is electrically connected to a first terminal of the eighth transistor, a first terminal of the second switch, and a first terminal of the third switch,
wherein a gate of the seventh transistor is electrically connected to a second terminal of the eighth transistor and a first terminal of the second capacitor,
wherein a second terminal of the first switch is electrically connected to a second terminal of the second switch,
wherein a first terminal of the current comparison circuit is electrically connected to a second terminal of the third switch, and
wherein a second terminal of the current comparison circuit is electrically connected to a first terminal of the fifth transistor.

9. A semiconductor device comprising:
a first circuit; and
a fifth circuit,
wherein the first circuit comprises a first current source, a third current source, a first switch, and a fourth switch,
wherein the fifth circuit comprises a seventh transistor, an eighth transistor, a second capacitor, a second switch, a third switch, a fifth switch, and a current comparison circuit,
wherein an output terminal of the first current source is electrically connected to a first terminal of the first switch,
wherein an input terminal of the third current source is electrically connected to a first terminal of the fourth switch,
wherein a first terminal of the seventh transistor is electrically connected to a first terminal of the eighth transistor, a first terminal of the second switch, and a first terminal of the third switch,
wherein a gate of the seventh transistor is electrically connected to a second terminal of the eighth transistor and a first terminal of the second capacitor,
wherein a second terminal of the first switch is electrically connected to a second terminal of the second switch,
wherein a second terminal of the fourth switch is electrically connected to a first terminal of the fifth switch,
wherein a first terminal of the current comparison circuit is electrically connected to a second terminal of the third switch, and
wherein a second terminal of the current comparison circuit is electrically connected to a second terminal of the fifth switch.

10. The semiconductor device according to claim 8,
wherein the seventh transistor comprises silicon in a channel formation region, and
wherein the eighth transistor comprises a metal oxide in a channel formation region.

11. The semiconductor device according to claim 9,
wherein the fifth circuit further comprises a ninth transistor, a tenth transistor, a third capacitor, and a sixth switch,
wherein a first terminal of the ninth transistor is electrically connected to a first terminal of the tenth transistor, a first terminal of the second switch, and a first terminal of the sixth switch,
wherein a gate of the ninth transistor is electrically connected to a second terminal of the tenth transistor and a first terminal of the third capacitor,
wherein a second terminal of the sixth switch is electrically connected to a first terminal of the fifth switch and a second terminal of the fourth switch, and
wherein a gate of the eighth transistor is not directly connected to a gate of the tenth transistor.

12. The semiconductor device according to claim 11,
wherein each of the seventh transistor and the ninth transistor comprises silicon in a channel formation region, and
wherein each of the eighth transistor and the tenth transistor comprises a metal oxide in a channel formation region.

13. The semiconductor device according to claim 3, wherein a gate of the first transistor is electrically connected to a gate of the second transistor.

14. The semiconductor device according to claim 1, wherein each of the first transistor, the third transistor, and the fourth transistor comprises a metal oxide in a channel formation region.

15. The semiconductor device according to claim 3, wherein the first transistor comprises a metal oxide in a channel formation region.

16. The semiconductor device according to claim 5, wherein each of the first transistor and the third transistor comprises a metal oxide in a channel formation region.

* * * * *